United States Patent
Takano et al.

(10) Patent No.: US 10,680,143 B2
(45) Date of Patent: Jun. 9, 2020

(54) OPTICAL PLATE, LIGHTING DEVICE, AND LIGHT SOURCE MODULE

(71) Applicant: LG INNOTEK CO., LTD., Seoul (KR)

(72) Inventors: Sadao Takano, Seoul (KR); Takuma Kato, Seoul (KR); Iwao Shohji, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 15/773,390

(22) PCT Filed: Nov. 2, 2016

(86) PCT No.: PCT/KR2016/012529
§ 371 (c)(1),
(2) Date: May 3, 2018

(87) PCT Pub. No.: WO2017/078402
PCT Pub. Date: May 11, 2017

(65) Prior Publication Data
US 2018/0323352 A1    Nov. 8, 2018

(30) Foreign Application Priority Data

Nov. 4, 2015 (KR) .......................... 10-2015-0154368
Nov. 4, 2015 (KR) .......................... 10-2015-0154373
(Continued)

(51) Int. Cl.
*H01L 33/50* (2010.01)
*H01L 33/44* (2010.01)
(Continued)

(52) U.S. Cl.
CPC ........ *H01L 33/505* (2013.01); *H01L 25/0753* (2013.01); *H01L 33/44* (2013.01);
(Continued)

(58) Field of Classification Search
CPC ..... H01L 33/48; H01L 33/486; H01L 33/505; H01L 33/50; H01L 33/502; H01L 33/52;
(Continued)

(56) References Cited

U.S. PATENT DOCUMENTS

2007/0273274 A1* 11/2007 Horiuchi ................ C09K 11/06
                                                      313/504
2008/0012036 A1*  1/2008 Loh ...................... H01L 33/483
                                                      257/99
(Continued)

FOREIGN PATENT DOCUMENTS

JP    2003-110146 A    4/2003
JP    2013-38215 A     2/2013
(Continued)

OTHER PUBLICATIONS

International Search Report for PCT/KR2016/012529 (PCT/ISA/210) dated Feb. 24, 2017.

*Primary Examiner* — Ermias T Woldegeorgis
(74) *Attorney, Agent, or Firm* — Birch, Stewart, Kolasch & Birch, LLP

(57) ABSTRACT

Disclosed according to one embodiment is a lighting device comprising: a light emitting device having a light emitting chip; and an optical plate corresponding to the light emitting chip, wherein the optical plate comprises: a phosphor layer; a transparent film on the upside and/or downside of the phosphor layer; and a support surrounding the outside of the phosphor layer.

11 Claims, 118 Drawing Sheets

| (30) | Foreign Application Priority Data | | |
|---|---|---|---|
| Nov. 4, 2015 | (KR) | ........................ | 10-2015-0154379 |
| Nov. 4, 2015 | (KR) | ........................ | 10-2015-0154382 |
| Nov. 4, 2015 | (KR) | ........................ | 10-2015-0154383 |
| Nov. 4, 2015 | (KR) | ........................ | 10-2015-0154385 |
| Nov. 4, 2015 | (KR) | ........................ | 10-2015-0154387 |
| Nov. 4, 2015 | (KR) | ........................ | 10-2015-0154388 |
| Nov. 27, 2015 | (KR) | ........................ | 10-2015-0167097 |

(51) Int. Cl.
    *H01L 25/075*      (2006.01)
    *H01L 33/60*      (2010.01)
    *H01L 33/64*      (2010.01)
    *H01L 33/48*      (2010.01)
    *H01L 33/62*      (2010.01)

(52) U.S. Cl.
    CPC ............ *H01L 33/502* (2013.01); *H01L 33/60* (2013.01); *H01L 33/644* (2013.01); *H01L 33/486* (2013.01); *H01L 33/507* (2013.01); *H01L 33/62* (2013.01); *H01L 2224/48091* (2013.01); *H01L 2224/48137* (2013.01); *H01L 2224/48247* (2013.01); *H01L 2224/48257* (2013.01); *H01L 2933/0083* (2013.01)

(58) Field of Classification Search
CPC . H01L 33/60; H01L 33/62; F21K 9/20; F21K 9/64; F21K 9/65
See application file for complete search history.

(56) References Cited

U.S. PATENT DOCUMENTS

| 2008/0089061 | A1* | 4/2008 | Hsieh | ................ | G02F 1/133608 362/235 |
|---|---|---|---|---|---|
| 2010/0103648 | A1* | 4/2010 | Kim | ..................... | H01L 33/507 362/97.1 |
| 2014/0133159 | A1 | 5/2014 | Asano et al. | | |
| 2014/0226308 | A1 | 8/2014 | Fukuda et al. | | |

FOREIGN PATENT DOCUMENTS

| JP | 2013038215 A | * | 2/2013 |
|---|---|---|---|
| KR | 10-2010-0046698 A | | 5/2010 |
| KR | 10-2012-0009686 A | | 2/2012 |
| KR | 10-2013-0014479 A | | 2/2013 |
| KR | 10-2014-0038456 A | | 3/2014 |
| KR | 10-2014-0059991 A | | 5/2014 |
| KR | 2014059991 A | * | 5/2014 |

\* cited by examiner (A)

(B)

(A)

(B)

(a)

(b)

OPTICAL PLATE, LIGHTING DEVICE, AND LIGHT SOURCE MODULE

CROSS REFERENCE TO RELATED APPLICATIONS

This application is the National Phase of PCT International Application No. PCT/KR2016/012529, filed on Nov. 2, 2016, which claims priority under 35 U.S.C. 119(a) to Patent Application No. 10-2015-0154368, filed in the Republic of Korea on Nov. 4, 2015, Patent Application No. 10-2015-0154373, filed in the Republic of Korea on Nov. 4, 2015, Patent Application No. 10-2015-0154379, filed in the Republic of Korea on Nov. 4, 2015, Patent Application No. 10-2015-0154382, filed in the Republic of Korea on Nov. 4, 2015, Patent Application No. 10-2015-0154383, filed in the Republic of Korea on Nov. 4, 2015, Patent Application No. 10-2015-0154385, filed in the Republic of Korea on Nov. 4, 2015, Patent Application No. 10-2015-0154387, filed in the Republic of Korea on Nov. 4, 2015, Patent Application No. 10-2015-0154388, filed in the Republic of Korea on Nov. 4, 2015, and Patent Application No. 10-2015-0167097, filed in the Republic of Korea on Nov. 27, 2015, all of which are hereby expressly incorporated by reference into the present application.

TECHNICAL FIELD

An embodiment relates to an optical plate.

An embodiment relates to a lighting device having an optical plate and a light source module including the same.

BACKGROUND ART

Light emitting devices, for example, a light emitting diodes are a type of semiconductor device which converts electrical energy into light, and are attracting much attention as a next-generation light source by replacing conventional fluorescent lamps and incandescent lamps.

Since the light emitting diodes generate light by using a semiconductor device, the light emitting diodes consume only a very low power in comparison with incandescent lamps, which heat tungsten to generate light, or fluorescent lamps which cause a phosphor to collide with ultraviolet generated through high pressure discharge to generate light.

In addition, since the light emitting diode generates light by using the potential gap of the semiconductor device, it has a longer lifetime, faster response characteristics, and an environment-friendly characteristic as compared with the conventional light source.

The light emitting diodes are used as a light source for lighting devices such as various lamps, liquid crystal displays, electronic display boards, street lamps, and indicating lamps used at indoor and outdoor places, and the use of the light emitting diodes as the light source is increasing.

DISCLOSURE OF THE INVENTION

Technical Problem

An embodiment provides an optical plate having a novel structure that converts a wavelength.

An embodiment provides an optical plate that performs wavelength conversion on light incident at a position spaced apart from a light source.

An embodiment provides an optical plate including a semi-transmissive mirror that reflects and transmits incident light.

An embodiment may provide a light emitting device including an optical plate.

An embodiment provides a lighting device including a light emitting device and an optical plate.

An embodiment provides a lighting device including an optical plate with a semi-transmissive mirror on a light emitting device.

An embodiment provides a lighting device including an optical plate with a semi-transmissive mirror on a light emitting device and a support plate supporting the optical plate.

An embodiment may provide a lighting device capable of bonding the outer side between a light emitting device and an optical plate.

An embodiment provides a lighting device that blocks a substance or light leaking out through a region between a light emitting device and an optical plate.

An embodiment provides an optical plate that diffuses and wavelength-converts incident light on a light emitting device, and a lighting device including the same.

An embodiment may provide an optical plate including a phosphor layer on a light source, and a transparent film on at least one or both of an incidence surface and an exit surface of the phosphor layer.

An embodiment provides a lighting device including an optical plate on a light emitting device and a plate cover supporting the optical plate.

An embodiment provides a lighting device that blocks light leaking out through a region between a light emitting device and an optical plate.

An embodiment provides a lighting device that optimizes a gap between a light emitting chip of a light emitting device and a phosphor layer of an optical plate.

An embodiment provides a lighting device in which an optical plate is disposed on at least one light source, and a light source module including the same.

An embodiment provides a light source module including a light emitting chip on a circuit board and an optical plate that diffuses and wavelength-converts light incident on the light emitting chip.

An embodiment provides a lighting or light emitting device in which a phosphor layer is disposed on a light emitting chip that emits a relatively high peak wavelength among light emitting chips that emit different peak wavelengths.

An embodiment provides a lighting or light emitting device in which a phosphor layer is disposed on a light emitting chip that emits a relatively high peak wavelength among light emitting chips that emit the same color.

An embodiment provides a lighting or light emitting device including a body in which a barrier part is disposed between light emitting chips that emit different peak wavelengths.

An embodiment provides a lighting or light emitting device in which light emitting chips that emit different peak wavelengths are disposed in different cavities and phosphor layer is disposed on a light emitting chip that emits a relatively high peak wavelength.

An embodiment provides a lighting or light emitting device including a phosphor layer on a light emitting chip emitting a relatively high peak wavelength among light emitting chips that emit different peak wavelengths, and an optical filter reflecting a relatively peak wavelength above the phosphor layer.

An embodiment provides a light-emitting module including a lighting or light emitting device, and a light unit.

An embodiment provides a light emitting device in which a bottom area of a cavity is improved.

An embodiment provides a light emitting device in which an area of a lead frame disposed on a bottom of a cavity is improved.

An embodiment provides a light emitting device capable of improving a size of a light emitting chip disposed on a lead frame, and a light unit including the same.

Technical Solution

In one embodiment, a lighting device includes: a light emitting device having a light emitting chip; and an optical plate corresponding to the light emitting chip, wherein the optical plate includes: a phosphor layer; a transparent film on at least one of a top surface and a bottom surface of the phosphor layer; and a support surrounding the outer side of the phosphor layer.

In one embodiment, a lighting device includes: a light emitting device having a light emitting chip; and an optical plate disposed on the light emitting chip, wherein the optical plate includes: a first transparent film; a phosphor layer on the first transparent film; a second transparent film on the phosphor layer; a support surrounding the outer side of the phosphor layer and disposed between the first and second transparent films; and a semi-transmissive mirror disposed on a top surface or a bottom surface of the first transparent film and reflecting and transmitting incident light, and an area of a bottom surface of the semi-transmissive mirror is larger than an area of a bottom of the light emitting chip.

In one embodiment, a lighting device includes: a light emitting device having a light emitting chip; and an optical plate having a semi-transmissive mirror facing the light emitting chip on the light emitting device, wherein the optical plate includes: a phosphor layer; a first transparent film below the phosphor layer; and a support surrounding the side of the phosphor layer, the semi-transmissive mirror is disposed to face the light emitting chip in a partial region of the first transparent film and reflects and transmits incident light, and an area of a bottom surface of the semi-transmissive mirror is larger than an area of a top surface of the light emitting chip.

In one embodiment, a lighting device includes: a body; a plurality of lead frames disposed in the body; a light emitting device having a light emitting chip disposed on at least one of the plurality of lead frames; an optical plate disposed on the light emitting device and converting a wavelength of partial light emitted from the light emitting device, wherein the optical plate includes: a phosphor layer; a first transparent film disposed below the phosphor layer and to which light is incident; and a support having an open region in which the phosphor layer is disposed and disposed around the side of the phosphor layer, and the support is disposed at the outer periphery of the first transparent film.

In one embodiment, a lighting device includes: a body having a recess; a plurality of lead frames disposed in the recess of the body; a light emitting device having a light emitting chip disposed on at least one of the plurality of lead frames; an optical plate disposed on the light emitting device and converting a wavelength of partial light emitted from the light emitting device; and an adhesive member bonded to a top surface of the body and an outer side of a bottom surface of the optical plate, and the optical plate includes: a phosphor layer; a first transparent film disposed below the phosphor layer and to which light is incident; and a support having an open region in which the phosphor layer is disposed and disposed around the side of the phosphor layer.

In one embodiment, a lighting device includes: a body having a recess; a plurality of lead frames disposed in the recess of the body; a light emitting device having a light emitting chip disposed on at least one of the plurality of lead frames; an optical plate disposed on the light emitting device; and a plate cover disposed on a top surface outer side and a side of the optical plate, wherein the optical plate includes: a phosphor layer; a support disposed in an outer periphery of the phosphor layer; and a first transparent film disposed on the bottom surfaces of the phosphor layer and the support.

In one embodiment, a lighting device includes: a body having a recess; a plurality of lead frames disposed in the recess of the body; a light emitting chip disposed on at least one of the plurality of lead frames; a light emitting device including a molding member in the recess; and an optical plate disposed on the light emitting device and converting a wavelength of partial light emitted from the light emitting device, wherein the optical plate includes: a phosphor layer; a support having an open region in which the phosphor layer is disposed and disposed around the phosphor layer; and a transparent film disposed on the phosphor layer.

In one embodiment, a lighting device includes: a body having a recess; a plurality of lead frames disposed in the recess of the body; a light emitting chip on at least one of the plurality of lead frames; a light emitting device having a molding member in the recess; and an optical plate disposed on the light emitting device, wherein the optical plate includes: a phosphor layer disposed in the recess; a support disposed in an outer periphery of the phosphor layer; and a first transparent film disposed below the phosphor layer and the support, and the first transparent film of the optical plate is disposed between the molding member and the phosphor layer and contacts the molding member.

In one embodiment, an optical plate includes: a phosphor layer; a first transparent film below the phosphor layer; a second transparent film above the phosphor layer; a support surrounding the side of the phosphor layer and disposed between the first and second transparent films; and a semi-transmissive mirror disposed in a partial region of the first transparent film and reflects and transmits incident light, wherein the semi-transmissive mirror is disposed to face a light source, and an area of a lower surface of the semi-transmissive mirror is smaller than an area of a bottom surface of the phosphor layer.

In one embodiment, an optical plate includes: a phosphor layer; a first transparent film disposed below the phosphor layer and to which light is incident; a second transparent film disposed on the phosphor layer and emitting light; and a support having an open region in which the phosphor layer is disposed and disposed around the side of the phosphor layer, wherein the support is disposed at an outer periphery of the first transparent film.

In one embodiment, a light emitting device includes: a body having a recess; a plurality of lead frames disposed in the recess of the body; a light emitting chip on at least one of the plurality of lead frames; a molding member disposed in the recess; and an optical plate spaced apart from the light emitting chip in the recess, wherein the recess includes: a first sidewall inclined adjacent to the lead frame; a second sidewall disposed between the top surface of the body and the first sidewall, the second sidewall of the recess is disposed at the outside of the optical plate, and the optical plate includes a phosphor layer and a transparent film disposed on at least one of the top surface and the bottom surface of the phosphor layer.

In one embodiment, a light emitting device includes: a body having first to fourth side parts and a cavity having an opened upper portion; a first lead frame disposed in a first region of the cavity; a second lead frame disposed in a second region of the cavity; a first light emitting chip disposed on the first lead frame; and a second light emitting chip disposed on the second lead frame, wherein the body includes: first and second side parts disposed on opposite sides; and third and fourth side parts adjacent to the first and second side parts and disposed on opposite sides, the body includes a separation part between the first and second lead frames, the first lead frame includes: a first recess from which the separation part extends; a plurality of first lead parts protruding outward from the third side part of the body; a first extension part in a region between the plurality of first lead parts; and a second recess below the first extension part, and the second lead frame includes: a third recess from which the separation part extends; a plurality of second lead parts protruding outward from the fourth side part of the body; a second extension part in a region between the plurality of second lead parts; and a fourth recess below the second extension part.

In one embodiment, a light source module includes: a circuit board; a light emitting chip disposed on the circuit board; a reflective member disposed around the light emitting chip; and an optical plate disposed on the light emitting chip and supported by the reflective member, wherein the optical plate includes: a phosphor layer disposed on the light emitting chip; a support disposed at the outer periphery of the phosphor layer; a first transparent film disposed below the phosphor layer and the support; and a second transparent film disposed above the phosphor layer and the support.

In one embodiment, a light emitting device includes: a plurality of light emitting chips including a first light emitting chip and a second light emitting chip emitting first light and second light having different peak wavelengths; and a phosphor layer disposed on the second light emitting chip and exciting a part of a peak wavelength of the second light and emitting a peak wavelength of third light, wherein the phosphor layer is disposed on a region different from the first light emitting chip, the first light and the second light include light of the same color, and the second light include a longer wavelength than the first light.

In one embodiment, a light emitting device includes: a plurality of light emitting chips having different peak wavelengths of light of the same color; a first molding member disposed on a first light emitting chip emitting first light of a relative short wavelength among the plurality of light emitting chips and emitting the first light without wavelength conversion; a phosphor layer disposed on a second light emitting chip emitting second light of a relatively long wavelength among the plurality of light emitting chips, wherein the plurality of light emitting chips are separated from one another.

In one embodiment, a light source module includes: a circuit board and a lighting device on the circuit board.

Advantageous Effects

An embodiment may extend a life of a phosphor by spacing an optical plate apart from a light emitting chip.

An embodiment may wavelength-converts and diffuses incident light by an optical plate.

An embodiment may block a resin leaking out through a region between a light emitting device and an optical plate, thereby preventing the optical plate from being lifted and reducing optical loss.

An embodiment may block light leaking out through a region between a light emitting device and an optical plate, thereby improving extraction efficiency of light emitted through the optical plate.

An embodiment may prevent hot spot by arranging a semi-transmissive mirror in a region in which an amount of light incident from a light emitting chip is large among regions of an optical plate.

An embodiment may miniaturize a lighting device such as white color by arranging an optical plate to be spaced apart from a light source in a recess of a light emitting device.

An embodiment may improve reliability of a light emitting device and a lighting device including the same.

An embodiment may improve reliability of a lighting device in which a light emitting device is arranged.

An embodiment may increase a cavity size of a light emitting device, thereby reducing optical density.

An embodiment may increase a size of a light emitting chip in a light emitting device.

An embodiment may improve a life and efficiency of a molding member on a light emitting chip.

An embodiment may improve a life of a light emitting device.

An embodiment may improve reliability of a light emitting device.

An embodiment may improve a life of a phosphor layer and a light emitting chip emitting different peak wavelengths.

An embodiment may arrange a phosphor layer on a light emitting chip emitting a relatively long wavelength among light emitting chips emitting different peak wavelengths, thereby improving color reproducibility with light emitted through a light emitting chip of a relatively short wavelength.

An embodiment may improve a life of a light emitting chip providing an excitation wavelength to a phosphor layer having a quantum dot, and a light emitting device including the same.

An embodiment may improve reliability of a light-emitting module having a light emitting device and a light unit.

Figure 9:
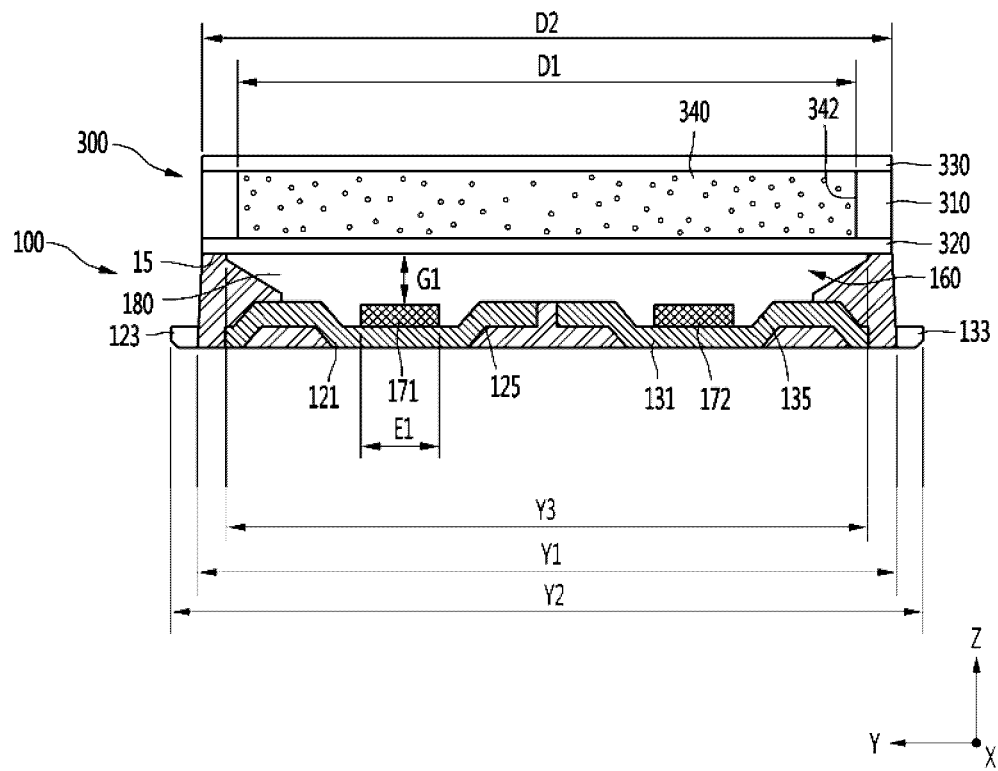
FIG. 9 is a view for describing the lighting device of FIG. 8.
Figure 12:
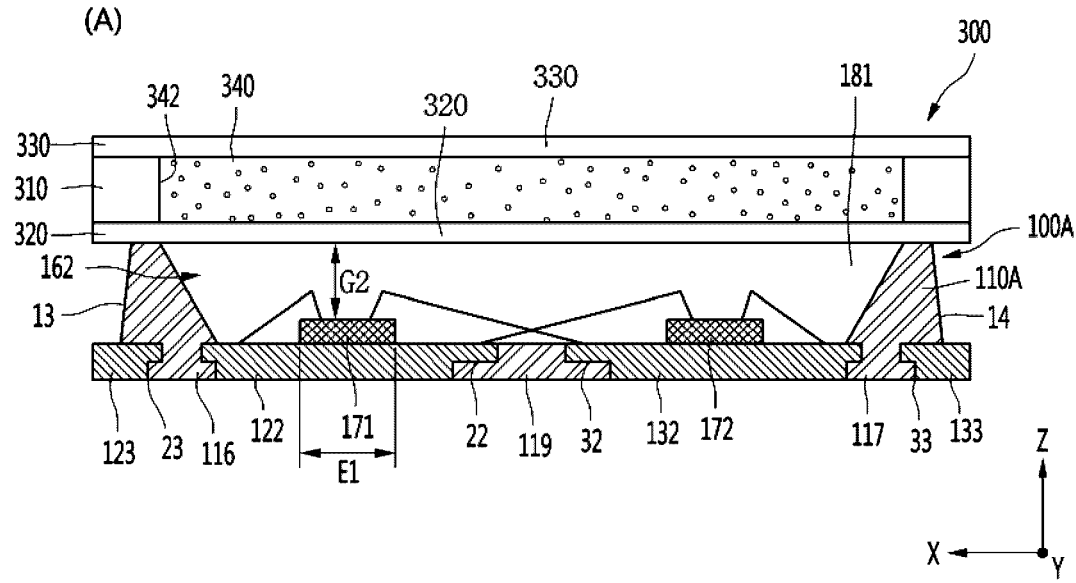
Figure 12:
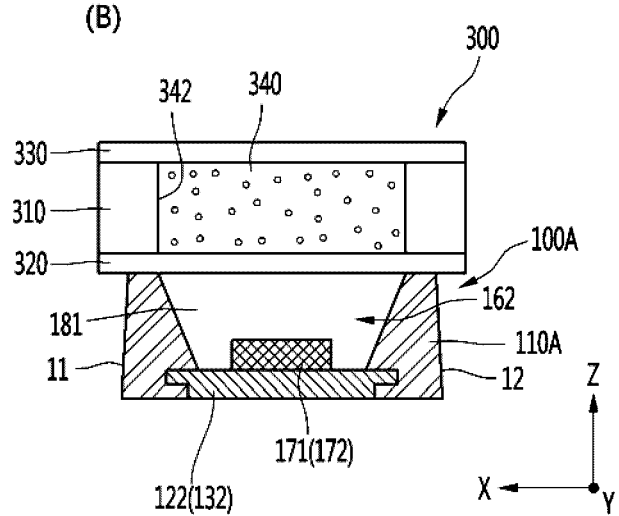

(A) and (B) of FIG. 12 are cross-sectional views of another example of the lighting device of FIG. 9 in a Y-axis direction and an X-axis direction.

Figure 13:
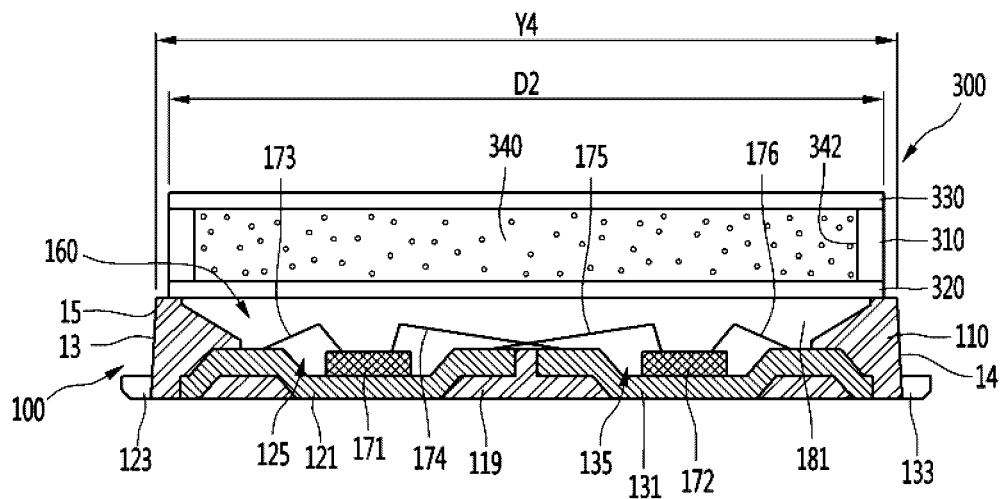

FIG. 13 illustrates a modification example of a lighting device according to an embodiment.

Figure 11:
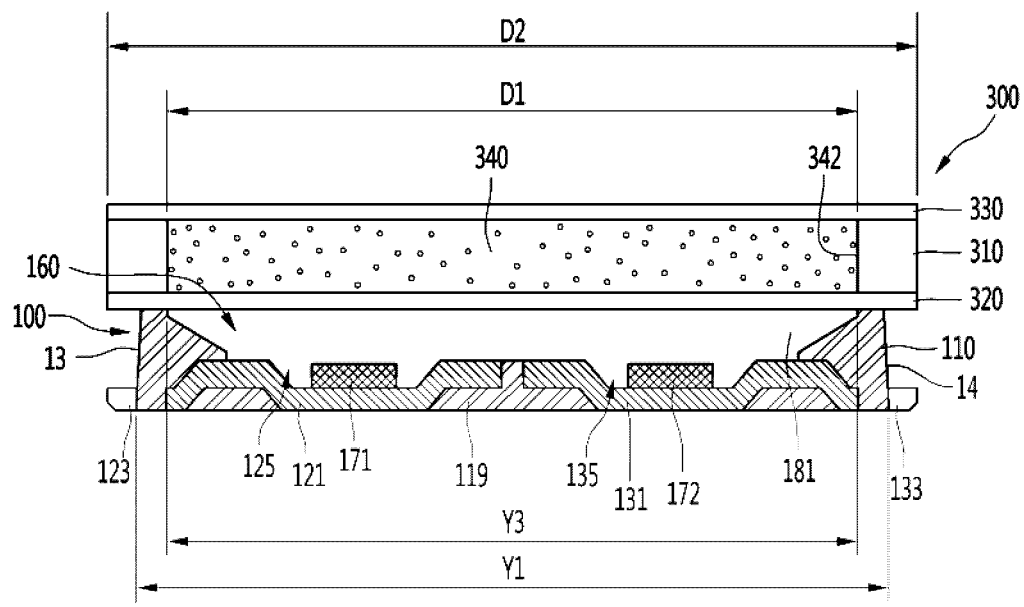
FIG. 11 illustrates another example of the optical plate in the lighting device of FIG. 8.
Figure 14:
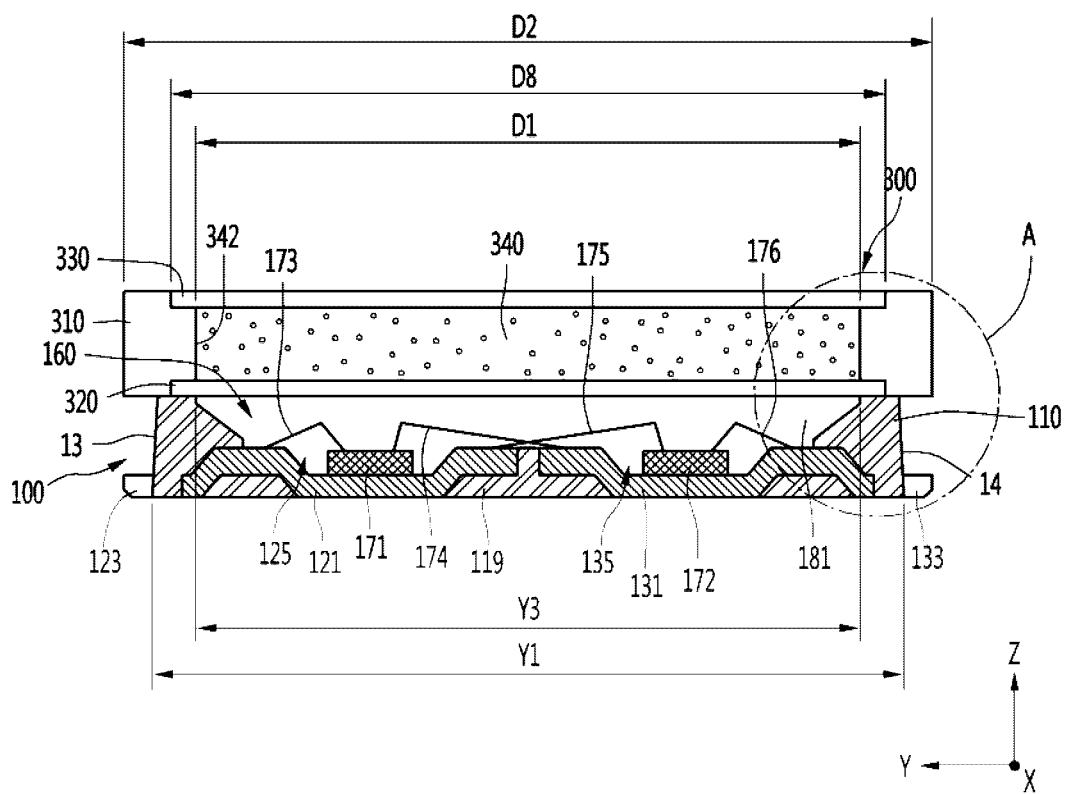

FIG. 14 illustrates another example of the optical plate in the lighting device of FIG. 11.

Figure 15:
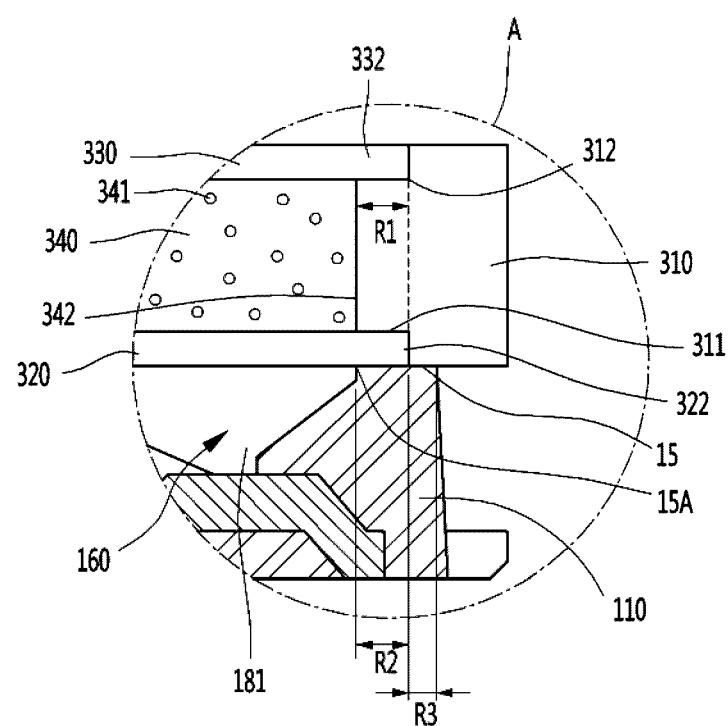

FIG. 15 is an enlarged view of a portion A of FIG. 14.

Figure 16:
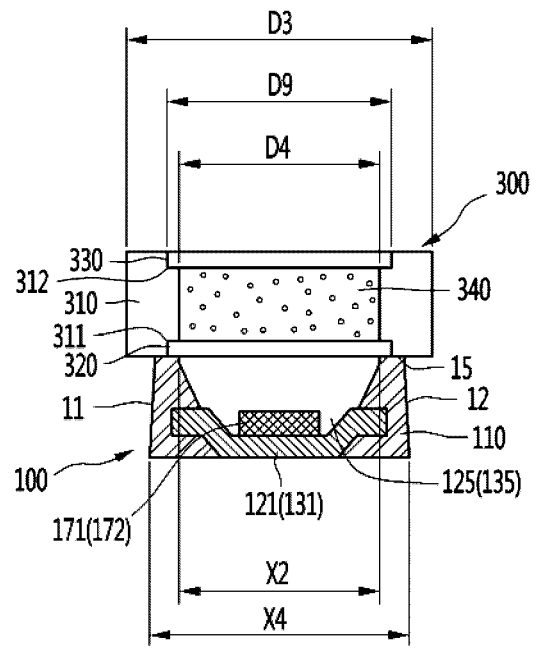

FIG. 16 is another side cross-sectional view of the lighting device of FIG. 14.

Figure 17:
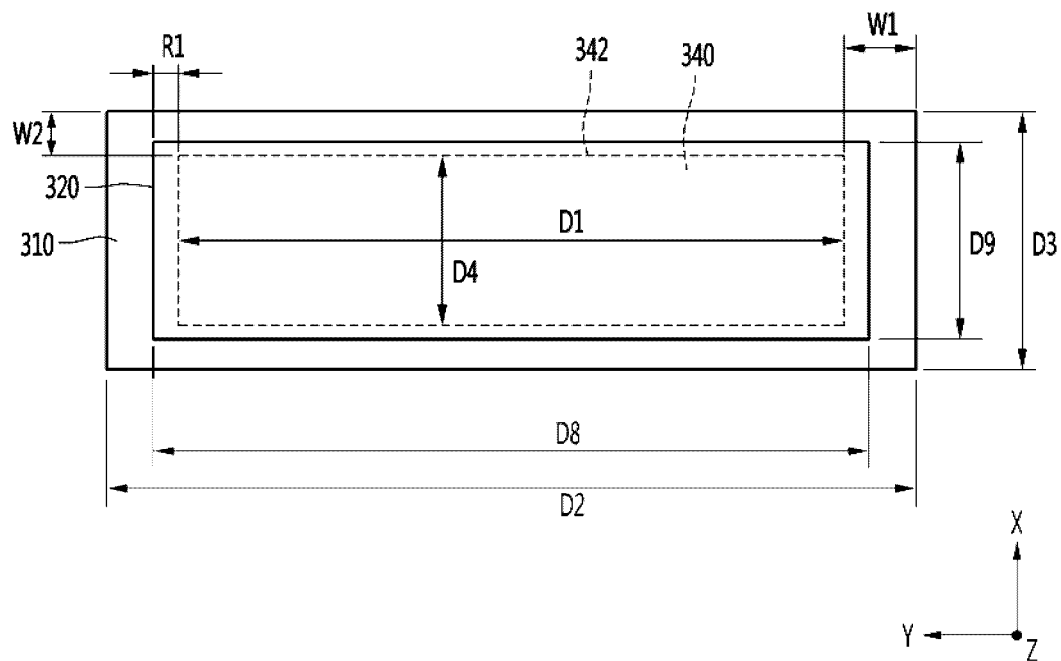

FIG. 17 is a perspective view of the optical plate of FIG. 14.

Figure 18:
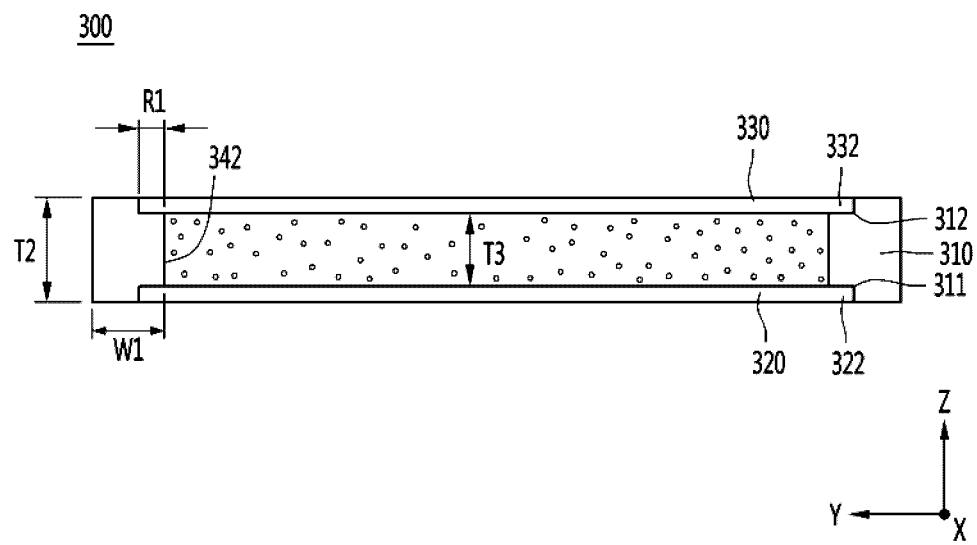

FIG. 18 is a side cross-sectional view of the optical plate of FIG. 16.

Figure 19:
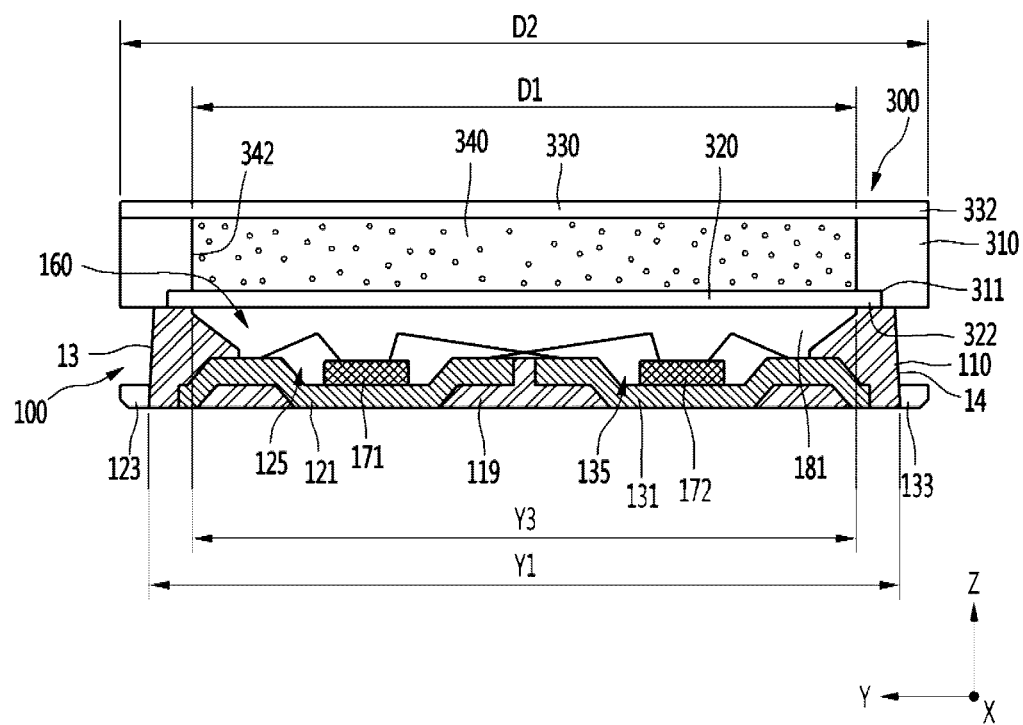

FIG. 19 is a view illustrating a first modification example of the optical plate of FIG. 14.

Figure 20:
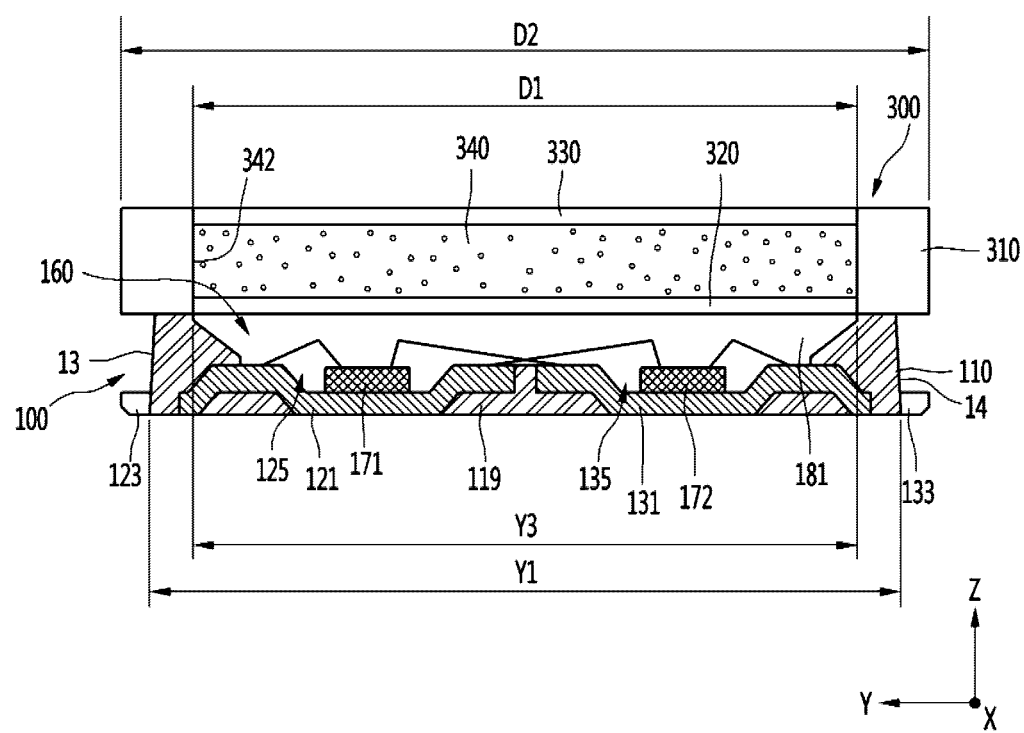

FIG. 20 is a view illustrating a second modification example of the optical plate of FIG. 14.

Figure 21:
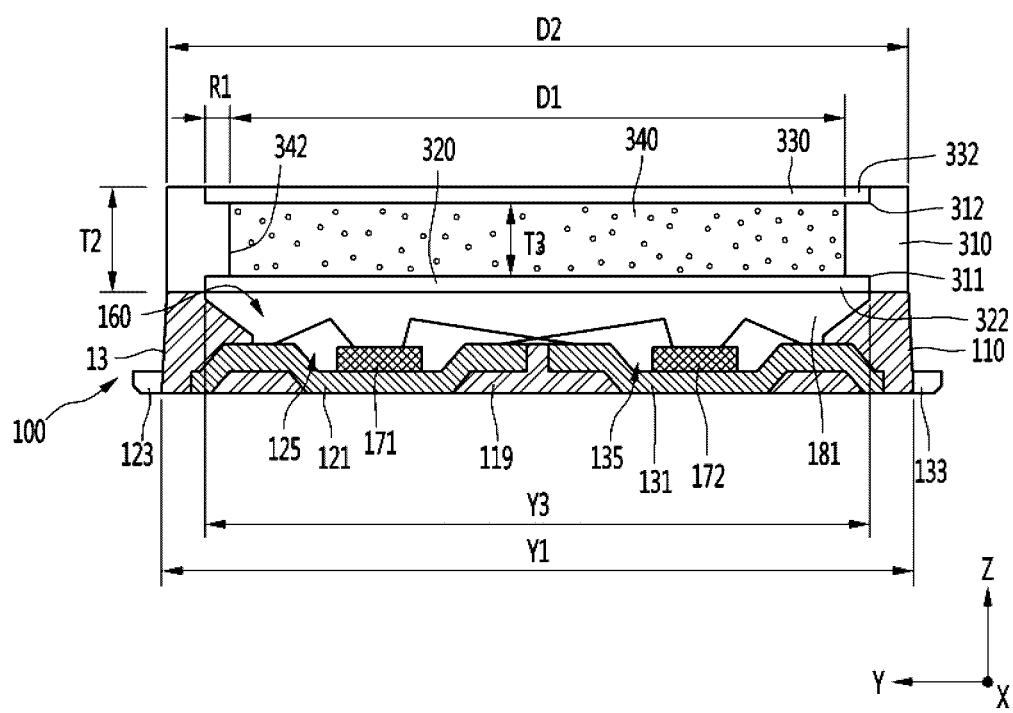

FIG. 21 is a view illustrating a third modification example of the optical plate of FIG. 14.

Figure 22:
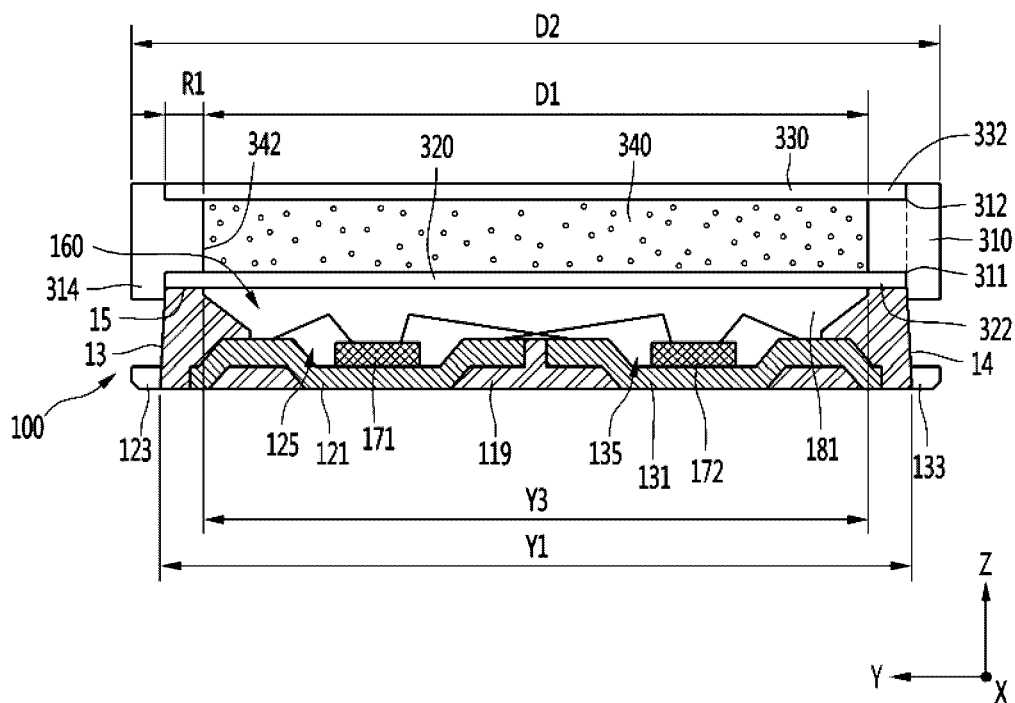

FIG. 22 is a view illustrating a fourth modification example of the optical plate of FIG. 14.

Figure 23:
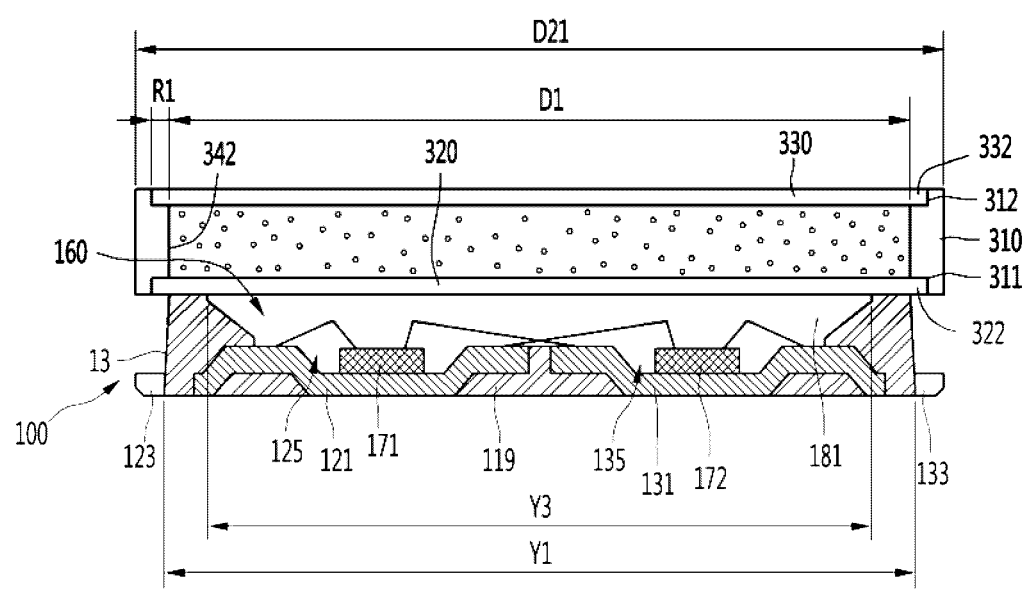

FIG. 23 is a view illustrating a fifth modification example of the optical plate of FIG. 14.

Figure 24:
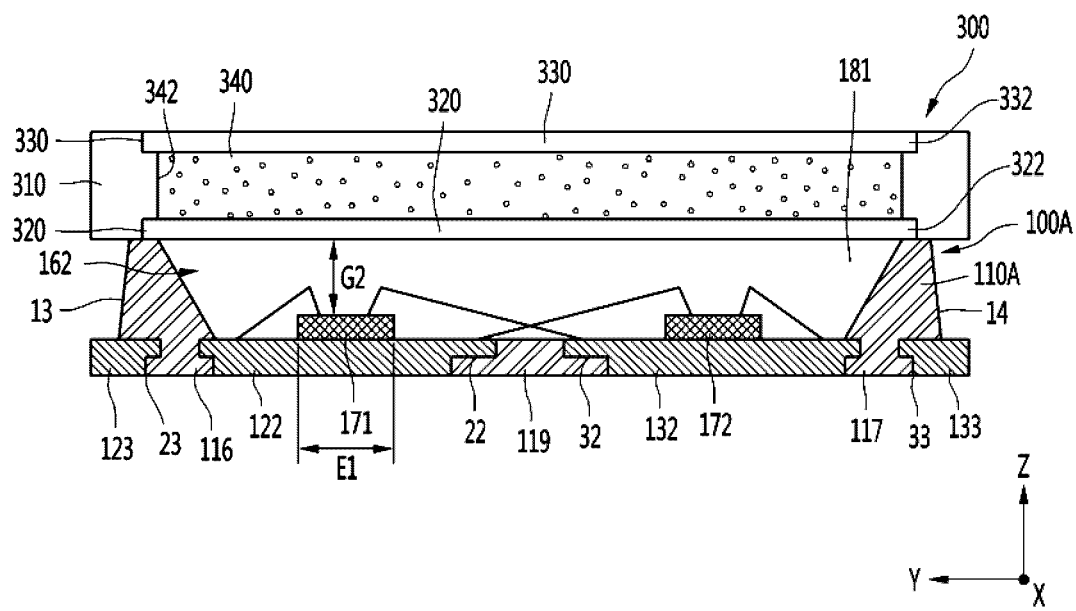

FIG. 24 illustrates a modification example of the lighting device of FIG. 14.

Figure 25:
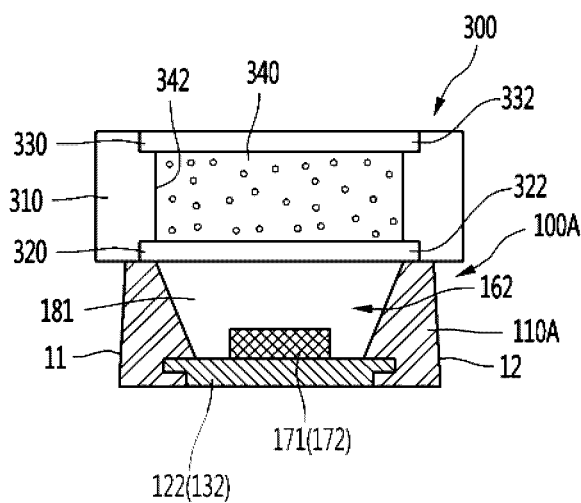

FIG. 25 is another side cross-sectional view of the lighting device of FIG. 24.

Figure 26:
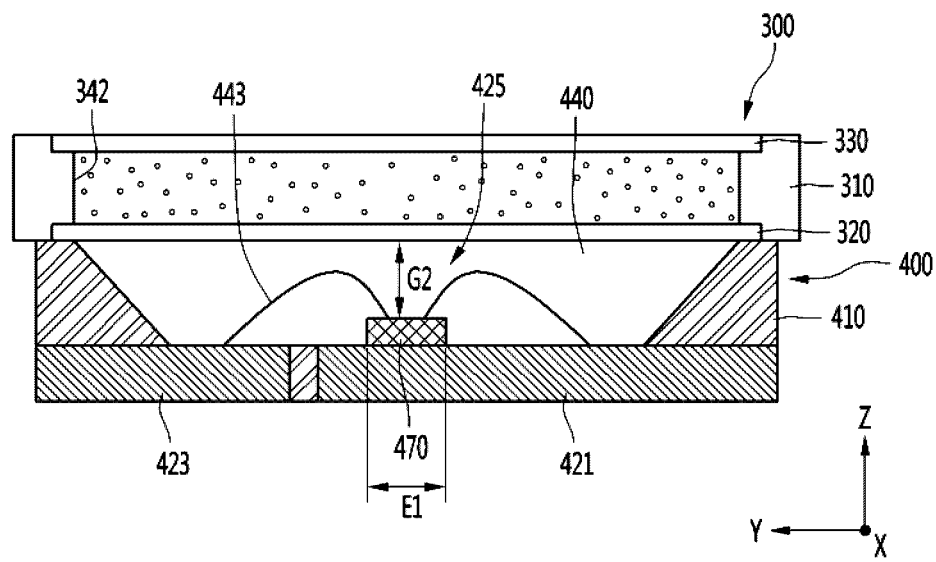

FIG. 26 illustrates a modification example of the lighting device of FIG. 14.

Figure 27:
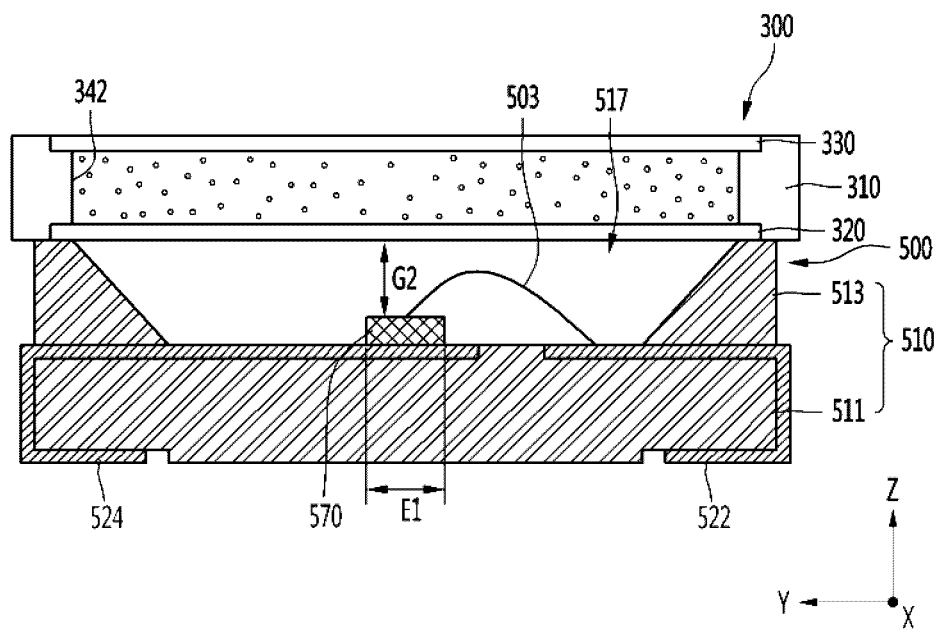

FIG. 27 illustrates a modification example of the lighting device of FIG. 14.

FIGS. 28 to 31 illustrate a process of manufacturing the optical plate of FIG. 14.

Figure 8:
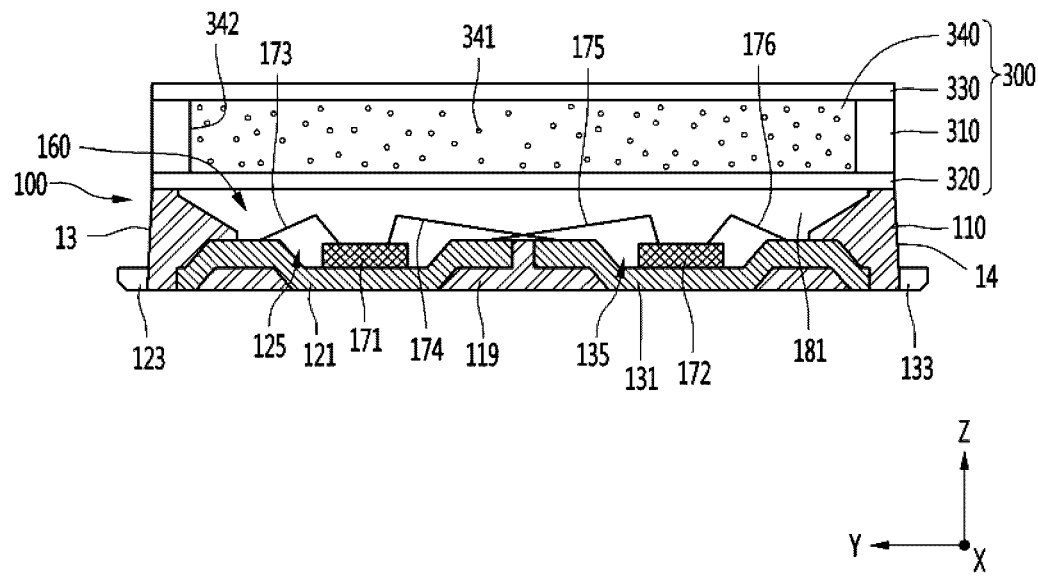
FIG. 8 is an A-A cross-sectional view of the lighting device of FIG. 7.
Figure 32:
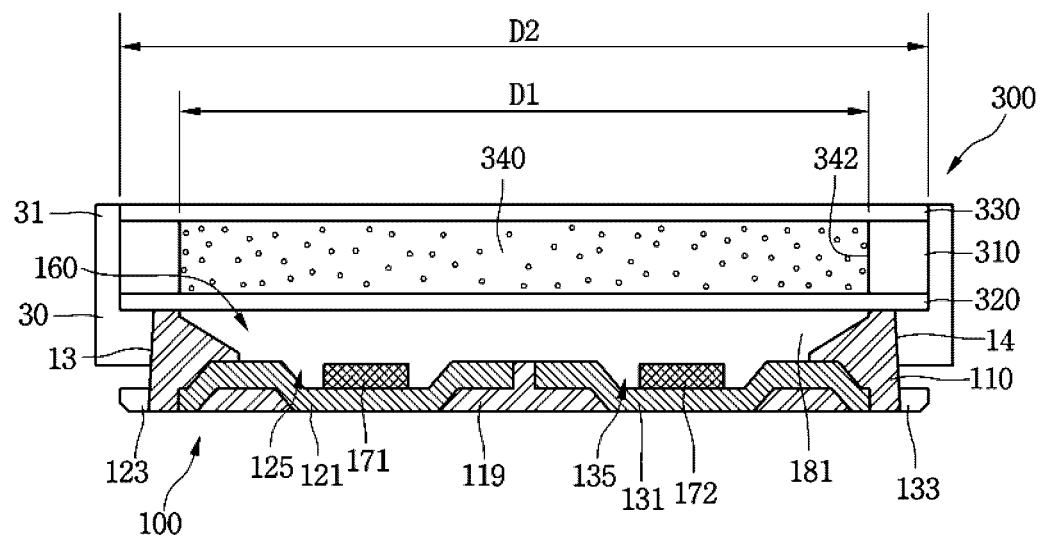

FIG. 32 is a side cross-sectional view illustrating a modification example of the lighting device of FIG. 8.

Figure 33:
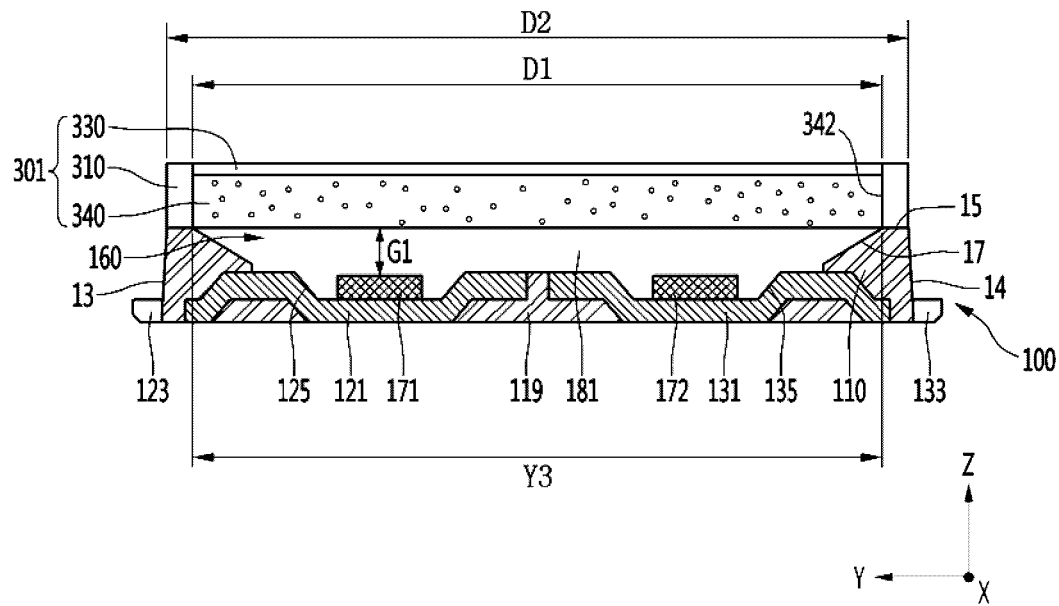

FIG. 33 is a cross-sectional view illustrating another example of the optical plate in the lighting device of FIG. 9.

Figure 34:
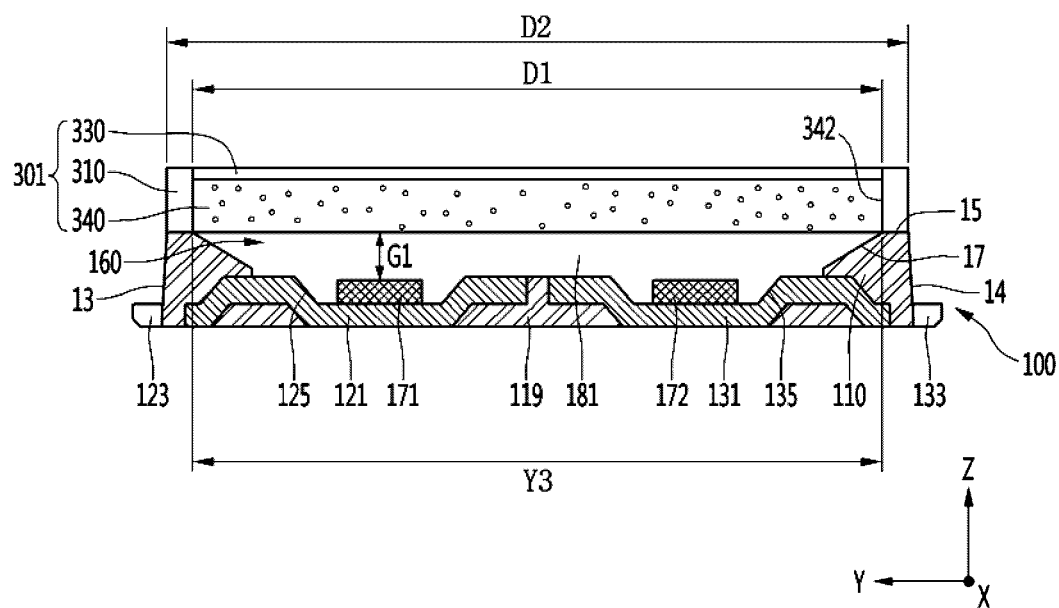

FIG. 34 is another side cross-sectional view of the lighting device of FIG. 33.

Figure 35:
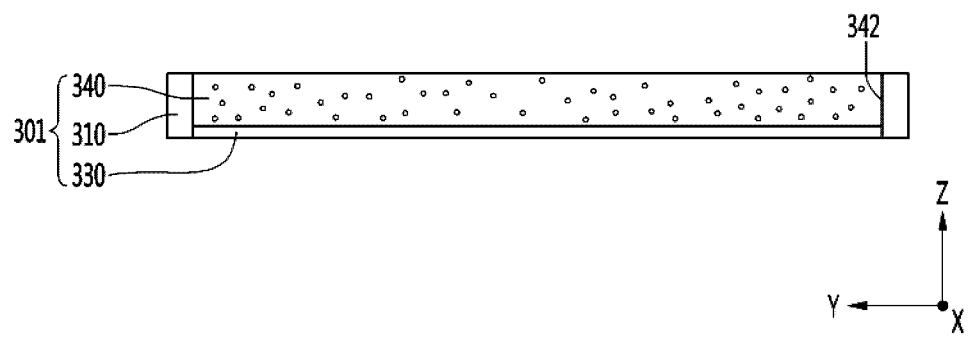
Figure 36:
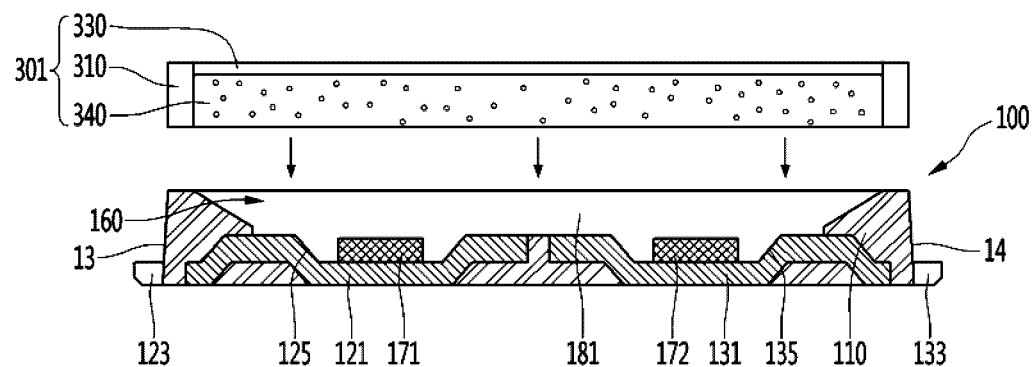
Figure 37:
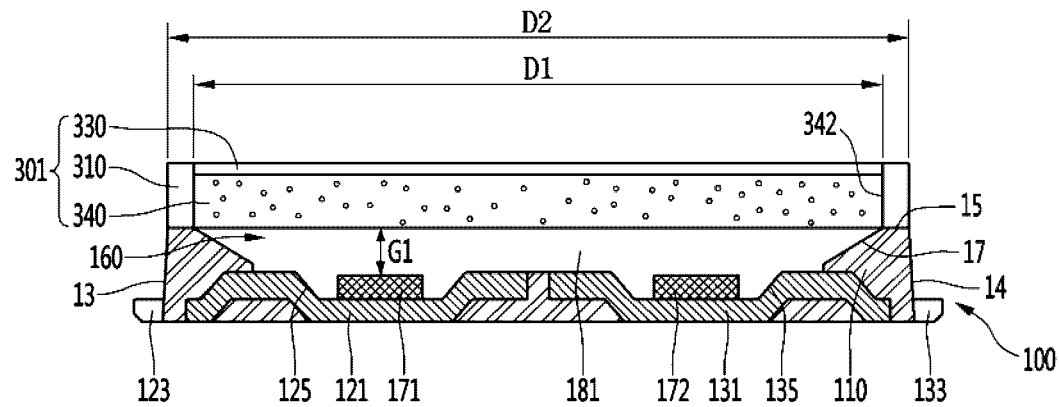

FIGS. 35 to 37 are views illustrating a process of manufacturing a lighting device according to an embodiment.

Figure 38:
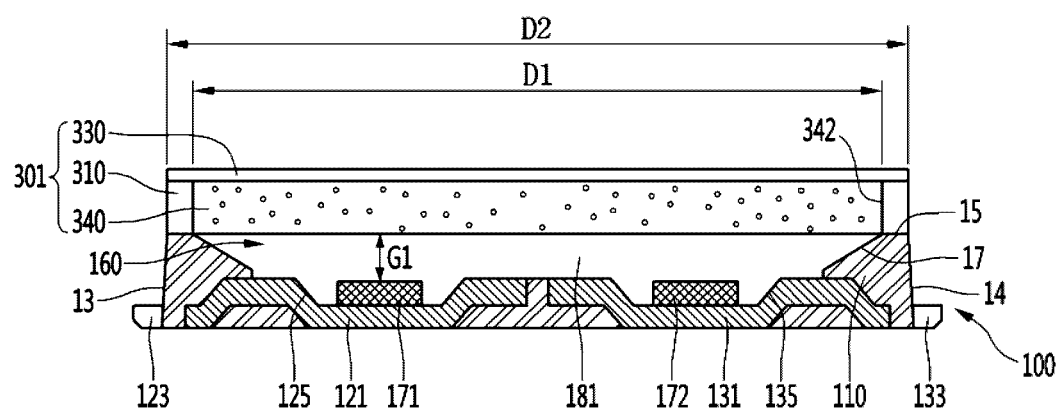

FIG. 38 illustrates a modification example of the lighting device of FIG. 33.

Figure 39:
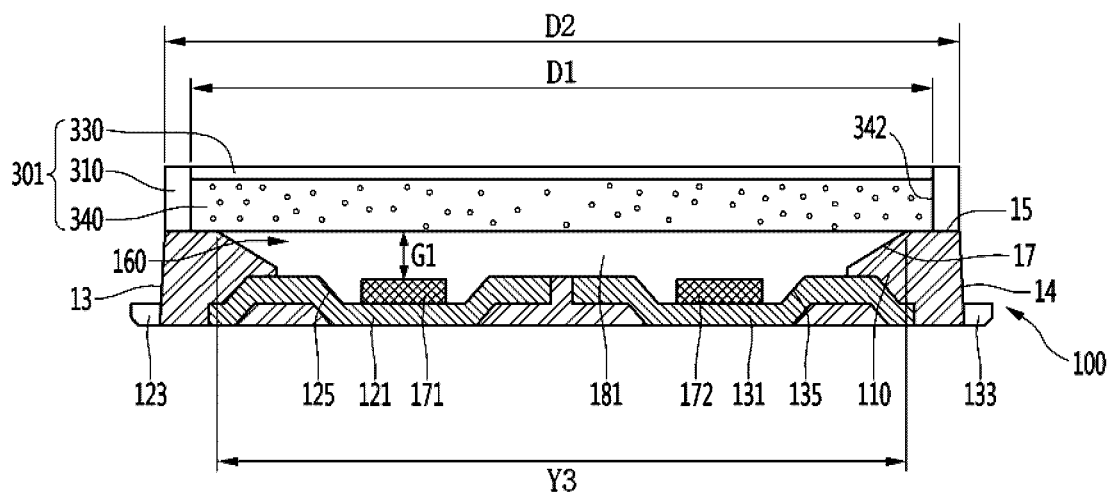

FIG. 39 illustrates a modification example of the lighting device of FIG. 33.

Figure 40:
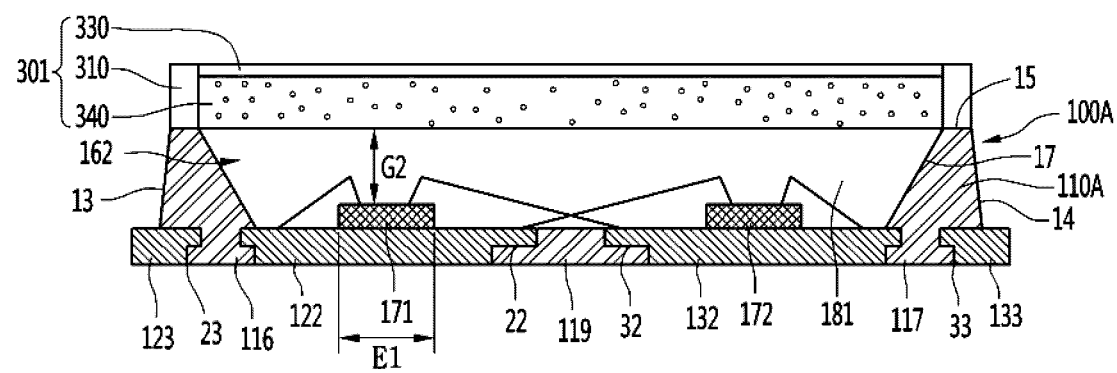

FIG. 40 illustrates a modification example of a lighting device including a light emitting device of FIG. 24.

Figure 41:
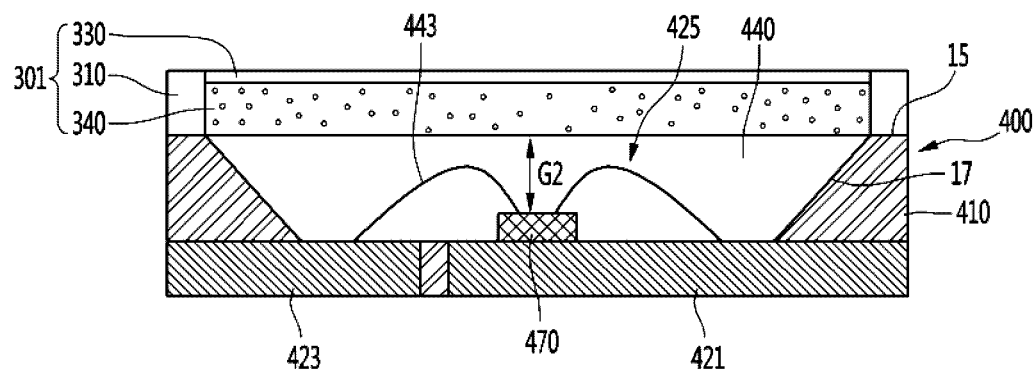

FIG. 41 illustrates a modification example of a lighting device including a light emitting device of FIG. 25.

Figure 42:
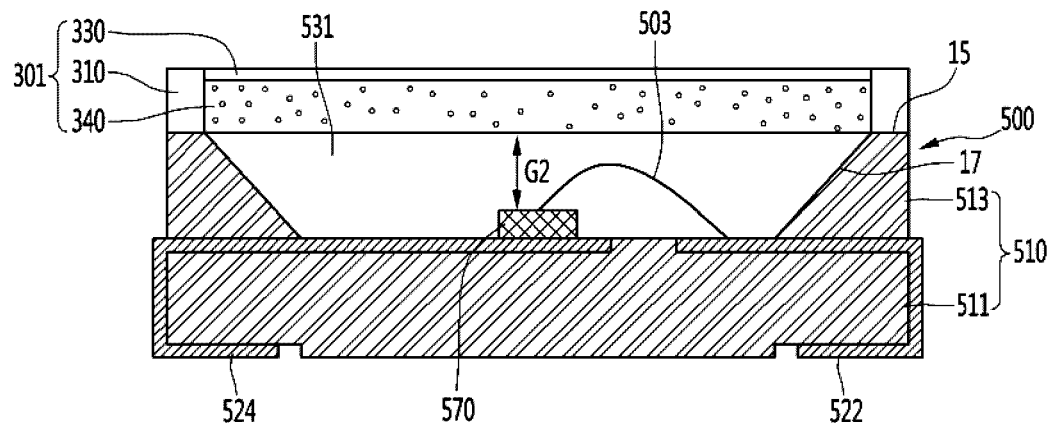

FIG. 42 illustrates a modification example of a lighting device including a light emitting device of FIG. 26.

Figure 43:
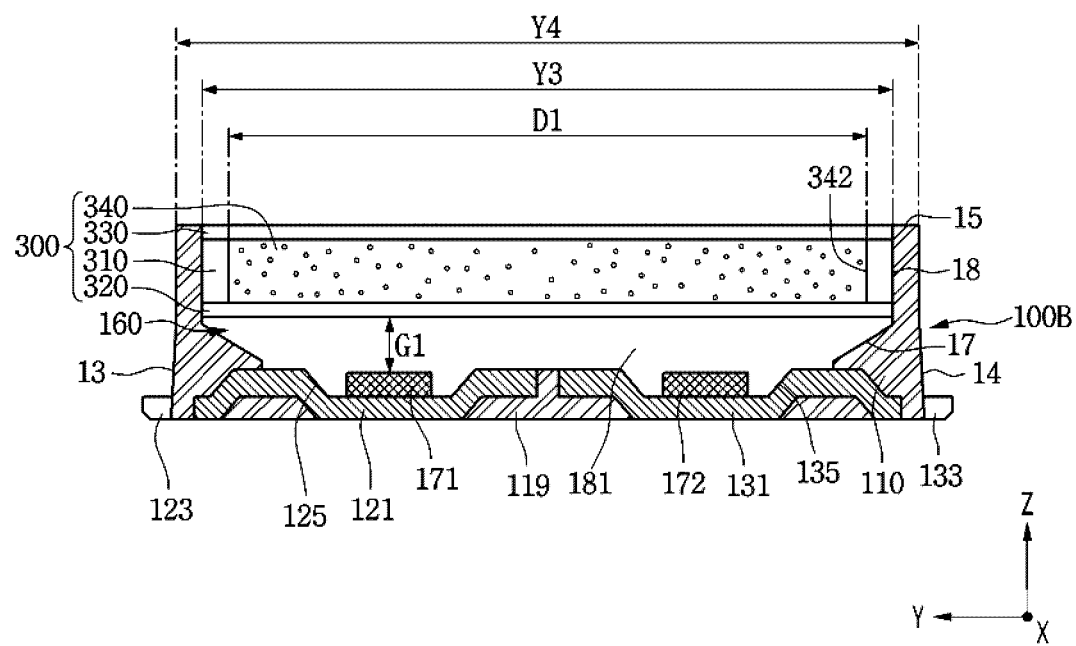

FIG. 43 is a side cross-sectional view illustrating a light emitting device including an optical plate according to a second embodiment.

Figure 44:
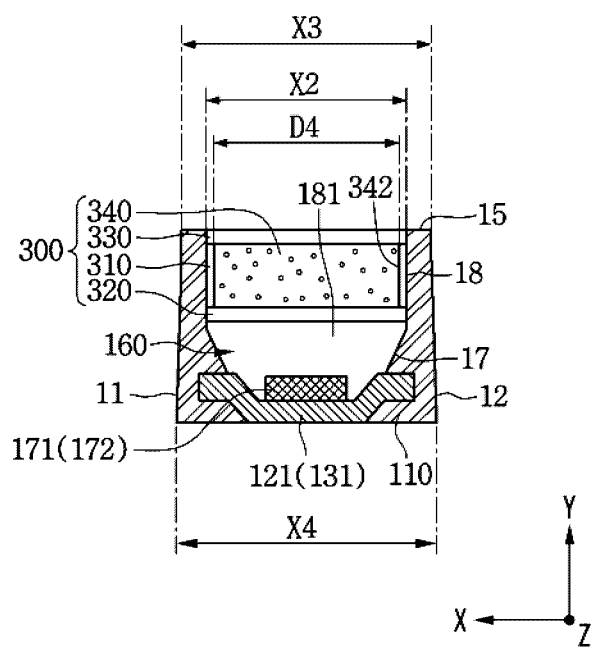

FIG. 44 is another side cross-sectional view of the light emitting device of FIG. 43.

Figure 45:
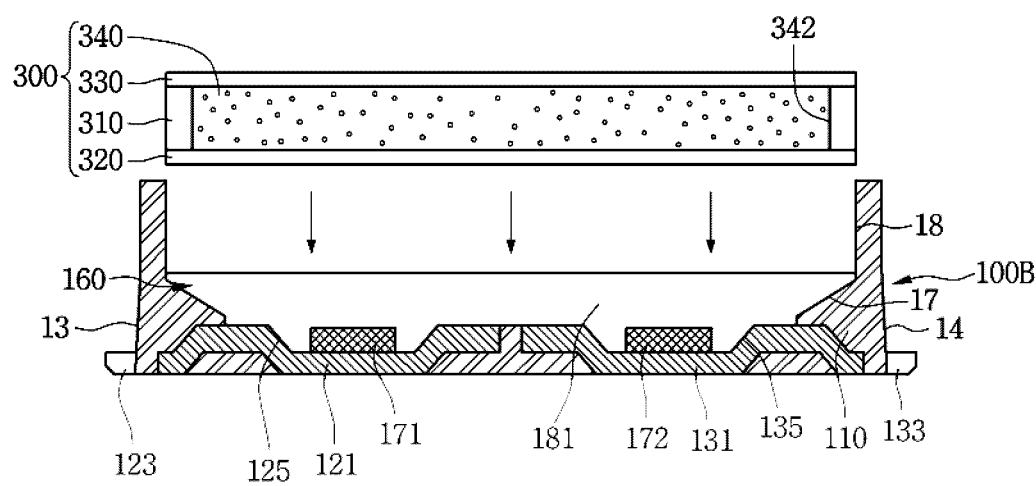
Figure 46:
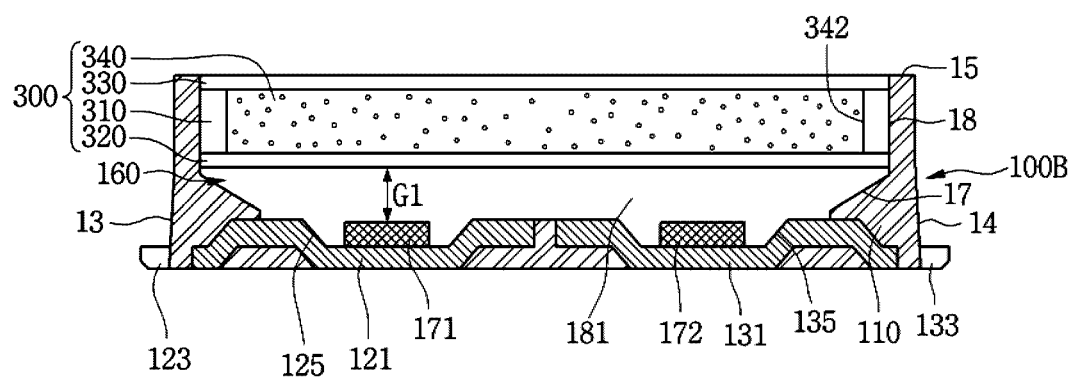

FIGS. 45 and 46 illustrate a process of assembling the optical plate to the light emitting device of FIG. 43.

Figure 47:
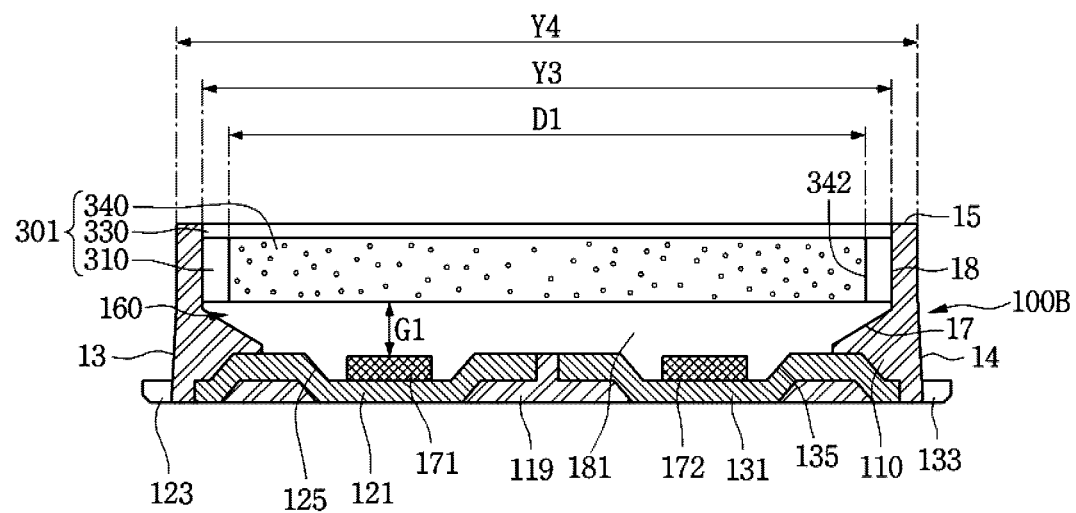

FIG. 47 illustrates a first modification example of the optical plate in the light emitting device of FIG. 43.

Figure 48:
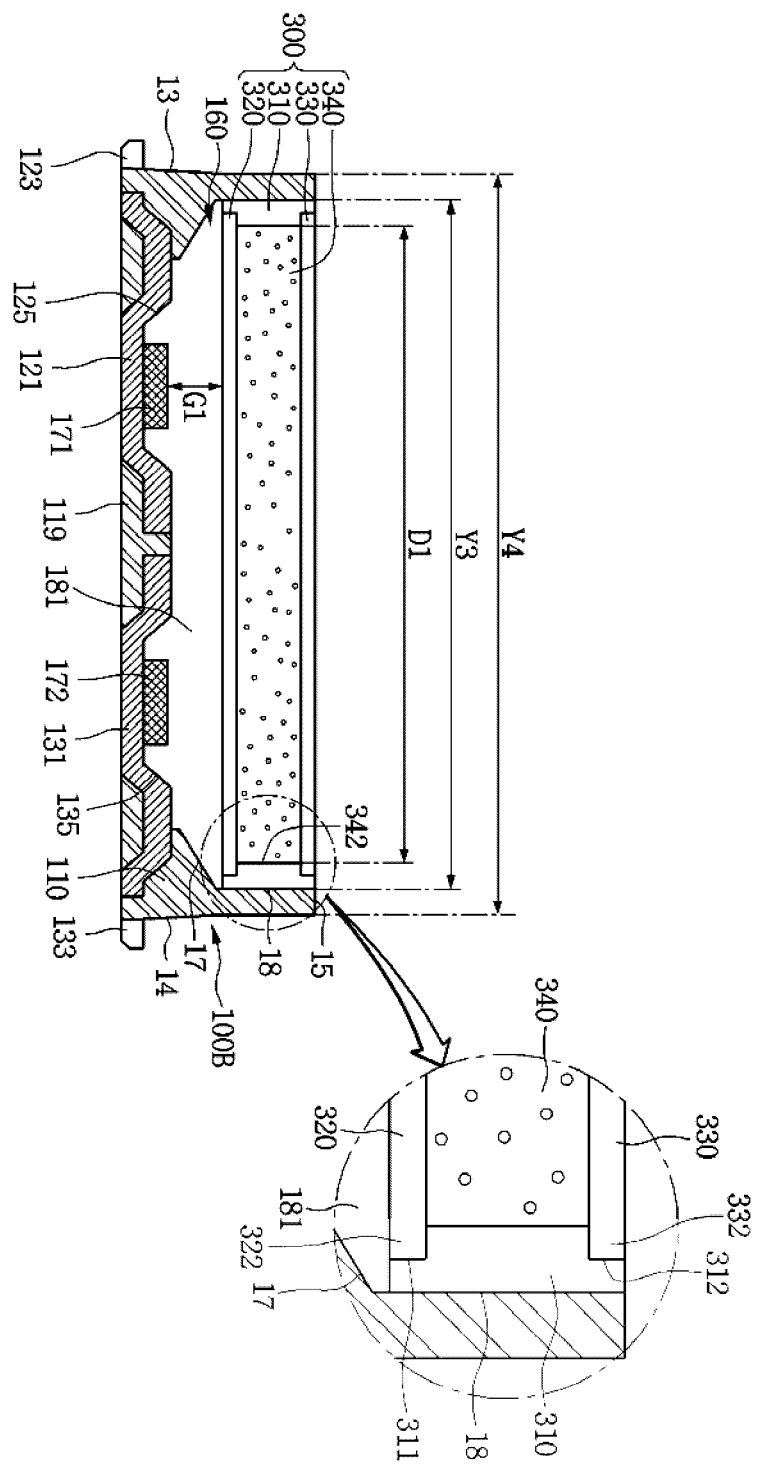

FIG. 48 illustrates a second modification example of the optical plate in the light emitting device of FIG. 43.

Figure 49:
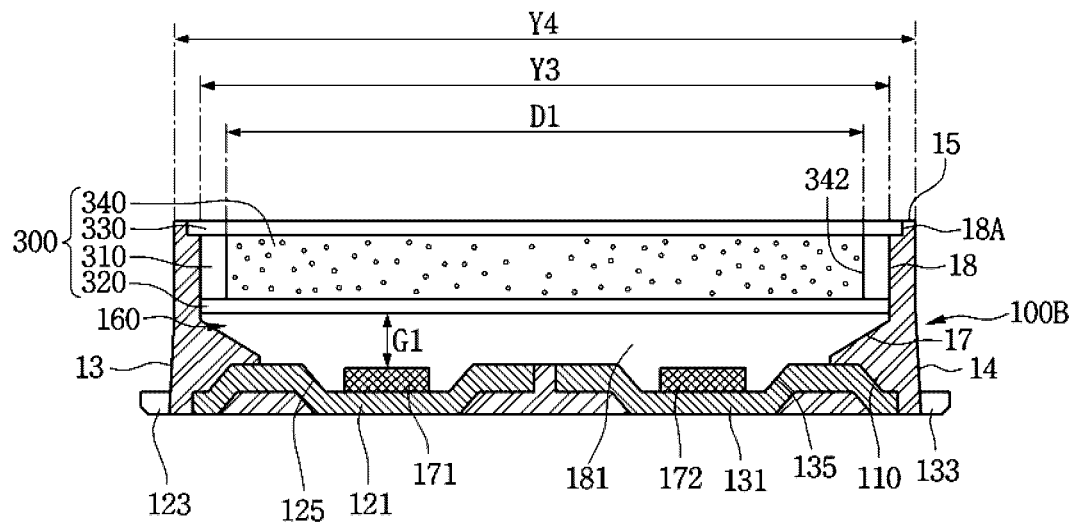

FIG. 49 illustrates a third modification example of the optical plate in the light emitting device of FIG. 43.

Figure 50:
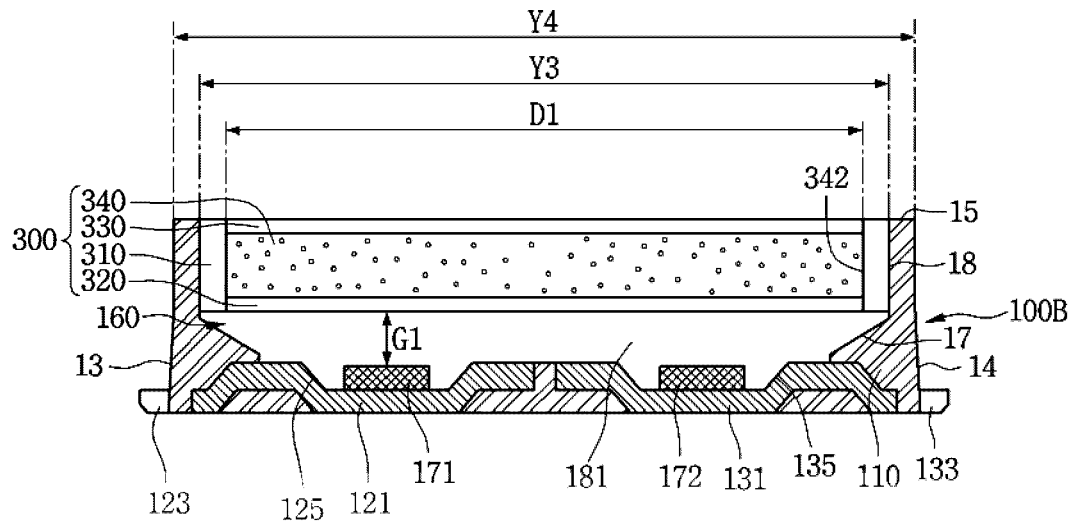

FIG. 50 illustrates a fourth modification example of the optical plate in the light emitting device of FIG. 43.

Figure 51:
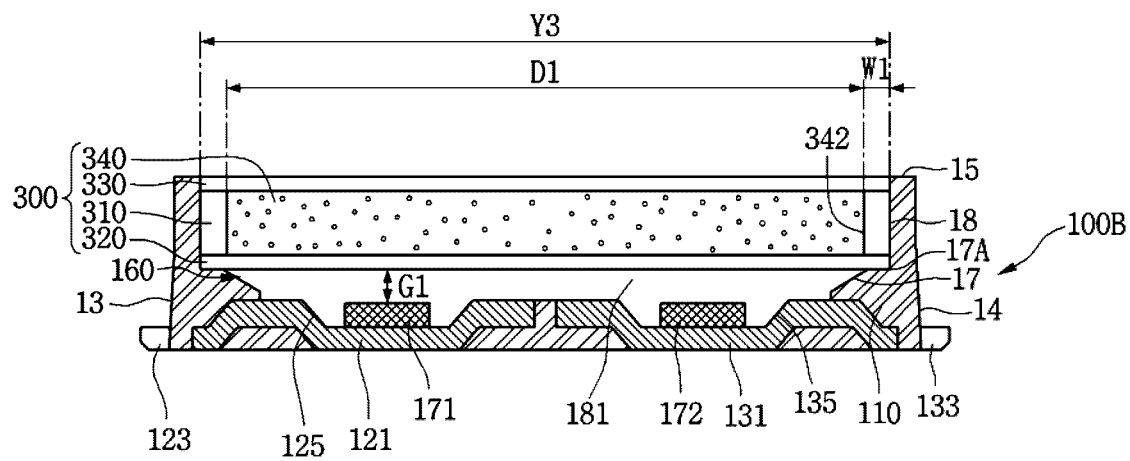

FIG. 51 illustrates a fifth modification example of the optical plate in the light emitting device of FIG. 43.

Figure 52:
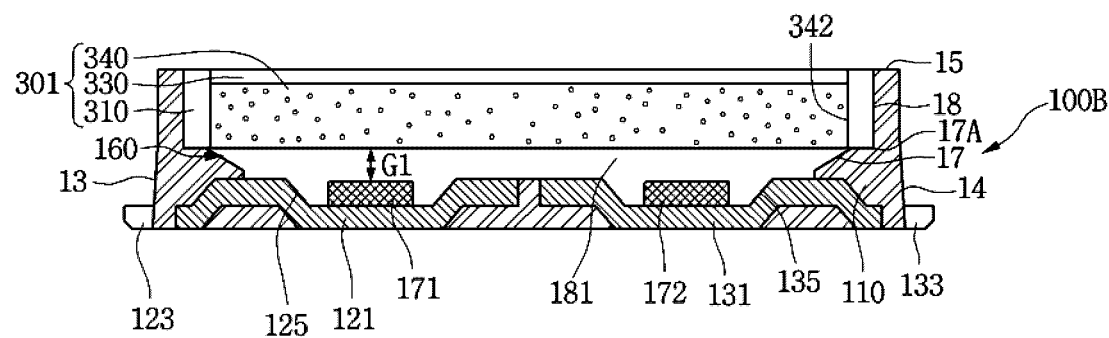

FIG. 52 illustrates a sixth modification example of the optical plate in the light emitting device of FIG. 43.

Figure 53:
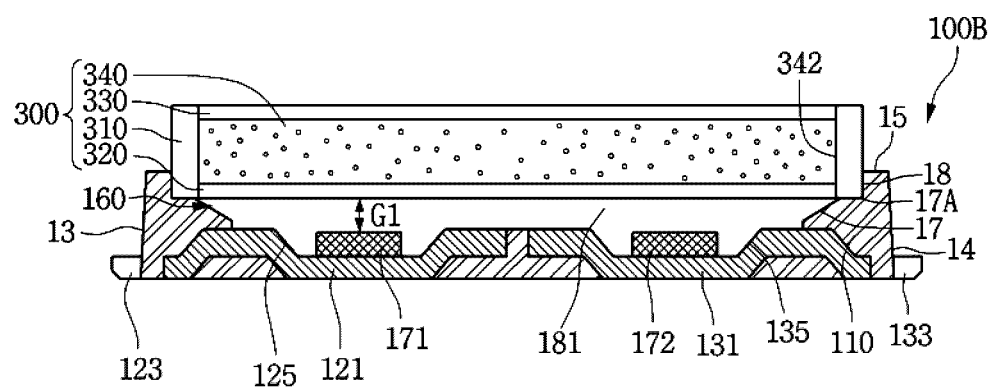

FIG. 53 illustrates a seventh modification example of the optical plate in the light emitting device of FIG. 43.

Figure 54:
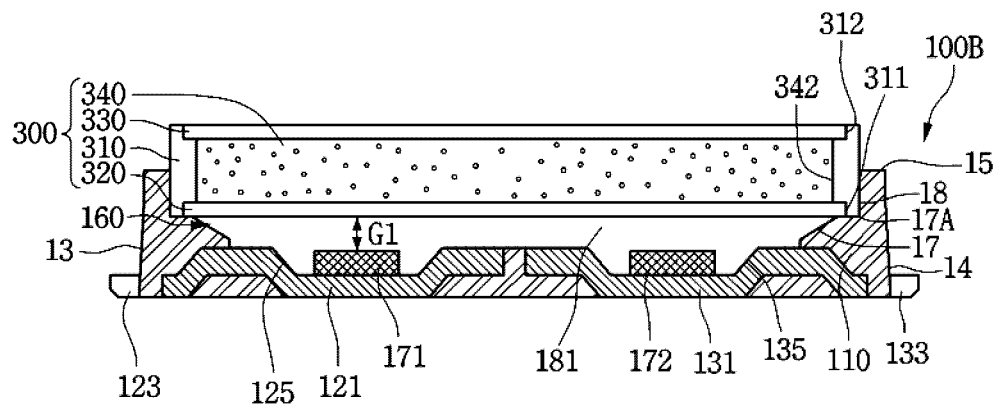

FIG. 54 illustrates an eighth modification example of the optical plate in the light emitting device of FIG. 43.

Figure 55:
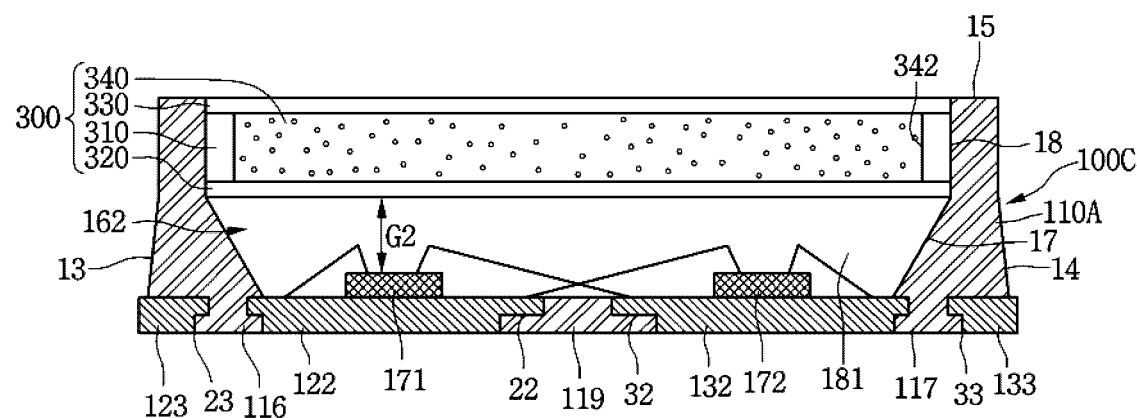

FIG. 55 is a side cross-sectional view of a light emitting device including an optical plate according to a modification example of the second embodiment.

Figure 56:
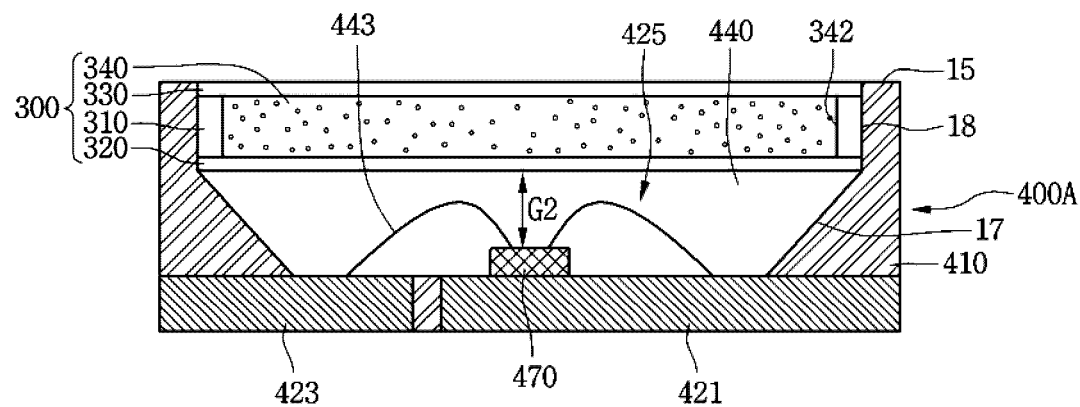

FIG. 56 is a side cross-sectional view of a light emitting device including an optical plate according to a modification example of the second embodiment.

Figure 57:
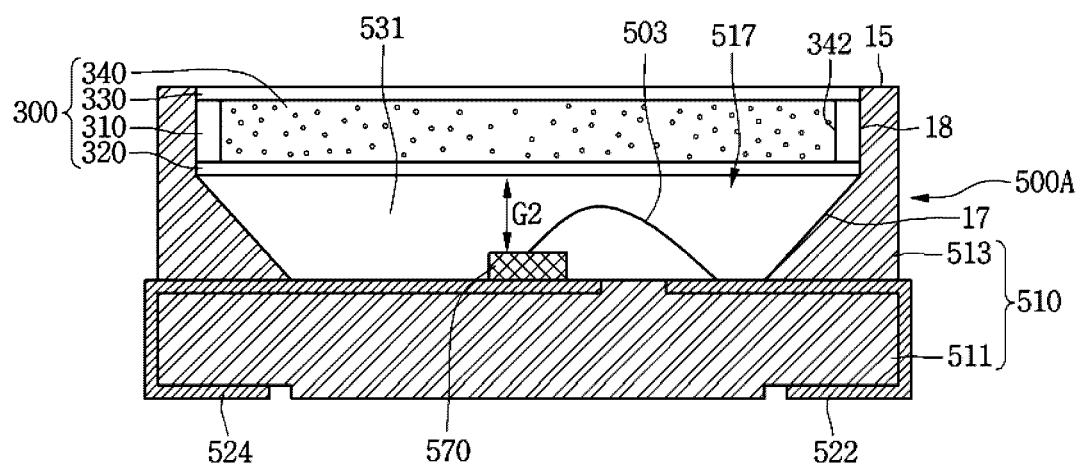

FIG. 57 is a side cross-sectional view of a light emitting device including an optical plate according to a modification example of the second embodiment.

Figure 58:
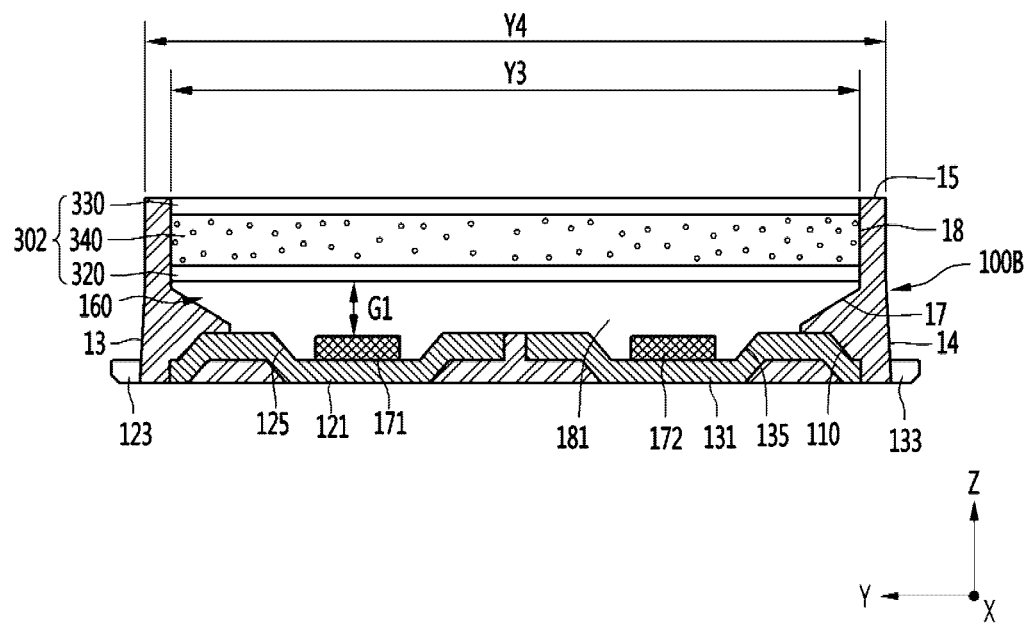

FIG. 58 is a side cross-sectional view illustrating a light emitting device including an optical plate according to a third embodiment.

Figure 59:
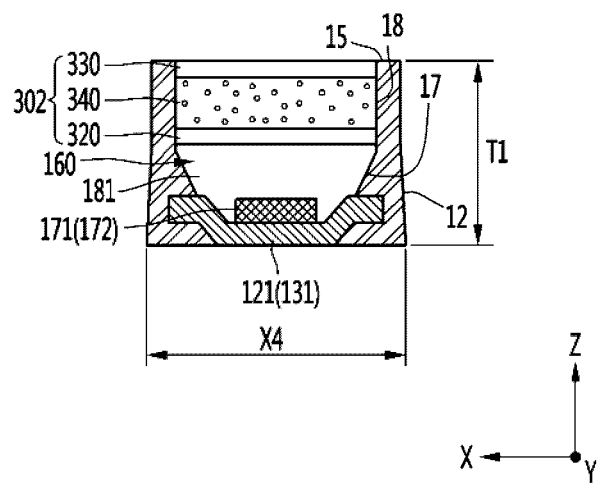

FIG. 59 is another side cross-sectional view of the light emitting device of FIG. 58.

Figure 60:
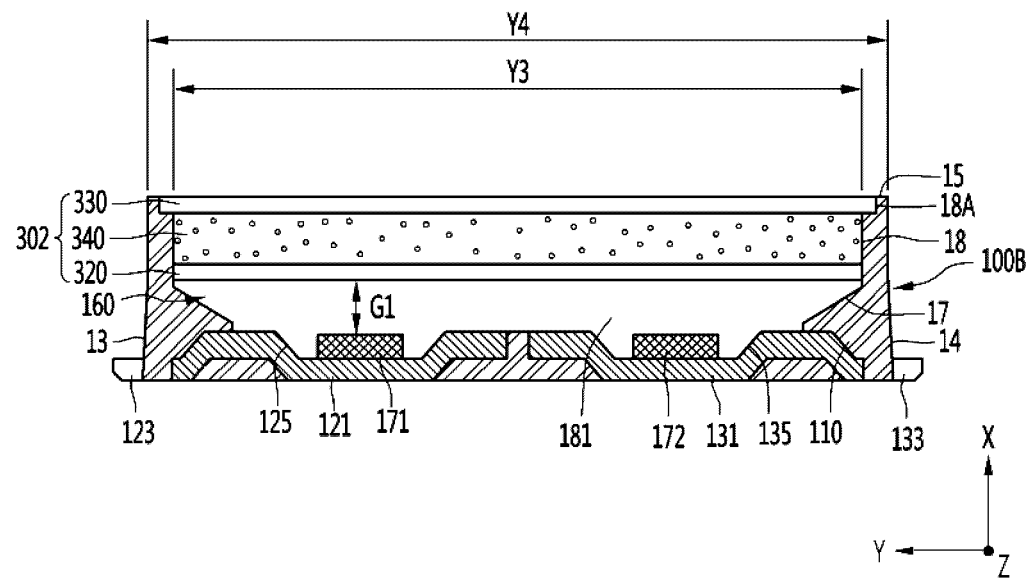

FIG. 60 illustrates a first modification example of an optical plate in the light emitting device of FIG. 58.

Figure 61:
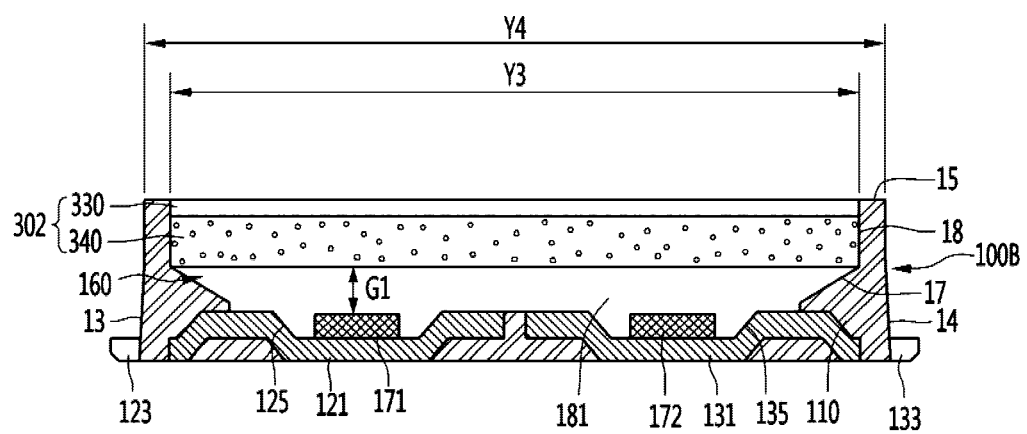

FIG. 61 illustrates a second modification example of an optical plate in the light emitting device of FIG. 58.

Figure 62:
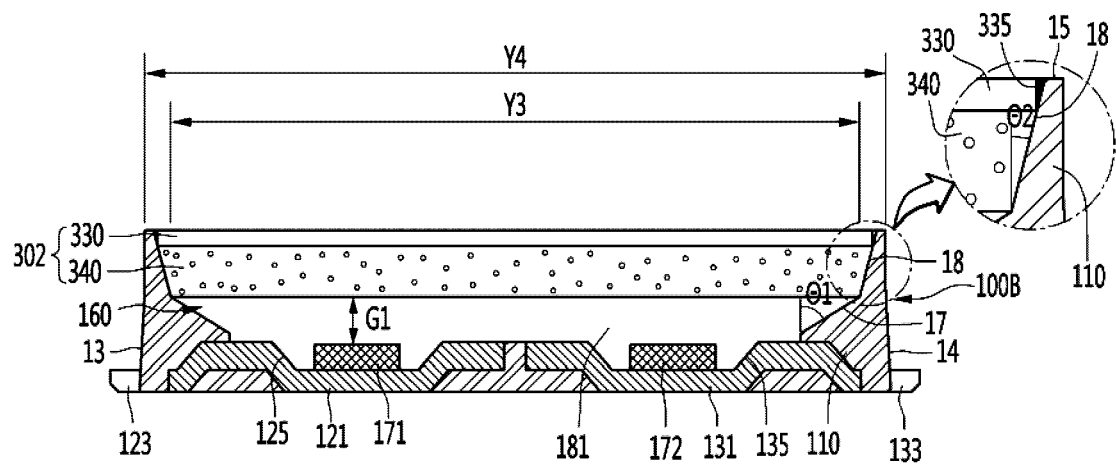

FIG. 62 illustrates a third modification example of the optical plate in the light emitting device of FIG. 58.

Figure 63:
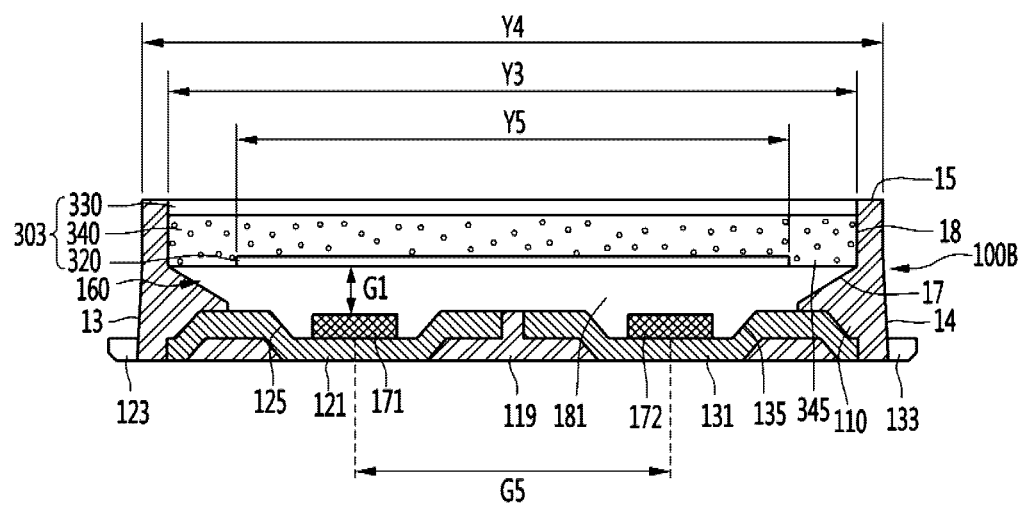

FIG. 63 illustrates a fourth modification example of the optical plate in the light emitting device of FIG. 58.

Figure 64:
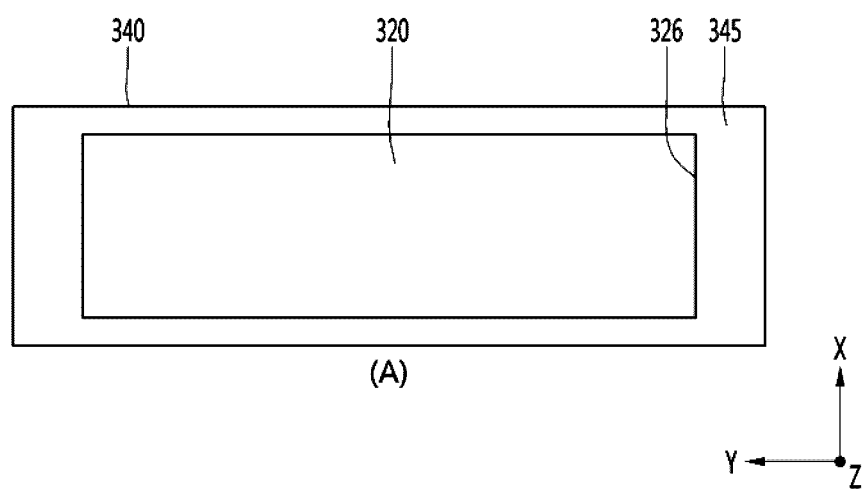
Figure 64:
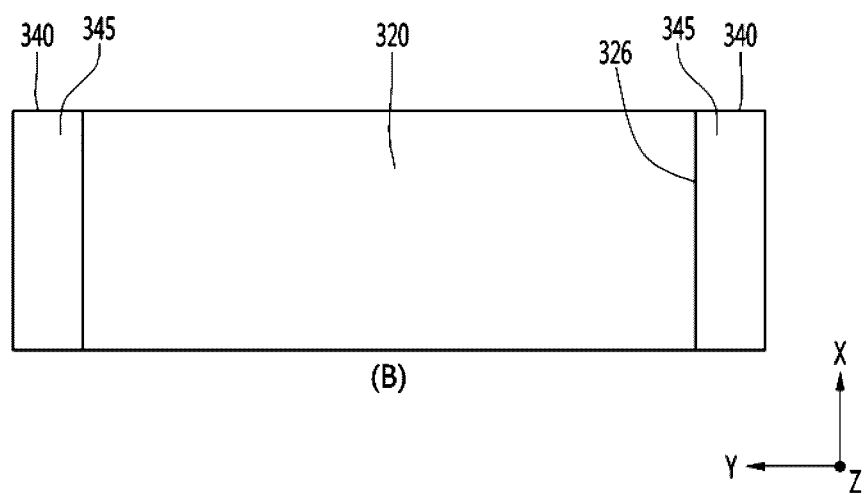

FIG. 64 illustrates a fifth modification example of the optical plate in the light emitting device of FIG. 58.

Figure 65:
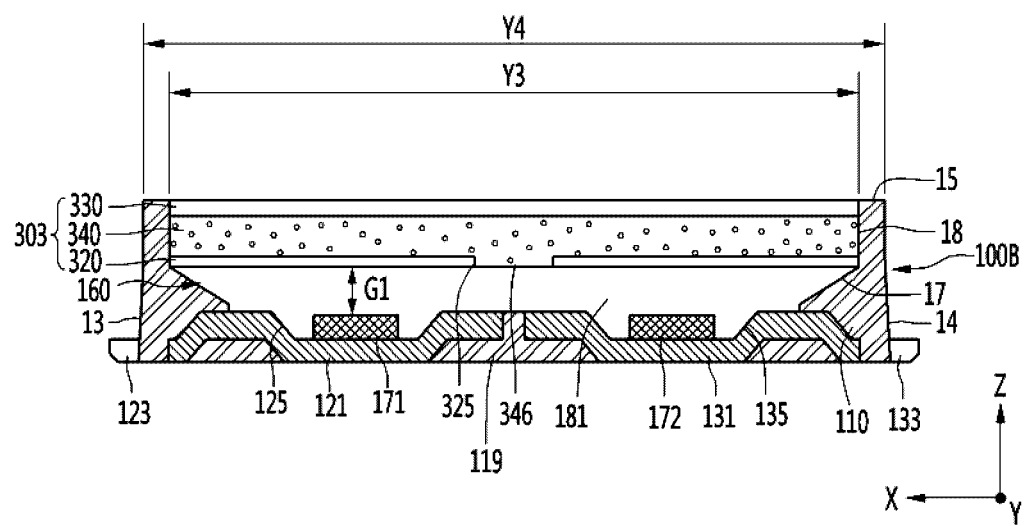

(A) and (B) of FIG. 65 are bottom views of the optical plate of FIG. 64.

Figure 66:
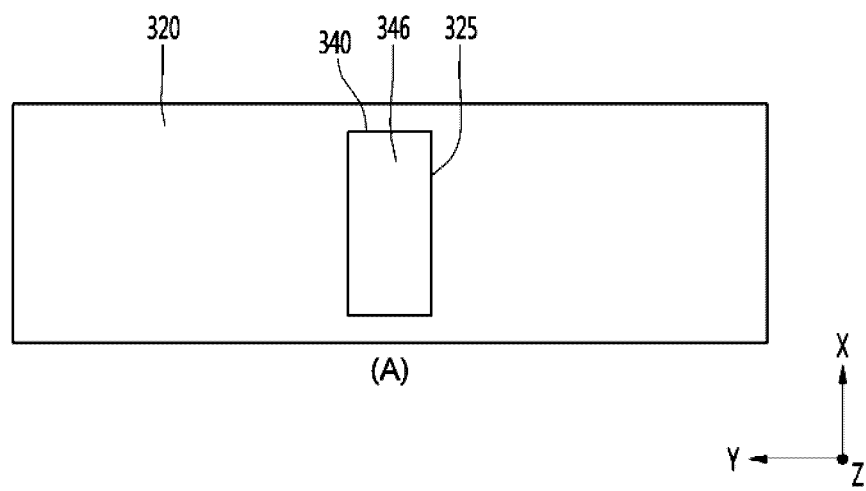
Figure 66:
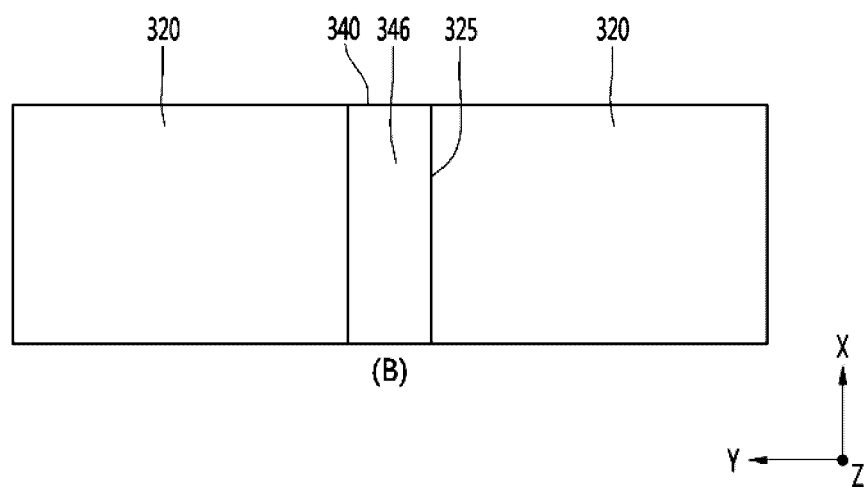

FIG. 66 illustrates a sixth modification example of the light emitting device including the optical plate of FIG. 58.

Figure 67:
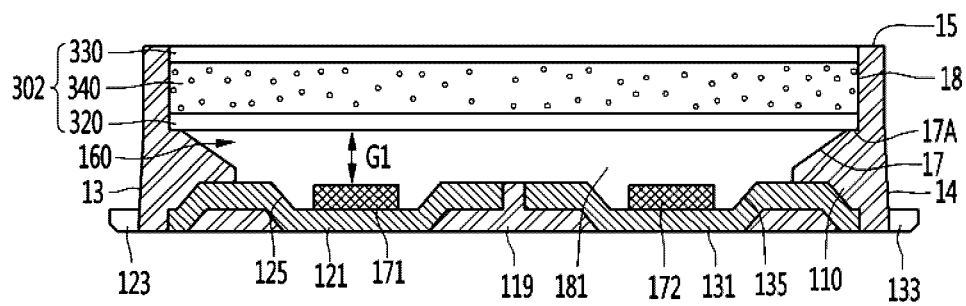

(A) and (B) of FIG. 67 are bottom views of the optical plate of FIG. 66.

Figure 68:
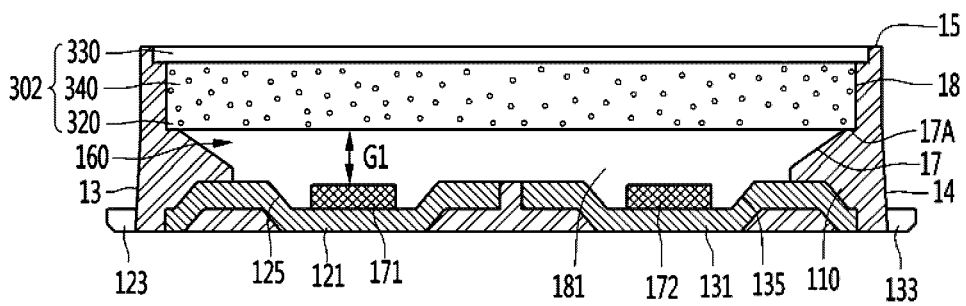

FIG. 68 illustrates a seventh modification example of the optical plate in the light emitting device of FIG. 66.

Figure 69:
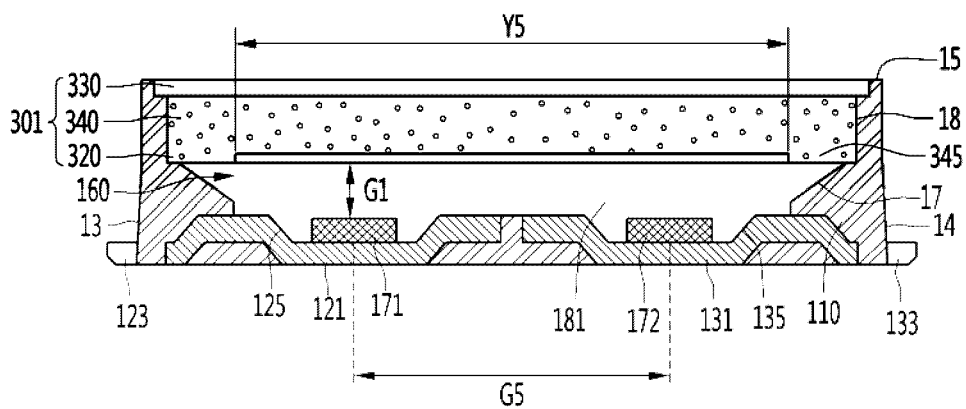

FIG. 69 illustrates an eighth modification example of the optical plate in the light emitting device of FIG. 68.

Figure 70:
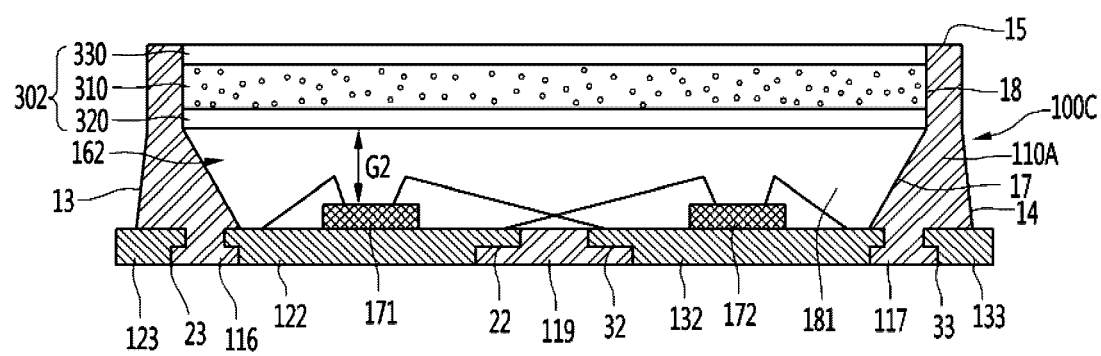

FIG. 70 is a side cross-sectional view of a light emitting device including an optical plate according to a modification example of the third embodiment.

Figure 71:
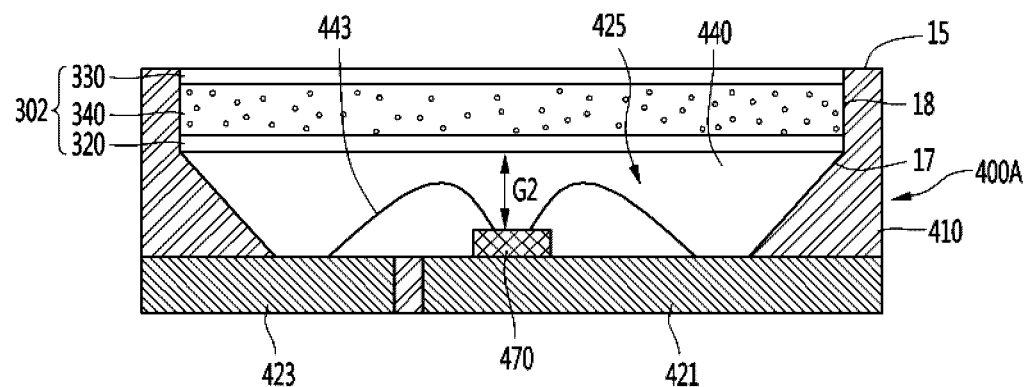

FIG. 71 is a side cross-sectional view of a light emitting device including an optical plate according to a modification example of the third embodiment.

Figure 72:
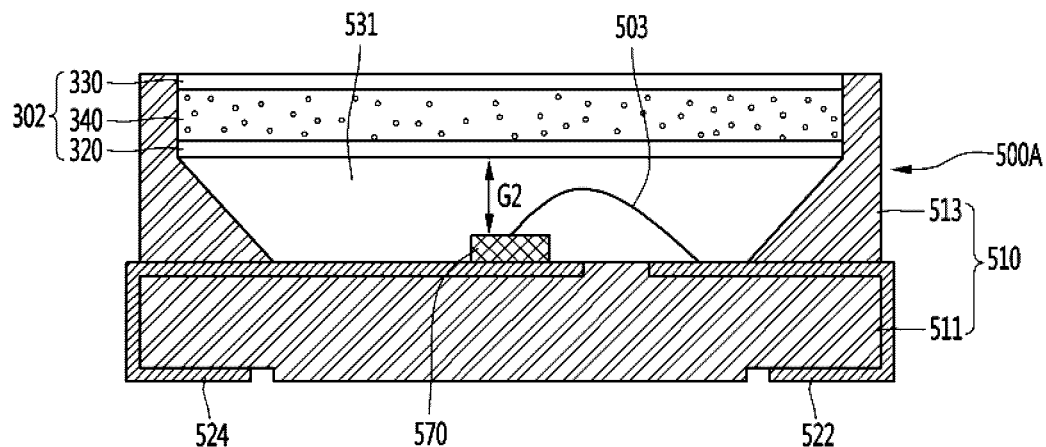

FIG. 72 is a side cross-sectional view of a light emitting device including an optical plate according to a modification example of the third embodiment.

Figure 73:
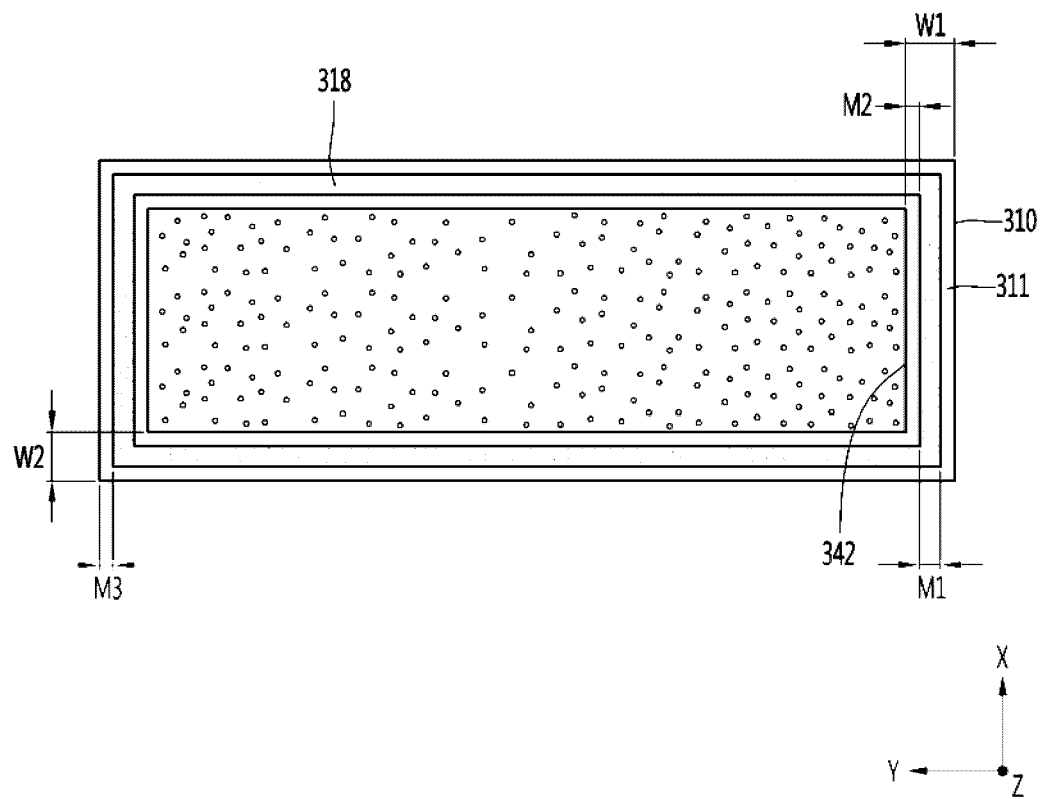
Figure 74:
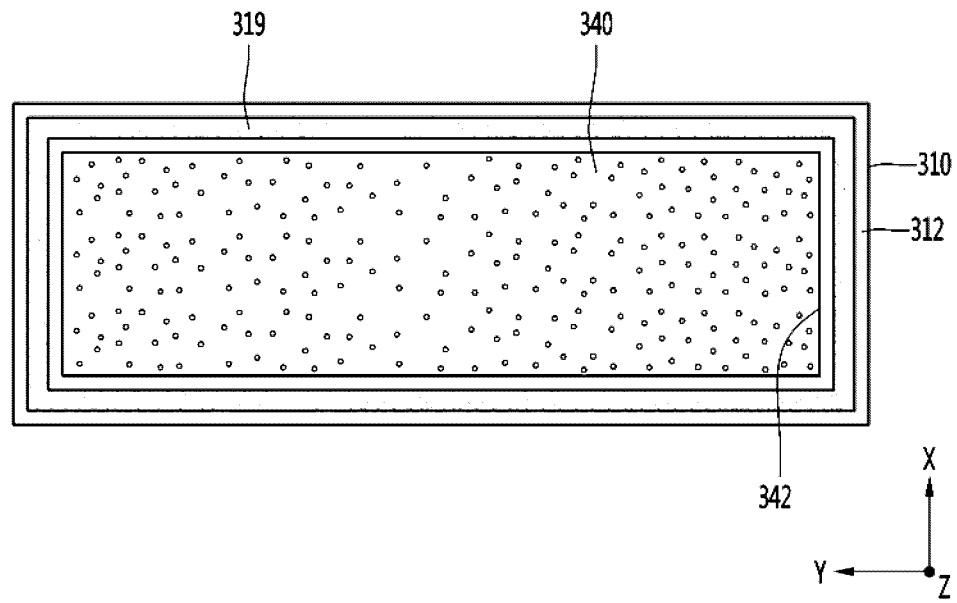

FIGS. 73 and 74 are a plan view and a bottom view of a support in an optical plate having an adhesive tape according to an embodiment.

Figure 75:
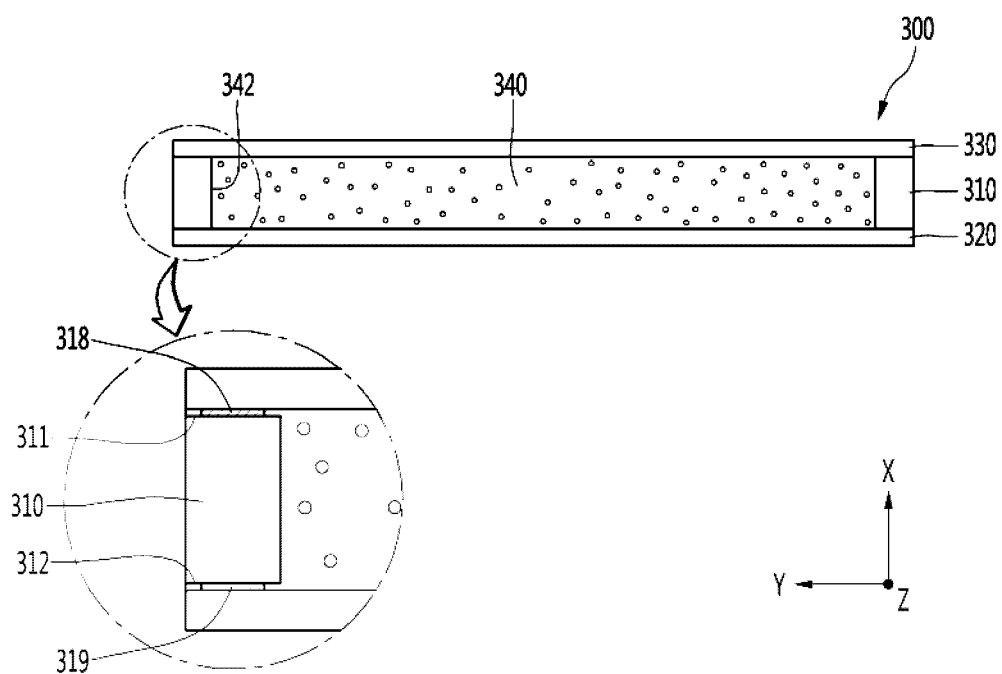

FIG. 75 illustrates an example of a transparent film bonded to the support of the optical plate of FIGS. 73 and 74.

Figure 76:
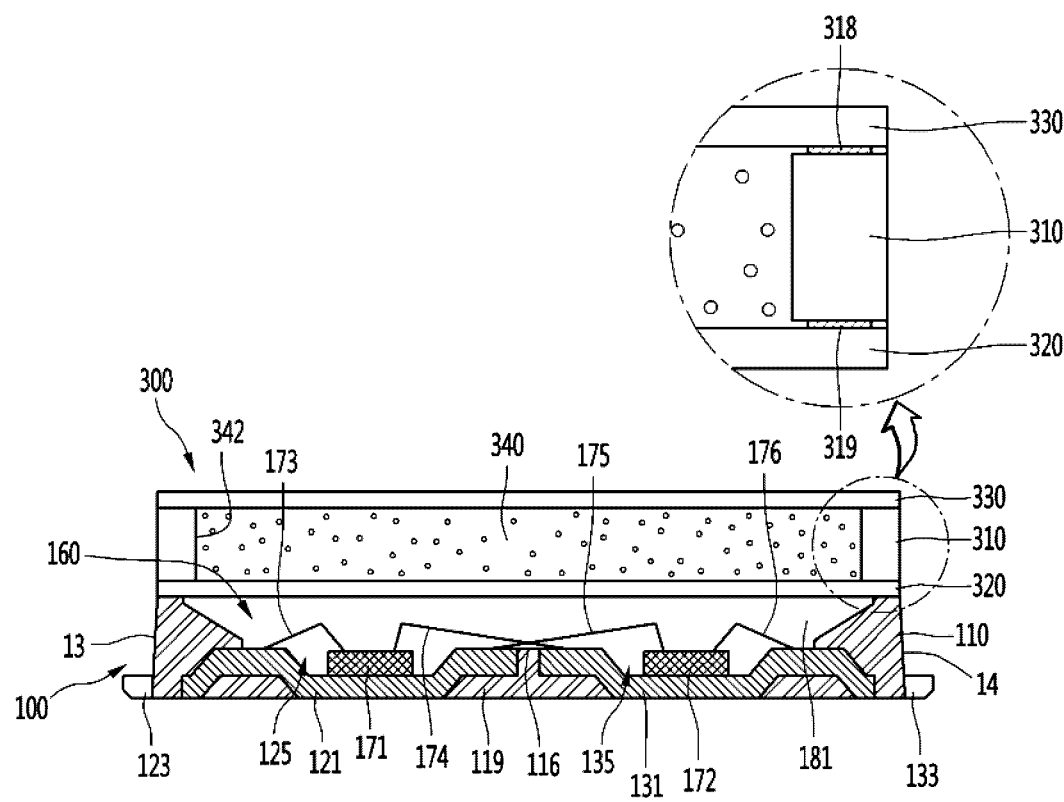

FIG. 76 is a side cross-sectional view of a light emitting device including the optical plate of FIG. 75.

Figure 2:
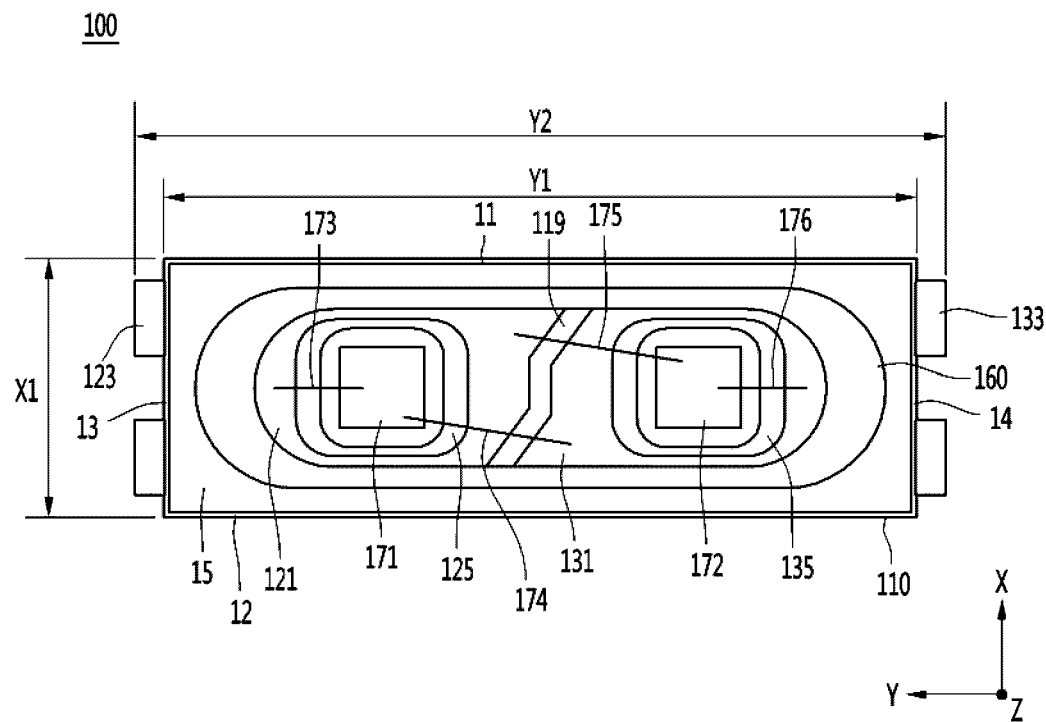
FIG. 2 is a plan view illustrating an example of a light emitting device of the lighting device of FIG. 1.
Figure 77:
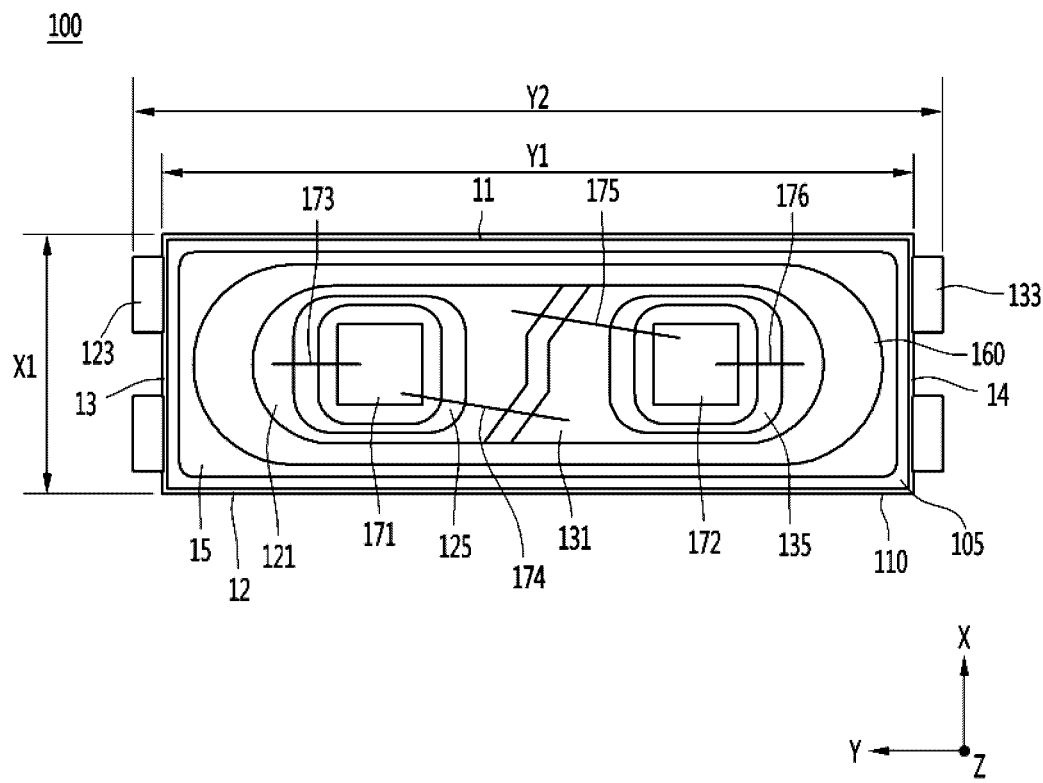

FIG. 77 is a view illustrating another example of the light emitting device of FIG. 2 according to a fourth embodiment.

Figure 78:
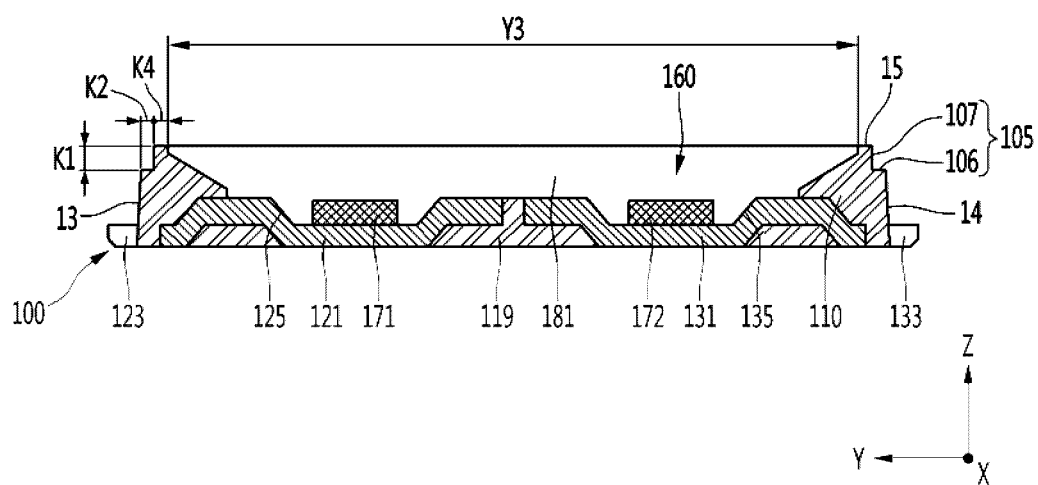

FIG. 78 is a longitudinal cross-sectional view of the light emitting device of FIG. 77.

Figure 79:
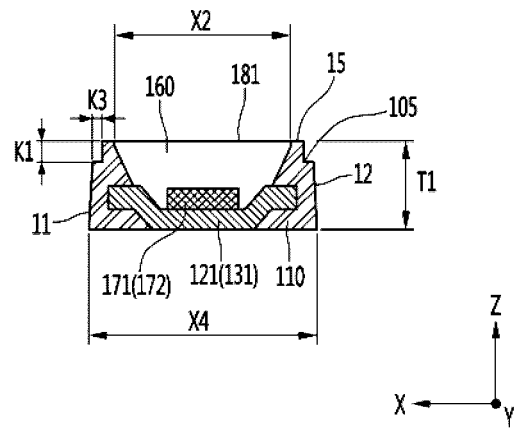

FIG. 79 is a transverse cross-sectional view of the light emitting device of FIG. 77.

Figure 80:
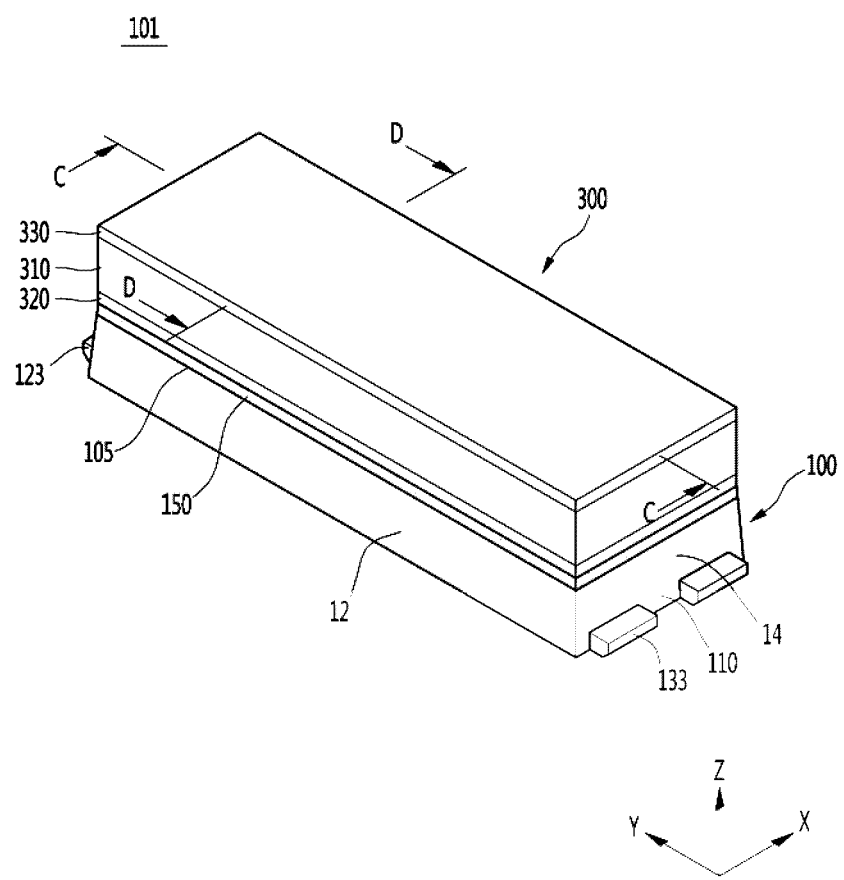

FIG. 80 is a perspective view of a lighting device in which an optical plate is arranged on the light emitting device of FIG. 77 according to a fourth embodiment.

Figure 81:
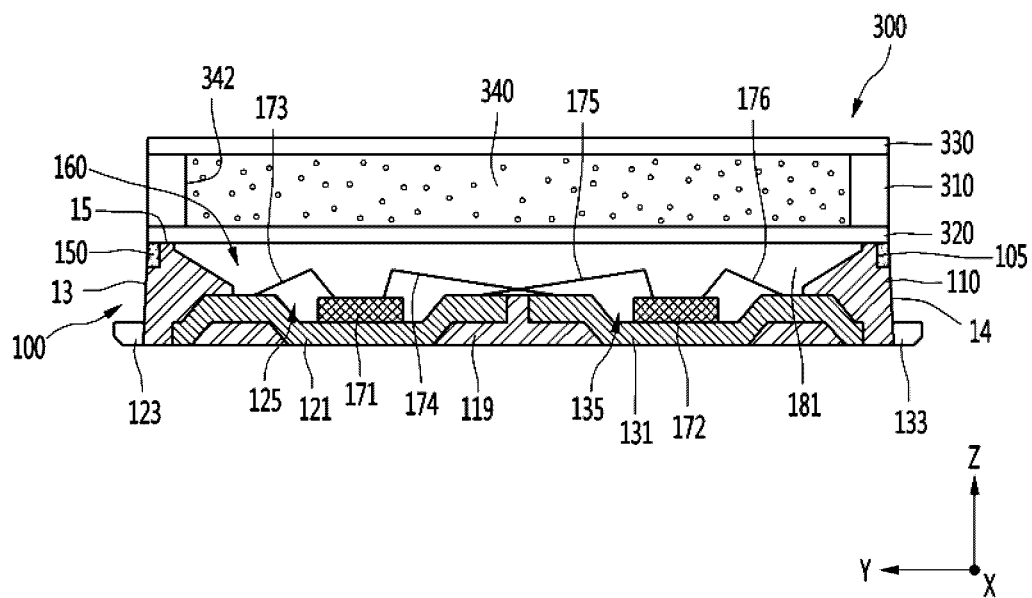

FIG. 81 is a C-C cross-sectional view of the lighting device of FIG. 80.

Figure 82:
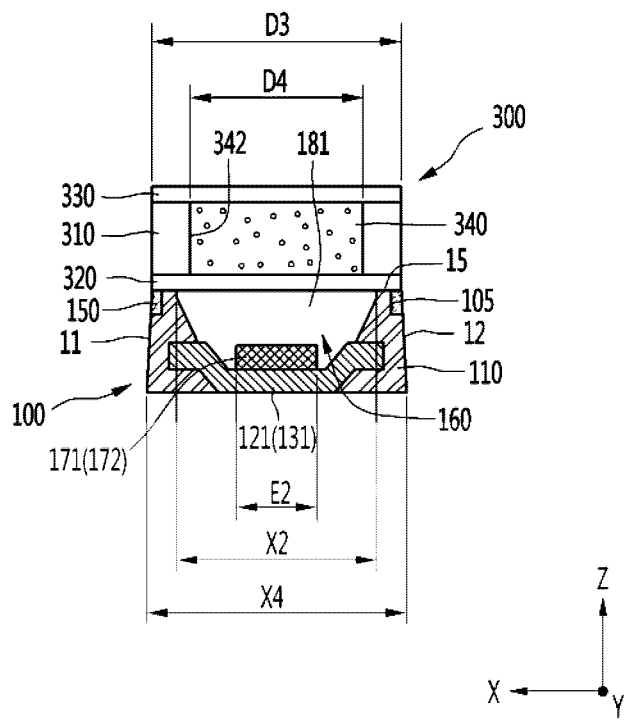

FIG. 82 is a D-D cross-sectional view of the lighting device of FIG. 80.

Figure 83:
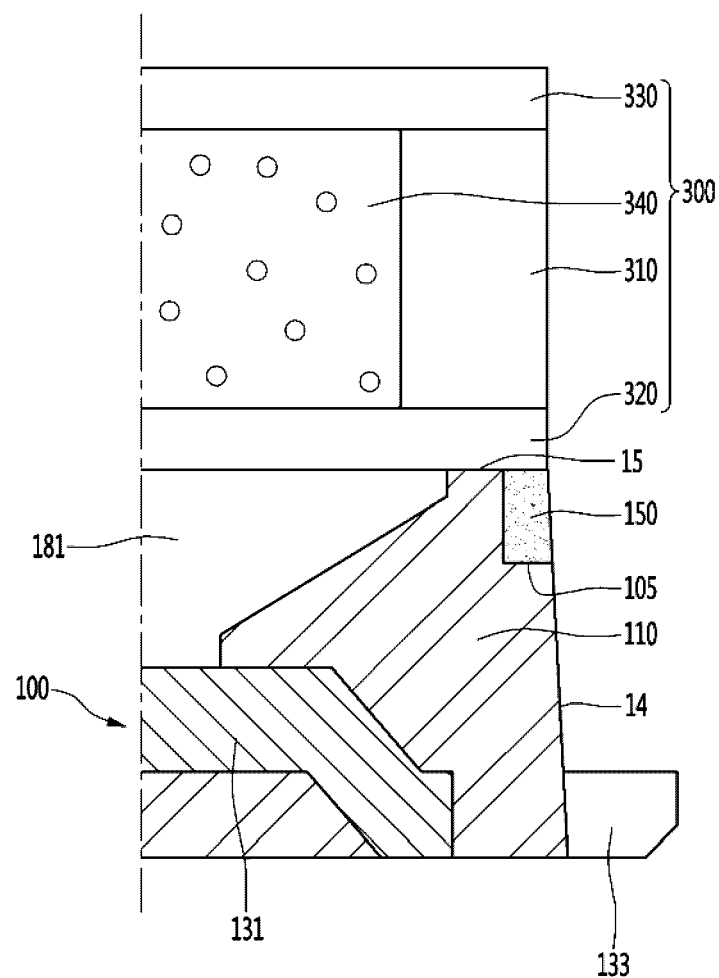

FIG. 83 is a partial enlarged view of the lighting device of FIG. 81.

FIGS. 84 to 88 illustrate a modification example of a surrounding groove or an adhesive member of the light emitting device of FIG. 83.

Figure 89:
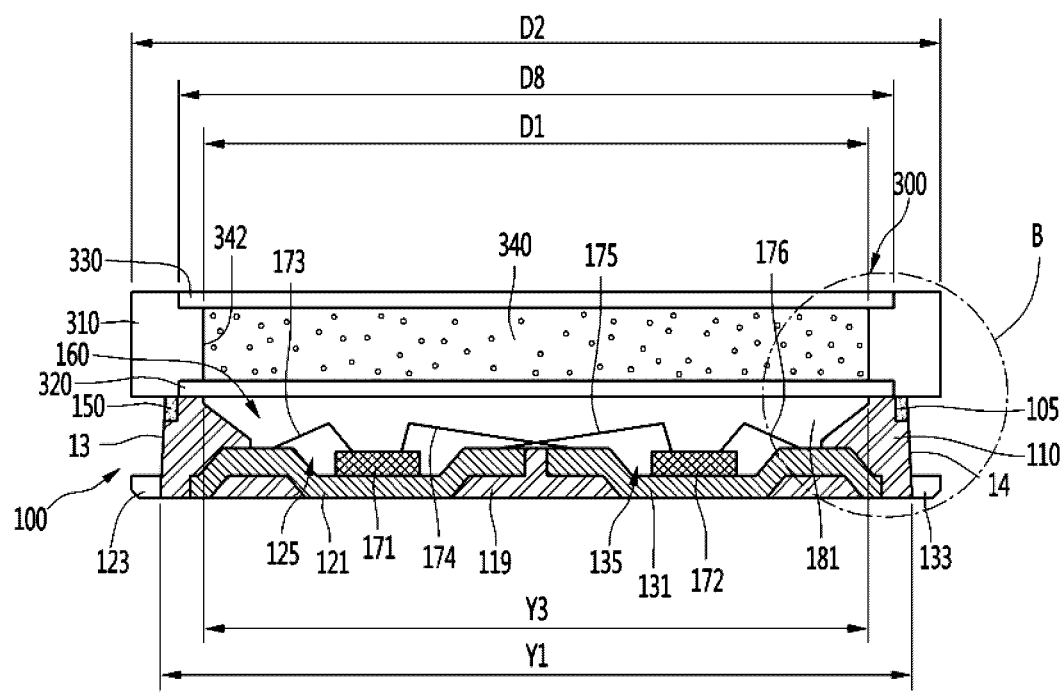

FIG. 89 illustrates a modification example of the lighting device of FIG. 81.

Figure 90:
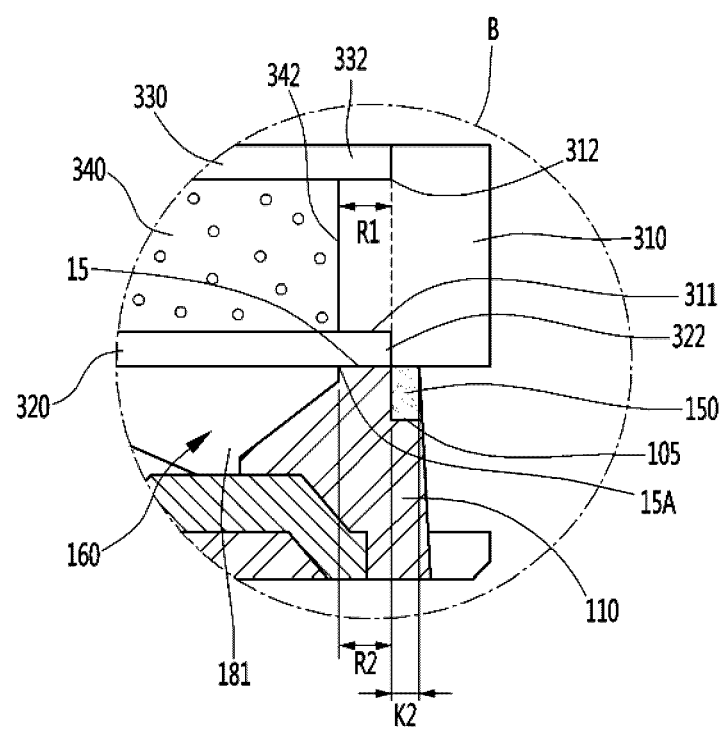

FIG. 90 is an enlarged view of a portion B of the lighting device of FIG. 89.

Figure 91:
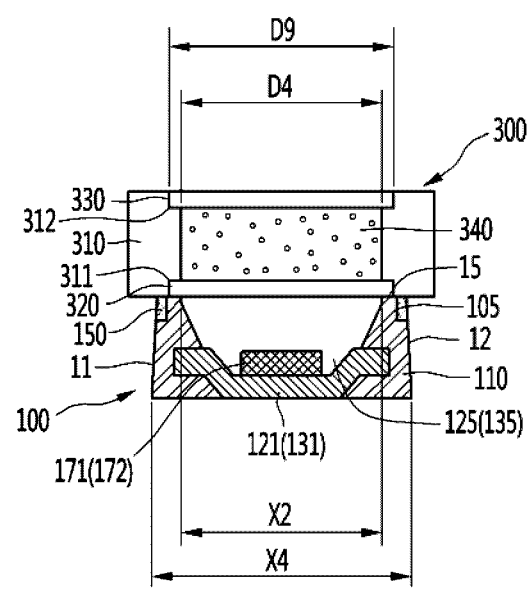

FIG. 91 is another side cross-sectional view of the lighting device of FIG. 89.

Figure 92:
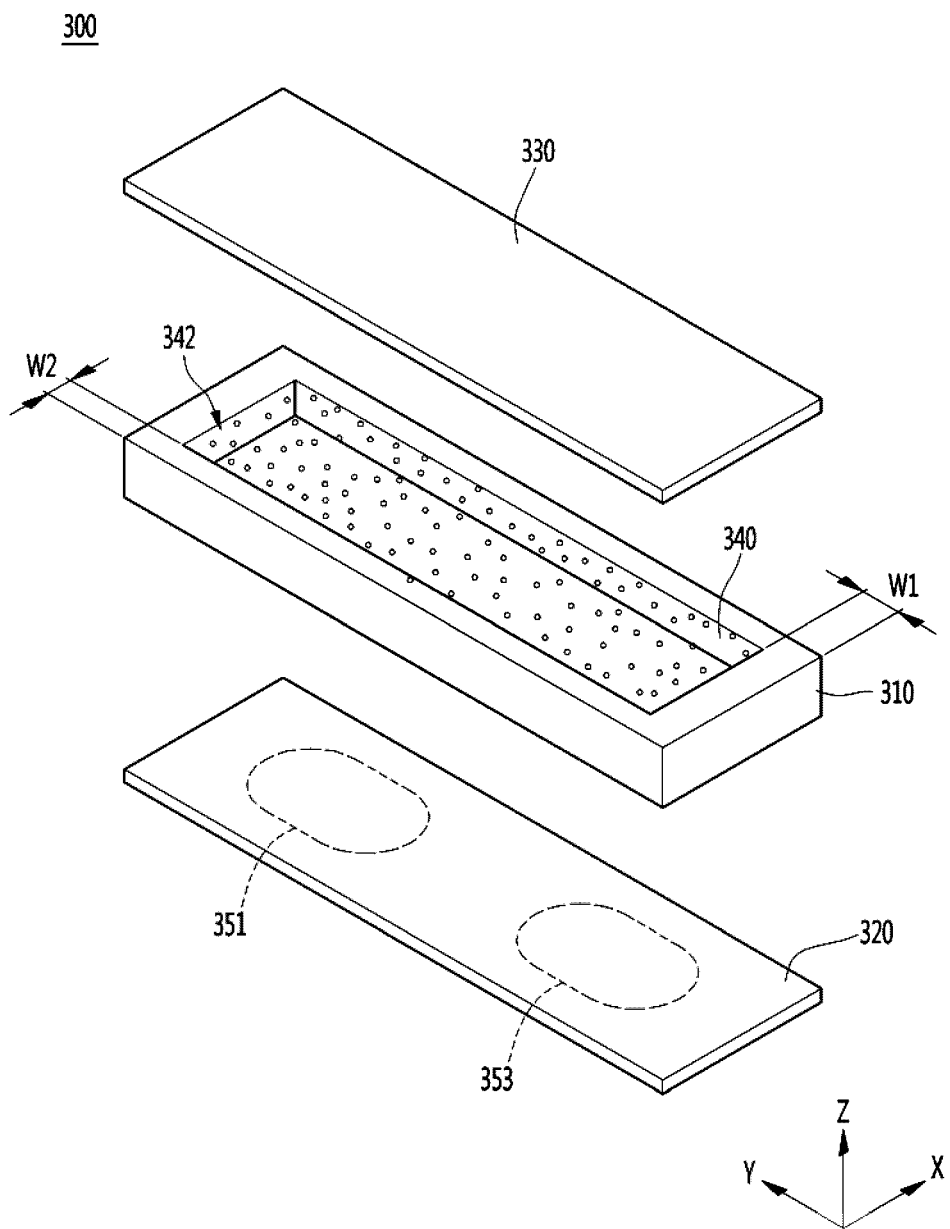

FIG. 92 is an exploded perspective view of an optical plate of a lighting device according to a fifth embodiment.

Figure 93:
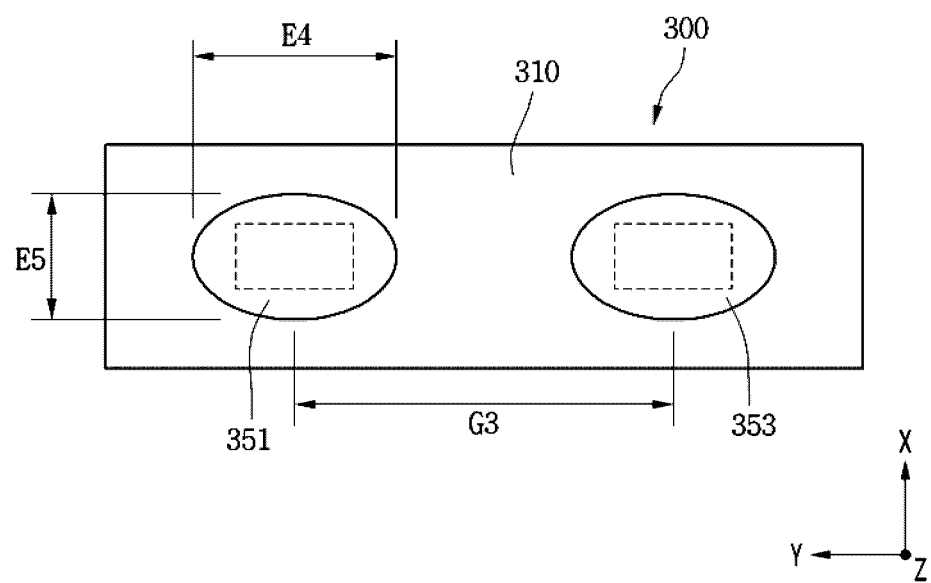

FIG. 93 is an assembly bottom view of the optical plate of FIG. 92.

Figure 94:
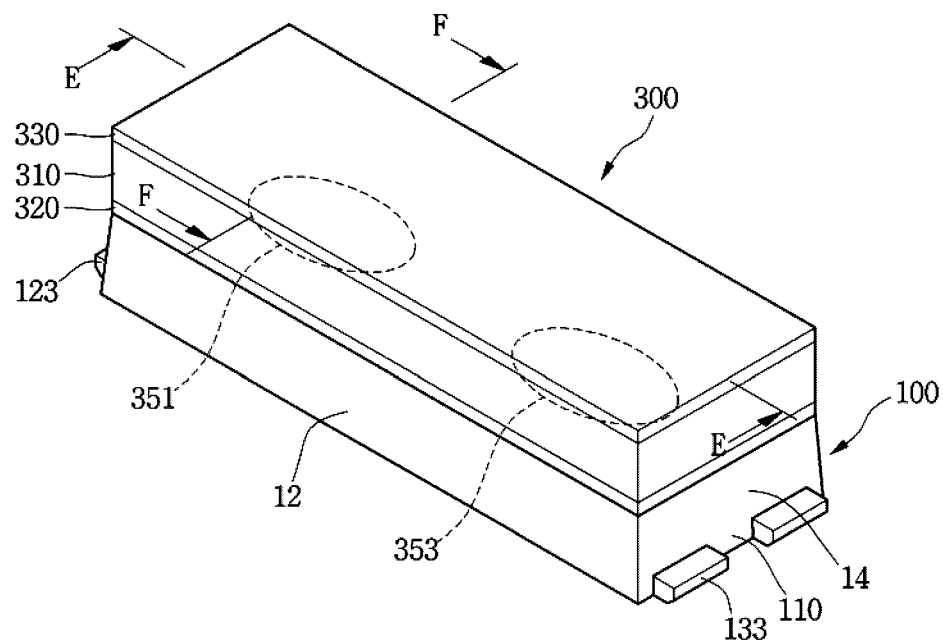

FIG. 94 is an assembly perspective view of a light emitting device including the optical plate of FIG. 92.

Figure 95:
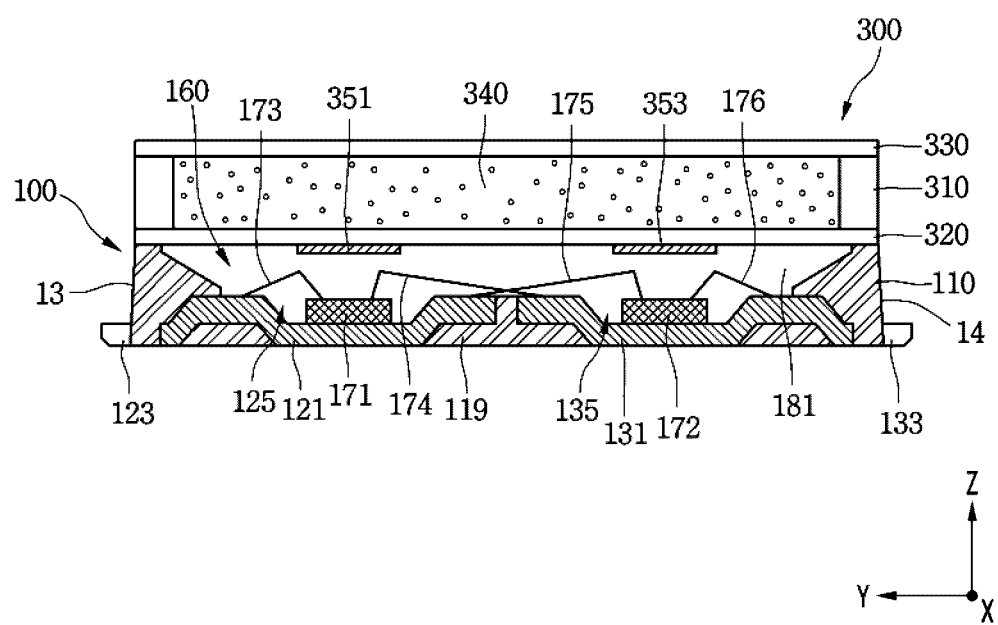

FIG. 95 is an E-E cross-sectional view of the lighting device of FIG. 94.

Figure 96:
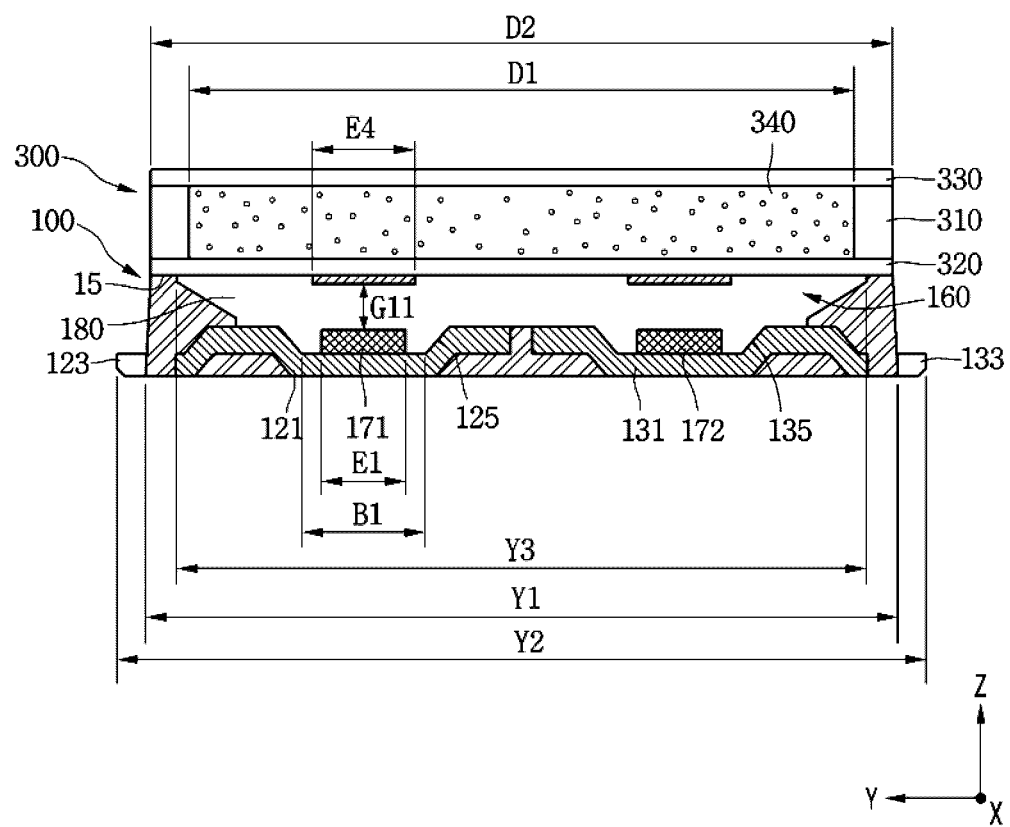

FIG. 96 is a view for describing the lighting device of FIG. 95.

Figure 97:
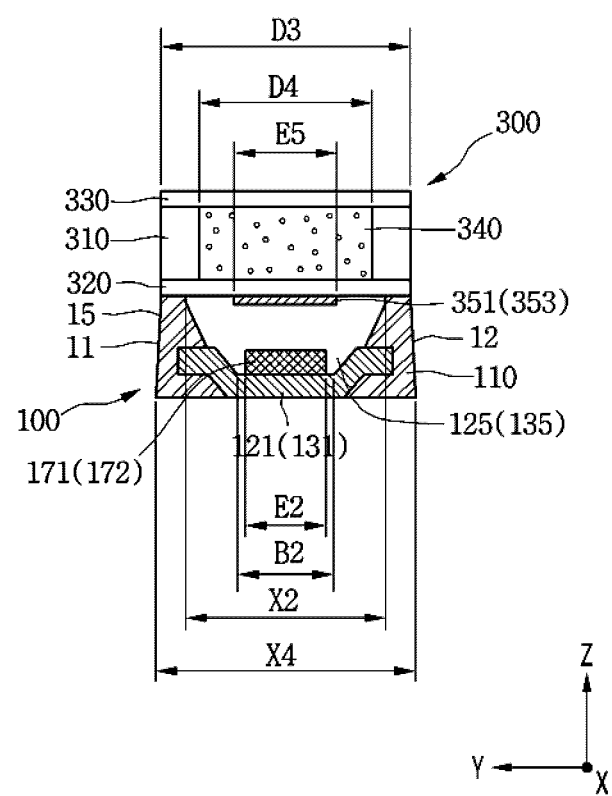

FIG. 97 is an F-F cross-sectional view of the lighting device of FIG. 94.

Figure 98:
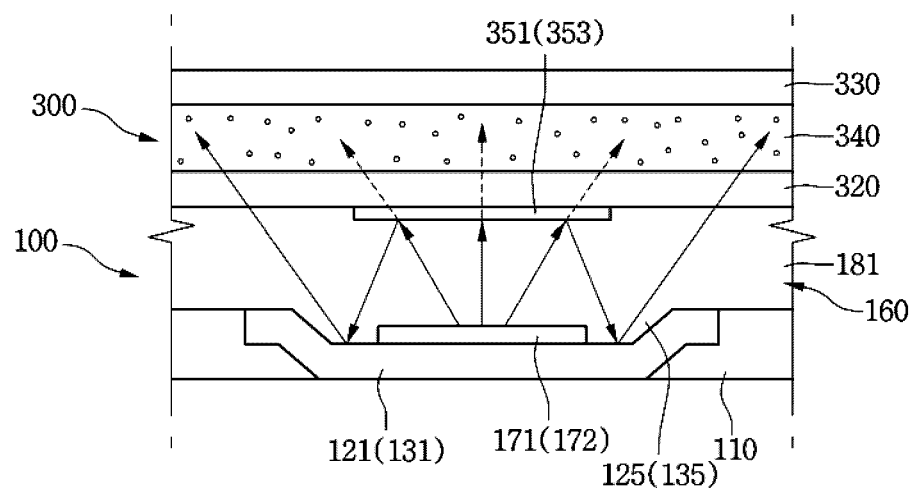

FIG. 98 is a view for describing a light extraction path in the lighting device of FIG. 95.

Figure 99:
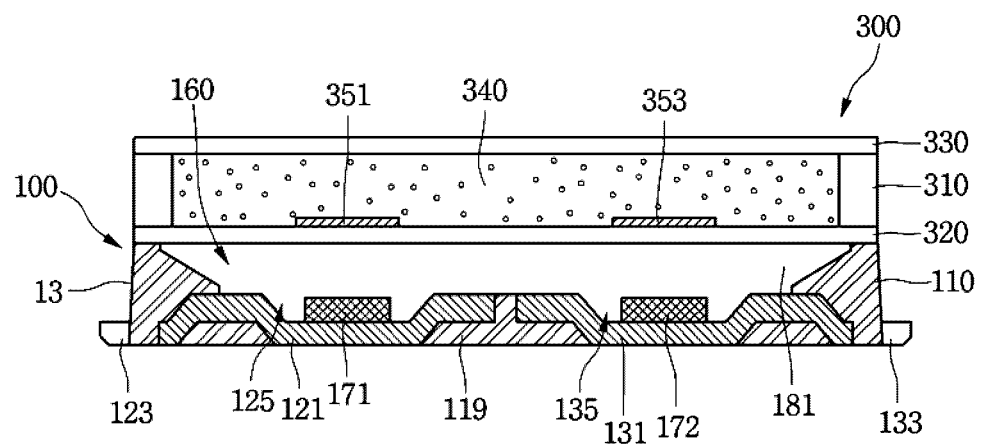

FIG. 99 illustrates another example of the optical plate in the lighting device of FIG. 95.

Figure 100:
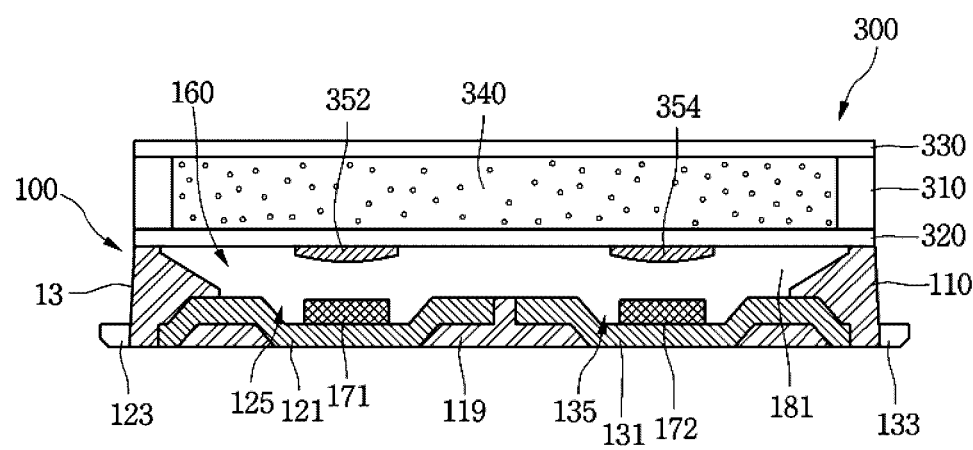

FIG. 100 illustrates another example of the optical plate in the lighting device of FIG. 95.

Figure 101:
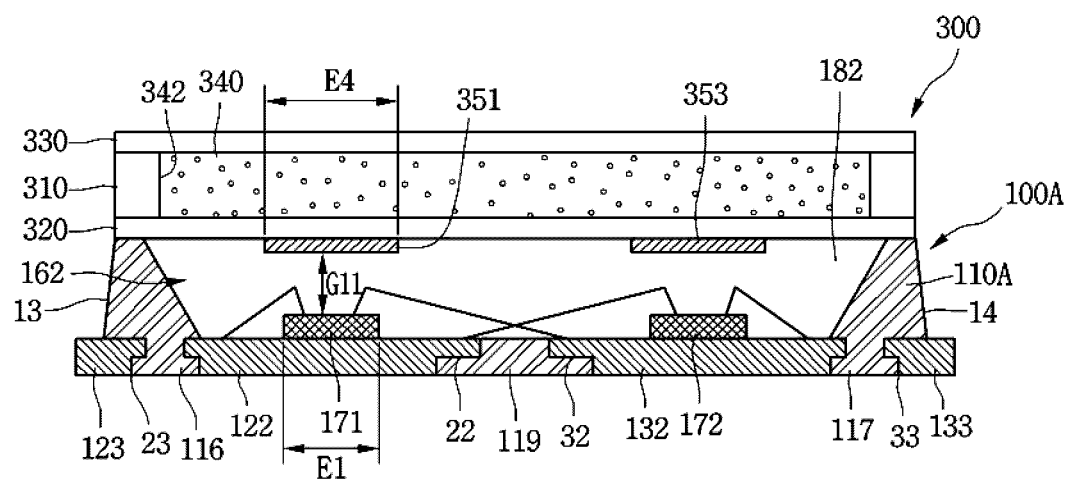

FIG. 101 is a side cross-sectional view when another light emitting device is applied to the lighting device of FIG. 94.

Figure 102:
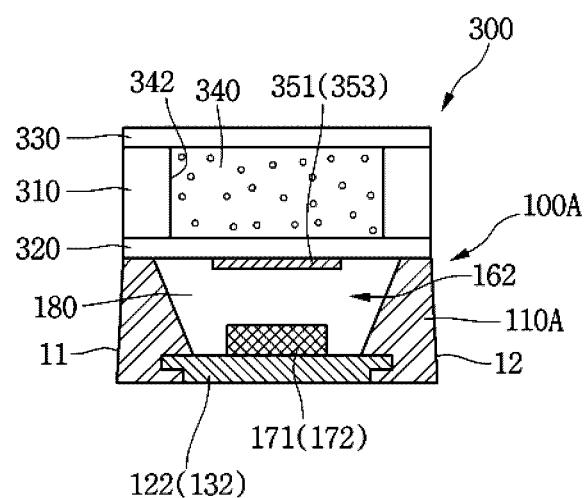

FIG. 102 is another side cross-sectional view of the lighting device of FIG. 101.

Figure 103:
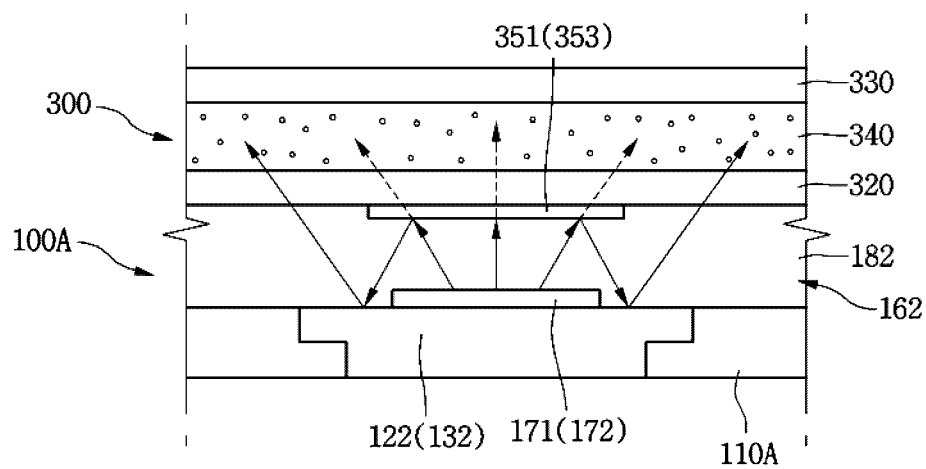

FIG. 103 is a view for describing a light extraction path in the lighting device of FIG. 101.

Figure 104:
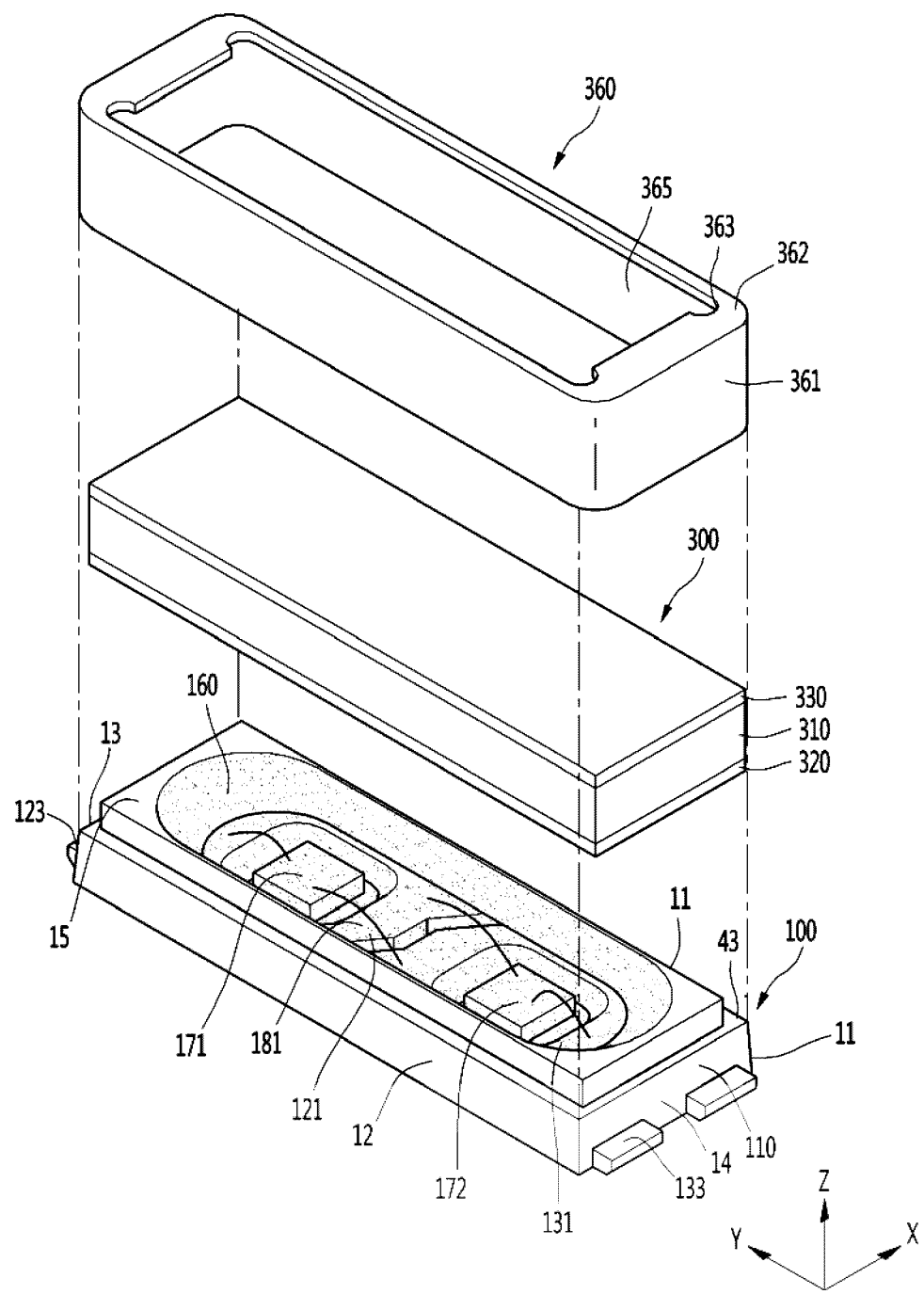

FIG. 104 is an exploded perspective view illustrating a lighting device including a plate cover according to a sixth embodiment.

Figure 105:
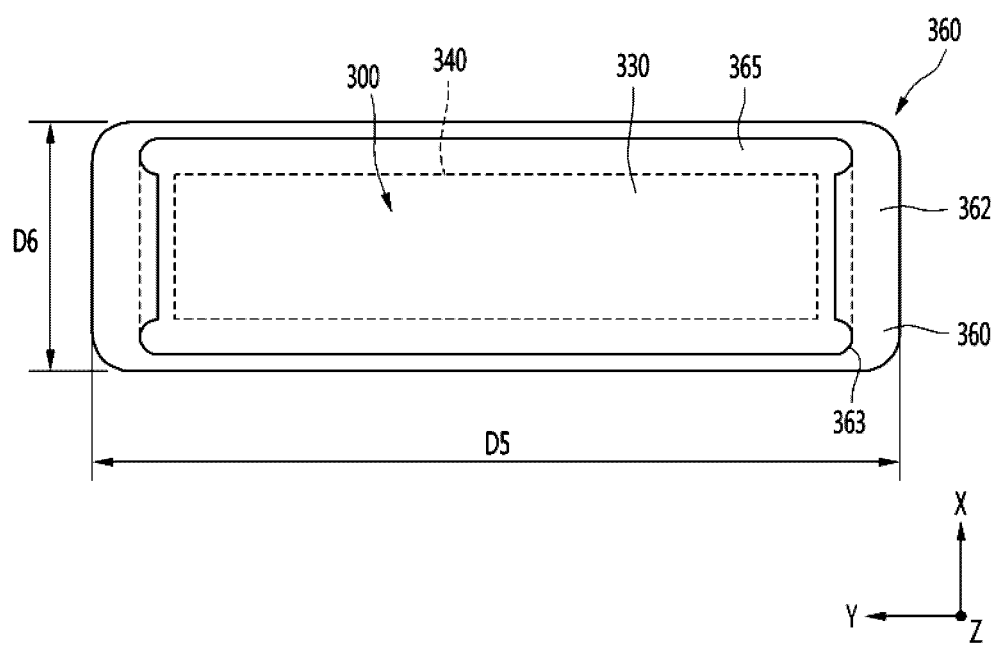

FIG. 105 is an assembly plan view of an optical and plate cover in the lighting device of FIG. 104.

Figure 106:
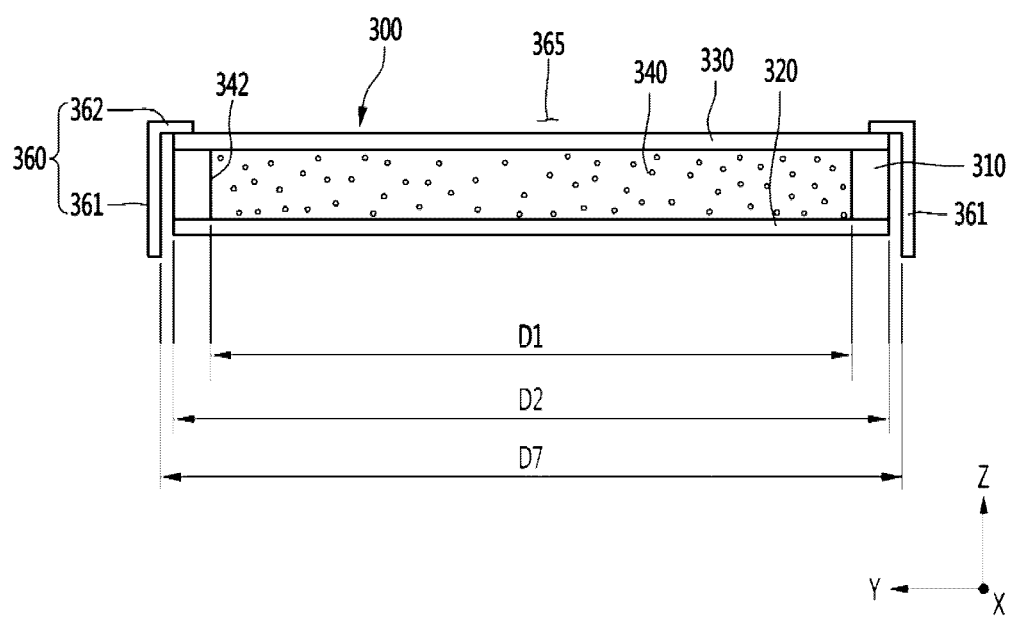

FIG. 106 is an assembly side cross-sectional view of an optical and plate cover of FIG. 105.

Figure 107:
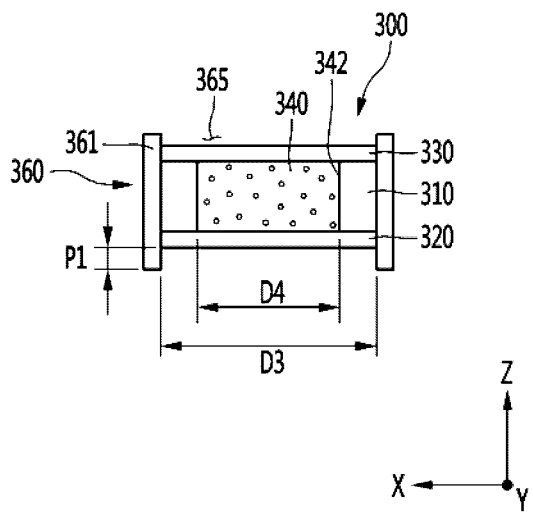

FIG. 107 is another side cross-sectional view of an optical and plate cover of FIG. 105.

Figure 108:
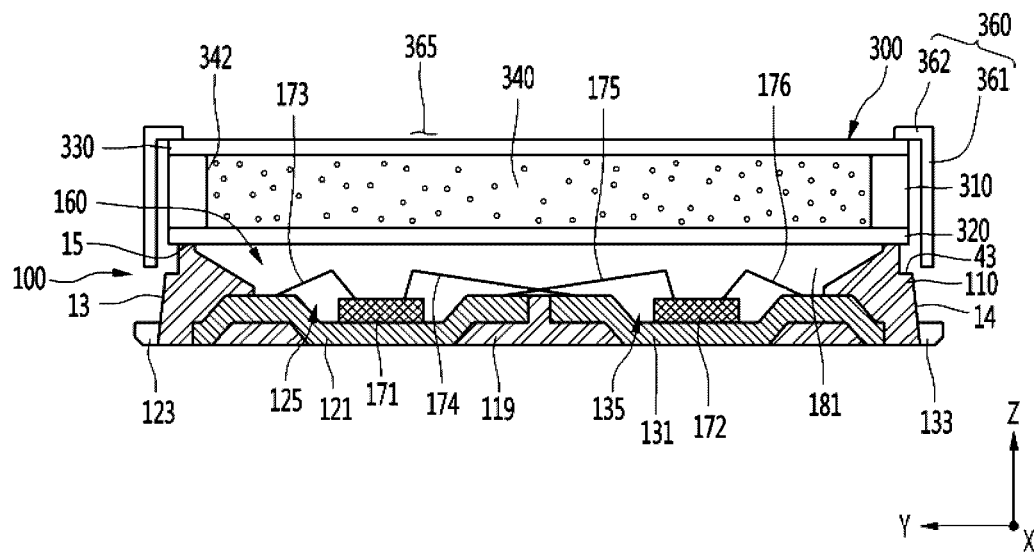

FIG. 108 is an assembly cross-sectional view of the lighting device of FIG. 105.

Figure 109:
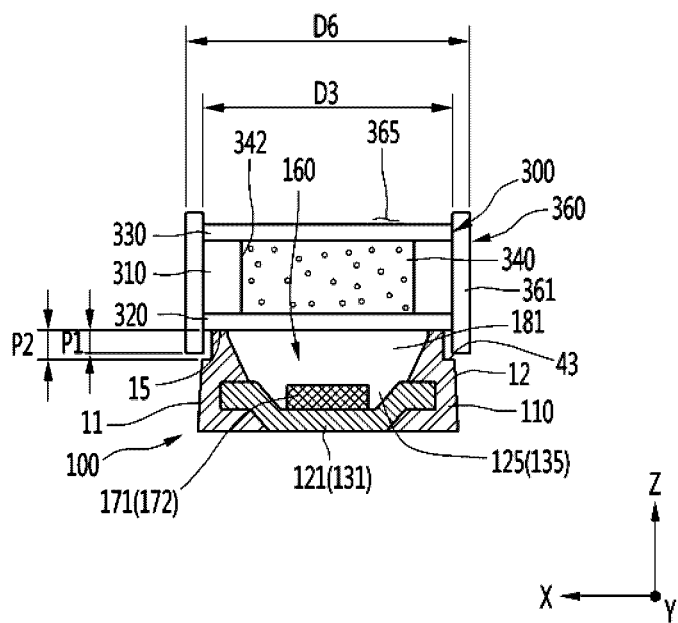

FIG. 109 is another side cross-sectional view of the lighting device of FIG. 105.

Figure 110:
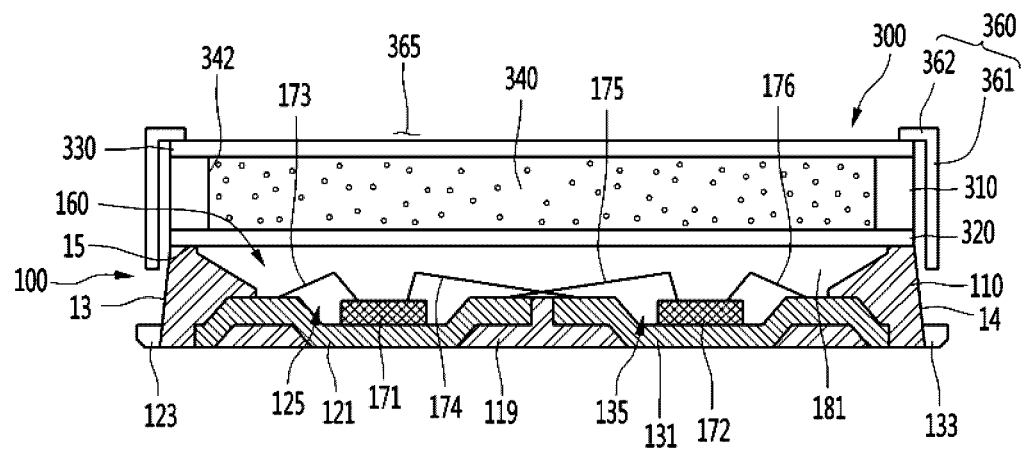

FIG. 110 illustrates an example in which a plate cover is connected to the lighting device of FIG. 9.

Figure 10:
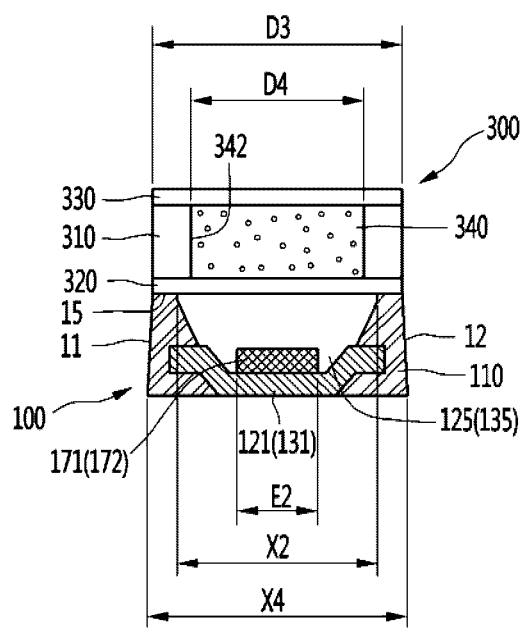
FIG. 10 is a B-B cross-sectional view of the lighting device of FIG. 7.
Figure 111:
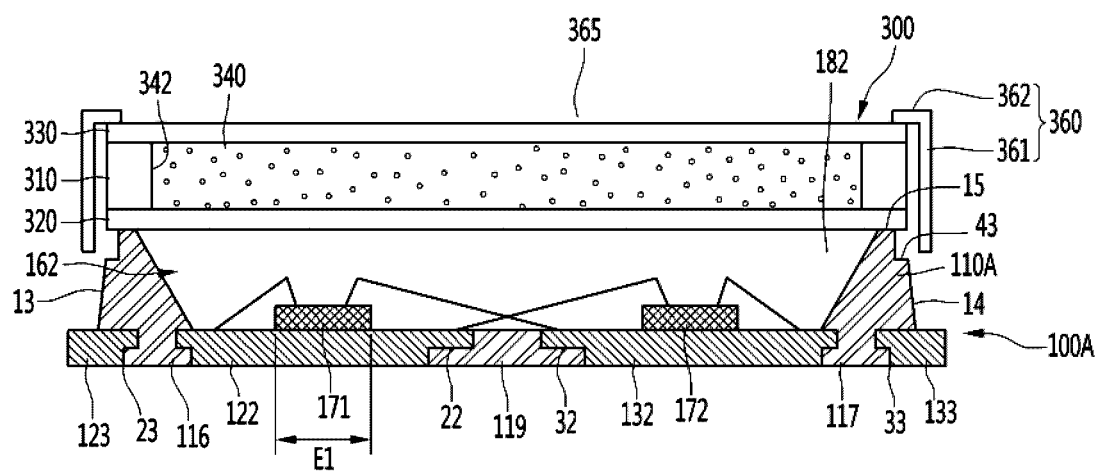

FIG. 111 illustrates an example in which a plate cover is applied to the lighting device of FIG. 10.

Figure 112:
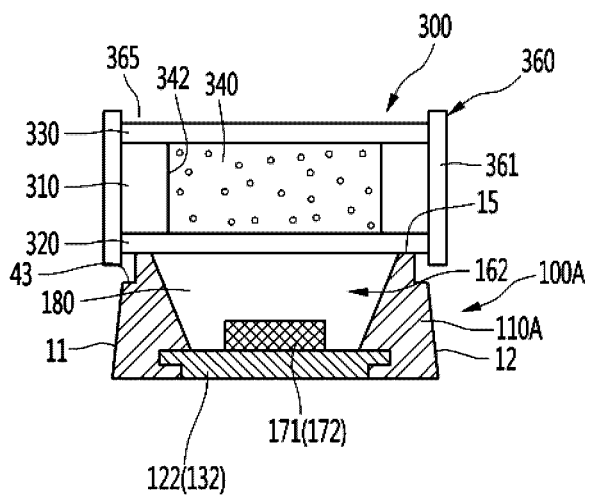

FIG. 112 is another side cross-sectional view of the lighting device of FIG. 111.

Figure 113:
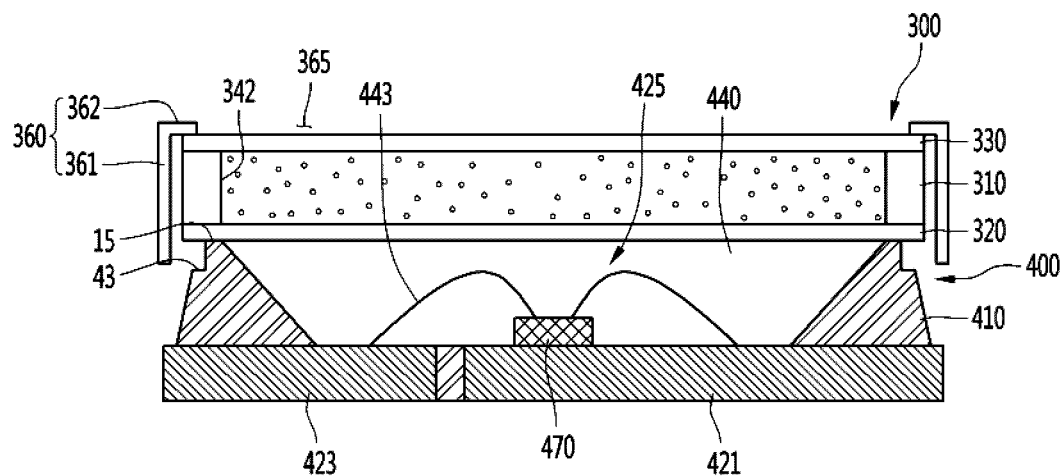

FIG. 113 is a side cross-sectional view of a lighting device including a plate cover according to a modification example of the sixth embodiment.

Figure 114:
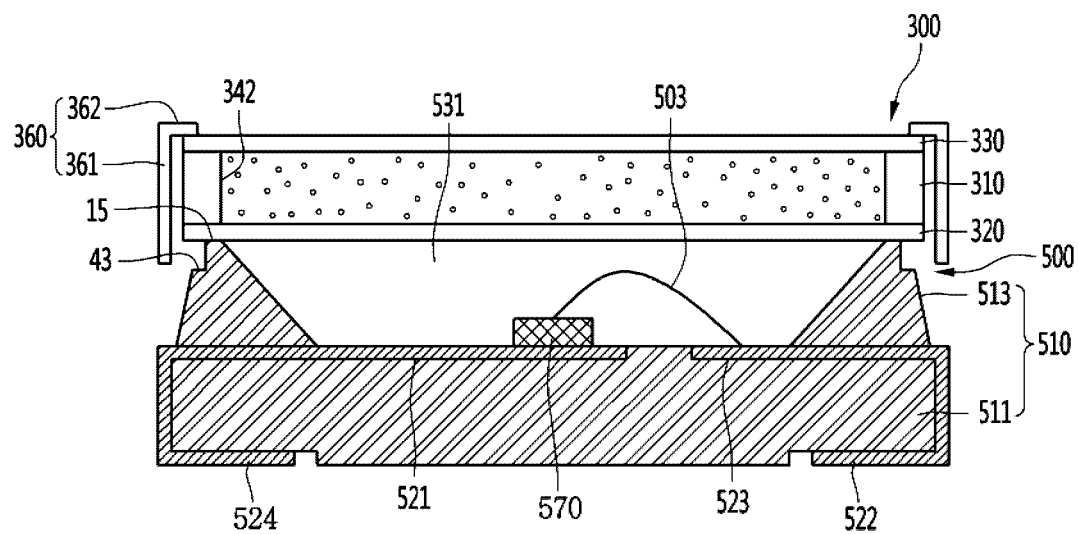

FIG. 114 is a side cross-sectional view of a lighting device including a plate cover according to a modification example of the sixth embodiment.

Figure 115:
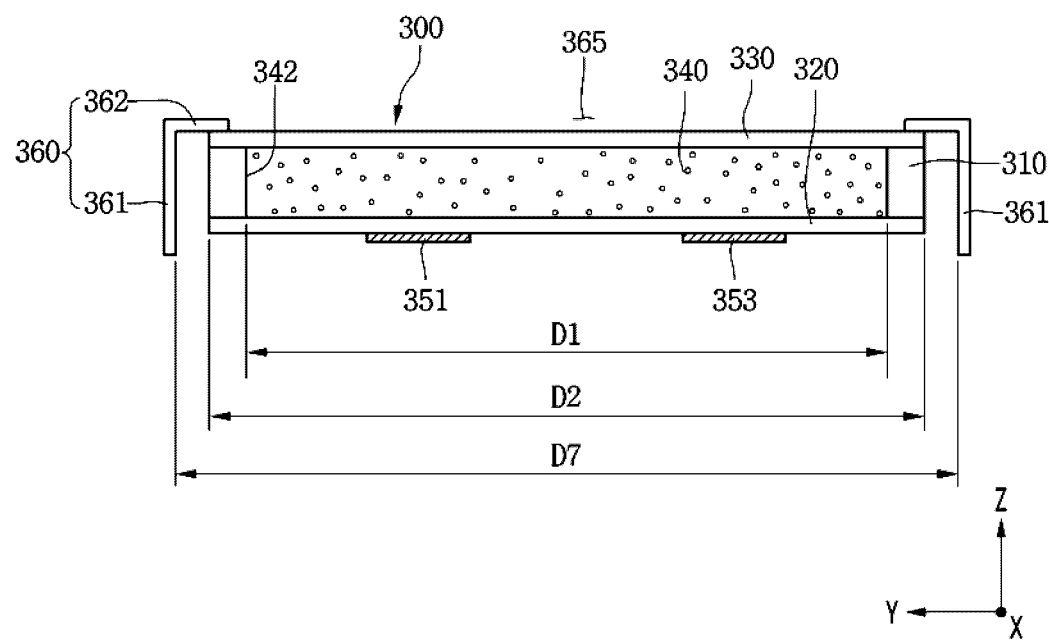

FIG. 115 is an assembly side cross-sectional view of an optical plate and a plate cover on a lighting-emitting element in the sixth embodiment.

Figure 116:
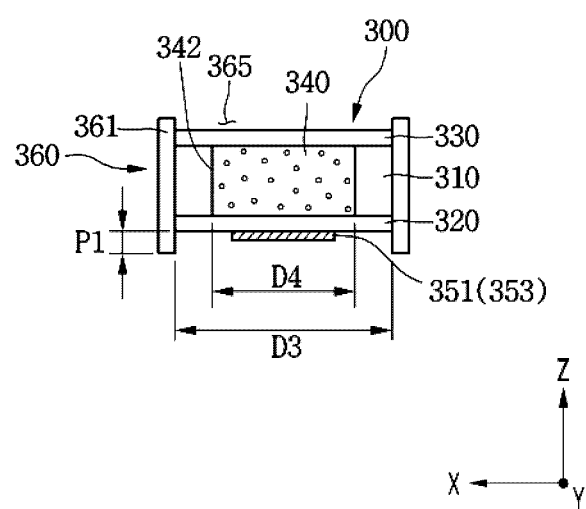

FIG. 116 is another side cross-sectional view of FIG. 115.

Figure 117:
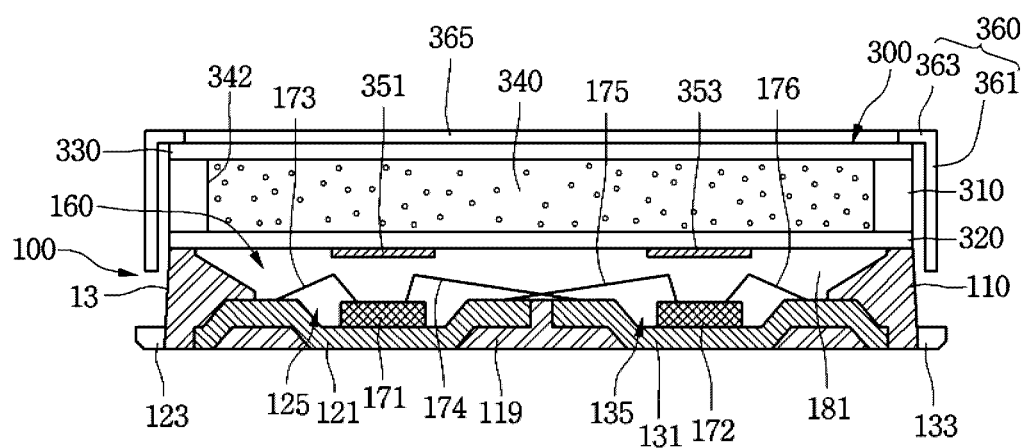

FIG. 117 is a side cross-sectional view of a lighting device including the optical plate and the plate cover of FIG. 115.

Figure 118:
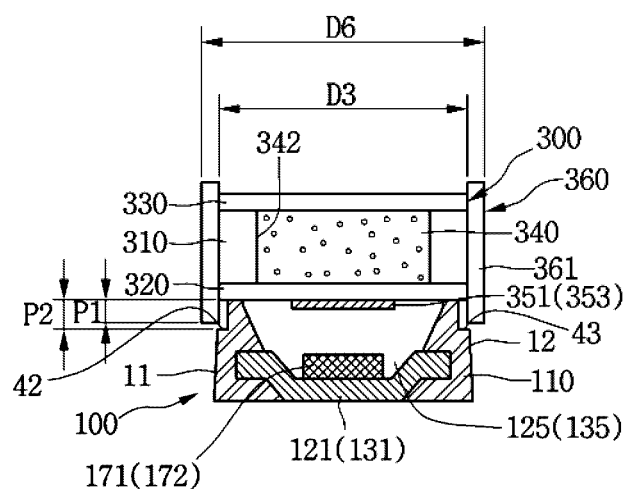

FIG. 118 is another side cross-sectional view of the lighting device of FIG. 117.

Figure 119:
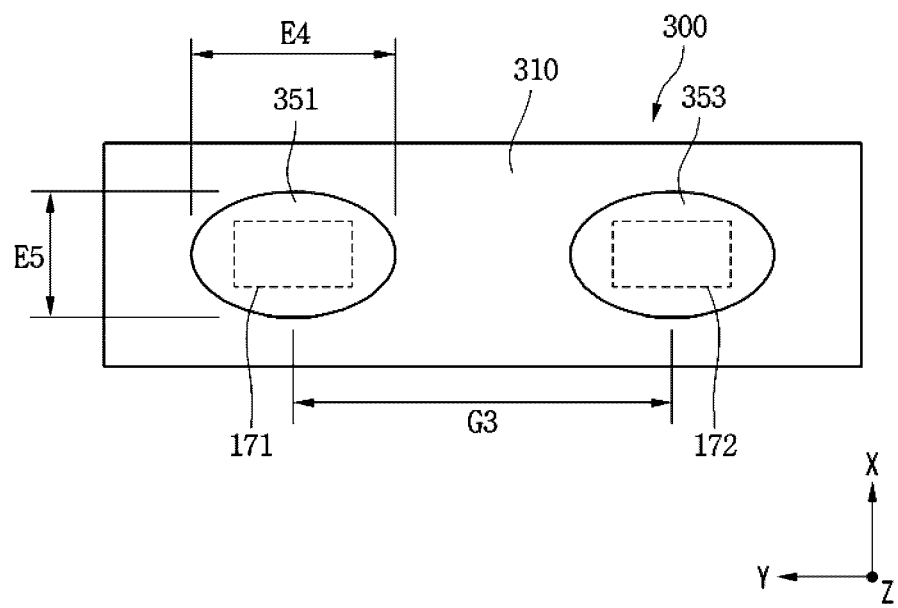

FIG. 119 is a view illustrating an example of a first shape of a semi-transmissive mirror of an optical plate in the fifth and sixth embodiments.

Figure 120:
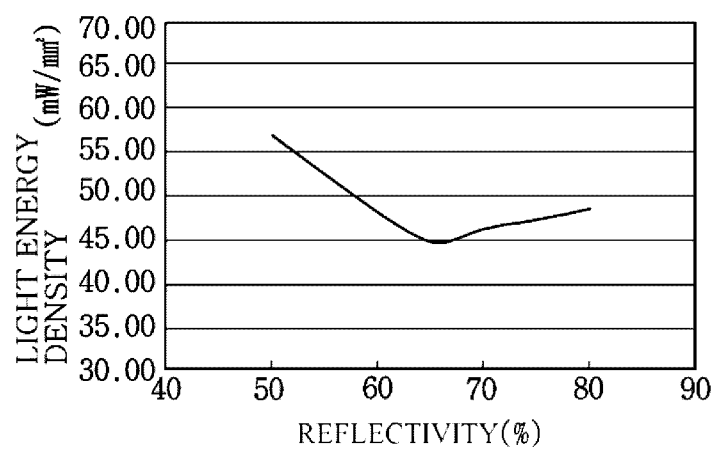

FIG. 120 is a graph showing a light energy density according to reflectivity of a semi-transmissive mirror in the optical plate of FIG. 119.

Figure 121:
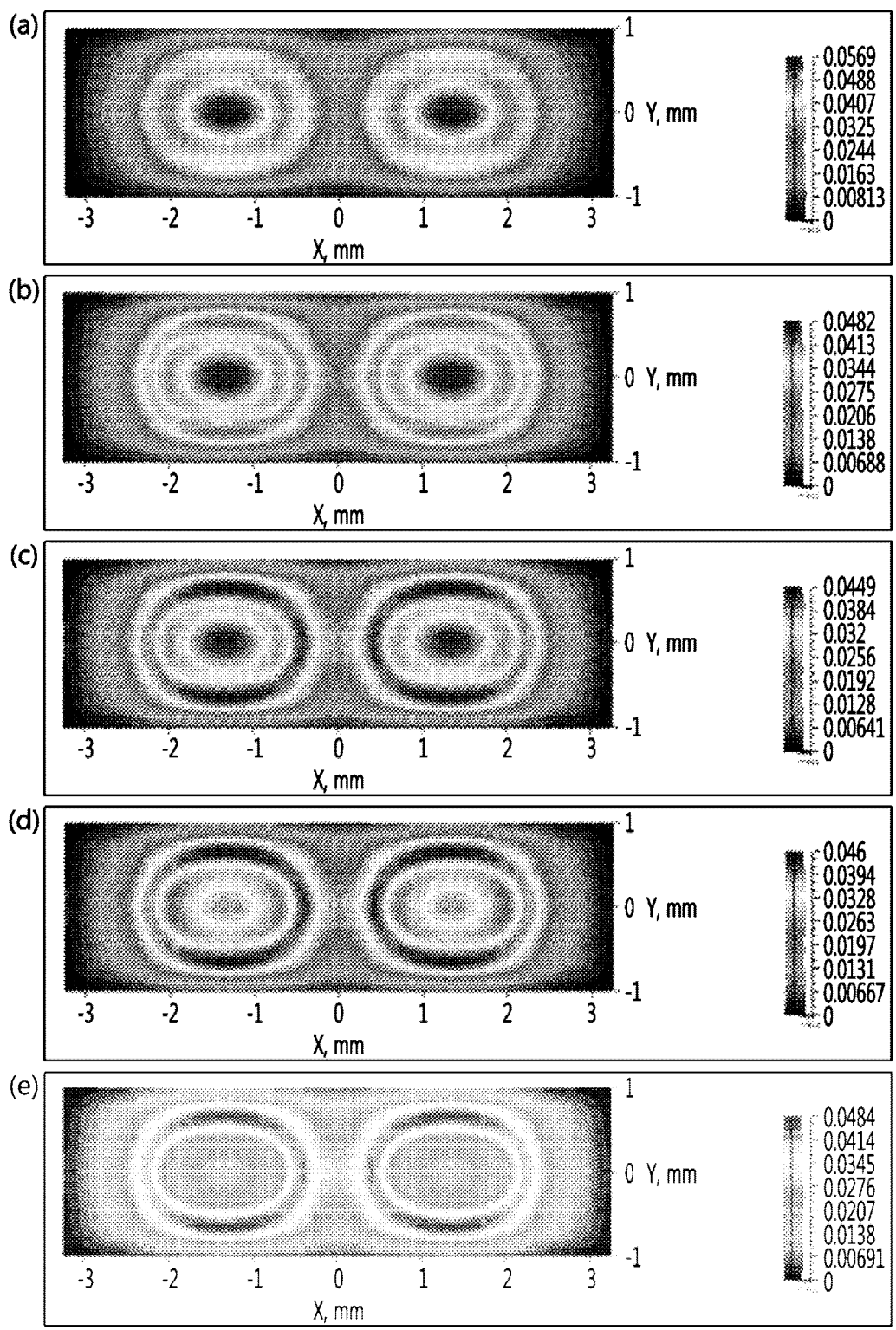

(a) to (e) of FIG. 121 are views illustrating a light energy distribution according to reflectivity of a semi-transmissive mirror in the optical plate of FIG. 119.

Figure 122:
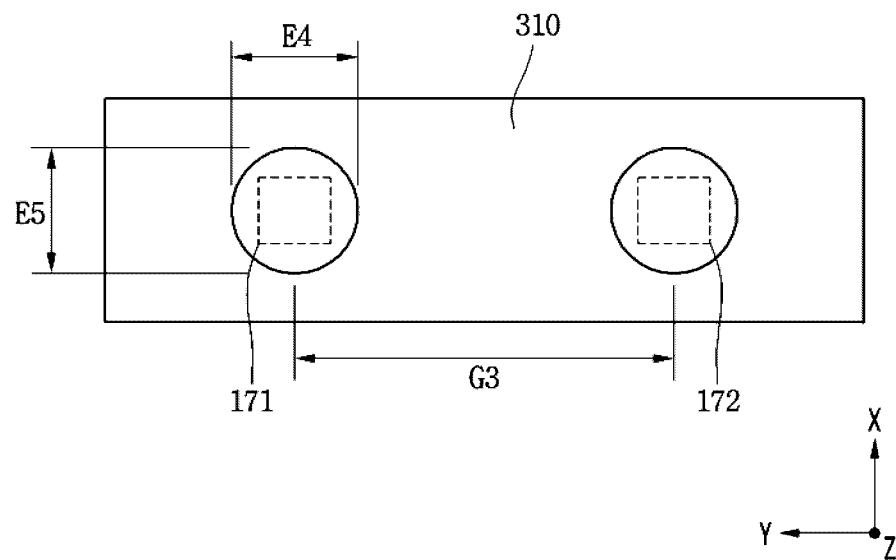

FIG. 122 is a view illustrating an example of a second shape of a semi-transmissive mirror of an optical plate in the fifth and sixth embodiments.

Figure 123:
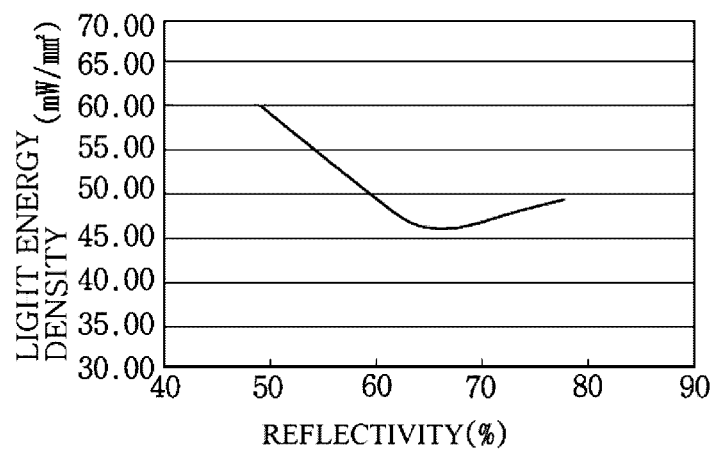

FIG. 123 is a graph showing a light energy density according to reflectivity of a semi-transmissive mirror in the optical plate of FIG. 122.

Figure 124:
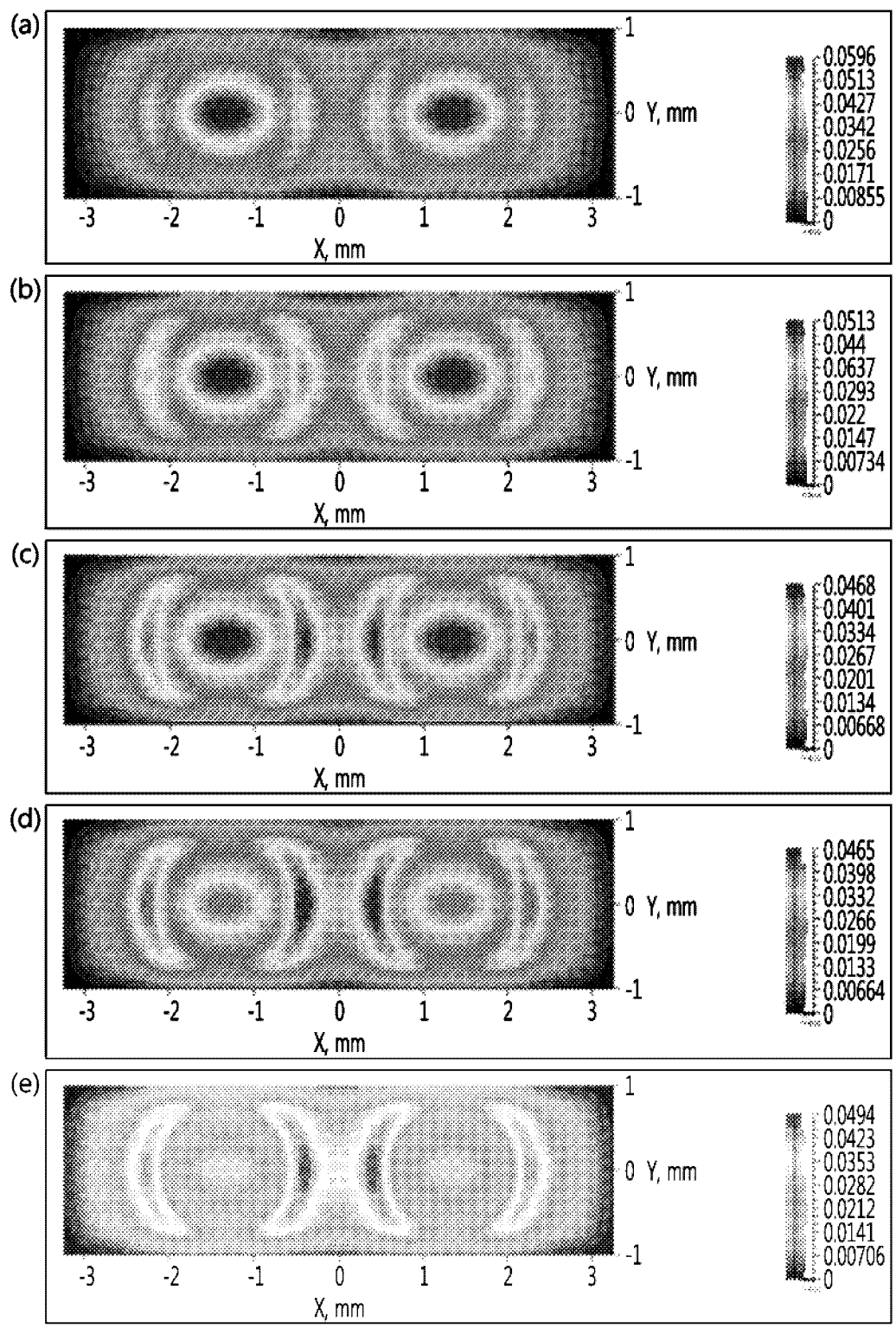

(a) to (e) of FIG. 124 are views illustrating a light energy distribution according to reflectivity of a semi-transmissive mirror in the optical plate of FIG. 122.

Figure 125:
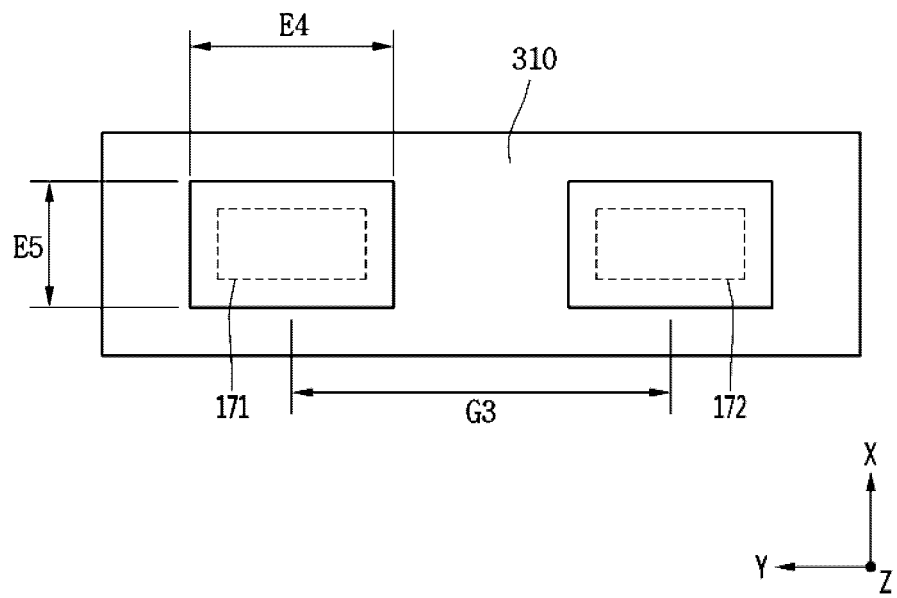

FIG. 125 is a view illustrating an example of a third shape of a semi-transmissive mirror of an optical plate in the fifth and sixth embodiments.

Figure 126:
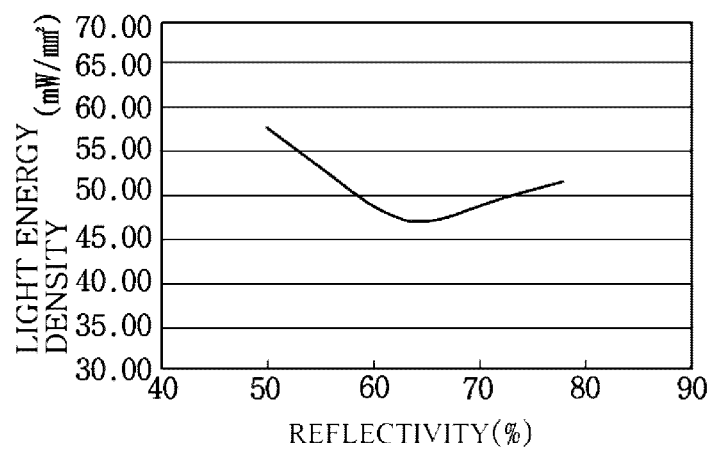

FIG. 126 is a graph showing a light energy density according to reflectivity of a semi-transmissive mirror in the optical plate of FIG. 125.

Figure 127:
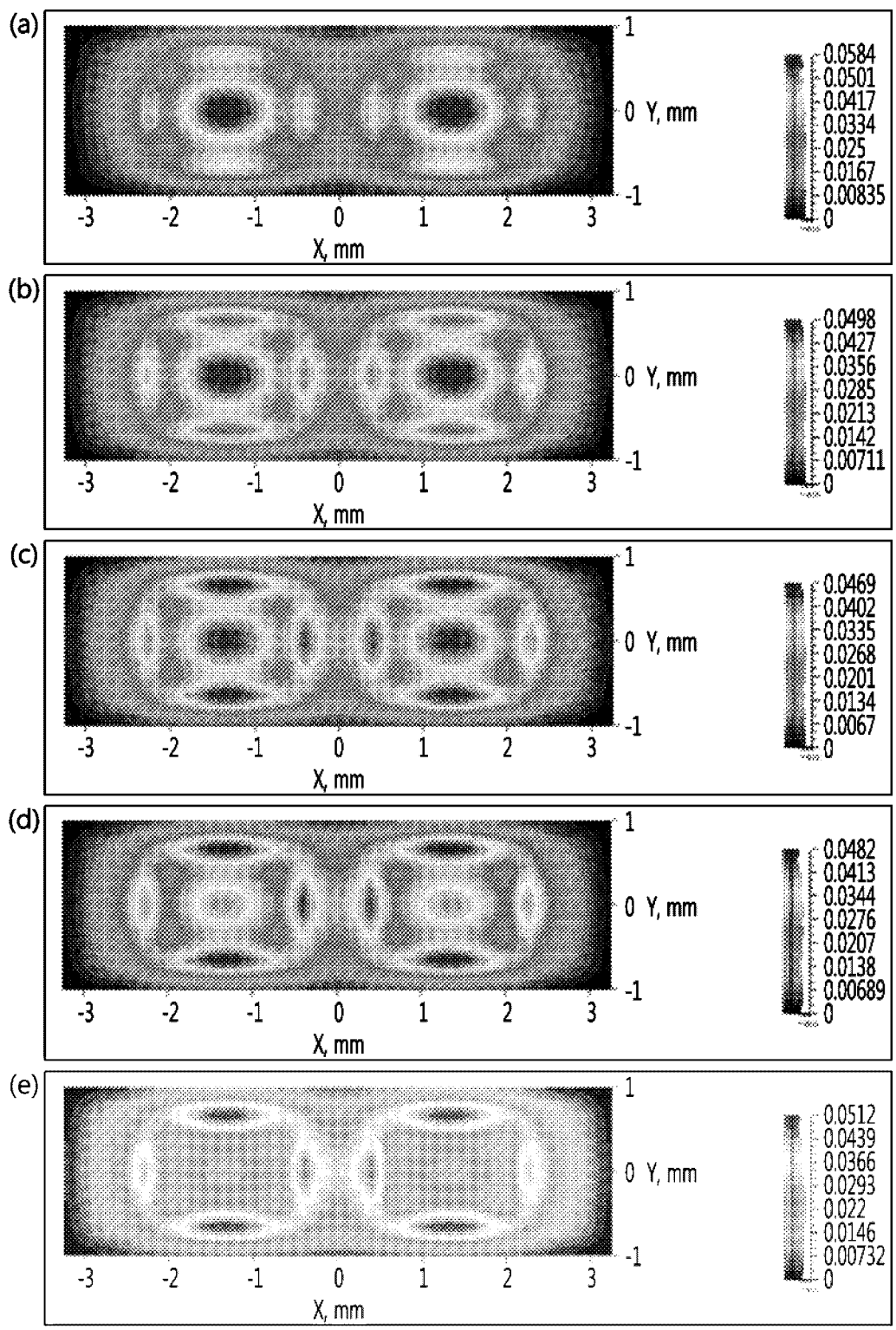

(a) to (e) of FIG. 127 are views illustrating a light energy distribution according to reflectivity of a semi-transmissive mirror in the optical plate of FIG. 125.

Figure 128:
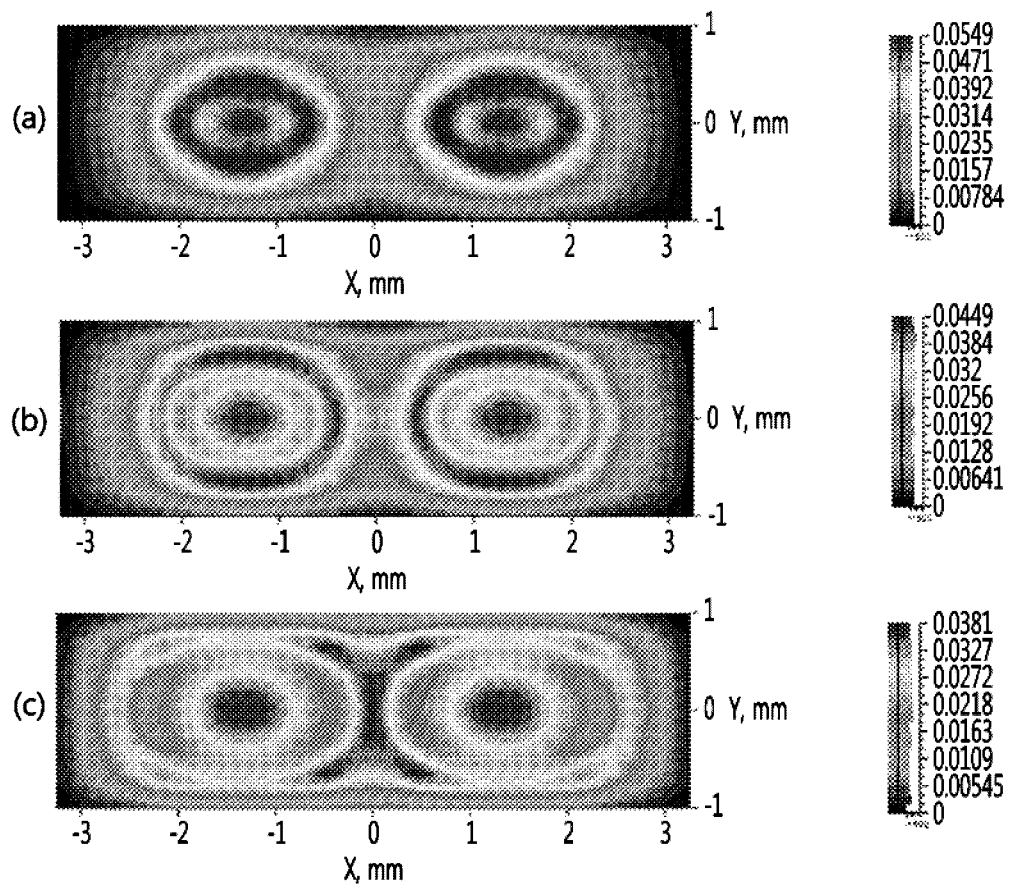

(a) to (c) of FIG. 128 are views illustrating a light energy distribution according to a size of a semi-transmissive mirror in the optical plate according to an embodiment.

Figure 129:
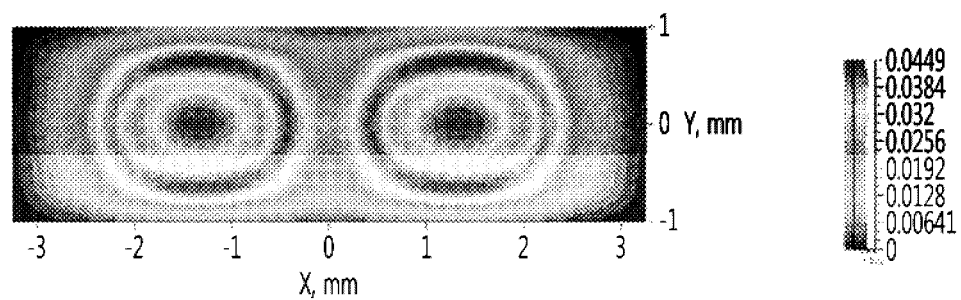

FIG. 129 is a view illustrating a light energy distribution in an optical plate to which the light emitting device of FIG. 95 is applied.

Figure 130:
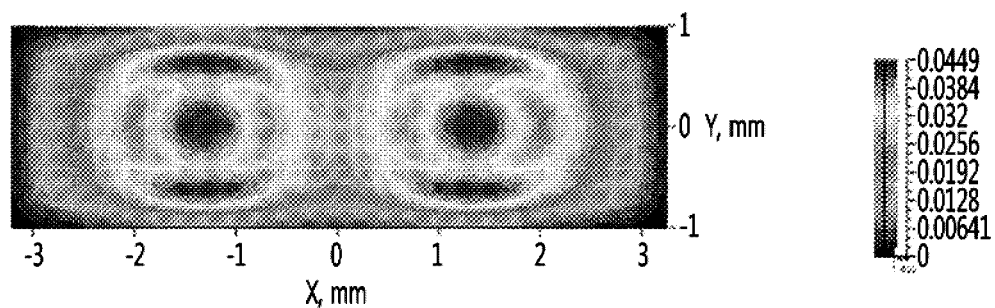

FIG. 130 is a view illustrating a light energy distribution in an optical plate to which the light emitting device of FIG. 101 is applied.

Figure 131:
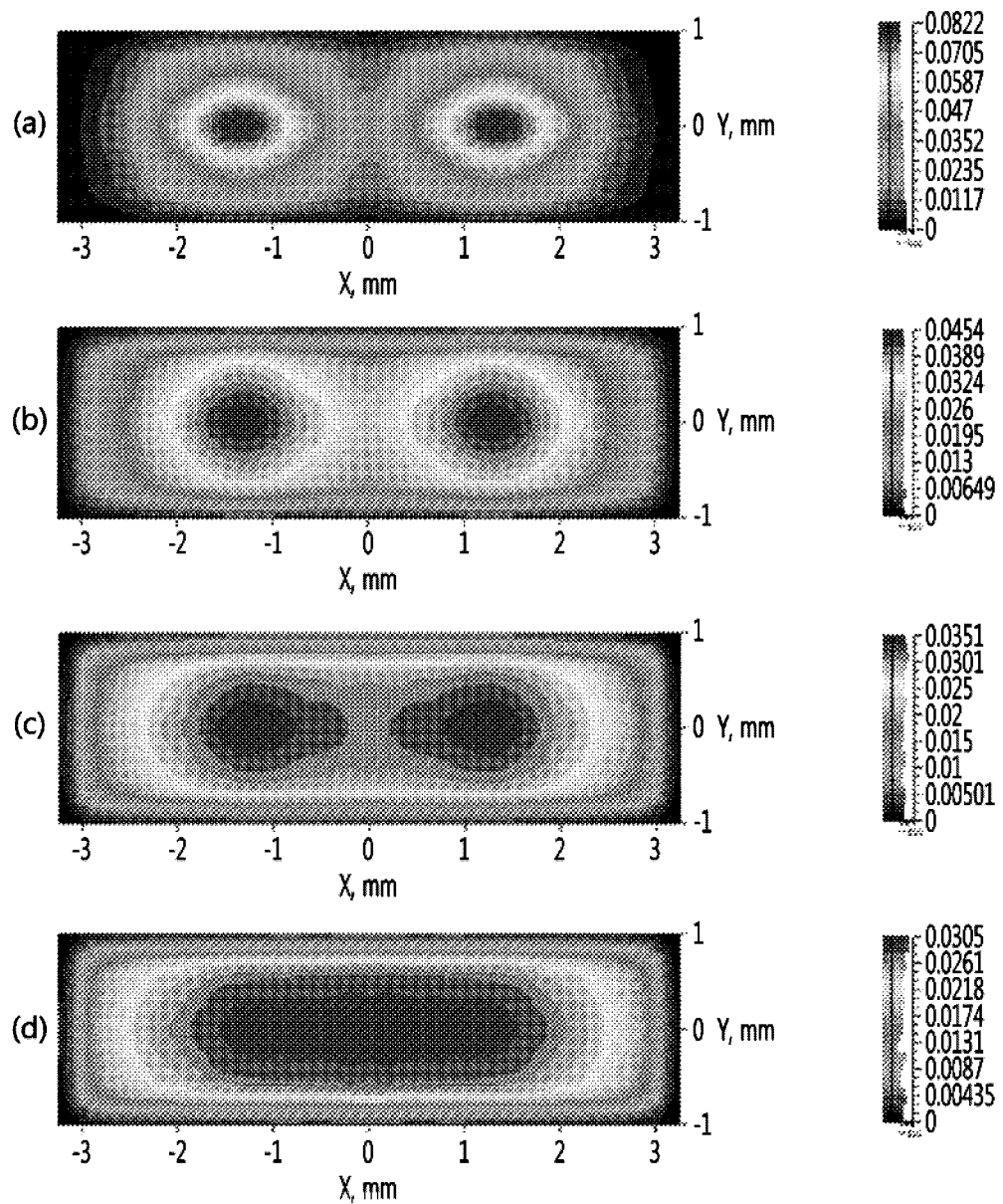

(a) to (d) of FIG. 131 are views illustrating a light energy distribution in an optical plate having no semi-transmissive mirror in a comparative example.

Figure 132:
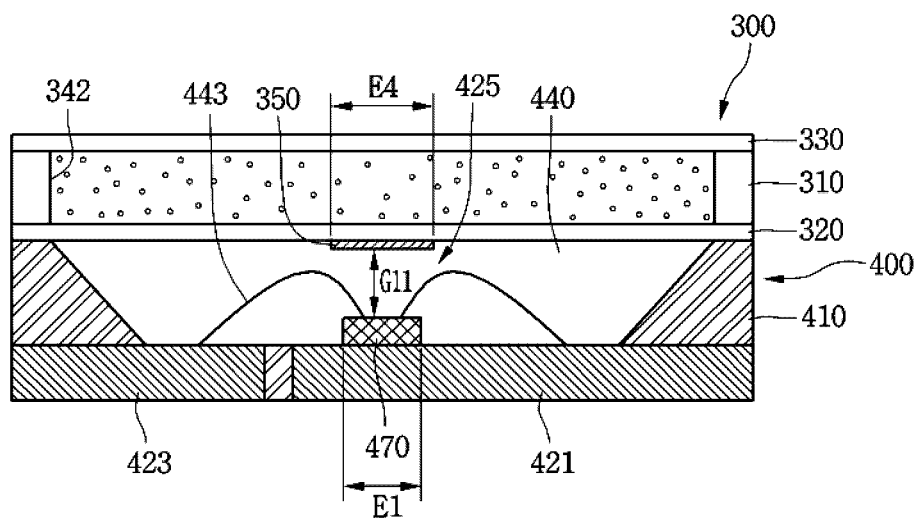

FIG. 132 is a side cross-sectional view of another lighting device according to a modification example of the sixth embodiment.

Figure 133:
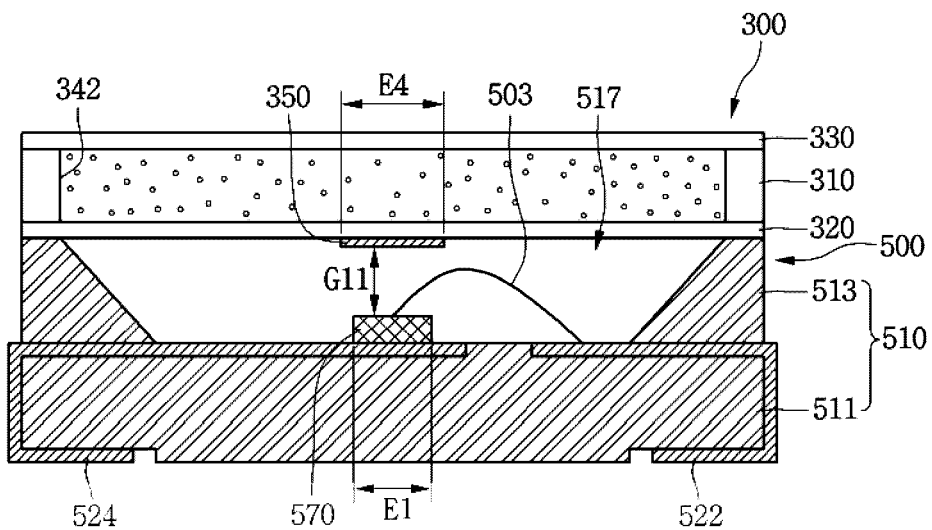

FIG. 133 is a side cross-sectional view of another lighting device according to a modification example of the sixth embodiment.

Figure 134:
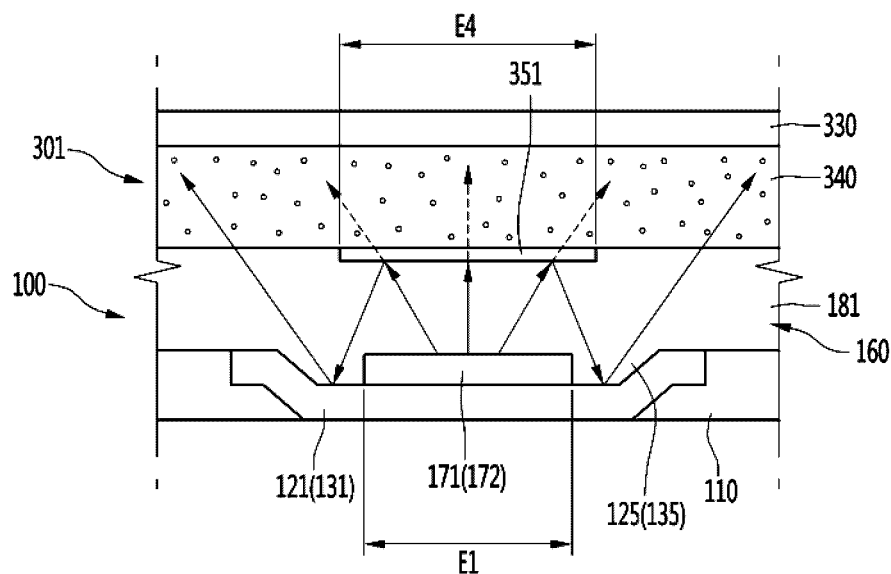

FIG. 134 illustrates an example of a lighting device in which a semi-transmissive mirror is arranged on a phosphor layer, according to a modification example of FIG. 98.

Figure 135:
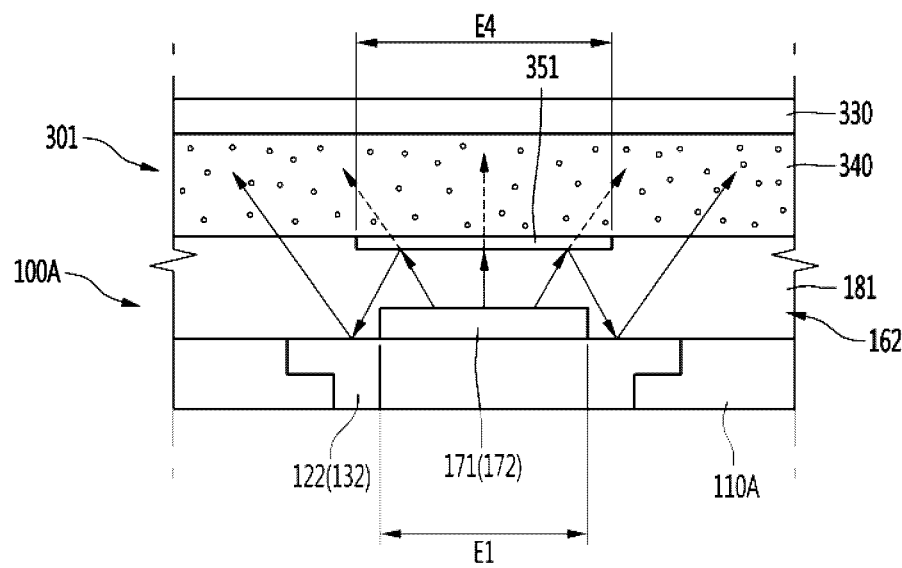

FIG. 135 illustrates another example of a lighting device in which a semi-transmissive mirror is arranged on a phosphor layer, according to a modification example of FIG. 103.

Figure 136:
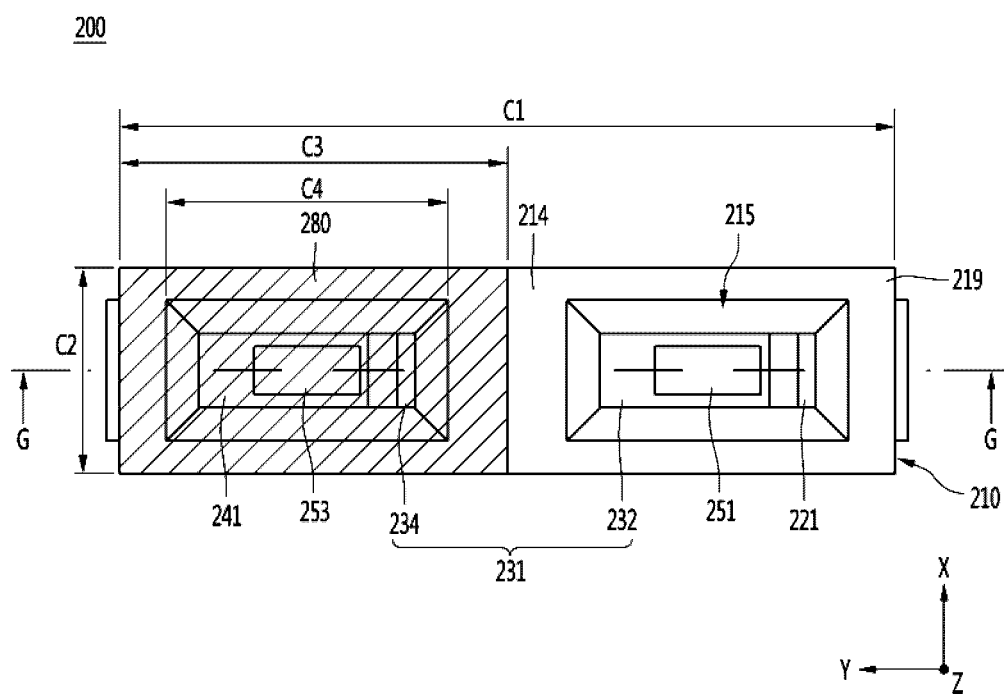

FIG. 136 is a plan view illustrating a light emitting device according to a seventh embodiment.

Figure 137:
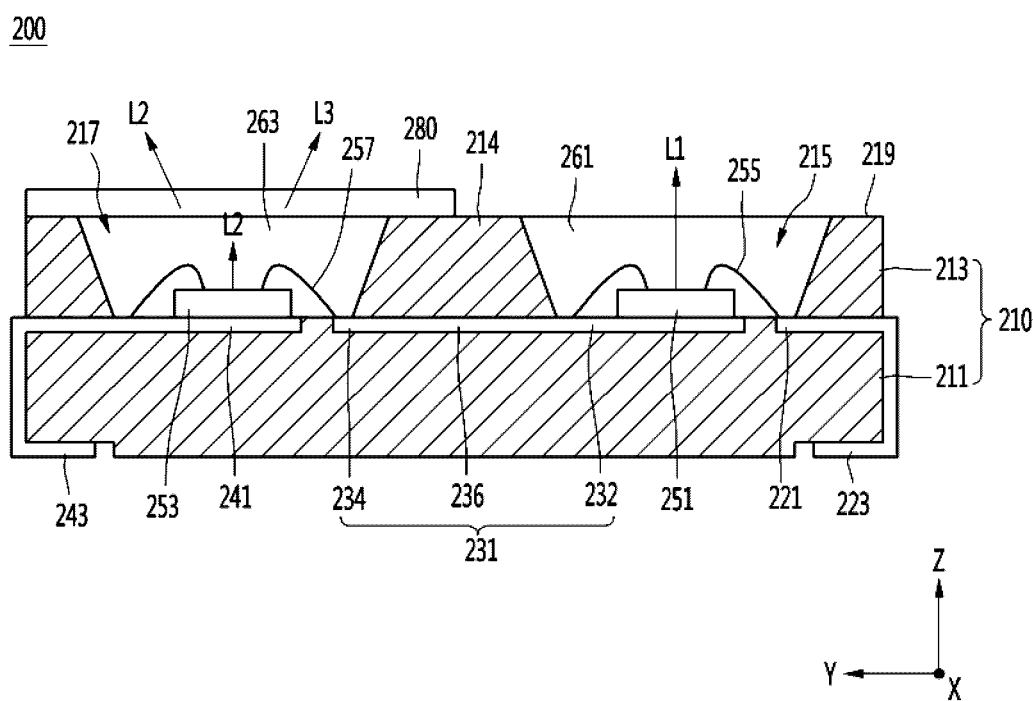

FIG. 137 is a G-G cross-sectional view of the light emitting device of FIG. 136.

Figure 138:
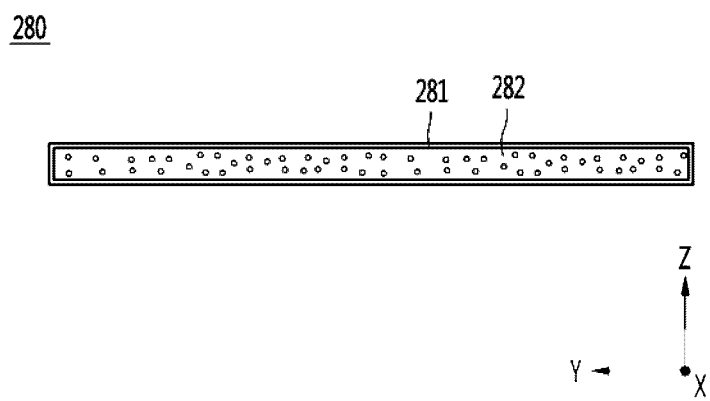

FIG. 138 illustrates an example of a phosphor layer of FIG. 137.

Figure 139:
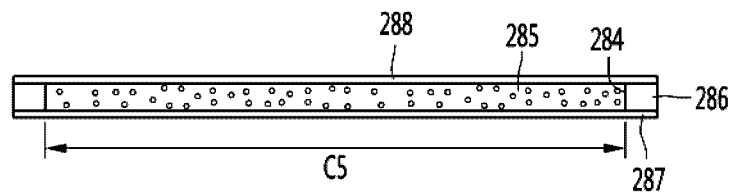
Figure 139:
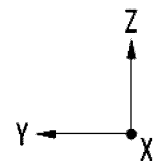

FIG. 139 illustrates another example of a phosphor layer of FIG. 137.

Figure 140:
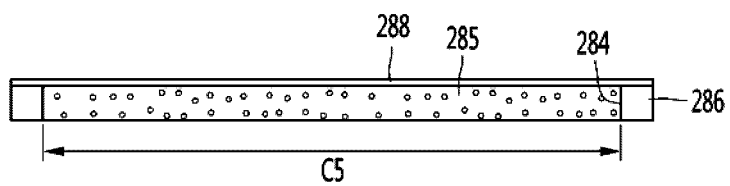
Figure 141:
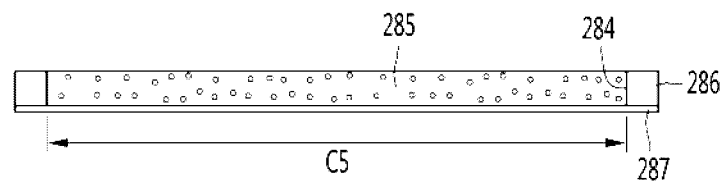

FIGS. 140 and 141 illustrate a modification example of the phosphor layer of FIG. 137.

Figure 142:
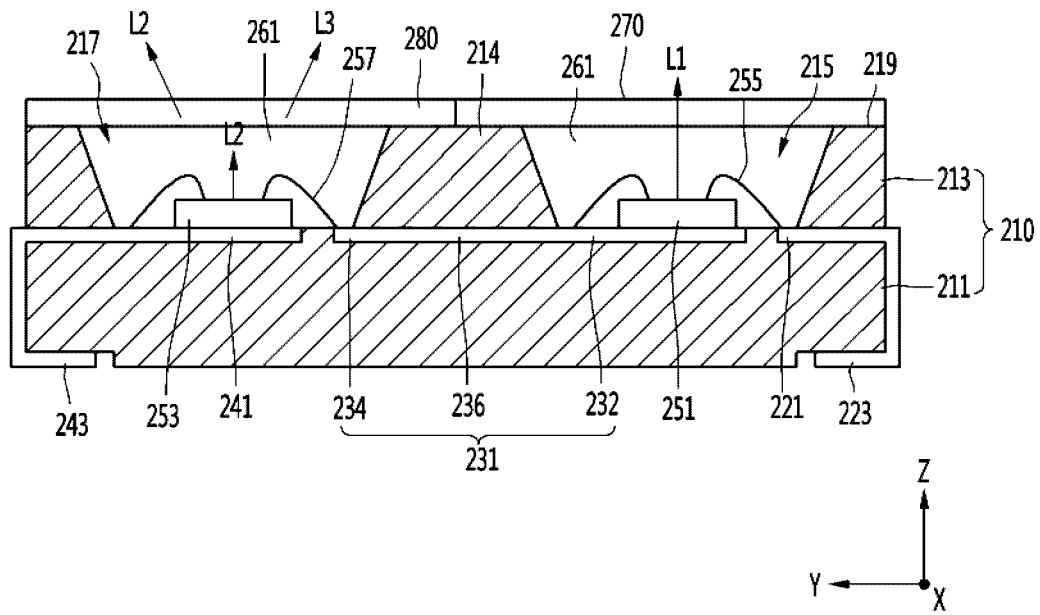

FIG. 142 illustrates a modification example of the light emitting device of FIG. 137.

Figure 143:
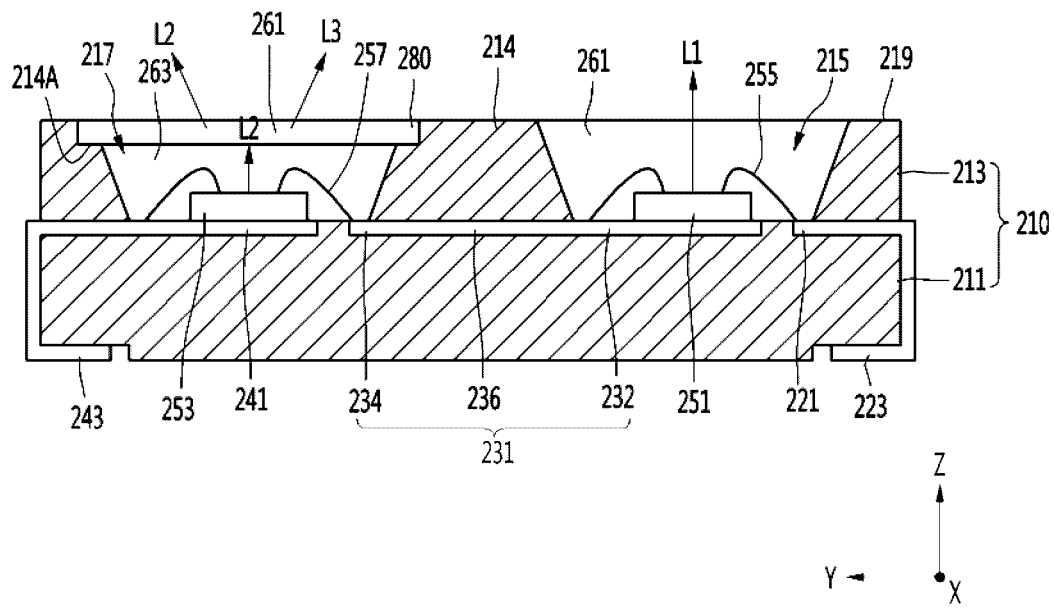

FIG. 143 illustrates a modification example of the light emitting device of FIG. 137.

Figure 144:
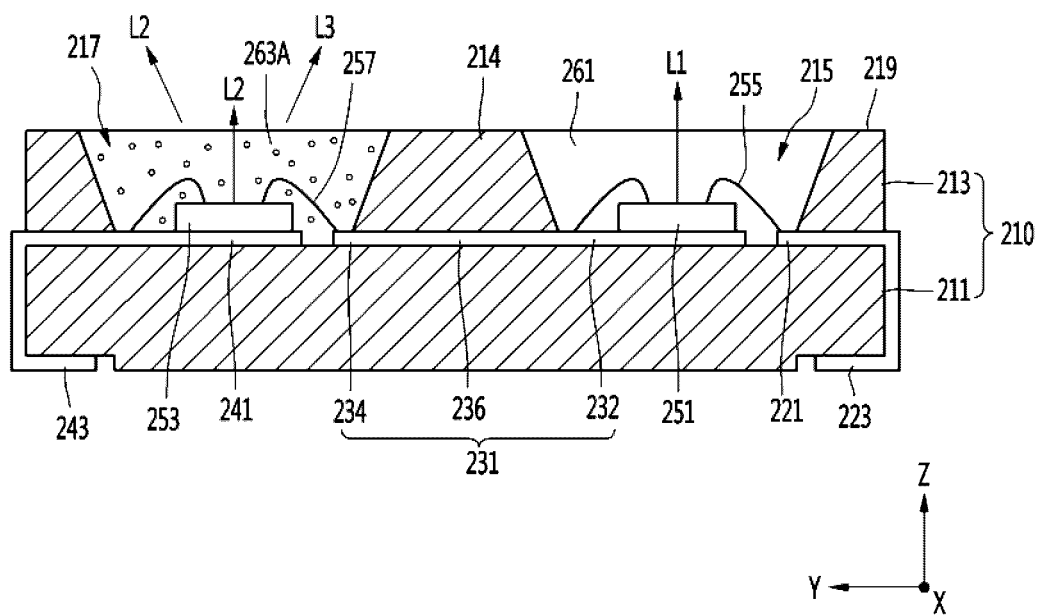

FIG. 144 is a side cross-sectional view of a light emitting device according to a first modification example of the seventh embodiment.

Figure 145:
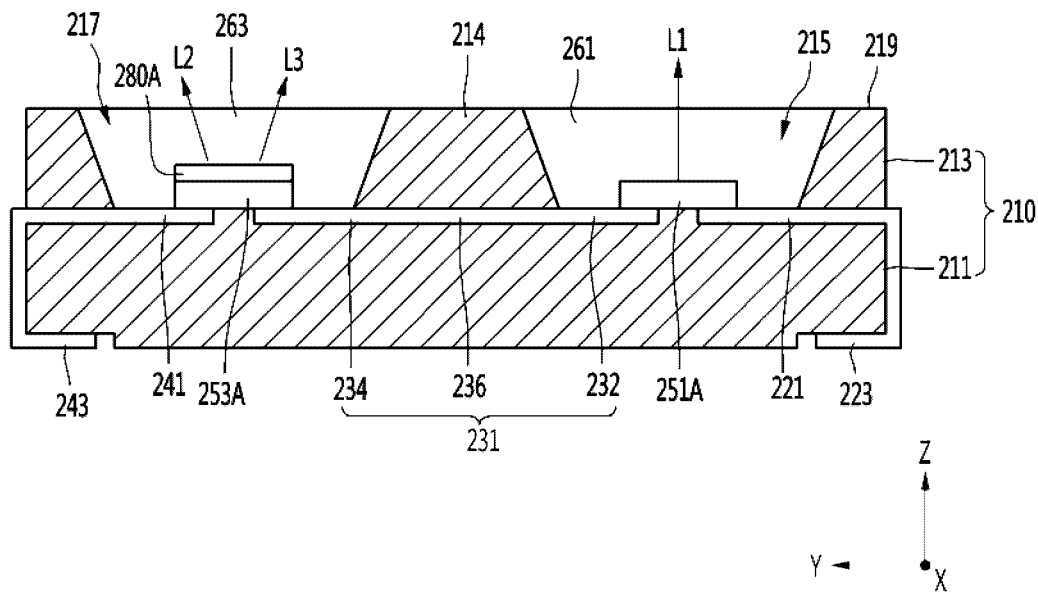

FIG. 145 is a side cross-sectional view of a light emitting device according to a second modification example of the seventh embodiment.

Figure 146:
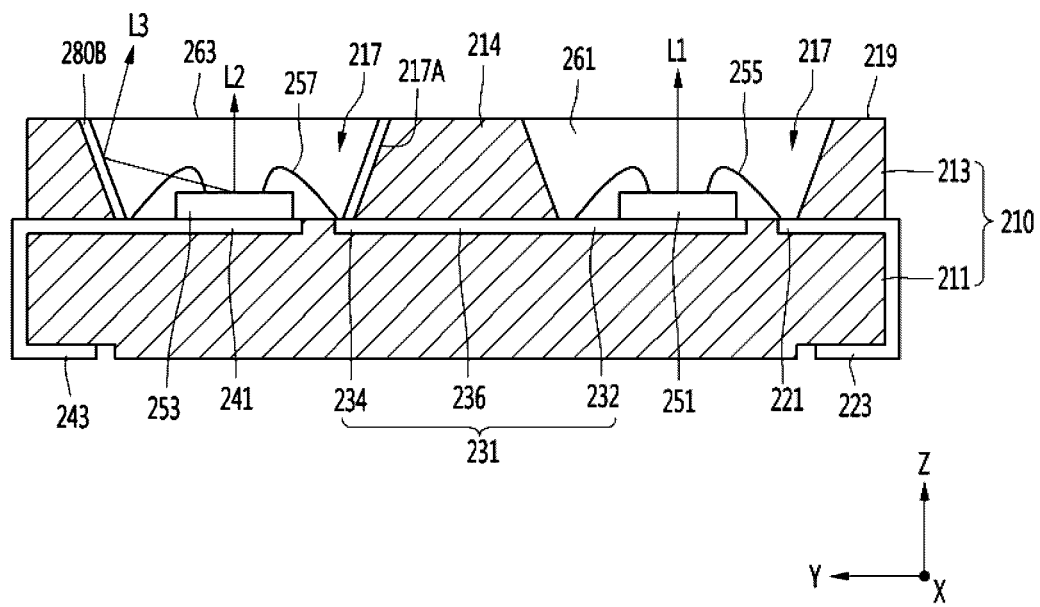

FIG. 146 is a side cross-sectional view of a light emitting device according to a third modification example of the seventh embodiment.

Figure 147:
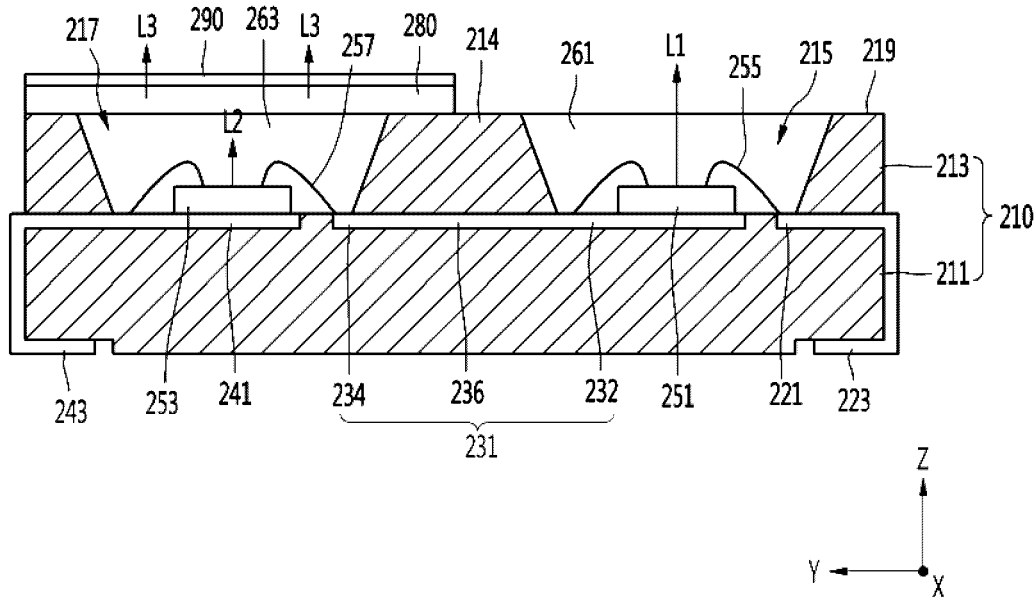

FIG. 147 is a side cross-sectional view of a light emitting device according to a fourth modification example of the seventh embodiment.

Figure 148:
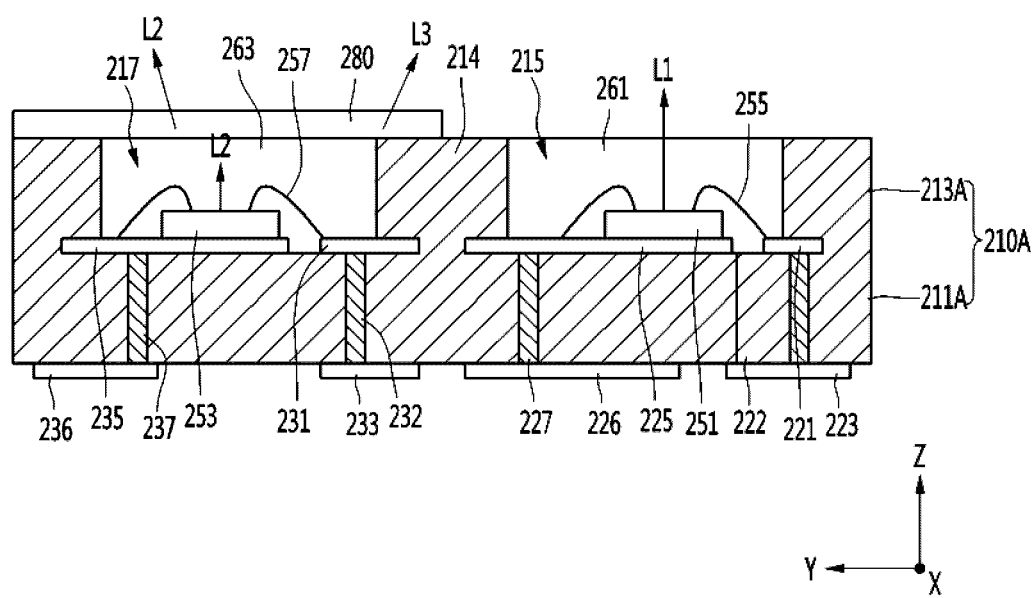

FIG. 148 is a side cross-sectional view of a light emitting device according to a fifth modification example of the seventh embodiment.

Figure 149:
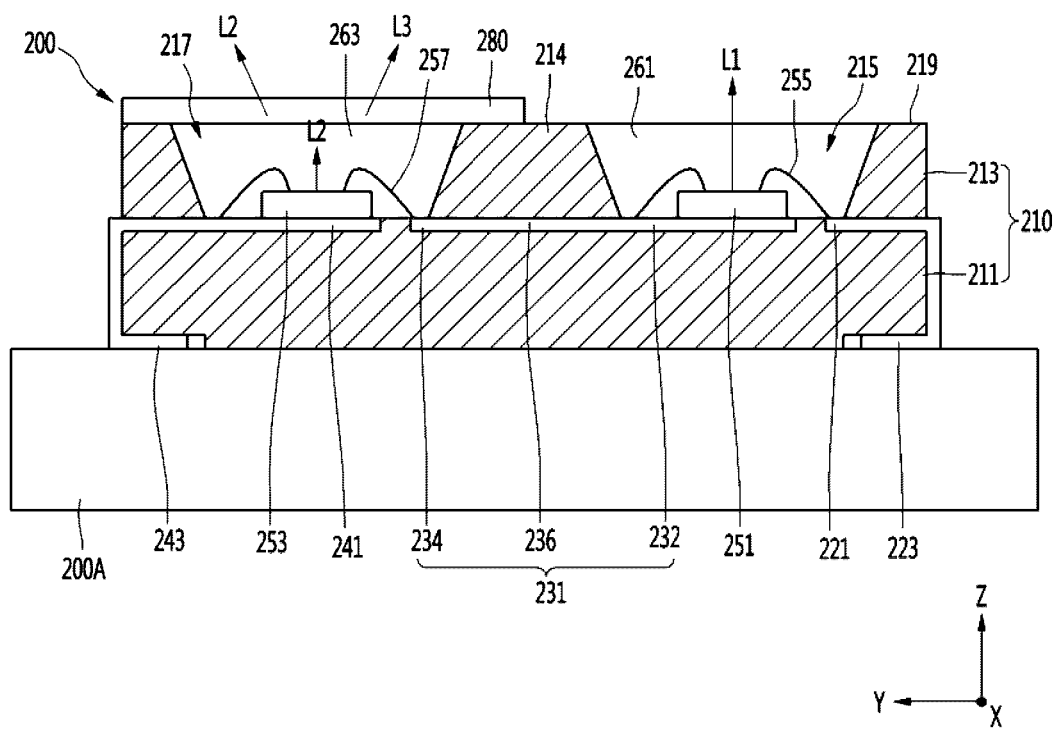

FIG. 149 is a plan view of a light unit including the light emitting device of FIG. 137.

Figure 150:
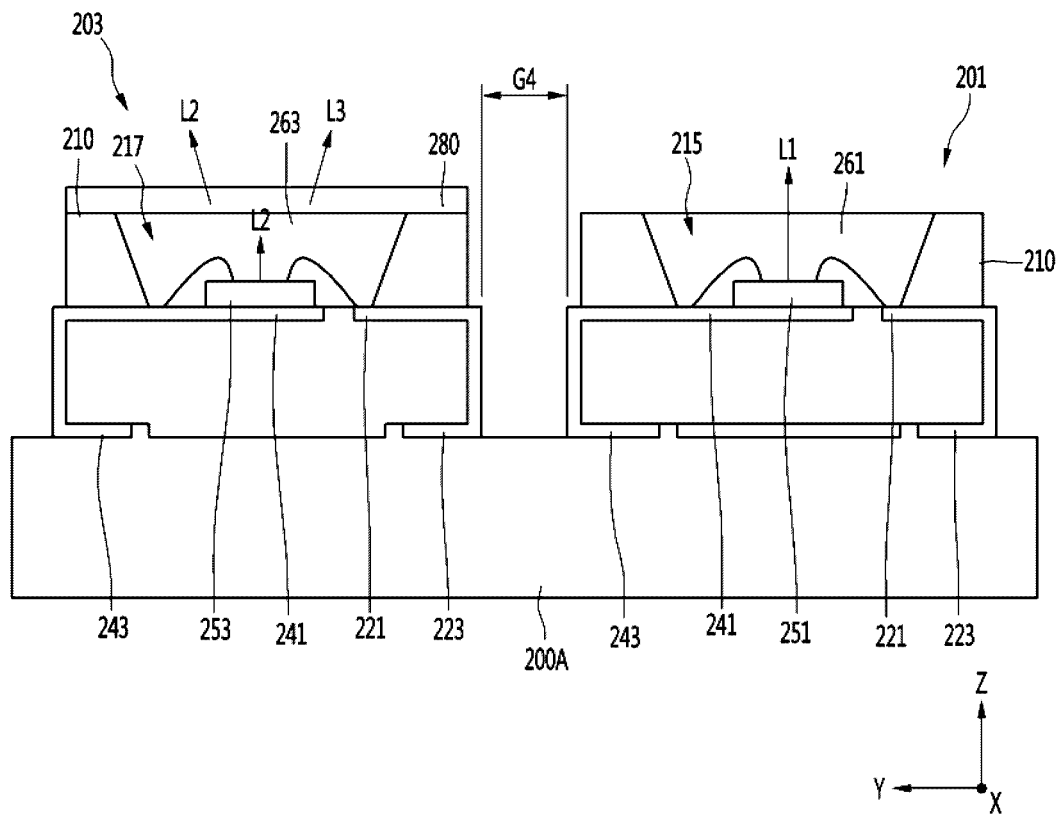

FIG. 150 is a view illustrating a light unit including a plurality of light emitting devices according to a sixth modification example of the seventh embodiment.

Figure 151:
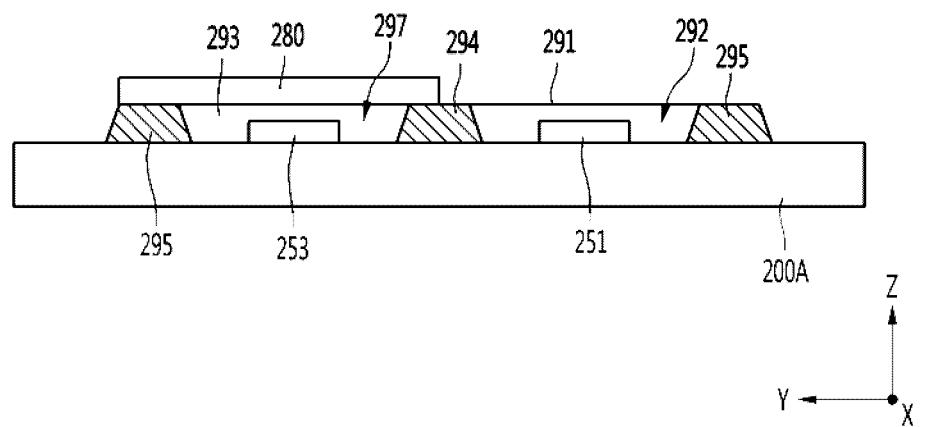

FIG. 151 is a view illustrating a light unit including a light emitting chip according to a seventh modification example of the seventh embodiment.

Figure 152:
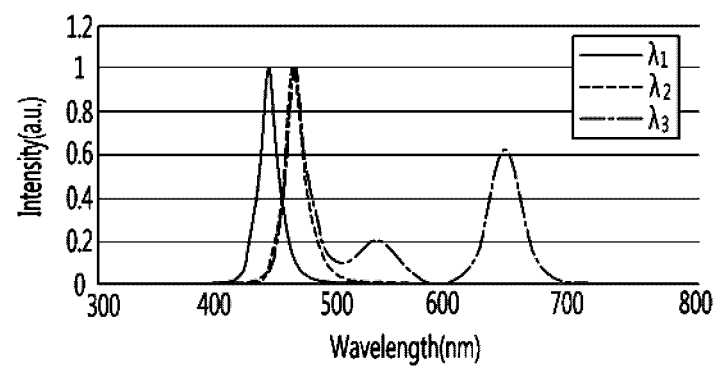

FIG. 152 is a view illustrating a wavelength spectrum emitted from a light emitting device according to the seventh embodiment.

Figure 153:
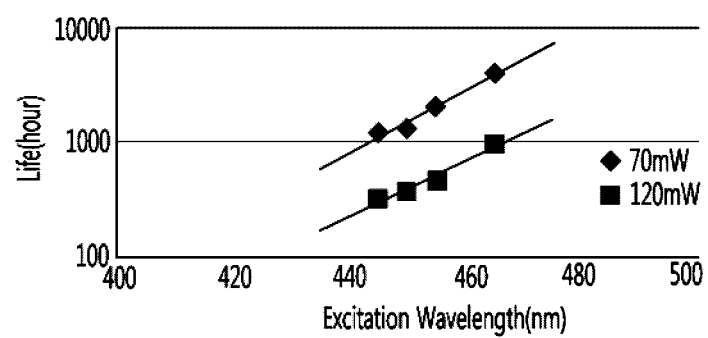

FIG. 153 is a view illustrating the life time of the light emitting chip according to an excitation wavelength of the light emitting chip according to the seventh embodiment.

Figure 154:
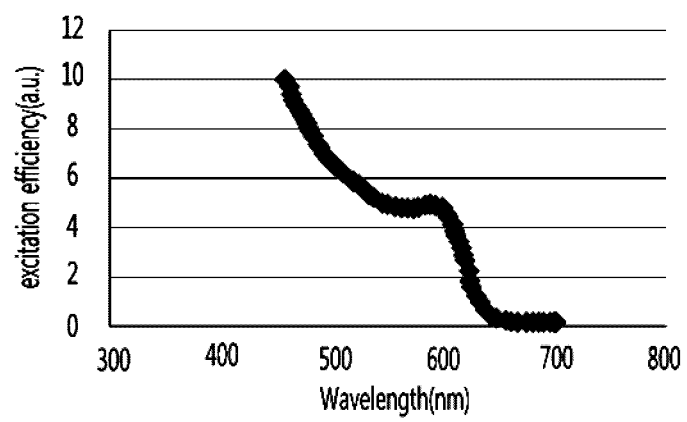

FIG. 154 is a graph showing excitation efficiency according to the peak wavelength according to the seventh embodiment.

Figure 155:
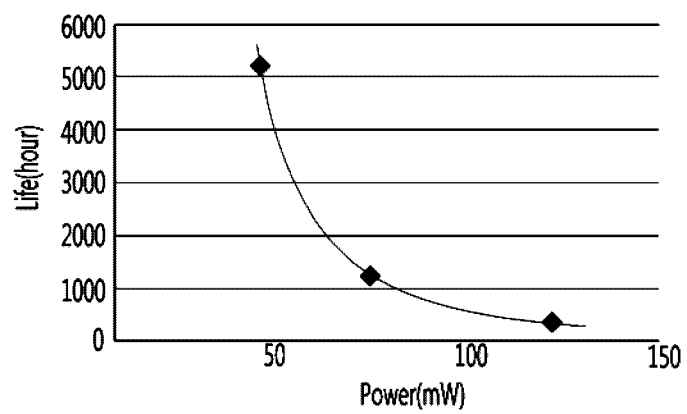

FIG. 155 is a graph showing the life time according to the output power of the light emitting chip according to the seventh embodiment.

Figure 156:
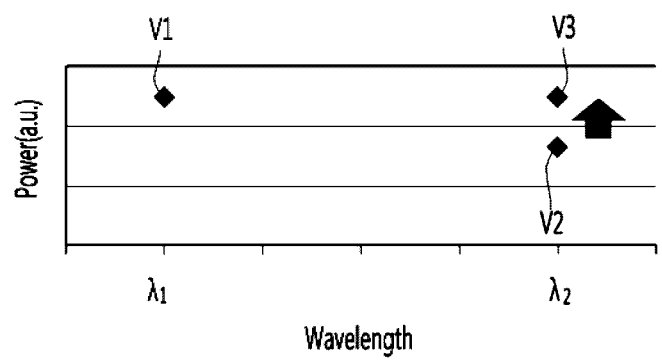

FIG. 156 is a view illustrating a comparison between the peak wavelength and the output power of the light emitting chip in a comparative example of the seventh embodiment.

Figure 157:
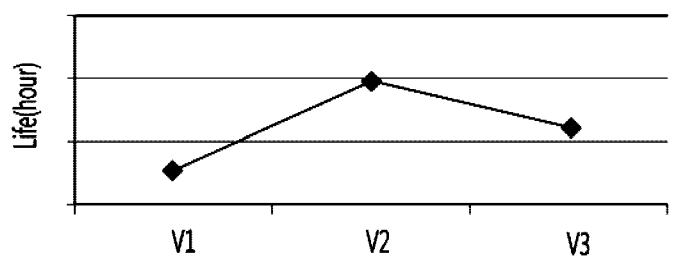

FIG. 157 is a view illustrating a comparison of the life time according to the light emitting chip of FIG. 156.

Figure 158:
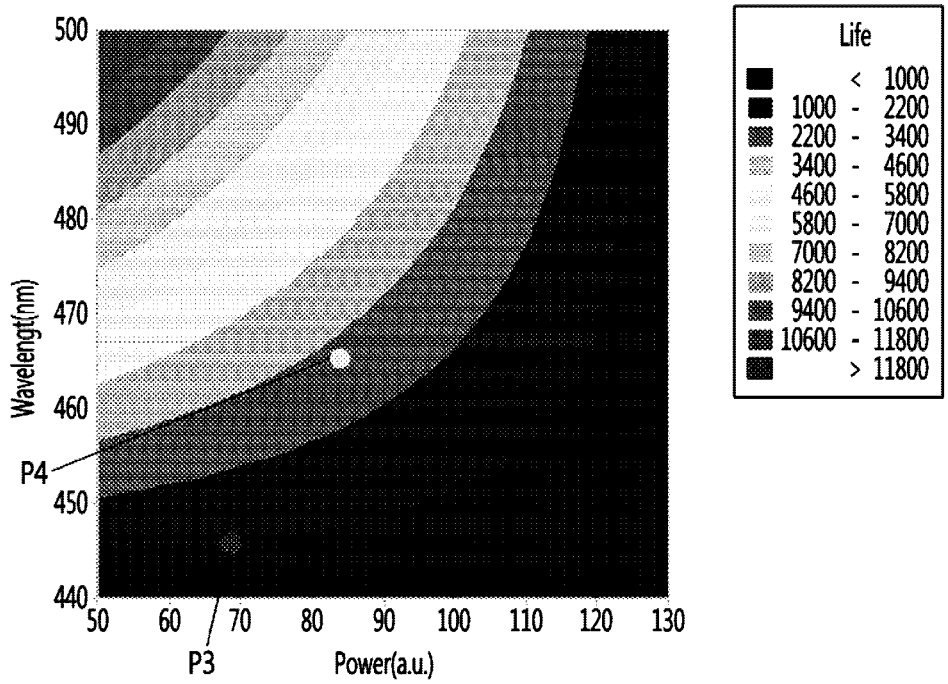

FIG. 158 is a view illustrating a comparison between the output power and the peak wavelength of the light emitting chip in the seventh embodiment.

Figure 159:
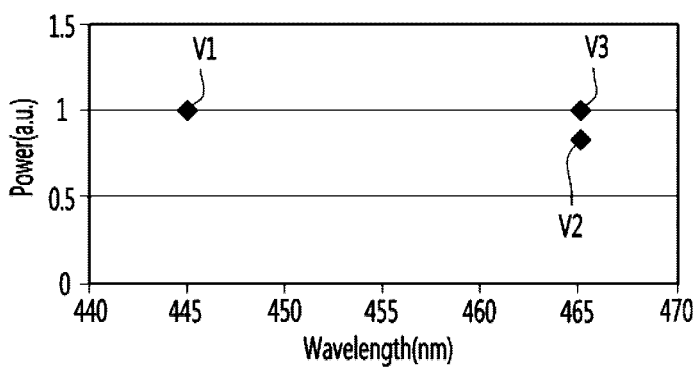

FIG. 159 is a view illustrating the light emitting chip and the output power in the light emitting device according to the seventh embodiment.

Figure 160:
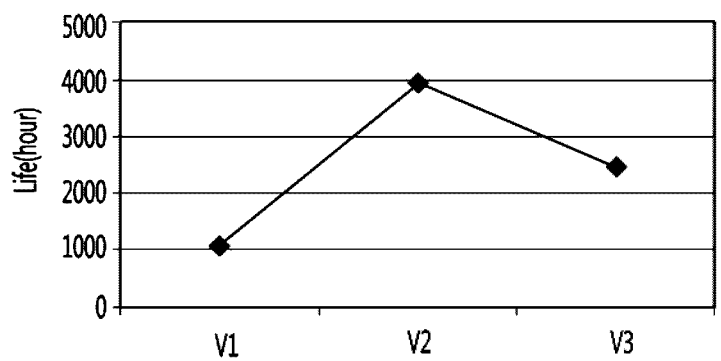

FIG. 160 is a view illustrating a comparison of the life time according to the light emitting chip of FIG. 159.

FIGS. 161 to 164 are top views for describing the arrangement type and size of the light emitting chip of the light emitting device arranged below the optical plate according to another example of the seventh embodiment.

Figure 165:
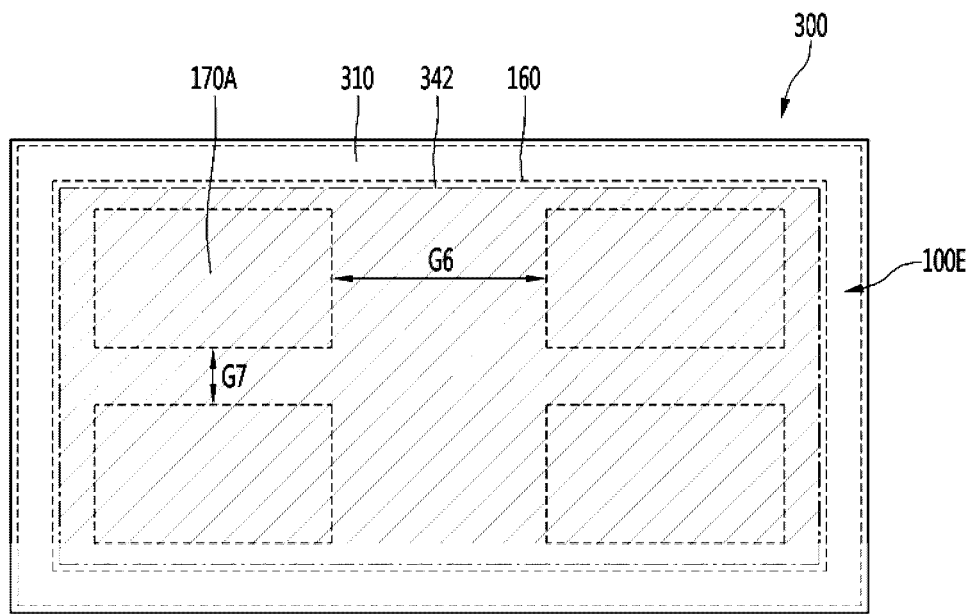

FIG. 165 illustrates a case where three or more light emitting chips are arranged in the light emitting device according to another example of the seventh embodiment.

Figure 166:
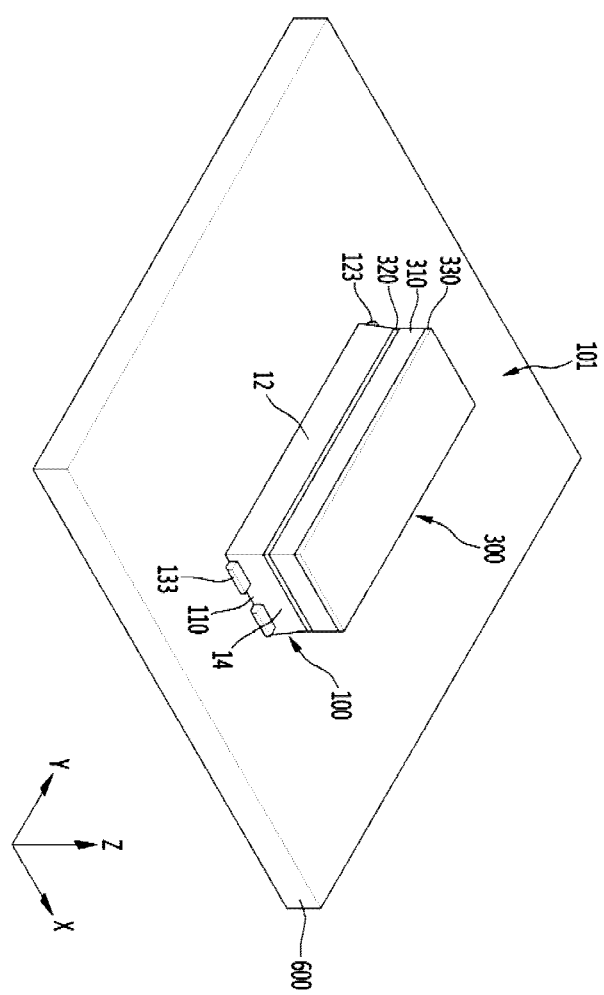

FIG. 166 is a perspective view of a light source module in which a lighting device is arranged on a circuit substrate according to an embodiment.

Figure 167:
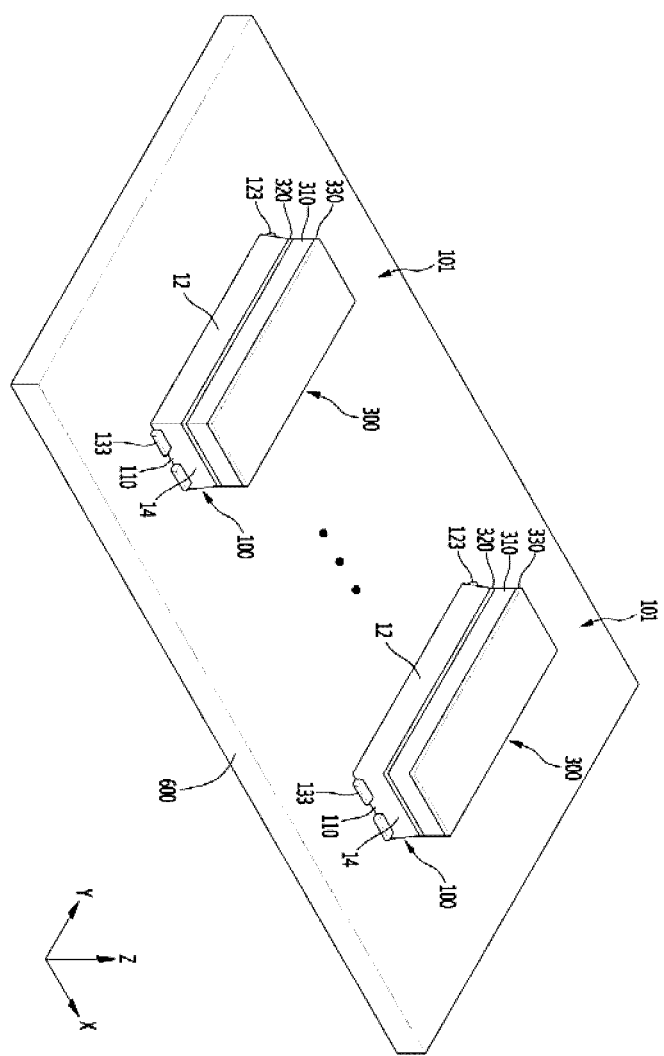

FIG. 167 is a perspective view of a light source module in which a plurality of lighting devices are arranged on a circuit substrate according to an embodiment.

Figure 168:
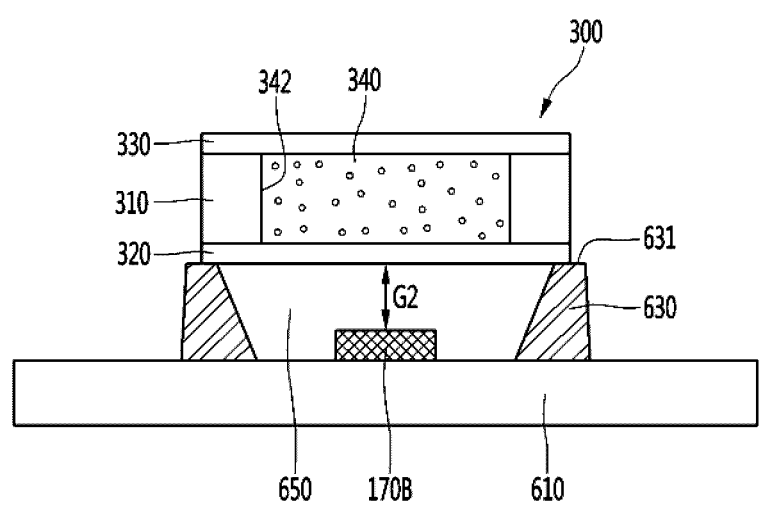
Figure 169:
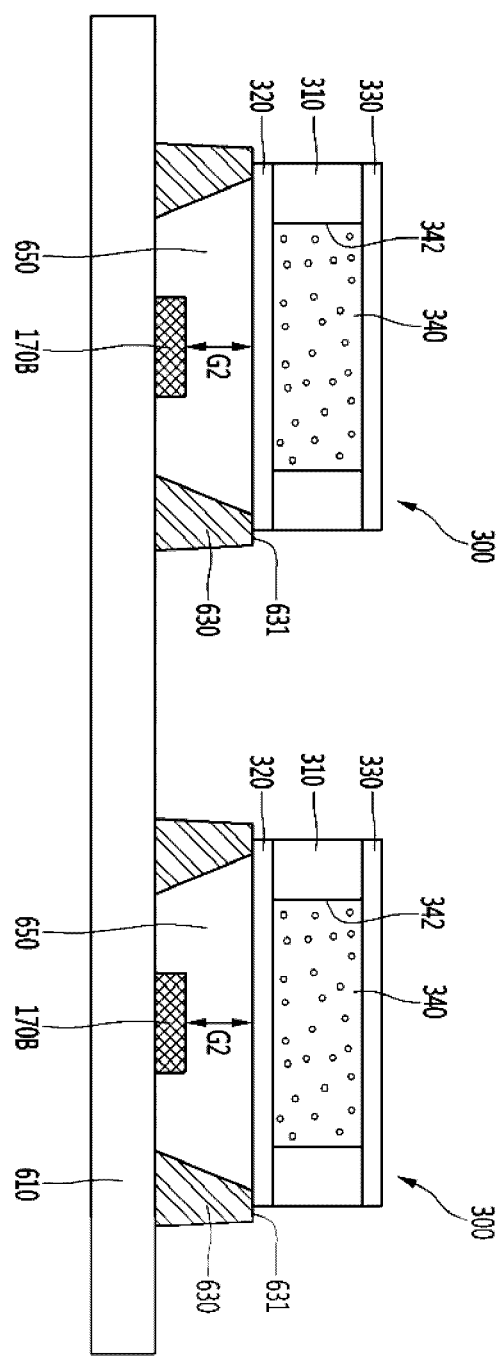
Figure 170:
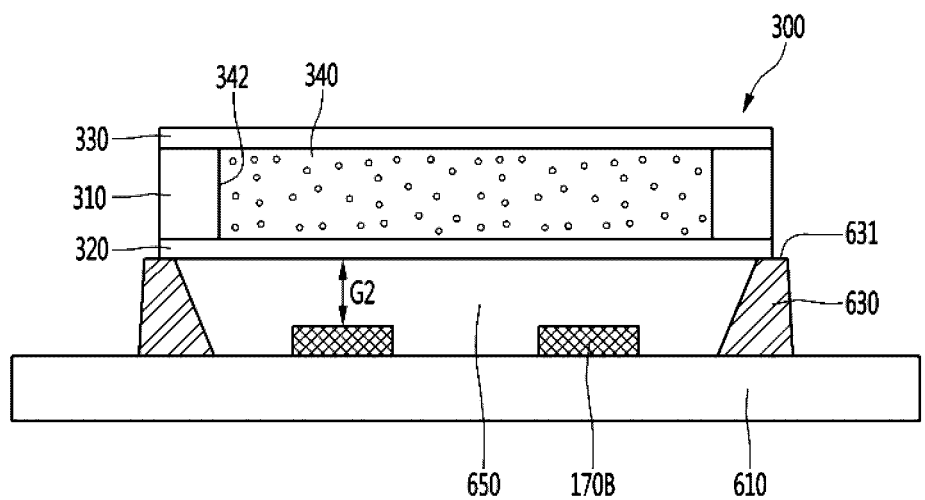

FIGS. 168 to 170 illustrate an example in which a light emitting chip and an optical plate are arranged on a circuit substrate in a modification example of the seventh embodiment.

Figure 171:
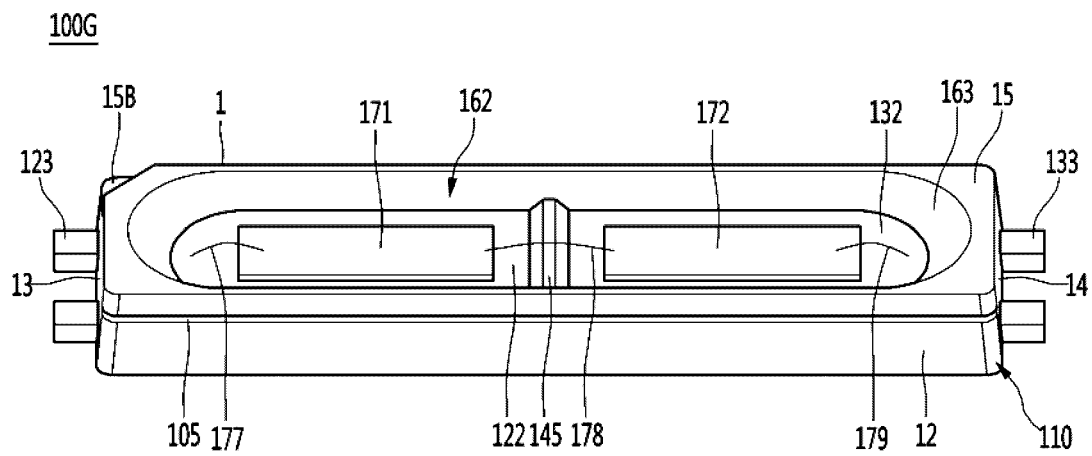

FIG. 171 is a perspective view of a light emitting device according to an eighth embodiment.

Figure 172:
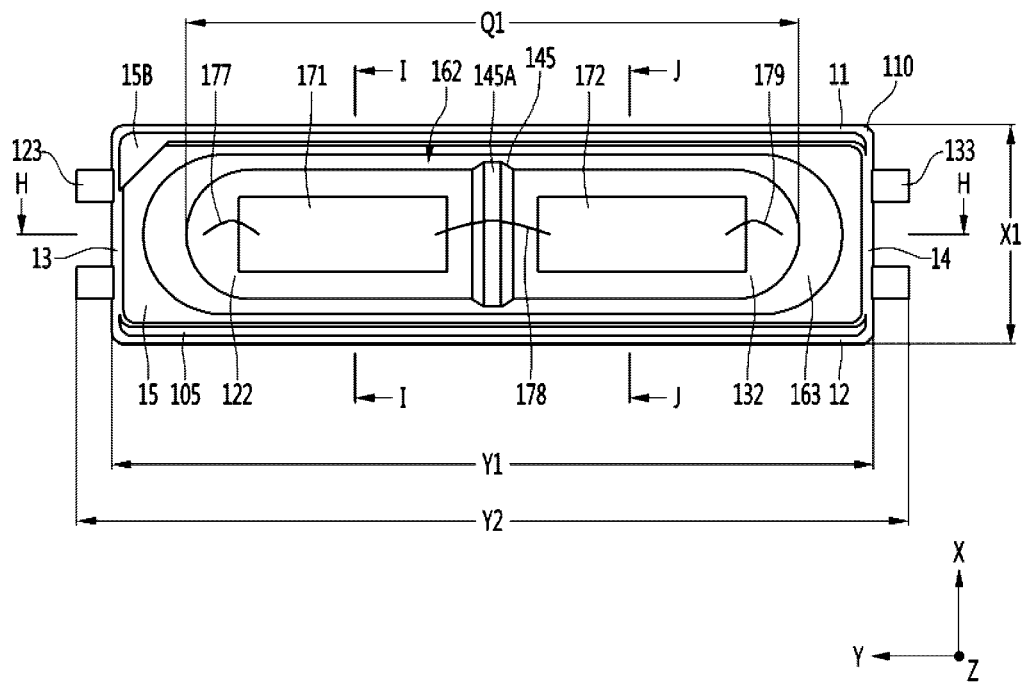

FIG. 172 is a plan view of the light emitting device of FIG. 171.

Figure 173:
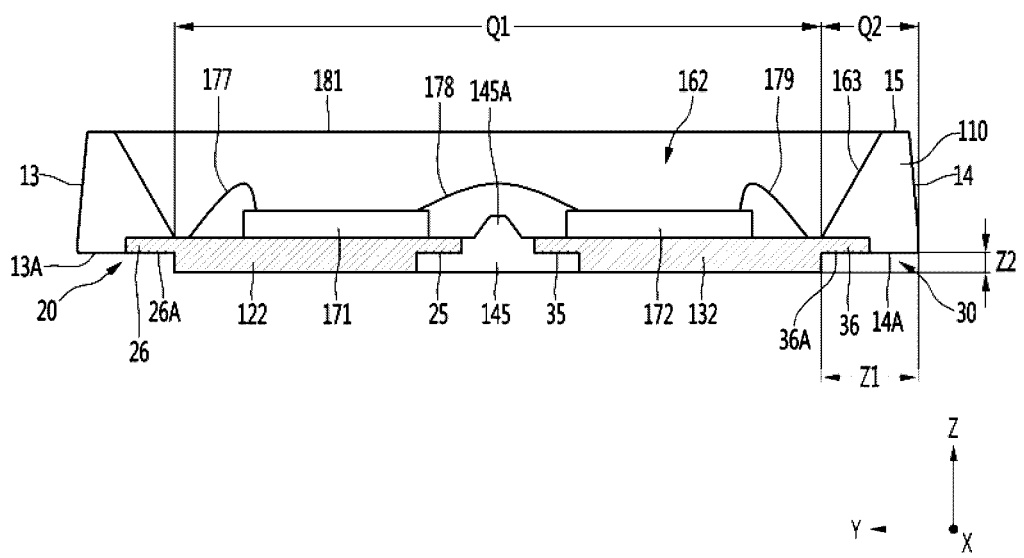

FIG. 173 is an H-H cross-sectional view of the light emitting device of FIG. 172.

Figure 174:
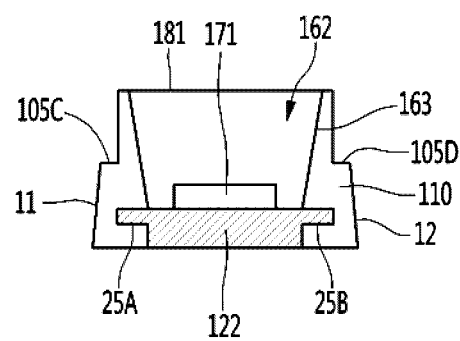

FIG. 174 is an I-I cross-sectional view of the light emitting device of FIG. 172.

Figure 175:
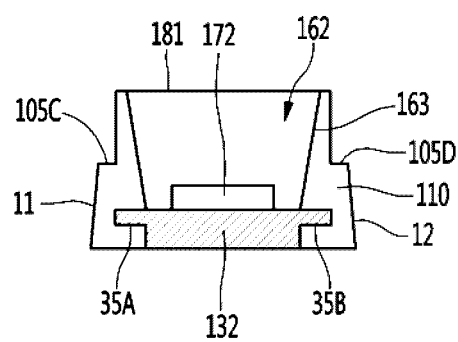

FIG. 175 is a J-J cross-sectional view of the light emitting device of FIG. 172.

Figure 176:
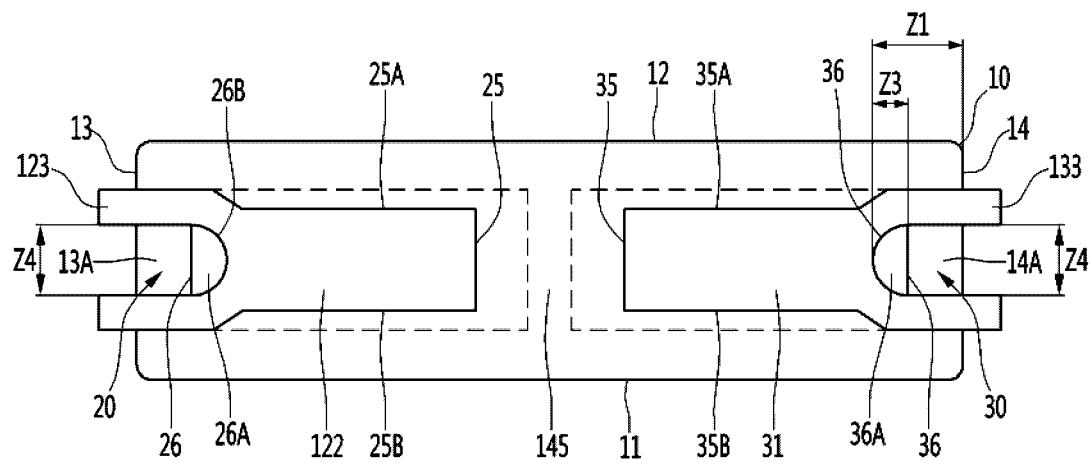

FIG. 176 is a bottom view of the light emitting device of FIG. 172.

Figure 177:
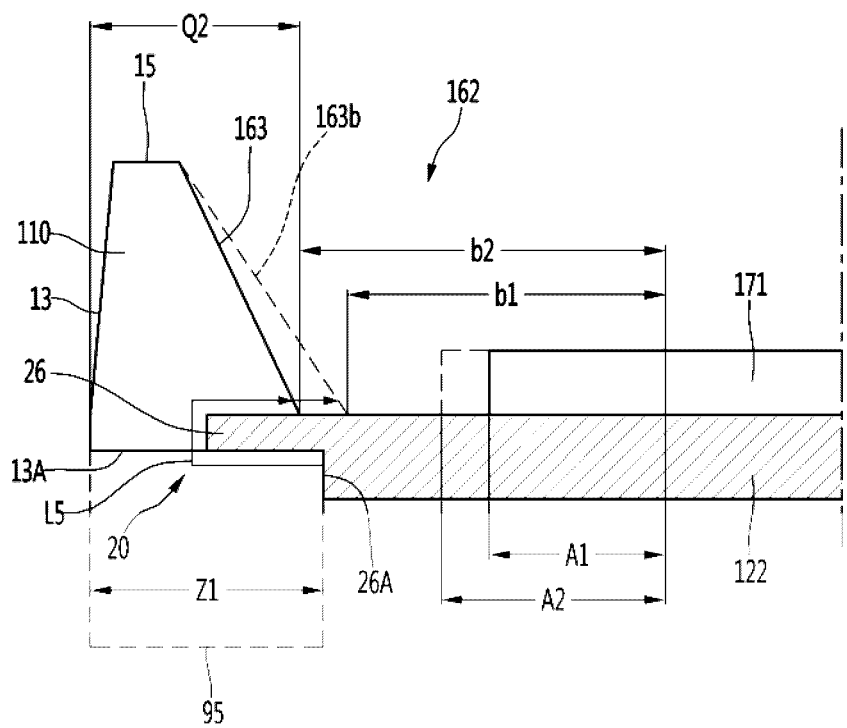

FIG. 177 is a partial enlarged view illustrating an assembly example of a lead frame and a body of FIG. 173.

Figure 178:
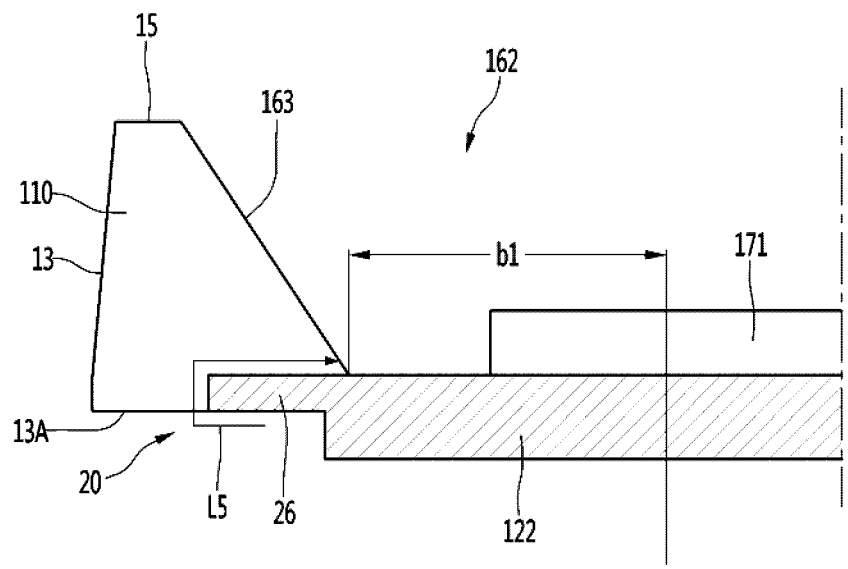
Figure 179:
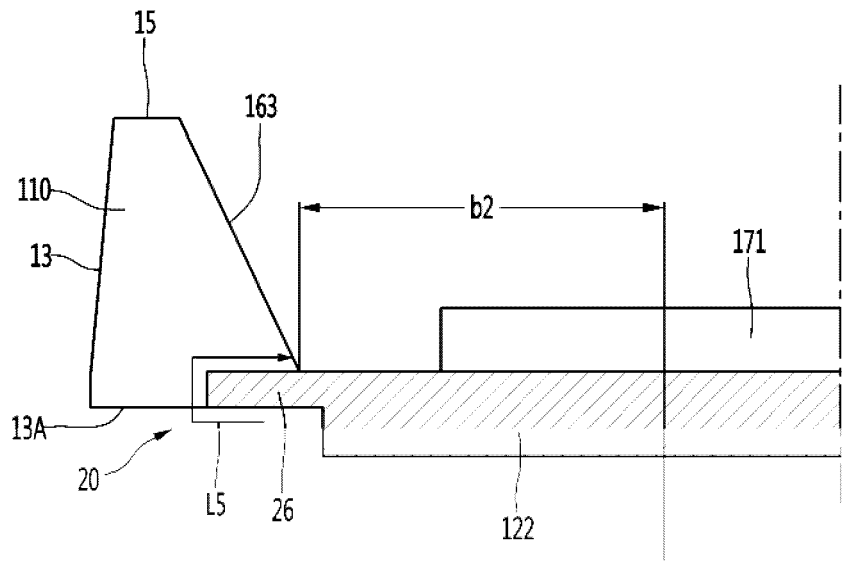

FIGS. 178 and 179 are views illustrating a comparison of size between a lead frame and a light emitting chip according to a lateral position of a cavity of a body of FIG. 173.

Figure 180:
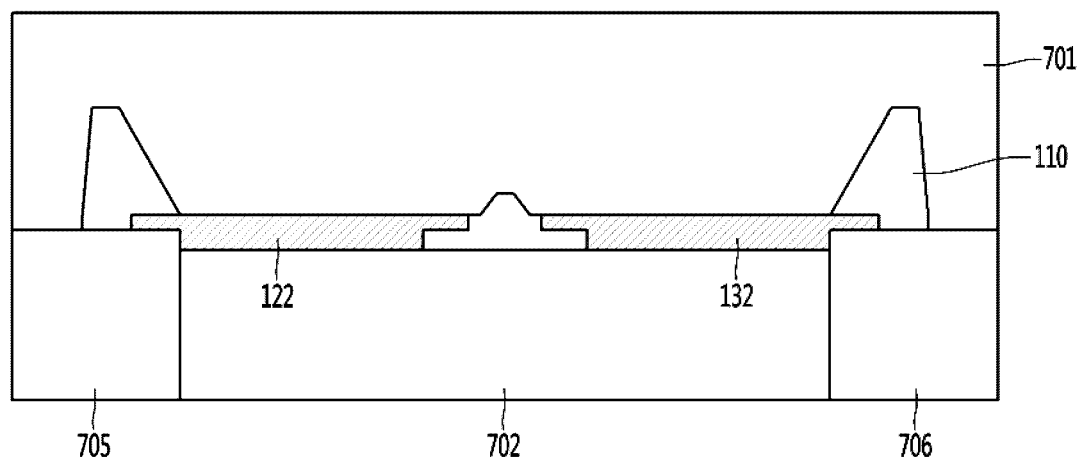

FIG. 180 is a view for describing a process of forming a body on a lead frame of a light emitting device according to the eighth embodiment.

Figure 181:
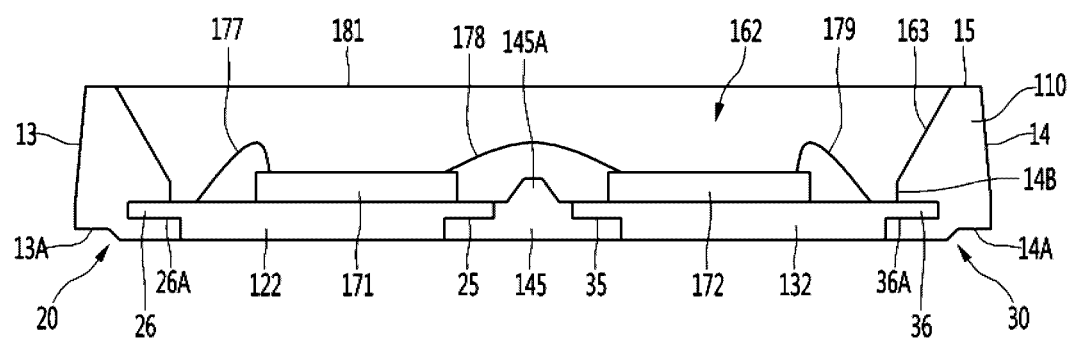

FIG. 181 illustrates another example of the light emitting device of FIG. 173.

Figure 182:
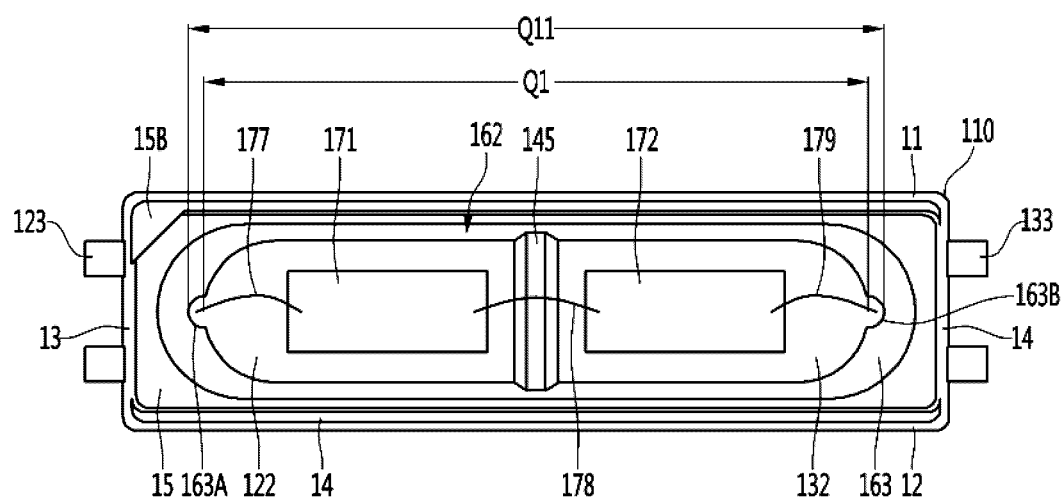

FIG. 182 illustrates another example of the light emitting device of FIG. 172.

Figure 183:
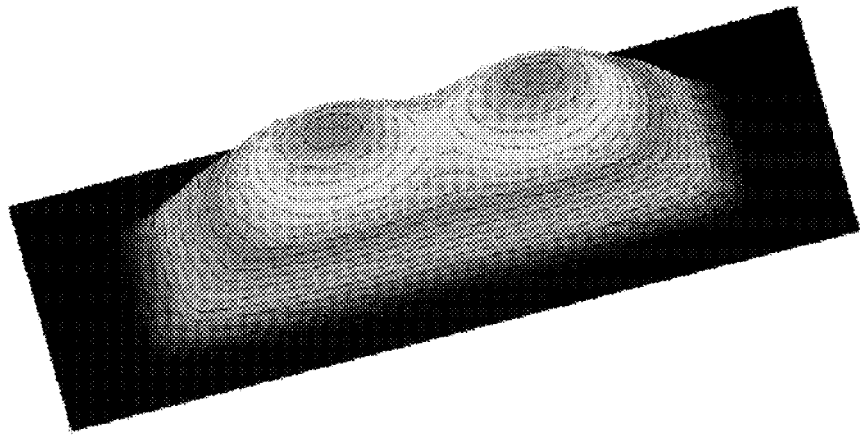
Figure 183:
Figure 183:
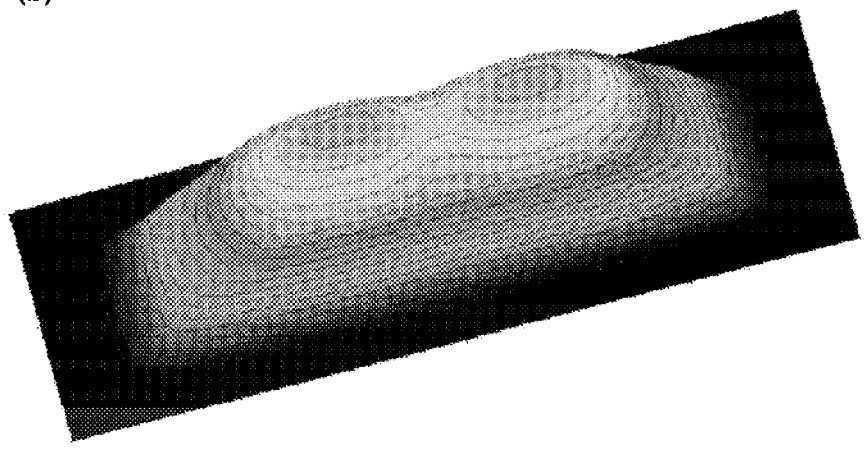
Figure 183:
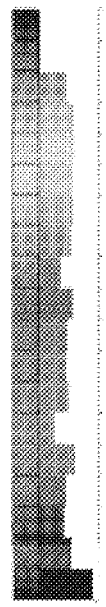

(a) and (b) of FIG. 183 are views illustrating a comparison of optical densities in the comparative example and the eighth embodiment.

Figure 184:
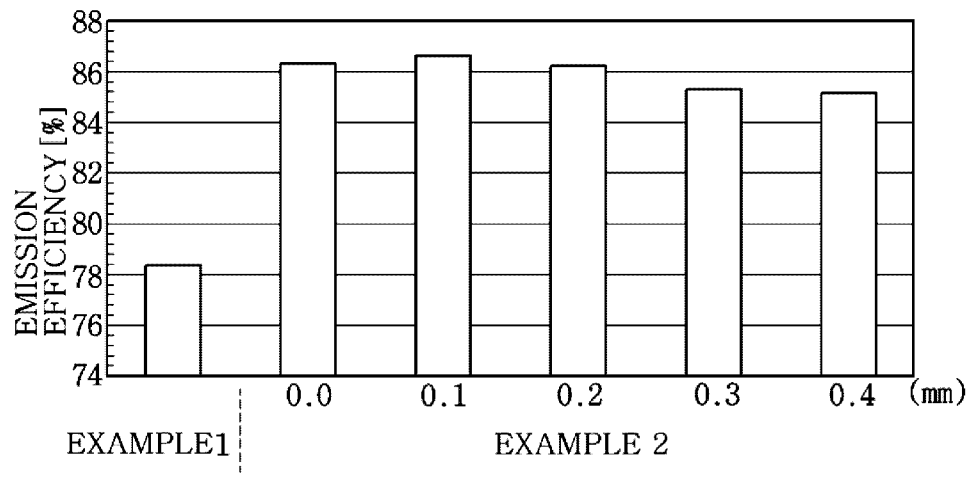
Figure 185:
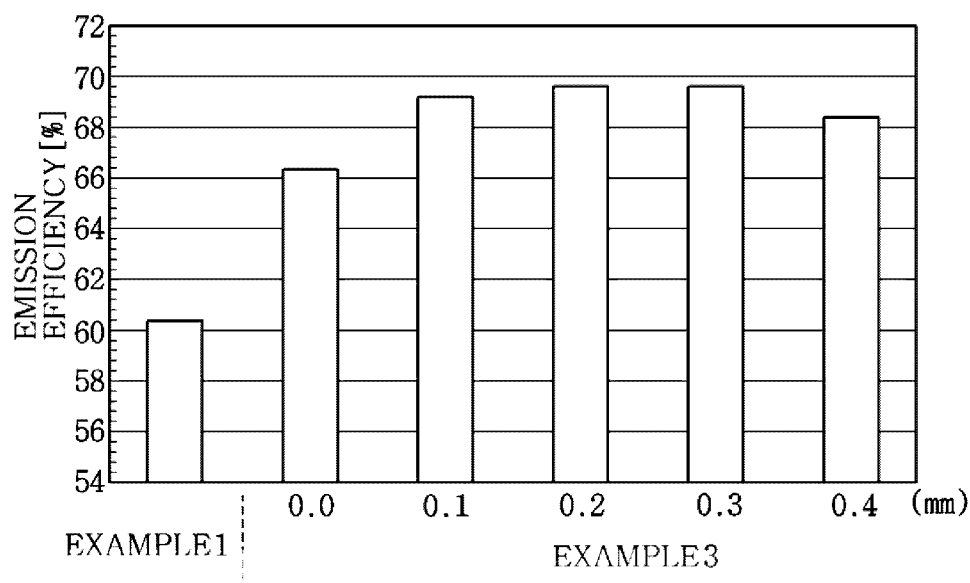
Figure 186:
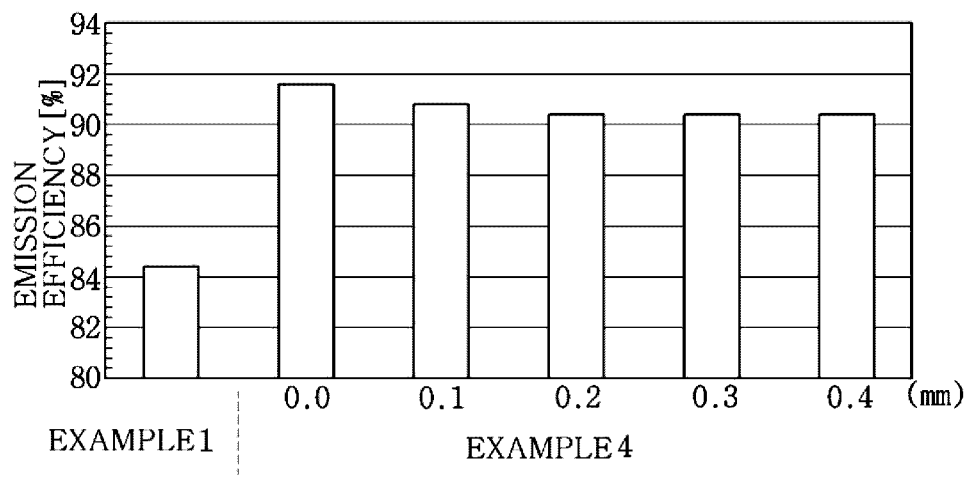

FIGS. 184 to 186 are graphs showing a comparison of light extraction efficiencies in Examples 1 to 4 of the lighting devices of FIGS. 1 to 12.

Figure 187:
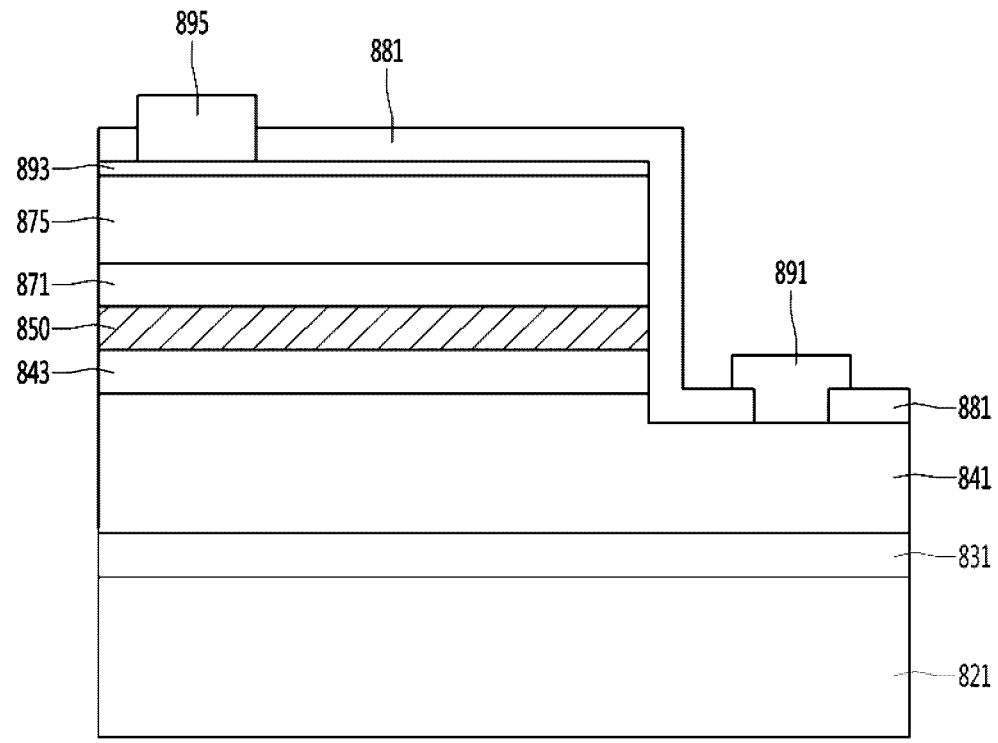

FIG. 187 is a view illustrating an example of a light emitting chip of a lighting device, a light emitting device, or a light unit according to an embodiment.

Figure 188:
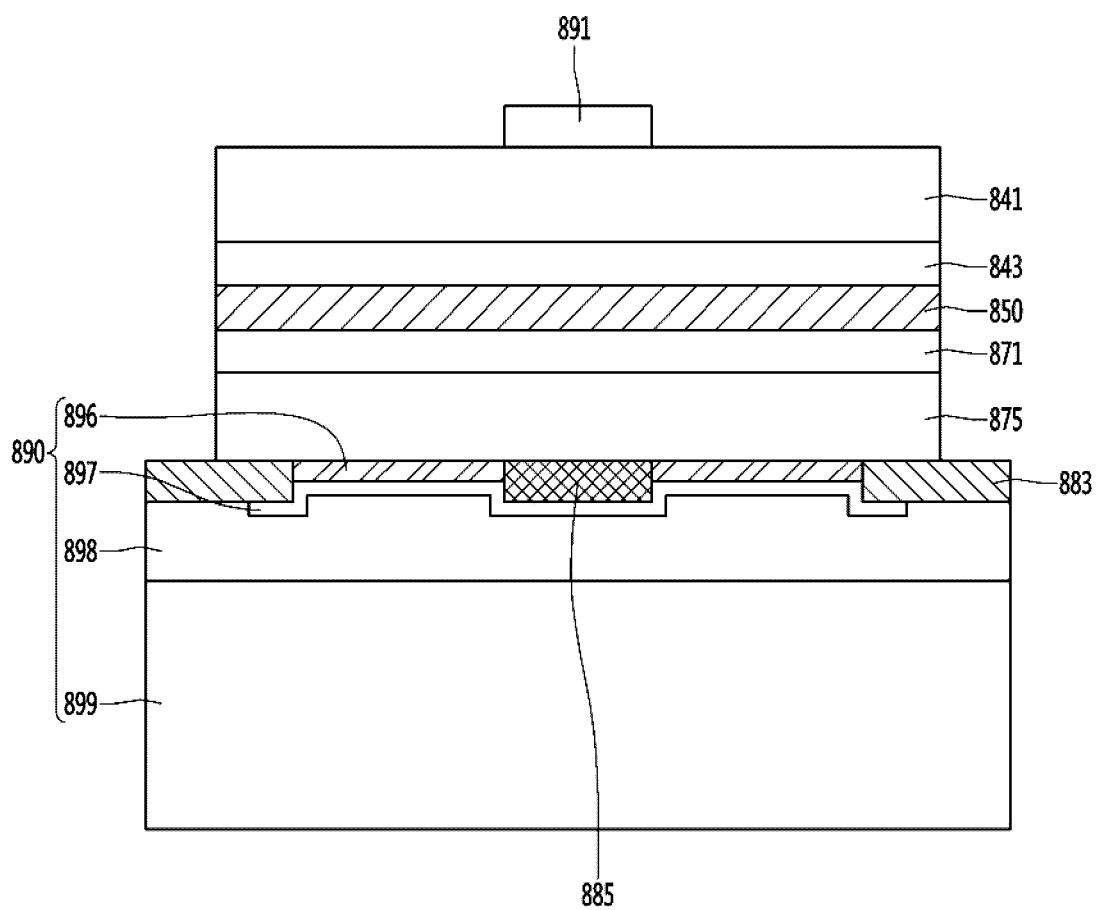

FIG. 188 is a view illustrating another example of a light emitting chip of a lighting device, a light emitting device, or a light unit according to an embodiment.

Figure 189:
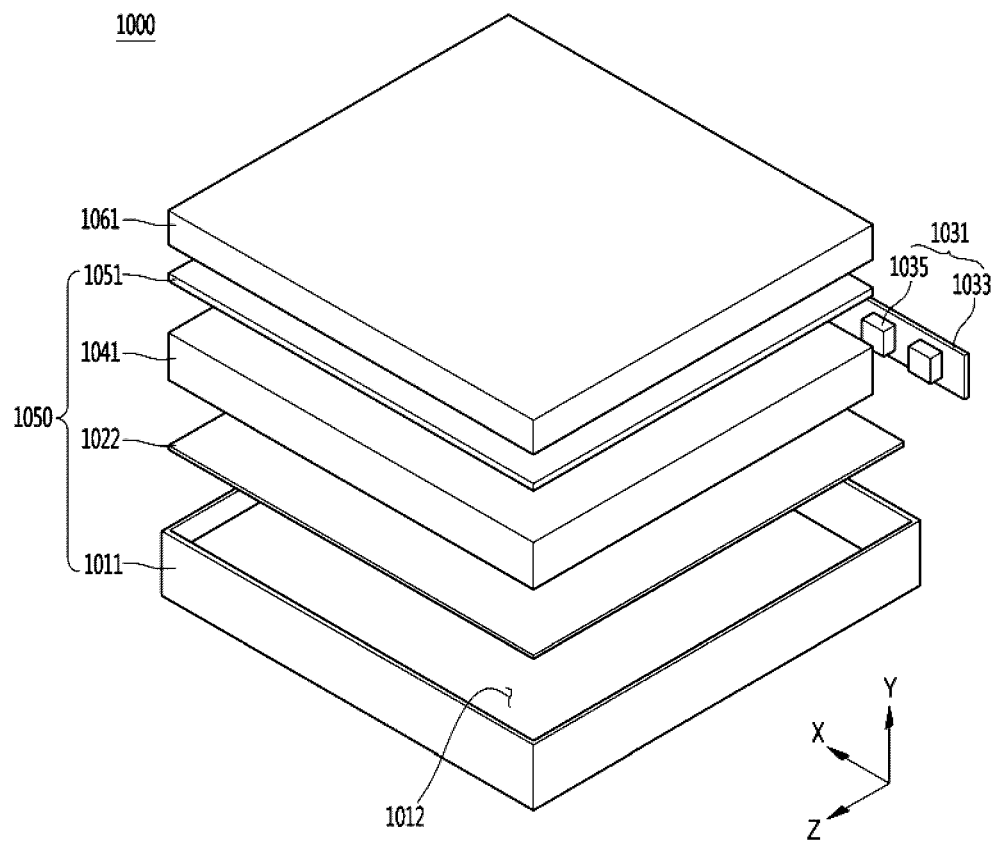

FIG. 189 is a perspective view illustrating a display device including a lighting device according to an embodiment.

Figure 190:
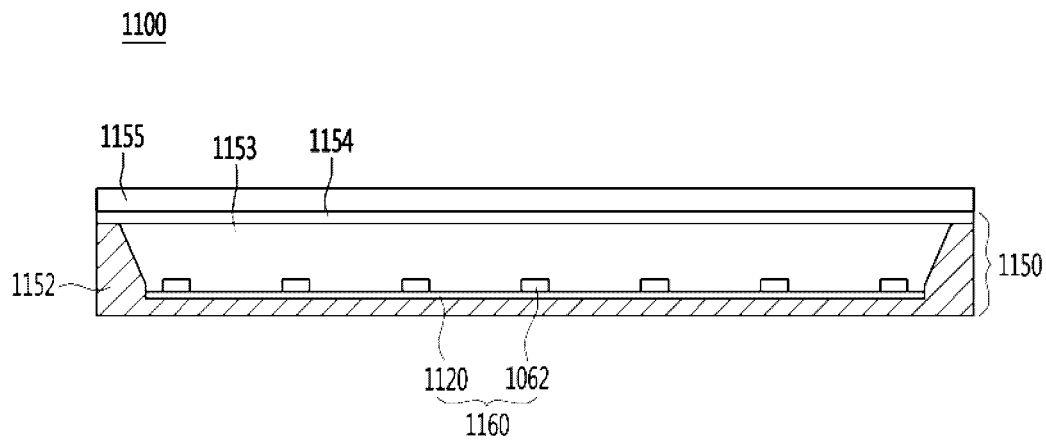

FIG. 190 is a perspective view illustrating a display device including a lighting device according to an embodiment.

Figure 191:
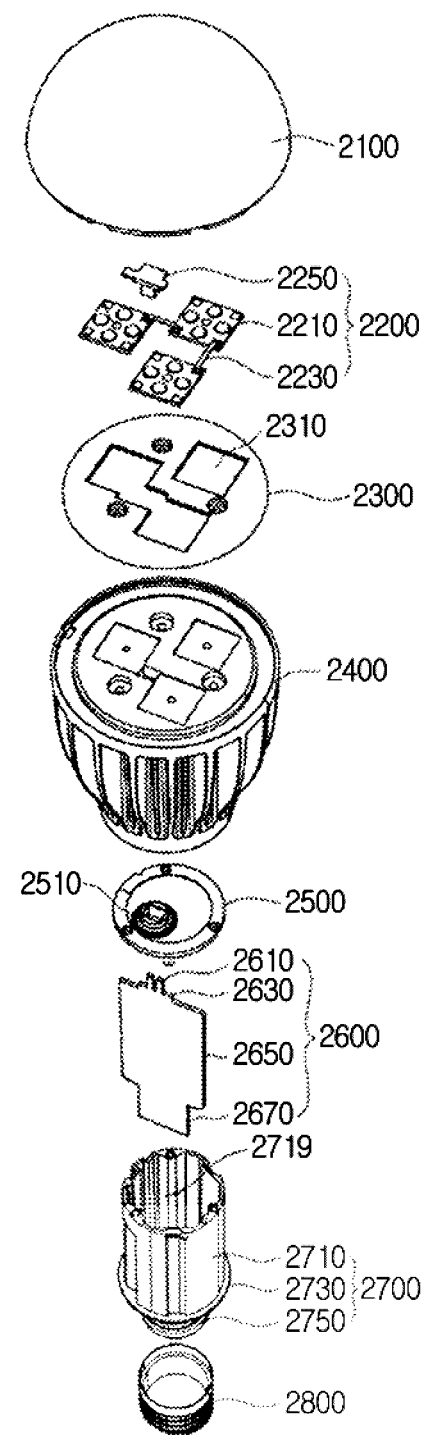

FIG. 191 is an exploded perspective view illustrating a lighting device including a lighting device according to an embodiment.

MODE FOR CARRYING OUT THE INVENTION

These embodiments may be modified in other forms or various embodiments may be combined with each other, and the scope of the present invention is not limited to each embodiment described below. Although the description in the specific embodiments is not described in the other embodiments, other embodiments may be understood as being related to the other embodiments unless otherwise described or contradicted by those in the other embodiments. For example, if the features for configuration A are described in a particular embodiment and the features for configuration B are described in another embodiment, even if the embodiment in which configuration A and configuration B are combined is not explicitly described, It is to be understood that they fall within the scope of the invention.

Hereinafter, embodiments of the present invention capable of realizing the above object will be described with reference to the accompanying drawings. In the description of embodiments according to the present invention, in the case of being described as being formed "on or under" of each element, the upper (upper) or lower (lower) or under are all such that two elements are in direct contact with each other or one or more other elements are indirectly formed between the two elements. Also, when expressed as "on or under", it may include not only an upward direction but also a downward direction with respect to one element. Hereinafter, embodiments of the present invention will be described in detail with reference to the accompanying drawings so that those skilled in the art can easily carry out the present invention.

Hereinafter, a lighting device and a light emitting device according to embodiments of the present invention will be described. Although the lighting device and the light emitting device of the embodiment are described using the Cartesian coordinate system, it goes without saying that they can be explained using different coordinate systems. In the Cartesian coordinate system, the X-axis, Y-axis and Z-axis directions shown in the respective drawings are orthogonal to each other, but the embodiment is not limited thereto. That is, the X-axis, Y-axis, and Z-axis directions may intersect without being orthogonal to each other. In the following embodiments, the first axis direction is the Y axis direction, the second axis direction is the X axis direction orthogonal to the Y axis direction, and the third axis direction is the Z axis direction orthogonal to the X axis and Y axis directions.

Hereinafter, a light source module or a light unit including a lighting device, a light emitting device, and a lighting and/or light emitting device, according to embodiments, will be described with reference to the accompanying drawings.

First Embodiment

Figure 1:
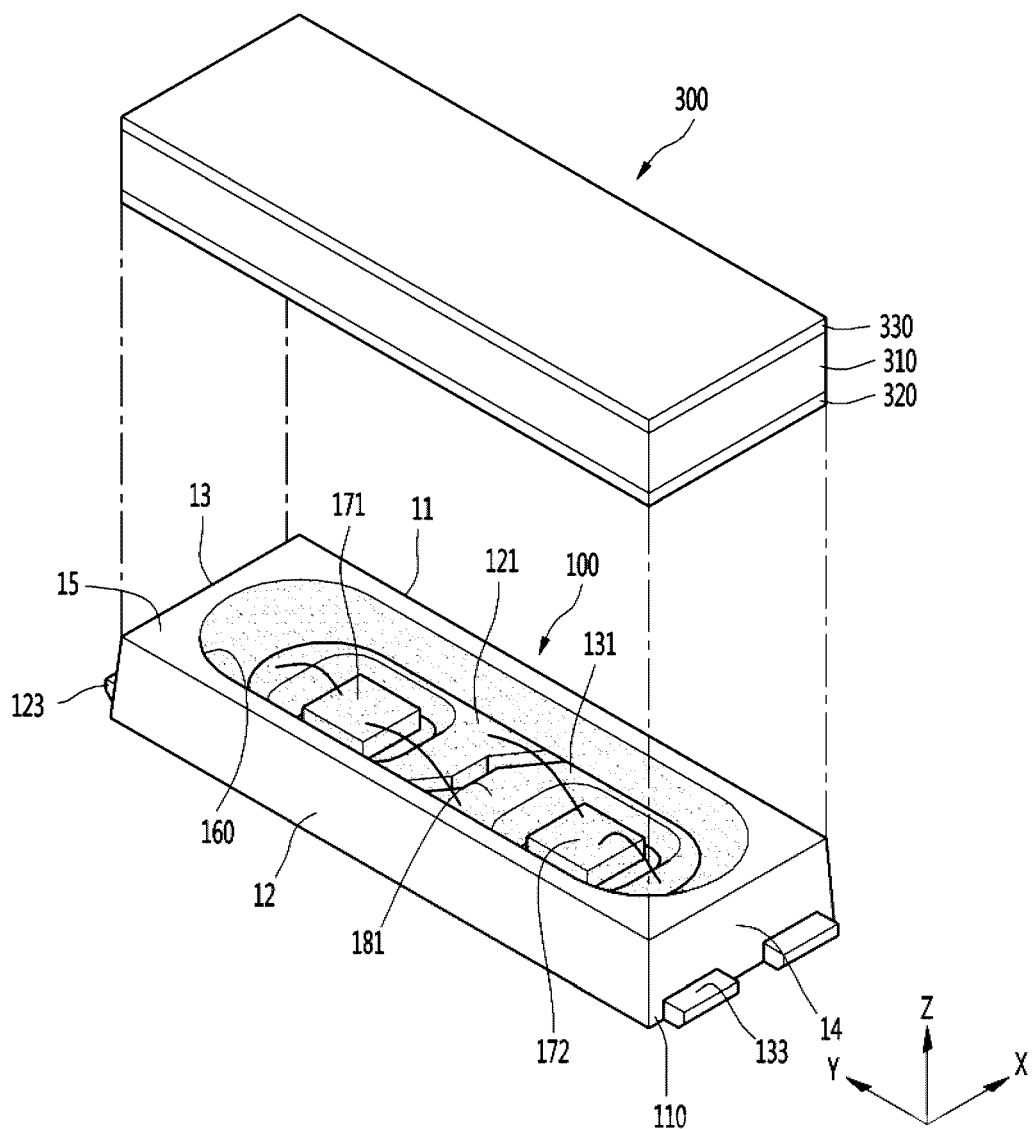
FIG. 1 is a perspective view of a lighting device according to a first embodiment.
Figure 3:
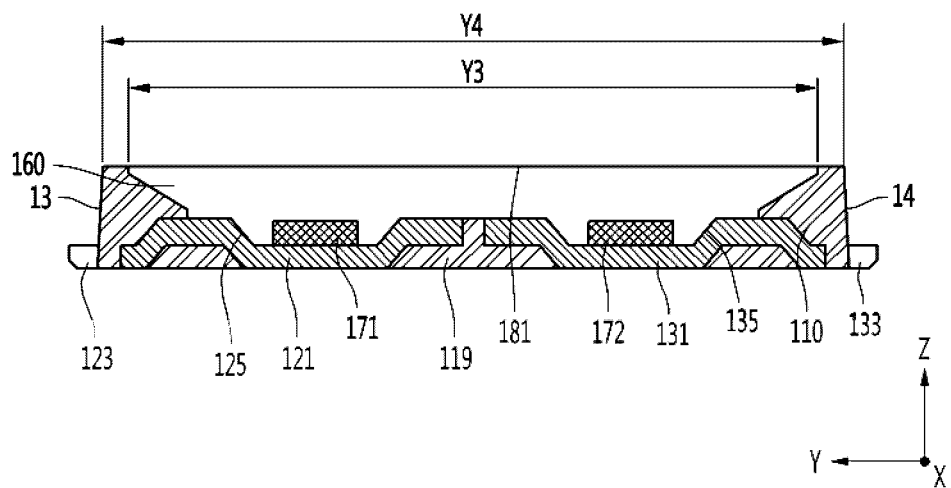
FIG. 3 is a side cross-sectional view of the light emitting device of FIG. 2.
Figure 4:
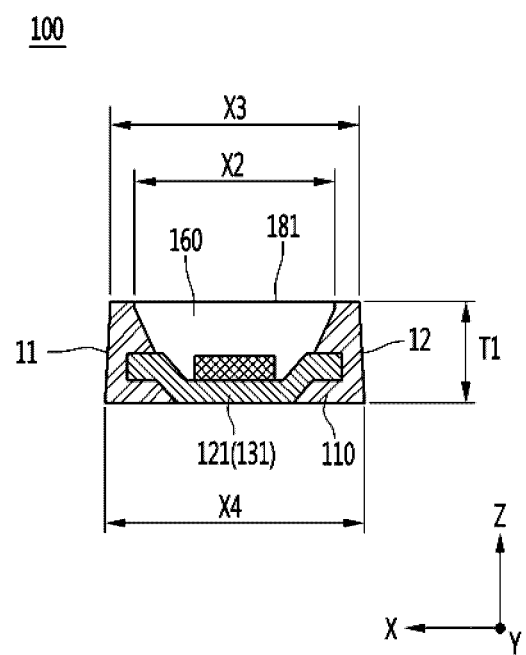
FIG. 4 is another side cross-sectional view of the light emitting device of FIG. 2.
Figure 5:
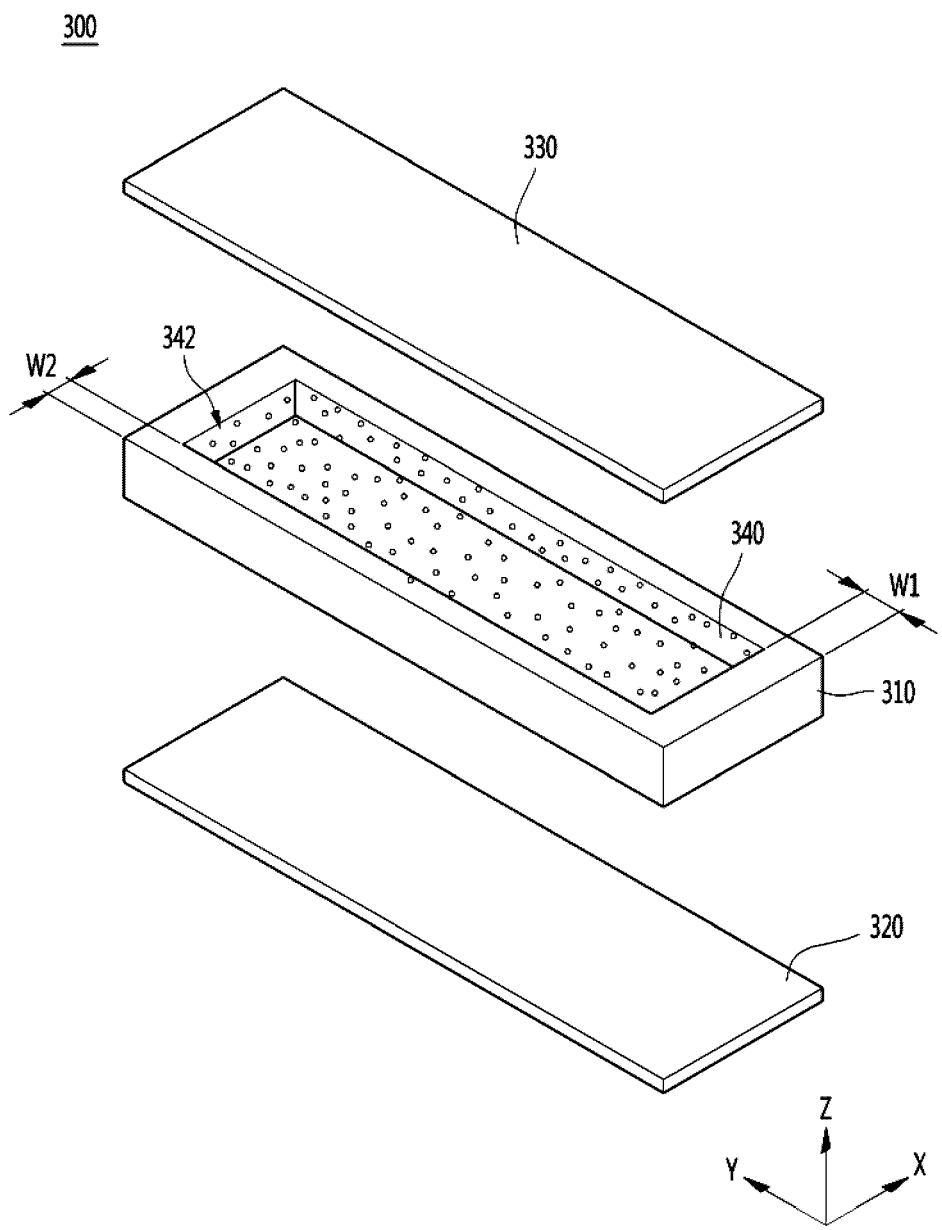
FIG. 5 is an exploded perspective view of an optical plate of the lighting device of FIG. 1.
Figure 6A:
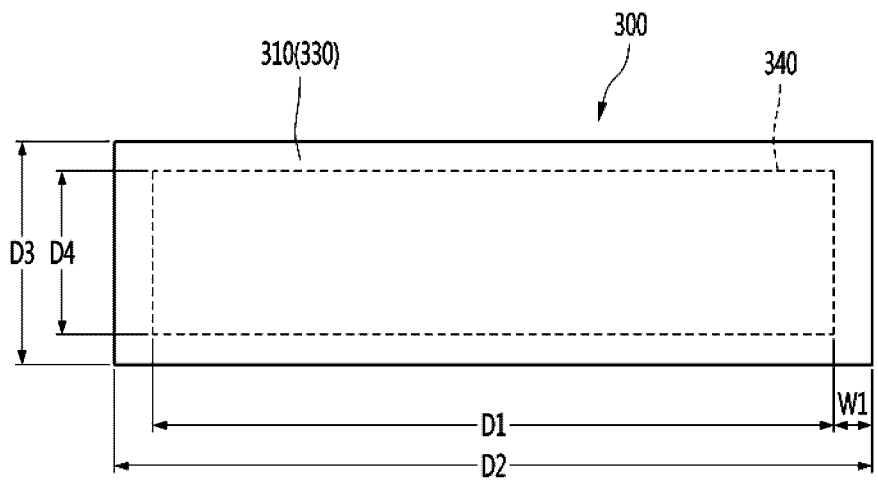
FIG. 6A is a bottom view of an optical plate of the lighting device of FIG. 1.
Figure 6A:
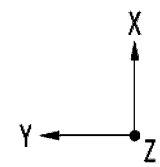
Figure 6B:
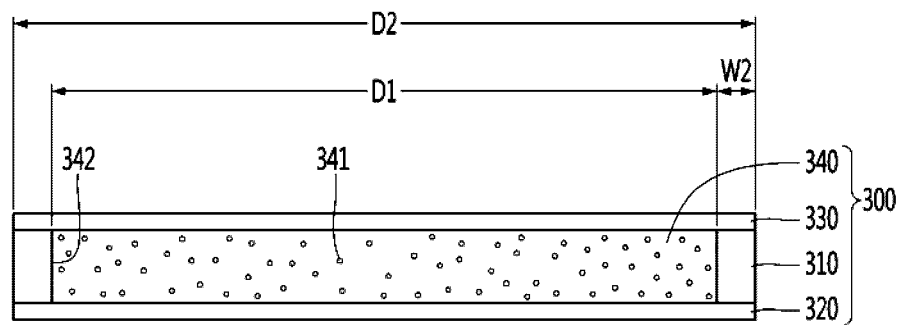
FIG. 6B is a cross-sectional view of the optical plate of FIG. 6A in a Y-axis direction.
Figure 6B:
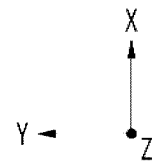
Figure 6C:
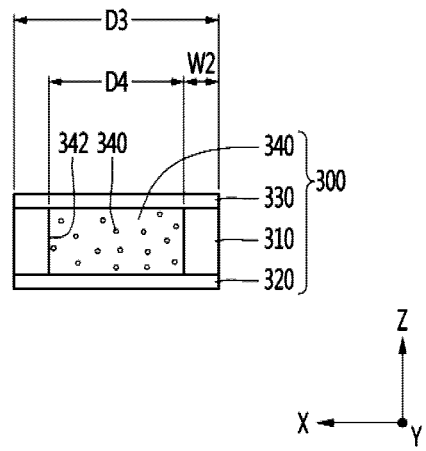
FIG. 6C is a cross-sectional view of the optical plate of FIG. 6A in an X-axis direction.
Figure 7:
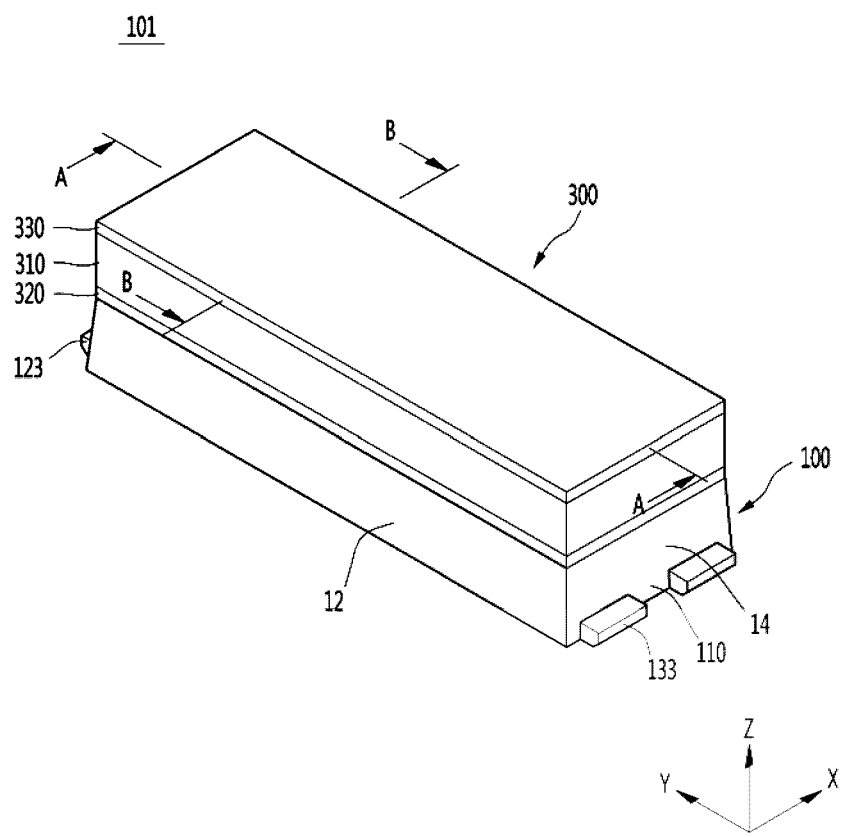
FIG. 7 is an assembly perspective view of the lighting device of FIG. 1.

FIG. 1 is a perspective view of a lighting device according to a first embodiment, FIG. 2 is a plan view illustrating an example of a light emitting device of the lighting device of FIG. 1, FIG. 3 is a side cross-sectional view of the light emitting device of FIG. 2, FIG. 4 is another side cross-sectional view of the light emitting device of FIG. 2, FIG. 5 is an exploded perspective view of an optical plate of the lighting device of FIG. 1, FIGS. 6A to 6C are a bottom view and cross-sectional views of an optical plate of the lighting device of FIG. 1, FIG. 7 is an assembly perspective view of the lighting device of FIG. 1, FIG. 8 is an A-A cross-sectional view of the lighting device of FIG. 7, FIG. 9 is a view for describing the lighting device of FIG. 8, and FIG. 10 is a B-B cross-sectional view of the lighting device of FIG. 7.

Referring to FIGS. 1 to 10, the lighting device 101 includes a light emitting device 100 which emits light, and an optical plate 300 which is arranged on the light emitting device 100 and diffuses and wavelength-converts incident light.

The light emitting device 100 may emit at least one of ultraviolet light, blue light, green light, and red light, and may emit, for example, light of a single wavelength, such as ultraviolet light or blue light. The light emitting device 100 may emit different peak wavelengths. For example, the light emitting device 100 may emit blue light and green light, or emit ultraviolet light and light of a visible light band, but embodiments of the present invention are not limited thereto.

As illustrated in FIGS. 5 and 6A to 6C, the optical plate 300 may be disposed on the light emitting device 100 and may include a phosphor 341 therein. The optical plate 300 may wavelength-convert the light emitted from the light emitting device 100 and emit the wavelength-converted light. A top view shape of the optical plate 300 may be a polygonal shape, an oval shape, or an oval shape having a straight line section. The optical plate 300 may face the top surface of the light emitting device 100 and may be disposed spaced apart from the light source inside the light emitting device 100, for example, light emitting chips 171 and 172. Therefore, the phosphor 341 in the optical plate 300 may reduce influence caused by heat generated from the light emitting chips 171 and 172.

For example, as illustrated in FIGS. 2 to 4, the light emitting device 100 includes a body 110 having a recess 160, a plurality of lead frames 121 and 131 in the recess 160, and at least one light emitting chip 171 and 172 in the recess 160.

The body 110 may include an insulating material or a conductive material. The body 110 may include at least one selected from a resin material such as polyphthalamide (PPA), silicon (Si), a metal material, photo sensitive glass (PSG), sapphire ($Al_2O_3$), and a printed circuit board (PCB). For example, the body 110 may include a resin material, for example, a material such as PPA, epoxy, or silicon. In order to increase reflection efficiency, a filler, which is a metal oxide such as $TiO_2$ or $SiO_2$, may be added to the epoxy or the silicon material used as the body 110. The body 110 may include a ceramic material. For another example, the body 110 may include a circuit board, and may include at least one selected from a substrate (PCB) made of a resin material, a substrate (metal core PCB) having a heat dissipation metal, and a ceramic substrate. The body 110 may be formed with a dark color or a black color so as to improve contrast, but embodiments of the present invention are not limited thereto.

The body 110 includes a recess 160 having a predetermined depth. The recess 160 may be formed in a cup structure concave from the top surface 15 of the body 110, a cavity structure, or a recess structure, but embodiments of the present invention are not limited thereto. Sidewalls of the recess 160 may be vertical or inclined to the bottom, and two or more of the sidewalls may be disposed to be inclined at the same angle or different angles. A reflective layer made of a different material may be further disposed on the surface of the recess, but embodiments of the present invention are not limited thereto. In the sidewall of the recess 160, angles of the upper sidewall adjacent to the top surface 15 of the body 110 and the lower sidewall adjacent to the lead frames 121 and 131 may be different, but embodiments of the present invention are not limited thereto.

When viewed from above, the shape of the body 110 may be formed in a polygonal structure such as a triangle, a rectangle, or a pentagon, may be formed in a circular shape, an oval shape, or a curved shape, or may be a polygonal shape with a curved edge, but embodiments of the present invention are not limited thereto.

The body 110 may include a plurality of side parts, for example, four side parts 11, 12, 13, and 14, as the outer sides. One or more of the plurality of side parts 11, 12, 13, and 14 may be formed as a surface vertical or inclined with respect to the bottom surface of the body 110. In the body 110, the first to fourth side parts 11, 12, 13, and 14 are described as an example. The first side part 11 and the second side part 12 are opposite surfaces in a second axis direction X, and the third side part 13 and the fourth part 14 are opposite surfaces in a first axis direction Y. Y-axis direction lengths Y1 of the first side part 11 and the second side part 12 may be different from X-axis direction widths X1 of the third side part 13 and the fourth side part 14. For example, the length Y1 may be greater than the width X1 and less than the maximum length Y2 of the light emitting device 100. The length Y1 may be an interval between the third side part 11 and the fourth side part 14, that is, the maximum interval. The Y-axis direction of the body 110 is a direction perpendicular to the X-axis direction. As in FIG. 3, the Y-axis direction length Y4 of the top surface of the body 110 may be greater than the Y-axis direction length Y3 of the upper portion of the recess 160 and less than the length Y1. The length Y1 may be a bottom length of the body 110. In the light emitting device 100, the Y-axis direction length Y2 may be disposed to be twice or more times the X-axis direction width X1, for example, three times or more the X-axis direction width X1. The plurality of light emitting chips 171 and 172 may be arranged in the light emitting device 100 in the Y-axis direction.

The plurality of lead frames 121 and 131 are arranged in the recess 160 of the body 110. The plurality of lead frames 121 and 131 may include two or more metal frames, for example, the first and second lead frames 121 and 131. The first and second lead frames 121 and 131 may be separated by a gap part 119. The first and second lead frames 121 and 131 may be arranged in the Y-axis direction.

One or more light emitting chips 171 and 172 may be arranged in the recess 160. The plurality of light emitting chips 171 and 172 may include two or more LED chips, for example, the first and second light emitting chips 171 and 172. One or more light emitting chips 171 and 172 may be arranged on at least one of the plurality of lead frames 121 and 131. For example, at least one light emitting chip 171 and 172 may be arranged on each of the plurality of lead frames 121 and 131. The plurality of light emitting chips 171 and 172 may be selectively connected to the plurality of lead frames 121 and 131. The light emitting chips 171 and 172 may be defined as light sources. The plurality of light emitting chips 171 and 172 may be arranged in the Y-axis direction.

At least one of the plurality of lead frames 121 and 131 may include a cavity having a depth lower than the bottom of the recess 160. The first lead frame 121 includes a first cavity 125, and the first cavity 125 is recessed at a depth lower than the bottom of the recess 160. The first cavity 125 may include a shape concave from the bottom of the recess 160 in the bottom direction of the body 110, for example, a cup structure or a recess shape. The first cavity 125 may be formed by bending or etching the first lead frame 121, but embodiments of the present invention are not limited thereto.

The sidewall and the bottom of the first cavity 125 may be formed by the first lead frame 121, and the sidewall of the first cavity 125 may be formed to be inclined from the bottom of the first cavity 125. Two sidewalls facing each other among the sidewalls of the first cavity 125 may be inclined at the same angle or at different angles. The frame thickness of the sidewall and the bottom of the first cavity 125 may be the same as the thickness of the first lead frame 121.

The second lead frame 131 includes a second cavity 135, and the second cavity 135 is recessed at a depth lower than the bottom of the recess 160. The second cavity 135 may include a shape concave from the top surface of the second lead frame 131 or the bottom of the recess 160 in the bottom direction of the body 110, for example, a cup structure or a recess shape. The second cavity 135 may be formed by bending or etching the second lead frame 131, but embodiments of the present invention are not limited thereto. The bottom and the sidewall of the second cavity 135 may be formed by the second lead frame 131, and the sidewall of the second cavity 135 may be formed to be inclined from the bottom of the second cavity 135. Two sidewalls corresponding to each other among the sidewalls of the second cavity 135 may be inclined at the same angle or at different angles. The frame thickness of the sidewall and the bottom of the second cavity 135 may be the same as the thickness of the second lead frame 131.

The bottom shapes of the first cavity 125 and the second cavity 135 may be a polygon, a polygonal shape having a partial curve, or a circular or oval shape, but embodiments of the present invention are not limited thereto. The first and second cavities 125 and 135 may be arranged in the Y-axis direction.

Partial bottoms of the first lead frame 121 and the second lead frame 131 may be exposed to the lower portion of the body 110, and may be arranged on the same plane as the bottom of the body 110 or different planes from the bottom of the body 110. Partial bottoms of the first lead frame 121 and the second lead frame 131 include opposite surfaces of the bottoms of the first and second cavities 125 and 135. The bottoms of the first and second cavities 125 and 135 may be exposed to the bottom of the body 110.

The first lead frame 121 may include a first lead part 123, and the first lead part 123 may protrude to the third side part 13 of the body 110. The second lead frame 131 may include a second lead part 133, and the second lead part 133 may protrude to the fourth side part 14 of the body 110. One or more first lead parts 123 may protrude, and one or more second lead parts 133 may protrude. The first and second lead parts 123 and 133 may protrude in opposite directions from the recess 160.

The first lead frame 121 and the second lead frame 131 may include a metal material, for example, at least one selected from titanium (Ti), copper (Cu), nickel (Ni), gold (Au), chromium (Cr), tantalum (Ta), platinum (Pt), tin (Sn), silver (Ag), and phosphorus (P), and may be formed in a single-layer structure or a multi-layer structure. The thickness of the first and second lead frames 121 and 131 may be in the range of 0.15 mm or more, for example, in the range of 0.18 mm to 1.5 mm. When the thickness of the first and second lead frames 121 and 131 is less than 0.15 mm, injection molding is difficult. In addition, when the thickness of the first and second lead frames 121 and 131 exceeds 1.5 mm, the thickness of the light emitting device 100 (see t1 in FIG. 4) may increase and the size thereof may increase, causing the increase in material costs. In addition, when the thickness of the first and second lead frames 121 and 131 is less than 0.15 mm, electrical characteristics and heat dissipation characteristics may be degraded.

The first and second lead frames 121 and 131 may be formed with the same thickness, but embodiments of the present invention are not limited thereto. The first and second lead electrodes 121 and 131 may act as lead frames supplying power. In addition to the first and second lead frames 121 and 131, an intermediate frame for electrical connection between metal frames for heat dissipation or the first and second lead frames 121 and 131 may be further disposed in the recess 160.

The first light emitting chip 171 may be disposed in the first cavity 125 of the first lead frame 121. For example, the first light emitting chip 171 may be bonded on the first cavity 125 by an adhesive, but embodiments of the present invention are not limited thereto. The second light emitting chip 172 may be disposed in the second cavity 135 of the second lead frame 131. For example, the second light emitting chip 172 may be bonded on the second cavity 135 by an adhesive, but embodiments of the present invention are not limited thereto. The adhesive may be an insulating adhesive or a conductive adhesive. The insulating adhesive may include a material such as epoxy or silicon, and the conductive adhesive may include a bonding material such as a solider.

The first and second light emitting chips 171 and 172 may selectively emit light in the range from a visible light band to an ultraviolet light band. For example, the first and second light emitting chips 171 and 172 may be selected from an ultraviolet LED chip, a red LED chip, a blue LED chip, a green LED chip, a yellow green LED chip, and a white LED chip. The first and second light emitting chips 171 and 172 include an LED chip including at least one of group III-V compound semiconductors and group II-VI compound semiconductors. The first and second light emitting chips 171 and 172 may have a chip structure in which two electrodes in the chip are disposed adjacent to each other, or a vertical chip structure in which two electrodes in the chip are disposed on opposite sides, but embodiments of the present invention are not limited thereto. When the light emitting chips 171 and 172 are horizontal chips, the lower insulating substrate may be bonded to the lead frame by the insulating or conductive adhesive. Alternatively, when the light emitting chips 171 and 172 are vertical chips, the lower electrode of the vertical chip may be electrically connected to the lead frame by a conductive adhesive.

Referring to FIGS. 2, 3, and 8, the first light emitting chip 171 may be connected to the first lead frame 121 by a first wire 173, and may be connected to the second lead frame 131 by a second wire 174, but embodiments of the present invention are not limited thereto. The second light emitting chip 172 may be connected to the first lead frame 121 by a third wire 175, and may be connected to the second lead frame 131 by a fourth wire 176, but embodiments of the present invention are not limited thereto. The first to fourth wires 173, 174, 175, and 176 may be bonded to the first and second lead frames 121 and 131 arranged in the bottom of the recess 160.

The light emitting device 100 according to an embodiment may include a protective element. The protective element may be arranged on a part of the first lead frame 121 or the second lead frame 131. The protective element may be implemented with a thyristor, a zener diode, or a transient voltage suppression (TVS), and the zener diode protects the light emitting chips 171 and 172 from electrostatic discharge (ESD). The protective element may be connected in parallel to a connection circuit of the first light emitting chip 171 and the second light emitting chip 172. As another example, the protective element may be arranged inside the body 110, but embodiments of the present invention are not limited thereto.

A molding member 181 may be formed in the recess 160, the first cavity 125, and the second cavity 135. The molding member 181 may include a molding member such as silicon or epoxy and may be formed in a single-layer structure or a multi-layer structure. The surface of the molding member 181 may have a flat shape, a concave shape, or a convex shape, but embodiments of the present invention are not limited thereto. The molding member 181 may be a layer having no phosphor. The molding member 181 may include a dispersing agent or a scattering agent, in addition to the phosphor. When the molding member 181 has the phosphor, the phosphor is disposed adjacent to the light emitting chips 171 and 172, and thus the phosphor is degraded by heat generated from the light emitting chips 171 and 172. The degradation of the phosphor may change a temperature color or color coordinates, thus degrading the reliability of the light emitting device 100. An embodiment may provide the phosphor inside the optical plate 300 spaced apart from the light emitting chips 171 and 172. As another example, the molding member 181 on the light emitting chips 171 and 172 may be removed.

As illustrated in FIGS. 5 and 6A to 6C, the optical plate 300 includes a support 310 having an open region 342 in which a central region is opened, a phosphor layer 340 in the support 310, and transparent films 320 and 330 disposed on at least one of the top surface and the bottom surface of the support 310 and the phosphor layer 340.

The thickness of the optical plate 300 may be in the range of 0.7 mm or more, for example, in the range of 0.75 mm to 1.5 mm. When the thickness of the optical plate 300 is less than 0.7 mm, it is difficult to secure the thickness of the phosphor layer 340, and the wavelength conversion efficiency is degraded. When exceeding 1.5 mm, the thickness of the device increases. When the thickness of the transparent films 320 and 330 increases, optical loss may occur. The thickness of the phosphor layer 340 may be equal to or less than the thickness of the support 310, and may be in the range of less than 1 mm, for example, in the range of 0.4 mm to 0.7 mm. When the thickness of the phosphor layer 340 is less than the above range, wavelength conversion efficiency is reduced, and when the thickness of the phosphor layer 340 is greater than the above range, the thickness of the lighting device increases.

The support 310 may include the open region 342 therein, and the outer shape thereof may include a circular or polygonal frame shape. The support 310 may include a frame shape in the outer periphery of the open region 342. The open region 342 may include a circular shape or a polygonal shape. As illustrated in FIGS. 8 to 10, the open region 342 may have a shape corresponding to the outer shape of the recess 160 of the light emitting device 100, but embodiments of the present invention are not limited thereto. The support 310 may be formed to surround the side surface of the phosphor layer 340. The support 310 may be formed to surround the outer periphery of the phosphor layer 340.

The area of the bottom surface of the open region 342 may be equal to, smaller than, or larger than the area of the top surface of the molding member 160 or the light exit surface. The area of the bottom surface of the open region 342 may be equal to or smaller than the area of the top surface, but embodiments of the present invention are not limited thereto.

The support 310 may be a reflective material. The support 310 may include a glass material, for example, a white glass or a glass material having high reflectivity. The white glass or the glass material having high reflectivity may be formed by adding white particles and/or bubbles to a transparent glass. The reflectivity of the support 310 may be higher than the reflectivity of the transparent films 320 and 330.

As another example, the support 310 may include a resin material, and the resin material may include a resin material such as PPA, epoxy, or a silicon material. A filler, which is a metal oxide such as $TiO_2$ or $SiO_2$ or white particles, may be added to the resin material. The support 310 may include a white resin. The support 310 may include a ceramic material. The support 310 may be formed with a dark color or a black color so as to improve contrast, but embodiments of the present invention are not limited thereto. When the support 310 is a reflective material, the support 310 may reflect incident light. A fine uneven pattern may be formed on the inner surface of the support 310, but embodiments of the present invention are not limited thereto.

As another example, the support 310 may be a transmissive material, for example, a transparent glass material or a transparent resin material. The support 310 may be a resin material such as silicon or epoxy. When the support 310 is a transmissive material, the support 310 may emit incident light through the side surface.

As another example, a reflective layer made of a metal material may be further disposed on the inner surface of the support 310 or the inner surface and the bottom surface of the support 310, and the reflective layer may effectively reflect incident light. At this time, the support 310 may include a transmissive material or a reflective material.

At least one of the inner surface and the outer surface of the support 310 may be a vertical or inclined surface, but embodiments of the present invention are not limited thereto. An interval W1 between the inner surface and the outer surface of the support 310 in the Y-axis direction may be in the range of 0.4 mm or more, for example, in the range of 0.45 mm to 0.6 mm. When the interval W1 is less than the above range, it may be difficult to secure the rigidity of the support 310, and when the interval W1 is greater than the above range, the waste of the material may be caused. The interval W1 may be a width of the outer frame of the open region 342 of the support 310.

An interval W2 between the inner surface and the outer surface of the support 310 in the X-axis direction may be less than the interval W1, and may be changed according to the size of the recess of the light emitting device, but embodiments of the present invention are not limited thereto. The interval W2 may be a frame thickness of the support 310 in the X-axis direction, and the interval W1 may be a thickness of the support 310 in the Y-axis direction.

The inner surface of the support 310, for example, the surface contacting the phosphor layer 340, may be disposed to be vertical or inclined with respect to the bottom surface of the first transparent film 320. When the inner surface of the support 310 is inclined, the width or the area of the top surface of the phosphor layer 340 may be greater than the width or the area of the bottom surface of the phosphor layer 340.

In the phosphor layer 340, a phosphor may be added to the resin material such as transparent silicon or epoxy. The phosphor layer 340 converts a wavelength of light emitted from the light emitting chips 171 and 172. The phosphor layer 340 may include at least one type or different types of a red phosphor, a green phosphor, a yellow phosphor, and a blue phosphor. The phosphor may excite part of emitted light and emit light of different wavelengths. The phosphor may selectively include YAG, TAG, silicate, nitride, or oxynitride-based material. The phosphor may include at least one of a red phosphor, a yellow phosphor, and a green phosphor.

As another example, the phosphor layer 340 may include a quantum dot. The quantum dot may include a group II-VI compound semiconductor or a group III-V compound semiconductor and may include at least one of a blue phosphor, a green phosphor, a yellow phosphor, and a red phosphor. Examples of the quantum dot may be ZnS, ZnSe, ZnTe, CdS, CdSe, CdTe, GaN, GaP, GaAs, GaSb, InP, InAs, InSb, AlS, AlP, AlAs, PbS, PbSe, Ge, Si, $CuInS_2$, and $CuInSe_2$, and a combination thereof. In the case of the quantum dot, the light emission efficiency greatly changes according to the temperature. Thus, the change in the light emission efficiency may be reduced by spacing the quantum dot apart from the light emitting chips 171 and 172.

The transparent films 320 and 330 may be disposed below and/or above the phosphor layer 340. The transparent films 320 and 330 may include, for example, a first transparent film 320 disposed below the phosphor layer 340, and/or a second transparent film 330 disposed above the phosphor layer 340. The transparent films 320 and 330 may be disposed on the incidence surface and/or the exit surface of the phosphor layer 340. In the optical plate 300, one of the first and second transparent films 320 and 330 may be removed. For example, the first or second transparent film 320 or 330 may be removed, but embodiments of the present invention are not limited thereto. In manufacturing the optical plate 300, one of the transparent films 320 and 330 may be a base film supporting the phosphor layer 340 in a dispensing process of the phosphor layer 340.

The first and second transparent films 320 and 330 may include glass or a transparent resin film. The first and second transparent films 320 and 330 are bonded on the support 310 to protect the phosphor layer 340. The first and second transparent films 320 and 330 may be made of a material having a refractive index equal to or lower than a refractive index of the molding member 181. The first and second transparent films 320 and 330 may be made of a material having a difference of 0.2 or less from a refractive index of the molding member 181. The first and second transparent films 320 and 330 may have a refractive index lower than a refractive index of the molding member 181 and the phosphor layer 340.

As another example, when the molding member 181 is removed, air gap may exist in the recess 160 of the light emitting device 100, and the first transparent film 320 may be disposed on the air gap.

The first transparent film 320 may be bonded or contacted with the bottom surface of the support 310 and the bottom surface of the phosphor layer 340. The second transparent film 330 may be bonded or contacted with the top surface of the support 310 and the top surface of the phosphor layer 340. The bottom surface of the optical plate 300 may be bonded on the molding member 181. The bottom surface of the first transparent film 320 may be bonded on the surface of the molding member 181. The first transparent film 320 is bonded before the curing of the molding member 181, thereby reducing optical loss at the interface between the first transparent film 320 and the first molding member 181.

The thickness of the first and second transparent films 320 and 330 may be in the range of 0.3 mm or less, for example, in the range of 0.08 mm to 0.2 mm. When the thickness of the first and second transparent films 320 and 330 is less than 0.05 mm, handling may be difficult and a problem may occur in rigidity. When exceeding 0.2 mm, the thickness of the optical plate 300 may increase and the light transmittance may be degraded. The thicknesses of the first and second transparent films 320 and 330 may be equal to or different from each other. When the thicknesses of the first and second transparent films 320 and 330 are different from each other, the first transparent film 320 may be thicker than the second transparent film 330. Since the first transparent film 320 is thicker than the second transparent film 330, the first transparent film 320 may be stably bonded to the light emitting device 100.

One or more opened holes may be disposed in a predetermined region of the first transparent film 320, and a part of the phosphor layer 340 may protrude in the one or more holes. A part of the protruding phosphor layer 340 may contact the molding member 181, but embodiments of the present invention are not limited thereto. One or more holes may be disposed in a region not overlapping the light emitting chips 171 and 172.

The thickness of the phosphor layer 340 may be thicker than the thickness of the first transparent film 320 or the second transparent film 330 and may be thicker than the sum of the thicknesses of the first and second transparent films 320 and 330. The thickness of the phosphor layer 340 may be five to seven times the thickness of the first transparent film 320.

The phosphor layer 340 may have the same thickness as the support 310. In this case, a partial or entire region of the top surface and the bottom surface of the support 310 may contact the first and second transparent films 320 and 330.

As another example, the phosphor layer 340 may be thinner than the support 310. The phosphor layer 340 may have a flat, convex, or concave top surface. The support 310 may protrude around the outer periphery of the first and second transparent films 320 and 330, but embodiments of the present invention are not limited thereto.

The optical plate 300 according to an embodiment is provided with a thickness smaller than the thickness of the light emitting device 100 (T1 in FIG. 4) and may function as a lighting plate or a fluorescent plate on the light emitting device 100. In the lighting device 101, the sum of the thicknesses of the optical plate 300 and the light emitting device 100 is 2 mm or less. When the thickness of the lighting device exceeds 2 mm, the thickness of the lighting device may increase, and the thickness of the light unit including the same may increase.

In the process of manufacturing the optical plate 300, the support 310 is formed on the first transparent film 320, and then the phosphor layer 340 is dispensed in the open region 342 of the support 310. The second transparent film 330 may be bonded on the phosphor layer 340 and the support 320 before the phosphor layer 340 is cured, and may be cut to a predetermined size to provide the optical plate 300 having a desired size.

In the process of bonding the optical plate 300 on the light emitting device, the molding member 181 may be molded in the light emitting device 100, and the first transparent film 320 may be bonded on the molding member 181 before the molding member 181 is cured.

The optical plate 300 may be connected on the light emitting device 100 as illustrated in FIGS. 7 to 10. The optical plate 300 may be bonded to the top surface of the body 110 of the light emitting device 100. As illustrated in FIG. 9, the optical plate 300 may be spaced apart from the light emitting chips 171 and 172 by a predetermined interval G1. The interval G1 may be in the range of 0.4 mm to 1.4 mm, for example, in the range of 0.4 mm to 0.7 mm. When the interval G1 between the light emitting chips 171 and 172 and the first transparent film 320 is less than the above range, the thickness of the body 110 becomes thinner and thus it may be difficult to secure the rigidity and the degradation problem may occur. When the interval G1 is greater than the above range, the thickness of the light emitting device 100 may increase and the light diffusion effect may be slight.

When the thickness of the light emitting chips 171 and 172 may be in the range of 30 μm to 300 μm, for example, in the range of 70 μm to 200 μm. When the thickness is thinner than the thickness range, it is difficult to perform work. When the thickness is thicker than the thickness range, the thickness of the light emitting device increases. A straight distance between the light emitting chips 171 and 172 and the phosphor layer 340 may be less than 1 mm. When the lead frames 121 and 131 have the cavities 125 and 135, the distance between the light emitting chips 171 and 172 disposed in the cavities 125 and 135 and the phosphor layer 340 may be less than 1 mm. Accordingly, it is possible to reduce the degradation problem of the phosphor layer 340.

The length D2 of the optical plate 300 in the first axis direction Y may be less than the maximum length Y2 of the light emitting device 100 in the first axis direction Y, and may be equal to or different from the length Y1 of the body 110. The length Y1 of the body 110 may be a lower length of the body 110 and may be a maximum length of the body 110. The length D2 of the optical plate 300 in the first axis direction may be equal to, greater than, or less than the upper length Y4 of the body 110 as illustrated in FIG. 3, but embodiments of the present invention are not limited thereto.

The optical plate 300 may be disposed on the top surface 15 of the body 110 of the light emitting device 100. For example, the area of the bottom surface of the optical plate 300 may be equal to, larger than, or smaller than the area of the top surface of the body 110. The length of the bottom surface of the optical plate 300 may be equal to, greater than, or less than the length of the top surface of the body 110 (Y4 in FIG. 3). The length of the phosphor layer 340 may be less than the length of the top surface of the body 110 (Y4 in FIG. 3).

As illustrated in FIGS. 10 and 6C, the width D3 of the optical plate 300 in the second axis direction X is less than the width X4 of the light emitting device 100 in the second axis direction X, and the optical plate 300 may be disposed on the top surface 15 of the light emitting device 100. The support 310 of the optical plate 300 may overlap the top surface 15 of the body 110 in a vertical direction. The first transparent film 320 may be disposed on the top surface of the body 110. For example, the outer periphery of the bottom surface of the first transparent film 320 may be bonded to the top surface of the body 110 by an adhesive. The outer periphery of the first transparent film 320 may be disposed to be more outer side than the region of the recess 160 or the molding member 181. Either or both of the support 310 and the first transparent film 320 may be bonded to the top surface of the body 110 by an adhesive. A part of the support 310 may overlap the top surface of the body 110 in a vertical direction. When the contact area between the bottom surface of the optical plate 300 and the top surface 15 of the body increases, the flow of the optical plate 300 in the horizontal direction may be reduced. The outer bottom surface of the optical plate 300 may be bonded to the top surface of the body 110 by an adhesive.

As illustrated in FIGS. 8 and 9, the phosphor layer 340 of the optical plate 300 may be disposed in a region corresponding to the recess 160 of the light emitting device 100. Accordingly, light emitted through the recess 160 is incident on the phosphor layer 340 through the first transparent film 320, is transmitted or wavelength-converted, and is emitted to the second transparent film 330.

The molding member 181 may be disposed below the first transparent film 320. The molding member 181 may be bonded to the bottom surface of the first transparent film 320. The bottom surface of the first transparent film 320 may be disposed above the top surface of the body 110, or may be disposed above the top surface of the molding member

181. The first transparent film 320 may be disposed between the molding member 181 and the phosphor layer 340.

As illustrated in FIGS. 9 and 10, the length D1 of the phosphor layer 340 in the first axis direction Y may be equal to or less than the length Y3 of the recess 160 in the first axis direction. The width D4 of the phosphor layer 340 in the second axis direction may be equal to or less than the width X2 of the recess 160 in the second axis direction. The length D1 of the phosphor layer 340 in the first axis direction may be greater than the width D4 of the phosphor layer 340 in the second axis direction. The phosphor layer 340 may overlap the recess 160 in a vertical direction. Accordingly, the phosphor layer 340 may effectively wavelength-convert the light emitted through the recess 160 of the light emitting device 100. The length E1 of the light emitting chips 171 and 172 in the Y-axis direction may be equal to or greater than the width E2 of the light emitting chips 171 and 172 in the X-axis direction, but embodiments of the present invention are not limited thereto.

FIG. 11 is another example of the optical plate of FIG. 8.

Referring to FIG. 11, the optical plate 300 includes a support 310 having an open region 342 disposed on the light emitting device 100 according to the embodiment, a first transparent film 320, a second transparent film 330, and a phosphor layer 340 in the open region 342.

The length D1 of the open region 342 of the support 310 may be equal to or greater than the upper length Y3 of the recess 160 or the upper length of the molding member 181. The width of the phosphor layer 340 may be equal to or greater than the upper length Y3 of the recess 160 or the upper length of the molding member 181.

The outer side of the optical plate 300 may protrude more outwardly than the region of the light emitting device 100. Accordingly, the optical plate 300 may be stably bonded on the light emitting device 100. The outer side of the first transparent film 320 may protrude more outwardly than the body 110 of the light emitting device 100. Accordingly, the incidence area of the first transparent film 320 may be increased. The area of the bottom surface of the first transparent film 320 may be larger than the area of the top surface of the recess 160 or the area of the top surface of the molding member 181.

The outer side of the support 310 may protrude more outwardly than the body 110 of the light emitting device 100. The outer side of the second transparent film 330 may protrude more outwardly than the body 110 of the light emitting device 100. The length D2 of the optical plate 300 may be provided to be greater than the length Y1 of the light emitting device 100, thereby increasing the length or the area of the phosphor layer 340. The optical plate 300 may be stably disposed on the light emitting device 100. The optical plate 300 may provide the incidence area of the phosphor layer 340 corresponding to the upper area of the recess 181, thereby increasing the light incidence area and improving the light extraction efficiency.

In the optical plate 300 according to the embodiment, a part of the light incident on the first transparent film 320 may leak out to the outside through a region between the body 110 of the light emitting device 100 and the support 310 along the first transparent film 320. That is, the light leakage problem through the outer periphery of the first transparent film 320 may occur. This light leakage problem may degrade the light speed extracted through the second transparent film 330 of the optical plate 300. Hereinafter, another embodiment may provide an optical plate 300 having a structure that can reduce the light leakage problem.

(A) and (B) of FIG. 12 are cross-sectional views of another example of the light emitting device of FIG. 9 in a Y direction and an X direction. In describing the embodiment, the same configuration as that in the first embodiment will be described with reference to the description of the first embodiment, and a redundant description thereof will be omitted.

Referring to (A) and (B) of FIG. 12, the lighting device includes a light emitting device 100A and an optical plate 300 on the light emitting device 100A. The optical plate 300 may refer to the disclosed components.

The light emitting device 100A includes a body 110A having a recess 162, a plurality of lead frames 122 and 132 in the recess 162, and a plurality of light emitting chips 171 and 172 in the recess 162.

The optical plate 300 may be spaced apart from the light emitting chips 171 and 172 of the light emitting device 100A by a predetermined interval G2. The interval G2 may be in the range of 0.4 mm to 1.4 mm, for example, in the range of 0.4 mm to 0.7 mm. When the interval G2 between the light emitting chips 171 and 172 and the first transparent film 320 of the optical plate 300 is less than the above range, the thickness of the body 110 becomes thinner and thus it may be difficult to secure the rigidity and the degradation problem may occur. When the interval G2 is greater than the above range, the thickness of the light emitting device 100A may increase and the light diffusion effect may be slight. The sum of the thicknesses of the light emitting device 100A and the optical plate 300 is 2 mm or less, and thus it is possible to prevent the thickness of a lighting device such as a backlight unit from increasing.

At least one or all of the plurality of lead frames 122 and 132 may have a flat top surface. That is, as illustrated in FIG. 8, a cavity is not formed in each of the lead frames 121 and 131, and a lead frame having a flat top surface may be provided. The plurality of lead frames 122 and 132 include a first lead frame 122 and a second lead frame 132 spaced apart from the first lead frame 132. The width of the top surface of the first lead frame 122 may be wider than the width of the bottom surface thereof, and the area of the top surface thereof may be wider than the area of the bottom surface thereof. The width of the top surface of the second lead frame 132 may be wider than the width of the bottom surface thereof, and the area of the top surface thereof may be wider than the area of the bottom surface thereof. Accordingly, since the surface area of the first and second lead frames 122 and 132 can increase, the adhesion with the body 110A may be improved, and the heat dissipation efficiency may be increased.

The first and second lead frames 121 and 131 may have stepped structures 22 and 32 in a region facing each other. The stepped structures 22 and 32 may increase the contact area with the gap part 119 disposed between the first and second lead frames 122 and 132. The stepped structures 22 and 32 may be formed in a stepped shape or have a slope, but embodiments of the present invention are not limited thereto.

The gap part 119 may be disposed in a region between the first and second lead frames 122 and 132, or a part thereof may be disposed on the top surface of the first and second lead frames 122 and 132. The gap part 119 may be the same material as the body 110A or different insulating materials from the body 110A, but embodiments of the present invention are not limited thereto.

The first and second lead frames 122 and 132 may include holes 23 and 33, and parts 116 and 117 of the body 110A may be connected to the holes 23 and 33. One or more holes 23 of the first lead frame 122 may be arranged to overlap the body 110A in a vertical direction. One or more holes 33 of the second lead frame 132 may be arranged to overlap the body 110A in a vertical direction. Each of the holes 23 and 33 may be formed to be greater than the width of the upper portion, but embodiments of the present invention are not limited thereto. Accordingly, the adhesion between the body 110A and the holes 23 and 33 of the lead frames 122 and 132 may increase, thereby preventing penetration of moisture.

FIG. 13 illustrates a modification example of an optical plate in a lighting device according to a first embodiment.

Referring to FIG. 13, the optical plate 300 may include a support 310 having an open region 342 disposed on the light emitting device 100 according to the embodiment, a first transparent film 320, a second transparent film 330, and a phosphor layer 340 in the open region 342.

The length D2 of the optical plate 300 in the Y-axis direction or the length of the support 310 may be shorter than the length Y4 of the top surface of the light emitting device 100. The outer side of the optical plate 300 may be disposed more inwardly than the outer line of the top surface 15 of the light emitting device 100. When the volume of the optical plate 300 is reduced, the adhesion efficiency with the molding member 181 may be further improved. In addition, since the outer side of the top surface 15 of the light emitting device 100 is exposed to the outer side of the optical plate 300, the light leaking to the optical plate 300 may be reflected by the top surface 15 of the light emitting device 100.

FIG. 14 is a side cross-sectional view illustrating a modification example of the optical plate in the lighting device of FIG. 8, FIG. 15 is an enlarged view of a portion A of FIG. 14, FIG. 16 is another side cross-sectional view of the lighting device of FIG. 14, FIG. 17 is a perspective view of the optical plate of FIG. 14, and FIG. 18 is a side cross-sectional view of the optical plate of FIG. 17.

Referring to FIGS. 14 to 18, the optical plate 300 may be disposed on the body 110 of the light emitting device 100. The optical plate 300 may include a support 310 having an open region 342, a first transparent film 320, a second transparent film 330, and a phosphor layer 340.

In the support 310, the outer region in the bottom surface region may be disposed in an outer part 322 of the first transparent film 320, and an inner region may have a stepped structure. The stepped structure of the inner lower portion of the support 310 may be defined as a first stepped part 311. The inner region of the support 310 may be a region adjacent to the phosphor layer 340, and the outer region may be a region disposed more outwardly than the inner region.

The first stepped part 311 of the support 310 may be disposed along the periphery of the open region 342 and the outer part 322 of the first transparent film 320. In the first transparent film 320, the outer part 322 is disposed inside the first stepped part 311, and the outer region of the support 310 covers the outer surface of the outer part 311 of the first transparent film 320.

As illustrated in FIGS. 17 and 18, the length D8 of the first transparent film 320 in the first axis direction Y may be greater than the length D1 of the open region 342 and the phosphor layer 340 in the first axis direction. The length D8 of the first transparent film 320 in the first axis direction Y may be greater than the length Y3 of the recess 160 of the light emitting device 100 in the first axis direction.

The length D8 of the first transparent film 320 may be less than the length D2 of the support 310 in the first axis direction Y. The length D8 of the first transparent film 320 may be equal to or greater than the length Y3 of the recess 160 of the light emitting device 100. The width D9 of the first transparent film 320 in the second axis direction X may be greater than the width D4 of the phosphor layer 340 in the second axis direction and may be less than the width D3 of the support 310.

As illustrated in FIG. 15, the first stepped part 311 of the support 310 may have a section R2 overlapped with the top surface 15 of the body 110 of the light emitting device 100 in a vertical direction. Accordingly, since the outer part 322 of the first transparent film 320 is disposed in the first stepped part 311, it is possible to solve the light leakage problem through the outer side of the first transparent film 320. The first stepped part 311 may have a notch shape, but embodiments of the present invention are not limited thereto.

A section R3 facing the top surface 15 of the body 110 of the light emitting device 100 among the outer regions of the bottom surface of the support 310 may satisfy R3>0, and the section R2 may satisfy R2>0. The width R1 of the first stepped part 311 may be equal to or greater than the section R2, and this may be changed according to the position of the inner side of the support 310.

The bottom surface of the support 310 may be bonded to the top surface 15 of the body 110 of the light emitting device 100. An adhesive may be disposed between the bottom surface of the support 310 and the top surface 15 of the body 110. Accordingly, it is possible to solve the light leakage problem that light leaks out in a side direction of the light emitting device 100 through a gap between the bottom surface of the support 310 and the top surface 15 of the body 110.

The outer side of the bottom surface of the first transparent film 320 may contact the top surface 15 of the body 110 of the light emitting device 100 or may be bonded thereto by an adhesive. Accordingly, it is possible to prevent light from leaking out through a gap between the bottom surface of the first transparent film 320 and the top surface 15 of the body 110 of the light emitting device 100.

The area of the bottom surface of the first transparent film 320 may be greater than the area of the bottom surface of the phosphor layer 340. Accordingly, the light incident on the first transparent film 320 may be uniformly incident on the entire region of the bottom surface of the phosphor layer 340.

In the support 310, the outer region in the top surface region may be disposed along the outer side of the outer part 332 of the second transparent film 330, and the inner upper portion may have a stepped structure from the outer region. The stepped structure of the inner upper portion of the support 310 may be defined as a second stepped part 312.

The second stepped part 312 of the support 310 may be disposed along the periphery of the open region 342 and the outer side of the outer part 332 of the second transparent film 330. In the second transparent film 330, the outer part 332 is disposed inside the second stepped part 312, and the outer region of the support 310 covers the outer surface of the outer part 332 of the second transparent film 330.

The length of the second transparent film 330 may be equal to the length D8 of the first transparent film 320, but embodiments of the present invention are not limited thereto. The width of the second transparent film 330 may be equal to the width D9 of the first transparent film 320. As another example, the second transparent film 330 is a light extraction surface, and the length and the width of the second transparent film 330 may be different from the length D8 and the width D9 of the first transparent film 320, but embodiments of the present invention are not limited thereto.

The area of the top surface of the second transparent film 330 may be greater than the area of the top surface of the phosphor layer 340. Accordingly, the second transparent film 330 may discharge light emitted through the phosphor layer 340 to the entire region.

Referring to FIG. 18, the thickness T3 of the phosphor layer 340 may be less than the thickness T2 of the support 310, and may be in the range of less than 1 mm, for example, in the range of 0.4 mm to 0.7 mm. When the thickness T3 of the phosphor layer 340 is less than the above range, wavelength conversion efficiency is reduced, and when the thickness T3 of the phosphor layer 340 is greater than the above range, wavelength conversion efficiency may be slight.

The interval between the bottom surface of the first transparent film 320 and the top surface of the second transparent film 330 may be equal to or less than the thickness T2 of the support 310, but embodiments of the present invention are not limited thereto. The bottom surface of the first transparent film 320 may be disposed on the same horizontal plane as the bottom surface of the support 310, but embodiments of the present invention are not limited thereto.

The interval W1 between the inner surface and the outer surface of the support 310 in the Y-axis direction may be in the range of 0.4 mm or more, for example, in the range of 0.45 mm to 0.6 mm. When the interval W1 is less than the above range, it may be difficult to secure the rigidity of the support 310, and when the interval W1 is greater than the above range, the waste of the material may be caused. The interval W1 may be a width of the outer frame of the open region 342 of the support 310. The inner surface of the support 310, for example, the surface contacting the phosphor layer 340, may be disposed to be vertical or inclined with respect to the bottom surface of the first transparent film 320. When the inner surface of the support 310 is inclined, the width or the area of the top surface of the phosphor layer 340 may be greater than the width or the area of the bottom surface of the phosphor layer 340. An interval W2 between the inner surface and the outer surface of the support 310 in the X-axis direction may be less than the interval W1, and may be changed according to the size of the recess of the light emitting device, but embodiments of the present invention are not limited thereto.

FIG. 19 illustrates a first modification example of the optical plate in the lighting device of FIG. 14.

Referring to FIG. 19, the optical plate 300 is disposed on a light emitting device 100. The optical plate 300 includes a support 310, a first transparent film 320, a second transparent film 330, and a phosphor layer 340.

The second transparent film 330 may have a length greater than a length of the first transparent film 320 in a Y-axis direction, and may have a top surface area greater than a bottom surface area of the first transparent film 320. The length of the second transparent film 330 in the Y-axis direction may be different from the length of the first transparent film 320. The length and the width of the second transparent film 330 may be equal to the length D2 and the width of the support 310, but embodiments of the present invention are not limited thereto.

Since the length of the second transparent film 330 can be formed up to the outer side of the top surface of the support 310, a separate stepped structure need not be formed on the top surface of the support 310.

FIG. 20 illustrates a second modification example of the optical plate in the lighting device of FIG. 14.

Referring to FIG. 20, the optical plate 300 is disposed on the light emitting device 100 according to the embodiment. The optical plate 300 includes a support 310 having an open region 342, a first transparent film 320, a second transparent film 330, and a phosphor layer 340 in the open region 342.

The phosphor layer 340 is disposed in the open region 342 of the support 310. The length D1 of the open region 342 may be equal to the length Y3 of the recess 160 of the light emitting device 100.

The length of the first transparent film 320 may be equal to the length D1 of the open region 342 or the phosphor layer 340. The length of the second transparent film 330 may be equal to the length D1 of the open region 342 or the phosphor layer 340.

According to the embodiment, a separate stepped part is not provided on the top surface and the bottom surface of the support 310, and the phosphor layer 340 may be disposed between the first transparent film 320 and the second transparent film 330. The bottom surface of the first transparent film 320 may contact the molding member 181 of the light emitting device 100. The area of the bottom surface of the first transparent film 320 may be equal to or smaller than the area of the top surface of the molding member 181. Accordingly, after the first transparent film 320 is bonded to the molding member 181, the support 310 may be bonded to the body 110 of the light emitting device 100, and the phosphor layer 340 and the second transparent film 330 may be sequentially stacked on the first transparent film 320.

Since the area of the first transparent film 320 is equal to or smaller than the area of the top surface of the molding member 181, the support 310 may be bonded to the body 110. Accordingly, it is possible to block the light leakage problem through the interface between the support 310 and the body 110 of the light emitting device 100.

FIG. 21 illustrates a third modification example of the optical plate in the lighting device of FIG. 14.

Referring to FIG. 21, the optical plate 300 may be disposed on the light emitting device 100 according to the embodiment. The optical plate 300 includes a support 310 having an open region 342, a first transparent film 320, a second transparent film 330, and a phosphor layer 340 arranged in the open region 342.

The support 310 may include a first stepped part 311 around the inner side of the bottom surface thereof, and the outer part 322 of the first transparent film 320 may be disposed on the first stepped part 311. The bottom surface of the support 310 may be bonded to the body 110 of the light emitting device 100, and may cover the outer part 322 of the first transparent film 320. Since the support 310 covers the outer part 322 of the first transparent film 320, it is possible to prevent light from leaking out through a gap between the support 310 and the body 110 of the light emitting device 100.

The length D1 of the open region 342 in the Y-axis direction may be less than the top surface length of the molding member 181 or the top surface length Y3 of the recess 160. The length D2 of the support 310 in the Y-axis direction may be equal to or greater than the length of the body 110 of the light emitting device 100, but embodiments of the present invention are not limited thereto.

A second stepped part 312 may be provided on the inner side of the top surface of the support 310, and the second transparent film 330 may be disposed on the second stepped part 312. Accordingly, it is possible to block light leaking out in the side direction of the second transparent film 330, thereby improving light extraction efficiency. The length of the second transparent film 330 may be equal to the length of the first transparent film 320, but embodiments of the present invention are not limited thereto. As another example, the second stepped part may not be provided on the top surface of the support 310, but embodiments of the present invention are not limited thereto.

According to the modification examples, the size of the second transparent film 330 of the optical plate 300 may be adjusted to be equal to or different from the size of the molding member 181 of the light emitting device 100, thereby adjusting the size of the light exit surface through the optical plate 300.

FIG. 22 illustrates a fourth modification example of the optical plate in the lighting device of FIG. 14.

Referring to FIG. 22, the optical plate 300 may be disposed on the light emitting device 100 according to the embodiment. The optical plate 300 includes a support 310 having an open region 342, a first transparent film 320, a second transparent film 330, and a phosphor layer 340 arranged in the open region 342.

The support 310 may include a first stepped part 311 in the inner side of the bottom surface thereof. The first stepped part 311 may overlap the top surface of the body 110 of the light emitting device 100 in a vertical direction. The first stepped part 311 may extend up to the region of the edge of the top surface of the body 110 of the light emitting device 100. The first transparent film 320 may be disposed below the phosphor layer 340, and the outer part 322 thereof may be disposed on the first stepped part 311.

The first transparent film 320 may be bonded to the top surface 15 of the body 110 of the light emitting device 100, or may extend up to the outer edge of the top surface 15 of the body 110. A protrusion 314 facing the side of the light emitting device 100 may be included in the outer side of the support 310. Since the protrusion 314 covers the outer side of the outer part 322 of the first transparent film 320, it is possible to remove light leakage phenomenon through the outer side of the first transparent film 320. The bottom surface of the protrusion 314 may extend below the bottom surface of the first transparent film 320 and block light.

The support 310 may include a second stepped part 312 in the inner side of the top surface thereof. The outer part 332 of the second transparent film 330 may be disposed in the second stepped part 312. The second stepped part 312 may overlap the top surface of the body 110 of the light emitting device 100 in a vertical direction. As another example, the second stepped part may not be formed, and the second transparent film 330 may be disposed on the phosphor layer 340, or may be disposed on the phosphor layer 340 and the support 310, but embodiments of the present invention are not limited thereto.

FIG. 23 illustrates a fifth modification example of the optical plate in the lighting device of FIG. 14.

Referring to FIG. 23, the optical plate 300 may be disposed on the light emitting device 100 according to the embodiment. The optical plate 300 includes a support 310 having an open region 342, a first transparent film 320, a second transparent film 330 and a phosphor layer 340 arranged in the open region 342.

The outer side of the support 310 may be disposed in a region not overlapping the body 110 of the light emitting device 100 in a vertical direction. The support 310 may be disposed more outwardly than the body 110 of the light emitting device 100. The open region 342 of the support 310 may have the same shape as the top surface outer shape of the body 110 of the light emitting device 100, or the bottom surface area of the open region 342 may be greater than the top surface area of the recess 160, but embodiments of the present invention are not limited thereto. The length D1 of the open region 342 of the support 310 and the phosphor layer 340 may be greater than length Y3 of the molding member 181 and the recess 160. The area of the bottom surface of the phosphor layer 340 may be greater than the area of the top surface of the molding member 181.

The first transparent film 320 may be bonded to the top surface of the molding member 181 and the top surface 15 of the body 110. The outer part 322 of the first transparent film 320 may protrude more outwardly than the side of the body 110. The length of the first transparent film 320 may be greater than the length of the top surface of the light emitting device 100.

The first transparent film 320 may be disposed inside the first stepped part 311 of the support 310 and may be bonded to the body 110 of the light emitting device 100. Since the support 310 is disposed in the outer part 322 of the first transparent film 320 and reflects leaking light, it is possible to reduce light leakage phenomenon through the outer part 322 of the first transparent film 320. In addition, even when light leaks out through the outer part 322 of the first transparent film 320, the light travels in a lower direction of the light emitting device 100, thereby reducing the light interference problem caused by optical loss.

The second transparent film 330 may have the same length as that of the first transparent film 320. The support 310 may include a second stepped part 312 in the inner side of the top surface thereof, and the outer part 332 of the second transparent film 330 may be disposed on the second stepped part 312.

FIG. 24 is a side cross-sectional view illustrating a modification example of the light emitting device of the lighting device of FIG. 14, and FIG. 25 is another side cross-sectional view of the lighting device of FIG. 24.

Referring to FIGS. 24 and 25, the lighting device includes a light emitting device 100A and an optical plate 300 on the light emitting device 100A. The above-described embodiments may be applied to the optical plate 300. For example, the optical plate 300 disclosed in FIGS. 15 to 23 may be applied.

The light emitting device 100A includes a body 110A having a recess 162, a plurality of lead frames 122 and 132 in the recess 162, and a plurality of light emitting chips 171 and 172 in the recess 162.

The optical plate 300 may be spaced apart from the light emitting chips 171 and 172 of the light emitting device 100A by a predetermined interval G2. The interval G2 may be in the range of 0.4 mm or more, for example, in the range of 0.4 mm to 1.4 mm. When the interval G2 between the light emitting chips 171 and 172 and the first transparent film 320 of the optical plate 300 is less than the above range, the thickness of the body 110 becomes thinner and thus it may be difficult to secure the rigidity and the degradation problem may occur. When the interval G2 is greater than the above range, the thickness of the light emitting device 100A may increase and the light diffusion effect may be slight.

At least one or all of the plurality of lead frames 122 and 132 may have a flat top surface. That is, as illustrated in FIG. 8, a cavity is not formed in each of the lead frames 121 and 131, and a lead frame having a flat top surface may be provided. The plurality of lead frames 122 and 132 include a first lead frame 122 and a second lead frame 132 spaced apart from the first lead frame 132. The light emitting device of FIGS. 24 and 25 can be understood by referring to the description of the light emitting device illustrated in (A) and (B) of FIG. 12.

FIG. 26 is a side cross-sectional view illustrating a modification example of the lighting device of FIG. 14.

Referring to FIG. 26, the lighting device includes a light emitting device 400 and an optical plate 300 on the light emitting device 400. The optical plate 300 can be understood by referring to the description of the above embodiments.

The light emitting device 400 includes a body 410, a first lead frame 423 and a second lead frame 421 disposed in the body 410, and a light emitting chip 470 disposed on the body 410 and electrically connected to the first lead frame 423 and the second lead frame 421.

The body 410 may include an insulating material or a conductive material. The body 410 may include at least one selected from a resin material such as polyphthalamide (PPA), silicon (Si), a metal material, photo sensitive glass (PSG), sapphire ($Al_2O_3$), and a printed circuit board (PCB). For example, the body 410 may include a resin material such as PPA, epoxy, or silicon. In order to increase reflection efficiency, a filler, which is a metal oxide such as $TiO_2$ or $SiO_2$, may be added to the epoxy or the silicon material used as the body 410. The body 410 may include a ceramic material.

The body 410 may provide a recess 425 having an inclined surface around the light emitting chip 470. A molding member 440 may be disposed on the recess 425, but embodiments of the present invention are not limited thereto. The inclined surface of the recess 425 may be formed with one or more angles, and a separate reflective member may be further disposed on the inclined surface, but embodiments of the present invention are not limited thereto.

The first lead frame 421 and the second lead frame 423 are electrically separated from each other and supply power to the light emitting chip 470. In addition, the first lead frame 421 and the second lead frame 423 may be disposed on the bottom of the recess 425, and may increase luminous efficiency by reflecting light generated from the light emitting chip 470 and may serve to discharge heat generated by the light emitting chip 470 to the outside.

The light emitting chip 470 may be disposed on the first lead frame 421 and may be connected to the first lead frame 423 by a wire 443. The first lead frame 421 may be formed as a cavity in which a region where the light emitting chip 470 is disposed is recessed, but embodiments are not limited thereto. The light emitting chip 470 may be disposed in a flip-chip manner, but embodiments of the present invention are not limited thereto.

The optical plate 300 may be disposed to face the light emitting chip 470. The optical plate 300 may include a phosphor therein, and may be disposed on the top surface of the body 410.

The optical plate 300 includes a frame-shaped support 310 having an open region 342, a phosphor layer 340 in the support 310, and transparent films 320 and 330 disposed below and/or above the support 310 and the phosphor layer 340. The above embodiments may be selectively applied to the optical plate 300, and the optical plate 300 can be understood by referring to the description of the above embodiments. The optical plate 300 according to an embodiment is provided with a thickness smaller than the thickness of the light emitting device 400 and may function as a lighting plate or a fluorescent plate on the light emitting device 400.

FIG. 27 is a side cross-sectional view illustrating a modification example of the lighting device of FIG. 14.

Referring to FIG. 27, the lighting device includes a light emitting device 500 and an optical plate 300 on the light emitting device 500. The optical plate 300 can be understood by referring to the description of the above embodiments.

The light emitting device 500 includes a body 510, a first lead frame 521 and a second lead frame 523 disposed in the body 510, a light emitting chip 570 disposed on the body 510 and electrically connected to the first lead frame 521 and the second lead frame 523, and a molding member 531 on the light emitting chip 570.

The body 510 may include a reflective part 513 having a recess 517 having an opened upper portion, and a support 511 supporting the reflective part 513, but embodiments of the present invention are not limited thereto.

The lead frames 521 and 523 and the light emitting chip 570 may be disposed in the recess 517 of the body 510, and the light emitting chip 570 may be disposed on the second lead frame 523 and may be connected to the first lead frame 521 by a wire 503. The second lead frame 523 may include a cavity in which the light emitting chip 570 is disposed, but embodiments of the present invention are not limited thereto. The first lead frame 521 and the second lead frame 523 are electrically separated from each other and supply power to the light emitting chip 570.

The first lead frame 521 and the second lead frame 523 may reflect light generated by the light emitting chip 570, thereby increasing luminous efficiency. To this end, a separate reflective layer may be further formed on the first lead frame 521 and the second lead frame 523, but embodiments of the present invention are not limited thereto. In addition, the first and second lead frames 521 and 523 may serve to discharge heat generated from the light emitting chip 570 to the outside. A lead part 522 of the first lead frame 521 and a lead part 524 of the second lead frame 523 may be disposed on the bottom surface of the body 510.

The molding member 531 may include a resin material such as silicon or epoxy and may surround the light emitting chip 570 to protect the light emitting chip 570. The molding member 531 may have a flat, convex, or concave top surface. The molding member 531 may be removed and the recess 517 may be filled with an air region.

The optical plate 300 may be disposed to face the light emitting chip 570. The optical plate 300 may include a phosphor therein, and may be disposed on the top surface of the body 510. The optical plate 300 includes a frame-shaped support 310 having an open region 342, a phosphor layer 340 in the support 310, a first transparent film 320 disposed below the support 310 and the phosphor layer 340, and a second transparent film 330 disposed above the support 310 and the phosphor layer 340. The optical plate 300 according to an embodiment is provided with a thickness smaller than the thickness of the light emitting device 500 and may function as a lighting plate or a fluorescent plate on the light emitting device 500.

FIGS. 28 to 31 illustrate a process of manufacturing the optical plate in the lighting device of FIG. 14.

Figure 28:
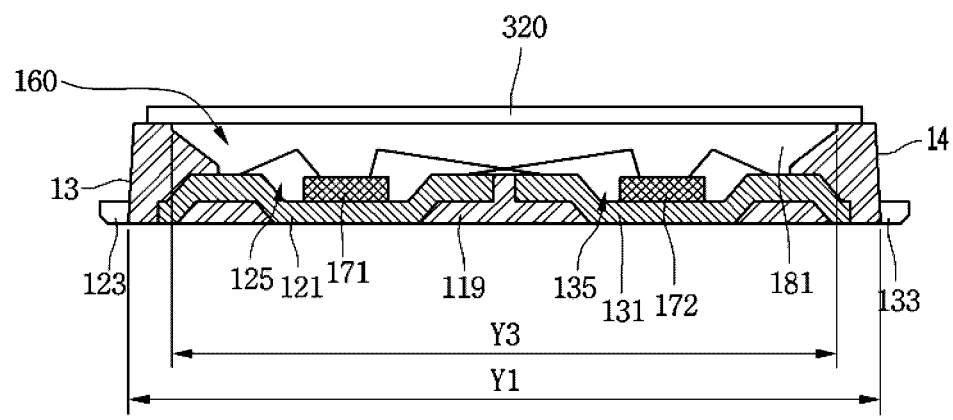

Referring to FIG. 28, a molding member 181 is molded in a light emitting device 100, and a first transparent film 320 is bonded to the molding member 181 before the molding member 181 is cured.

Figure 29:
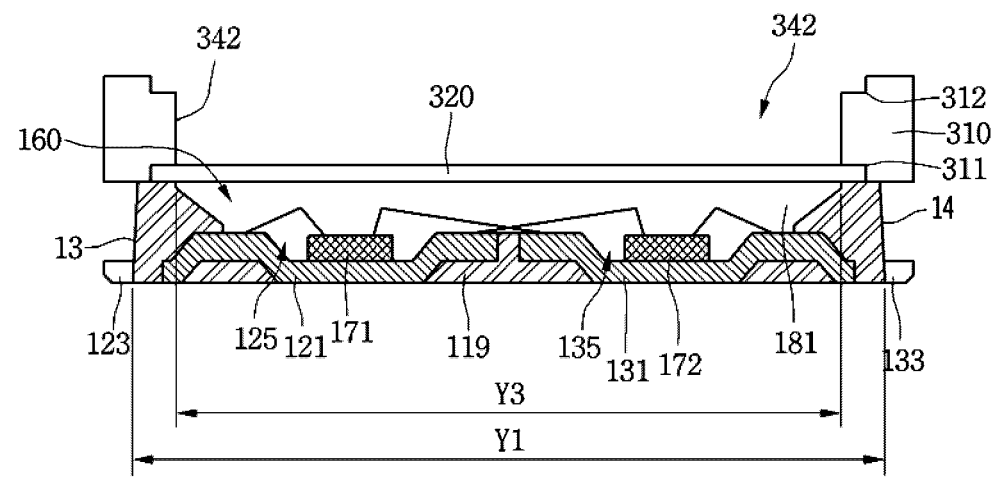

Referring to FIG. 29, a support 310 having a first stepped part 311 and/or a second stepped part 312 is bonded to a top surface 15 of a body 110 of the light emitting device 100. At this time, the outer periphery of the first transparent film 320 may be disposed on the first stepped part 311. The support 310 may include an open region 342 therein, and the open region 342 may be disposed on the molding member 181 and the first transparent film 320. Since the bottom surface of the support 310 is bonded to the top surface of the body 110 of the light emitting device 100, the support 310 may cover the outer periphery of the first transparent film 320.

Figure 30:
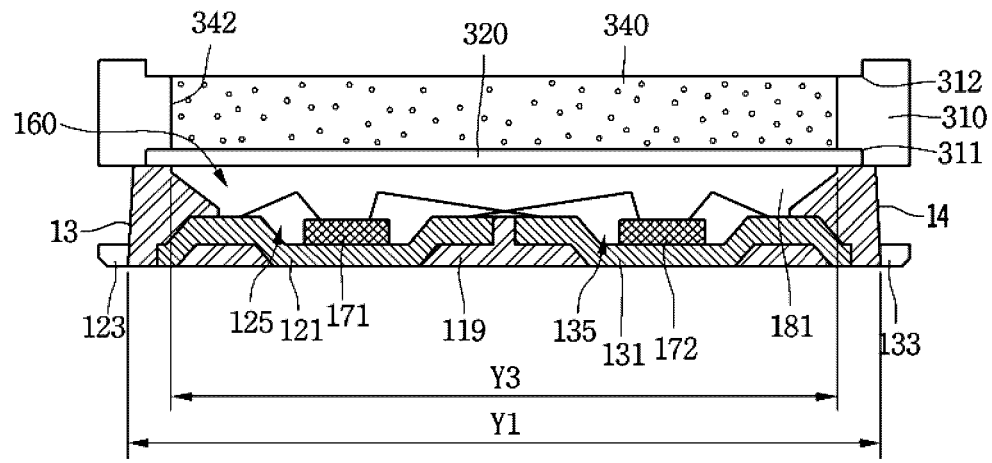

Referring to FIG. 30, a phosphor layer 340 is molded in the open region 342 of the support 310. The phosphor layer 340 is dispensed on the first transparent film 320 to fill the open region 342.

Figure 31:
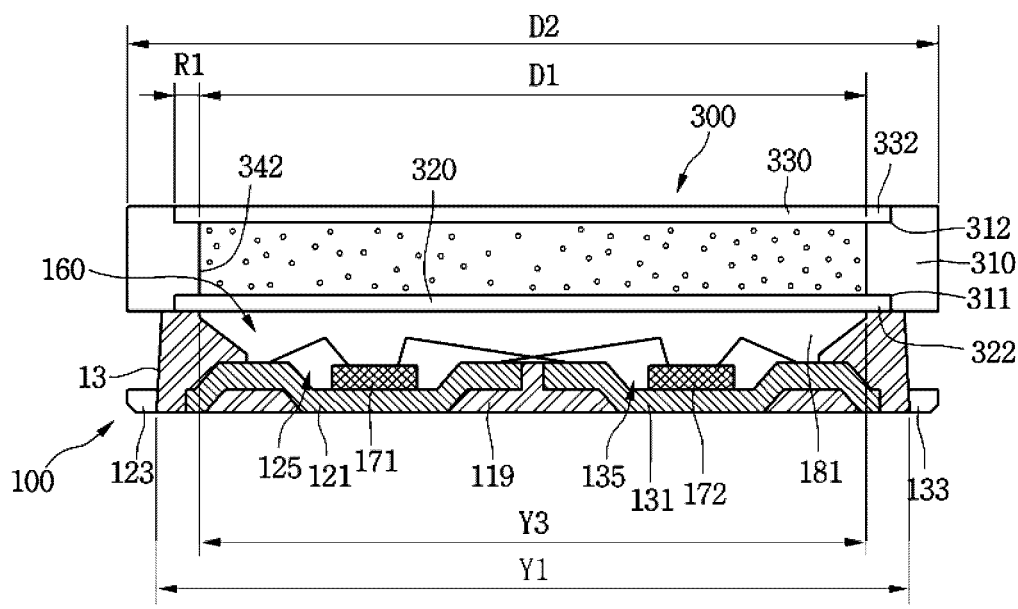

Referring to FIG. 31, a second transparent film 330 is bonded to the phosphor layer 340 before the phosphor layer 340 is cured. A second stepped part 312 of the support 310 may be disposed around the outer periphery of the second transparent film 330.

FIG. 32 is a side cross-sectional view illustrating an example of a reflective plate in the outer side of the optical plate of the lighting device of FIG. 11.

Referring to FIG. 32, the lighting device according to the embodiment may further include a reflective plate 30 in the outer side of the optical plate 300. The reflective plate 30 may further include a reflective part 31 disposed along the outer periphery of the optical plate 30.

The reflective part 31 of the reflective plate 30 may be disposed along the outer periphery of the first and second transparent films 320 and 330 of the optical plate 30 and may reflect leaking light.

The reflective plate 30 may be a white resin material, a plastic material, or a metal material. A part of the reflective plate 30 may be disposed in the outer side of the top surface of the optical plate 300, or may be disposed on the top surface of the optical plate 300, but embodiments of the present invention are not limited thereto.

The reflective plate 30 may extend from the outer periphery of the optical plate 30 to the outer periphery of the body 110 of the light emitting device 100. The reflective plate 30 may contact the outer side of the body 110, for example, third and fourth side parts 13 and 14, but embodiments of the present invention are not limited thereto. The reflective plate 30 may be spaced apart from the lead parts 123 and 133 of the lead frames 121 and 131, but embodiments of the present invention are not limited thereto.

FIG. 33 is a side cross-sectional view illustrating another example of the optical plate in the lighting device of FIG. 9, and FIG. 34 is another side cross-sectional view of the lighting device of FIG. 33.

Referring to FIGS. 33 and 34, an optical plate 301 is disposed on the light emitting device 100, and the optical plate 301 includes a support 310, a transparent film 330, and a phosphor layer 340. The optical plate 301 has a structure in which the first transparent film is removed from the optical plate 301 according to the embodiment. The light emitting device 100 can be understood by referring to the configuration and description of the light emitting device of the above embodiments.

In the optical plate 301, the phosphor layer 340 is disposed in the open region 342 of the support 310, and the phosphor layer 340 is bonded on the molding member 181 of the light emitting device 100.

The support 310 may be disposed above the light emitting device 100. The bottom surface of the support 310 may be disposed above the top surface 15 of the body 110. The bottom surface of the support 310 may be disposed above the top surface of the molding member 181. The support 310 may overlap the top surface 15 of the body 110 in a vertical direction.

The length D1 of the open region 342 and the phosphor layer 340 in the Y-axis direction may be greater than the length Y3 of the recess 160 of the light emitting device 100 in the Y-axis direction or less than the length D2. The width D4 of the open region 342 and the phosphor layer 340 in the X-axis direction may be greater than the width of the recess 160 of the light emitting device 100 in the X-axis direction or less than the width D3. That is, Y3≤D1>D2.

When the area of the bottom surface of the phosphor layer 340 is equal to the area of the top surface of the recess 160, the support 310 is not disposed on the recess 160, and thus does not influence the optical path. Accordingly, the optical loss caused by the support 310 can be reduced. When the support 310 is a reflective material, the support 310 can reflect incident light to adjust the orientation characteristics of the light. As another example, when the support 310 is a transmissive material, the support 310 can transmit light.

As another example, a reflective layer may be further disposed in the outer periphery of the phosphor layer 340 or the inner surface of the support 310 and may reflect incident light.

A molding member 181 may be disposed in the recess 160, and the molding member 181 may contact the phosphor layer 340. When the area of the bottom surface of the phosphor layer 340 is equal to the area of the top surface of the recess 160, the contact area between the molding member 181 and the phosphor layer 340 may be improved. A sidewall 17 of the recess 160 may be formed with an inclined surface, and the inclined surface 17 may reflect incident light in a direction of the phosphor layer 340.

In the optical plate 301, since one sheet of the transparent film 330 is removed, the thickness of the optical plate 301 may be reduced, and the optical loss at the interface with the molding member 181 may be reduced. The molding member 181 maintains the interval G1 between the phosphor layer 340 of the optical plate 301 and the light emitting chips 171 and 172, thereby reducing the problem that the phosphor in the phosphor layer 340 is degraded.

A process of manufacturing and assembling the optical plate of FIGS. 33 and 34 will be described with reference to FIGS. 35 to 37.

As illustrated in FIG. 35, after the transparent film 330 and the support 310 are disposed, the phosphor layer 340 is dispensed to the open region 342 of the support 310 and cured to complete the optical plate 301. As illustrated in FIG. 36, before the molding member 181 dispensed to the recess 160 of the light emitting device 100 is cured, the optical plate 301 is overturned such that the transparent film 330 faces upward, and the phosphor layer 340 is bonded on the molding member 181. Then, as illustrated in FIG. 37, the optical plate 301 may be bonded on the molding member 181 of the light emitting device 100.

The interface between the top surface of the body 110 of the light emitting device 100 and the support 310 may be bonded by an adhesive member. Since the interface is bonded by the adhesive member, it is possible to prevent the molding member 181 from leaking out to the outside.

FIG. 38 illustrates another example of the lighting device of FIG. 33.

Referring to FIG. 38, the optical plate 301 may include a support 310, a phosphor layer 340, and a transparent film 330 and may be disposed on the light emitting device 100. The phosphor layer 340 of the optical plate 301 may be bonded to the molding member 181 of the light emitting device 100. At this time, the transparent film 330 of the optical plate 301 has the length D2 greater than the length D1 of the phosphor layer 340 and the width greater than the width of the phosphor layer 340. The transparent film 330 may be disposed on the top surfaces of the phosphor layer 340 and the support 310. That is, the transparent film 330 may extend a part of the top surface of the support 310 or the entire top surface of the support 310.

The transparent film 330 disposed on the top surfaces of the phosphor layer 340 and the support 310 emits light wavelength-converted by the phosphor layer 340. When the support 310 is a reflective material, the support 310 may block leakage of light in a lateral direction. When the support 310 is a transmissive material, light passing through the support 310 may be emitted through the outside of the transparent film 330 and the support 310.

A reflective layer may be further disposed in the outer periphery of the phosphor layer 340 or the inner surface of the support 310 and may reflect incident light.

FIG. 39 illustrates another example of the lighting device of FIG. 33.

Referring to FIG. 39, the optical plate 301 may include a support 310, a phosphor layer 340, and a transparent film 330 and may be disposed on the light emitting device 100.

The phosphor layer 340 may be disposed on the recess 160 of the light emitting device 100, and may extend to the top surface 15 of the body 110 of the light emitting device 100. That is, a part of the outer side of the phosphor layer 340 may extend to the top surface 15 of the body 110 of the light emitting device 100. The phosphor layer 340 may be bonded to the top surface 15 of the body 110. Accordingly, the outer side of the bottom surface of the phosphor layer 340 may prevent the molding member 181 disposed in the recess 160 of the light emitting device 100 from leaking out between the body 110 and the optical plate 301. The length D1 of the phosphor layer 340 or the length of the open region 342 may be greater than the upper length Y3 of the recess 160 or the upper length of the molding member 181.

FIG. 40 illustrates a modification example of a lighting device including a light emitting device of FIG. 24.

Referring to FIG. 40, the light emitting device 100A refers to the configuration of FIG. 24, and an optical plate 301 is disposed on the light emitting device 100A. The optical plate 301 may include a support 310, a phosphor layer 340, and a transparent film 330 and may be disposed on the light emitting device 100A.

The phosphor layer 340 of the optical plate 301 may contact the molding member 181 disposed in a recess 162 of the light emitting device 100A. The molding member 181 may space a gap between light emitting chips 171 and 172 of the light emitting device 100 and the phosphor layer 340 of the optical plate 301 at a predetermined interval G2. Accordingly, it is possible to protect the phosphor layer 340 from heat generated therein.

FIGS. 41 and 42 illustrate an assembly example of the optical plate in the light emitting device of FIGS. 25 and 26.

Referring to FIG. 41, the optical plate 301 is disposed on a light emitting device 400. The optical plate 301 may include a support 310, a phosphor layer 340, and a transparent film 330 and may be disposed on the light emitting device 400.

In the light emitting device 400, a molding member 440 is disposed in the recess 425, and the phosphor layer 340 of the optical plate 301 contact the molding member 440. Since the phosphor layer 340 contacts the molding member 440, the optical loss can be reduced at the interface between the phosphor layer 340 and the molding member 440.

Referring to FIG. 42, the optical plate 301 is disposed on a light emitting device 500. The optical plate 301 may include a support 310, a phosphor layer 340, and a transparent film 330 and may be disposed on the light emitting device.

In the light emitting device 500, a molding member 531 is disposed in the recess 517, and the phosphor layer 340 of the optical plate 301 contact the molding member 531. Since the phosphor layer 340 contacts the molding member 531, the optical loss can be reduced at the interface between the phosphor layer 340 and the molding member 531.

Second Embodiment

FIGS. 43 and 44 illustrate a light emitting device including an optical plate according to a second embodiment. In describing the second embodiment, the configurations disclosed in the first embodiment or the modification examples of the first embodiment will be referred to. The configurations disclosed in the first embodiment or the modification examples of the first embodiment may be selectively applied to the second embodiment.

Referring to FIGS. 43 and 44, the light emitting device 100B includes a body 110 having a recess 160, a plurality of lead frames 121 and 131 in the recess 160, and at least one light emitting chip 171 and 172 in the recess 160.

The light emitting device 100B includes an optical plate 300 in the recess 160 of the body 110. The light emitting device 100B including the optical plate 300 may be defined as a lighting device.

One or more lead frames 121 and 131 in the recess 160 may include cavities 125 and 135, and the light emitting chips 171 and 172 may be disposed in the cavities 125 and 135.

A molding member 181 may be disposed in the recess 160, and the molding member 181 may contact the bottom surface of the optical plate 300. The top surface of the molding member 181 may be disposed below the top surface 15 of the body 110.

The recess 160 may include a first sidewall 17 adjacent to the lead frames 121 and 131, and a second sidewall 18 between the first sidewall 17 and the top surface 15 of the body 110. The first sidewall 17 may be formed with a surface inclined with respect to the optical axis, and the inclined surface may reflect light in a direction of the optical plate 300. The second sidewall 18 may be formed with a surface parallel to the optical axis or a surface inclined with respect to the optical axis. The second sidewall 18 may be disposed to be vertical or inclined between the first sidewall 17 and the top surface 15 of the body 110. The second sidewall 18 may contact the side surface of the optical plate 300 or may be bonded by an adhesive material.

The length Y3 of the upper portion of the recess 160 in the Y-axis direction may be equal to or greater than the upper length of the molding member 160 or may be equal to the length of the optical plate 300. The length Y3 of the upper portion of the recess 160 in the Y-axis direction and the width X2 thereof in the X-axis direction may have a length and a width such that the optical plate 300 can be inserted thereinto.

The recess 160 may include a first sidewall 17 adjacent to the bottom, and a second sidewall 18 between the first sidewall 17 and the top surface 15 of the body 110. The upper end of the first sidewall 17 may be a boundary part with the second sidewall 18. The position of the bottom surface of the optical plate 300 may be equal to or different from the height of the top surface of the molding member 181. The position of the bottom surface of the optical plate 300 may be adjusted to the position of the boundary part between the first sidewall 17 and the second sidewall 18 of the recess 160. Accordingly, the interval G1 between the optical plate 300 and the light emitting chips 171 and 172 may be adjusted to the interval described above.

The optical plate 300 includes a support 310 having an open region 342, a phosphor layer 340 in the open region 342 of the support 310, and transparent films 320 and 330 disposed on at least one of the top surface and the bottom surface of the support 310 and the phosphor layer 340. A detailed configuration of the optical plate 300 will refer to the description provided in the above embodiments, and the light emitting devices and/or the optical plates according to the above embodiments may be selectively applied.

In the optical plate 300, one of the first and second transparent films 320 and 330 may be removed. For example, the first or second transparent film 320 or 330 may be removed, but embodiments of the present invention are not limited thereto. The first transparent film 320 may be bonded on the surface of the molding member 181. As another example, when the molding member 181 is removed, air gap may exist in the recess 160 of the light emitting device 100B, and the first transparent film 320 may be disposed on the air gap.

The first transparent film 320 may be bonded to the bottom surface of the support 310 and the bottom surface of the phosphor layer 340. The second transparent film 330 may be bonded to the top surface of the support 310 and the top surface of the phosphor layer 340. The first and second transparent films 320 and 330 and the support 310 may contact the second sidewall 18 of the recess 160 and may be bonded thereto by an adhesive material.

The length D1 of the phosphor layer 340 in the Y-axis direction is a length of the open region 342 and may be less than the length Y3 of the recess 160. In addition, the phosphor layer 340 may overlap the light emitting chips 171 and 172 in a vertical direction and may effectively perform wavelength conversion of incident light.

A molding member 181 may be disposed between the optical plate 300 and the light emitting chips 171 and 172. The molding member 181 may be disposed between the light emitting chips 171 and 172 and the phosphor layer 340. The molding member 181 may not include the phosphor. As another example, the molding member 181 may include a phosphor different from the phosphor included in the phosphor layer 340.

The molding member 181 may space the first transparent film 320 apart from the light emitting chips 171 and 172 by a predetermined interval. The top surface of the optical plate 300 may be disposed on the same horizontal plane as the top surface 15 of the body 110, or may be disposed to be higher or lower than the top surface 15 of the body 110. The top surface of the second transparent film 330 may be disposed on the same horizontal plane as the top surface 15 of the body 110, or may be disposed to be higher or lower than the top surface 15 of the body 110. Even when the top surface of the second transparent film 330 is disposed above the top surface of the body 110, the loss of the light emitted through the side surface of the second transparent film 330 disposed on the top surface of the body 110 may be slight. The light emitted through the side surface of the second transparent film 330 is slight as compared with the light emitted to the top surface of the second transparent film 330 and may does not almost influence the orientation angle distribution.

FIGS. 45 and 46 illustrate a process of assembling the optical plate to the light emitting device of FIG. 43.

As illustrated in FIG. 45, after the molding member 181 is dispensed in the recess 160 of the body 110 of the light emitting device 100B, the prepared optical plate 300 is inserted into the recess 160 as illustrated in FIG. 46. The first transparent film 320 of the optical plate 300 may be bonded to the surface of the molding member 181, and when the molding member 181 is cured, the first transparent film 320 may be bonded to the surface of the surface of the molding member 181.

FIG. 47 illustrates another example of the optical plate in the light emitting device of FIG. 43.

Referring to FIG. 47, the optical plate 300 may be disposed in the recess 160 of the light emitting device 100B. The optical plate 301 includes a support 310 having an open region 342, a phosphor layer 340 in the open region 342, and a transparent film 330 disposed on the phosphor layer 340 and the support 310.

The support 310 may include a transmissive material or a reflective material. The support 310 and the phosphor layer 340 may be bonded to the surface of the molding member 181. The optical plate 301 has a structure in which the first transparent film 320 is removed from the optical plate 300 of FIG. 43. The transparent film 330 disposed on the phosphor layer 340 can be understood by referring to the second transparent film according to the embodiment.

In the optical plate 301, the transparent film 330 may be disposed on the phosphor layer 340 and the support 310 and may emit light wavelength-converted by the phosphor layer 340 and light of the light emitting chips 171 and 172.

In the process of manufacturing the optical plate 300, the transparent film is positioned on the base, the support 310 is formed, and the phosphor layer 340 is molded in the open region 342 of the support 310. When the phosphor layer 340 is cured, the phosphor layer 340 is cut into predetermined units and rotated such that the transparent film faces upward.

FIG. 48 illustrates a modification example of the optical plate in the light emitting device of FIG. 43.

Referring to FIG. 48, the optical plate 300 may be disposed in the recess 160 of the body 110 of the light emitting device 100B.

The optical plate 300 includes a support 310 having an open region 342, a first transparent film 320, a second transparent film 330, and a phosphor layer 340. The optical plate 300 is disposed in the recess 160. The optical plate 300 is disposed above the first sidewall 17 of the recess 160 and disposed inside the second sidewall 18.

The support 310 may include a transmissive material or a reflective material. The support 310 may include stepped structures 311 and 312. The stepped structures 311 and 312 may be formed along the inner periphery of at least one of the bottom surface and four surfaces of the support 310. For example, a first stepped structure 311 may be provided in the inner periphery of the bottom surface, and a second stepped structure 312 may be provided in the inner periphery of the top surface.

The first stepped structure 311 is a structure that is stepped from the bottom surface of the support 310, and the second stepped structure 312 is a structure that is stepped from the top surface of the support 310. The outer part 322 of the first transparent film 320 may be disposed in the first stepped structure 311, and the outer part 332 of the second transparent film 330 may be disposed in the second stepped structure 312. The outer parts 322 and 332 of the first and second transparent films 320 and 330 may overlap the support 310 in a vertical direction. Accordingly, the first and second transparent films 320 and 330 may improve the adhesion strength with the support 310 and may prevent leakage of the phosphor layer 340.

The thickness of the support 310 may be thicker than the thickness of the phosphor layer 340. The length of the first transparent film 320 in the Y-axis direction may be greater than the length of the phosphor layer 340 in the Y-axis direction.

FIG. 49 illustrates a modification example of the light emitting device including the optical plate according to the embodiment.

Referring to FIG. 49, the light emitting device 100B may have a stepped structure 18A on a second sidewall 18 of a body 110 having a recess 160. The stepped structure 18A may be recessed at a depth lower than a top surface 15 of the body 110 and may be disposed in the outer periphery of a top surface of the second sidewall 18.

The optical plate 300 includes a support 310, a first transparent film 320, a second transparent film 330, and a phosphor layer 340. The optical plate 300 can be understood by referring to the configuration and description of the first embodiment.

The outer part of the second transparent film 330 may be disposed in the stepped structure 18A of the body 110. The length of the second transparent film 330 may be greater than the length of the first transparent film 320, is greater than the length of the phosphor layer 340, and less than the upper length Y4 of the body 110. Since the second transparent film 330 can be bonded to the stepped structure 18A of the body 110, it is possible to block moisture penetration and to prevent the molding member 181 from being exposed to the outside.

FIG. 50 illustrates another example of the optical plate in the light emitting device.

Referring to FIG. 50, the optical plate 300 may be disposed in a recess 160 of the light emitting device. The optical plate 300 includes a support 310, a first transparent film 320, a second transparent film 330, and a phosphor layer 340. A detailed configuration of the optical plate 300 can be understood by referring to the description provided in the above embodiments, and the light emitting devices and/or the optical plates according to the above embodiments may be selectively applied.

The support 310 may be disposed around the first transparent film 320, the second transparent film 330, and the phosphor layer 340, and may be a transmissive material or a reflective material. The support 310 may be a transmissive material for light extraction efficiency.

The first and second transparent films 320 and 330 may not overlap the support 310 in a vertical direction. The length of the first and second transparent films 320 and 330 may be equal to the length D1 of the phosphor layer 340. The molding member 181 disposed in the recess 160 may contact the bottom surfaces of the first transparent film 320 and the support 310.

FIG. 51 illustrates a modification example of the light emitting device including the optical plate according to the embodiment.

Referring to FIG. 51, the light emitting device 100B includes a body 110 having a recess 160, a plurality of lead frames 121 and 131 in the recess 160, and at least one light emitting chip 171 and 172 in the recess 160.

A molding member 181 may be disposed in the recess 160, and the optical plate 300 may be disposed on the molding member 181. The optical plate 300 may be disposed in the recess 160. The optical plate 300 can be understood by referring to the above description.

The recess 160 may include an inclined first sidewall 17, a second sidewall 18 between the first sidewall 17 and the top surface 15, and a mounting part 17A between the first and second sidewalls 17 and 18. The mounting part 17A may be disposed as a horizontal plane and may face the outer periphery of the bottom surface of the optical plate 300. The outer side of the bottom surface of the first transparent film 320 or the bottom surface of the support 310 may contact the mounting part 17A, but embodiments of the present invention are not limited thereto. The width of the mounting part 17A may be equal to or greater than the width W1 of the support 310 in the length direction. Accordingly, when the support 310 is a transmissive material, incident light may be transmitted and reflected by the second sidewall 18. When the support 310 is a reflective material, incident light may be reflected. Since the support 310 is disposed on the mounting part 17A, the light of the light emitting device may not greatly influence the orientation angle of the light.

FIG. 52 illustrates a modification example of a light emitting device according to an embodiment.

Referring to FIG. 52, the optical plate 301 is disposed in a recess 160 of a light emitting device 100B.

The recess 160 may include a mounting part 17A between the first and second sidewalls 17 and 18, and may be disposed around the bottom surface of the optical plate 300 on the mounting part 17A.

The optical plate 300 includes a support 310, a transparent film 330, and a phosphor layer 340. The phosphor layer 300 has a structure in which the first transparent film is removed below the recess 160, and the phosphor layer 340 may be bonded to the molding member 181. The optical plate 300 can be understood by referring to the above description. The support 310 may be disposed in the mounting part 17A. Since the phosphor layer 340 directly contacts the molding member 181, it is possible to reduce the loss of light emitted from the light emitting chips 171 and 172.

FIG. 53 illustrates a modification example of a light emitting device according to an embodiment.

Referring to FIG. 53, the optical plate 300 is disposed in a recess 160 of a body 110 of a light emitting device 100B.

The recess 160 may include a mounting part 17A between the first and second sidewalls 17 and 18, and may be disposed around the bottom surface of the optical plate 300 on the mounting part 17A.

The optical plate 300 includes a support 310, a first transparent film 320, a second transparent film 330, and a phosphor layer 340. The first transparent film 320 may be bonded to the molding member 181. The outer periphery of the first transparent film 320 may be disposed on the mounting part 17A. The optical plate 300 can be understood by referring to the above description.

The recess 160 may include an inclined first sidewall 17, and a second sidewall 18 disposed in the outer periphery of the optical plate 300. The second sidewall 18 may be disposed with a height lower than the thickness of the optical plate 300, and the top surface 15 of the body 110 may be disposed to be lower than the top surface of the optical plate 300. In this case, the upper outer side of the support 310 of the optical plate 300 may be exposed on the second sidewall 18. When the material of the support 310 is a reflective material, it is possible to block light leaking out to the outside through the support 310. When the material of the support 310 is a transmissive material, the orientation angle of the light may be widened.

FIG. 54 illustrates a modification example of the optical plate in the light emitting device of FIG. 43.

Referring to FIG. 54, the optical plate 300 may be disposed in a recess 160 of a light emitting device 100B. The optical plate 300 includes a support 310, a first transparent film 320, a second transparent film 330, and a phosphor layer 340. The optical plate 300 can be understood by referring to the above description.

The support 310 may include a first stepped part 311 on a bottom surface thereof, a second stepped part 312 on a top surface thereof. The outer part of the first transparent film 320 may be disposed in the first stepped structure 311, and the outer part of the second transparent film 330 may be disposed in the second stepped structure 312. The top surface of the support 310 may be disposed above the top surface of the body 110. The support 310 may be made of a transmissive material or a reflective material. The outer upper portion of the support may be disposed above the top surface of the body 110, and the support 310 may transmit or reflect light according to the material.

FIG. 55 illustrates an example of the optical plate in the light emitting device of FIG. 24.

Referring to FIG. 28, in the light emitting device 100C, an optical plate 300 is disposed in a recess 160 of a body 110A. The recess 160 includes a first sidewall 17, and a second sidewall 18 between the first sidewall 17 and the top surface 15 of the body 110A. A molding member 181 may be disposed in the recess 160, and the optical plate 300 may be bonded to the molding member 181.

The second sidewall 18 may be disposed in the outer side of the optical plate 300. The optical plate 300 according to the embodiment may include a support 310, a first transparent film 320, a second transparent film 330, and a phosphor layer 340. The optical plate 300 can be understood by referring to the above description.

The support 310 may include an open region 342; and the phosphor layer 340 may be disposed in the open region 342. The first transparent film 320 may be disposed below the phosphor layer 340 and the support 310, and the second transparent film 330 may be disposed above the phosphor layer 340 and the support 310. The optical plate 300 may be changed to any one structure of the optical plates 300 of FIGS. 46 to 54, but embodiments of the present invention are not limited thereto.

FIG. 56 illustrates a structure including the optical plate of FIG. 43 in the light emitting device of FIG. 26.

Referring to FIG. 56, the optical plate 300 is disposed in a recess 425 of a body 410 in a light emitting device 400A. The light emitting device 400A can be understood by referring to the configuration of FIG. 26, and the optical plates of FIGS. 47 to 54 may be selectively applied to the optical plate 300.

FIG. 57 illustrates a structure including the optical plate of FIG. 43 in the light emitting device of FIG. 27.

Referring to FIG. 57, the optical plate 300 is disposed in a recess 517 of a body 510 in a light emitting device 500A. The light emitting device 500A can be understood by referring to the description of FIG. 27, and the optical plates of FIGS. 47 to 54 may be selectively applied to the optical plate 300.

Third Embodiment

FIGS. 58 and 59 illustrate a modification example of the light emitting device of FIGS. 43 and 44 as a light emitting device including an optical plate according to a third embodiment. In describing the third embodiment, the embodiment can be understood by referring to the configurations provided in the above embodiment or the modification examples thereof. The configurations disclosed in the first and second embodiments or the modification examples of the first and second embodiment may be selectively applied to the third embodiment.

Referring to FIGS. 58 and 59, the light emitting device 100B includes a body 110 having a recess 160, a plurality of lead frames 121 and 131 in the recess 160, and at least one light emitting chip 171 and 172 in the recess 160. A molding member 181 may be disposed on the recess 160. The light emitting device 100B can be understood by referring to the above description of the embodiments.

The light emitting device 100B includes an optical plate 302 in the recess 160 of the body 110. The light emitting device 100B including the optical plate 302 may be defined as a lighting device.

One or more lead frames 121 and 131 in the recess 160 may include cavities 125 and 135, and the light emitting chips 171 and 172 may be disposed in the cavities 125 and 135.

A molding member 181 may be disposed in the recess 160, and the molding member 181 may contact the bottom surface of the optical plate 302. The top surface of the molding member 181 may be disposed below the top surface 15 of the body 110.

The recess 160 may include a first sidewall 17 adjacent to the lead frames 121 and 131, and a second sidewall 18 between the first sidewall 17 and the top surface 15 of the body 110. The first sidewall 17 may be formed with a surface inclined with respect to the optical axis, and the inclined surface may reflect light in a direction of the optical plate 302. The second sidewall 18 may be formed with a surface parallel to the optical axis or a surface inclined with respect to the optical axis. The second sidewall 18 may be disposed to be vertical or inclined between the first sidewall 17 and the top surface 15 of the body 110. The second sidewall 18 may contact the side surface of the optical plate 302 or may be bonded by an adhesive material. The second sidewall 18 may be disposed in the outer periphery of the optical plate 302 and may reflect incident light. The optical axis may be a direction vertical to the top surfaces of the light emitting chips 171 and 172 and may be a perpendicular direction.

The length Y3 of the upper portion of the recess 160 may be equal to or greater than the upper length of the molding member 160 or may be equal to the length of the optical plate 302. The upper length Y3 and the width X2 of the recess 160 may have a length and a width such that the optical plate 302 can be inserted thereinto.

The upper end of the first sidewall 17 of the recess 160 may be a boundary part with the second sidewall 18. The insertion depth of the optical plate 302 may be limited to the height of the top surface of the molding member 181, or may be adjusted to the position of the boundary part between the first sidewall 17 and the second sidewall 18 of the recess 160. Accordingly, the interval G1 between the optical plate 300 and the light emitting chips 171 and 172 may be adjusted.

The optical plate 302 includes a phosphor layer 340, and transparent films 320 and 330 disposed on either or both of the top surface and the bottom surface of the phosphor layer 340. The optical plate 302 may have a structure in which the support is removed from the optical plate illustrated in FIG. 5.

The transparent films 320 and 330 may include a first transparent film 320 disposed between the phosphor layer 340 and the light emitting chips 171 and 172, and a second transparent film 330 disposed above the phosphor layer 340. The first transparent film 320 may be disposed between the molding member 320 and the phosphor layer 340. The first transparent film 320 may be bonded to the bottom surface of the phosphor layer 340 and may be bonded to the top surface of the molding member 181. A detailed configuration of the optical plate 302 will refer to the description provided in the above embodiments, and the light emitting devices and/or the optical plates according to the above embodiments may be selectively applied.

The first transparent film 320 may be bonded to the surface of the molding member 181. As another example, when the molding member 181 is removed, air gap may exist in the recess 160 of the light emitting device 100B, and the first transparent film 320 may be disposed on the air gap. The first and second transparent films 320 and 330 and the phosphor layer 340 may contact the second sidewall 18 of the recess 160 and may be bonded thereto by an adhesive material.

The length D1 of the phosphor layer 340 of the optical plate 302 in the Y-axis direction may be equal to or less than the upper length Y3 of the recess 160. In addition, the phosphor layer 340 may overlap the light emitting chips 171 and 172 in a vertical direction and may convert a wavelength of incident light.

A molding member 181 may be disposed between the optical plate 300 and the light emitting chips 171 and 172 and may maintain the interval G1 between the optical plate 300 and the light emitting chips 171 and 172. The molding member 181 may not include a phosphor and, if necessary, may include a phosphor different from the phosphor included in the phosphor layer 340.

The top surface of the optical plate 302 may be disposed on the same horizontal plane as the top surface 15 of the body 110, or may be disposed to be higher or lower than the top surface 15 of the body 110. The top surface of the second transparent film 330 may be disposed on the same horizontal plane as the top surface 15 of the body 110, or may be disposed to be higher or lower than the top surface 15 of the body 110. Even when the top surface of the second transparent film 330 is disposed to be higher than the top surface of the body 110, the optical loss may be slight.

The optical plate 302 may be inserted and bonded before the molding member 181 is cured. In the process of manufacturing the optical plate 302, the first transparent film 320 is disposed below the support having the open region, the phosphor layer 340 is formed in the open region, and the second transparent film 330 is covered. Then, the boundary line between the support and the phosphor layer 340 is cut to remove the support in the optical plate 302. The optical loss may be reduced by removing the support in the optical plate 302, and the area of the bottom surface of the phosphor layer 340 may be increased to substantially the same area as the area of the top surface of the recess 160.

FIG. 60 illustrates a modification example of the optical plate in the light emitting device of FIG. 58.

Referring to FIG. 60, the light emitting device 100B includes a body 110 having a recess 160, a plurality of lead frames 121 and 131 in the recess 160, and at least one light emitting chip 171 and 172 in the recess 160. A molding member 181 may be disposed on the recess 160.

The optical plate 302 may be disposed in the recess 160 of the light emitting device 100B. The optical plate 302 includes a phosphor layer 340, and transparent films 320 and 330 disposed on either or both of the top surface and the bottom surface of the phosphor layer 340. The configurations of the light emitting device 100B and the optical plate 302 can be understood by referring to the above description.

The transparent films 320 and 330 include a first transparent film 320 disposed between the phosphor layer 340 and the light emitting chips 171 and 172, and a second transparent film 330 disposed above the phosphor layer 340. The first transparent film 320 may be disposed between the phosphor layer 340 and the molding member 181. When the transparent films 320 and 330 are disposed on both sides of the phosphor layer 340, the optical plate 302 may protect the top surface and the bottom surface of the phosphor layer 340.

The optical plate 302 is disposed in the recess 160. The optical plate 302 is disposed above the first sidewall 17 of the recess 160 and disposed inside the second sidewall 18.

The light emitting device 100B may have a stepped structure 18A on the second sidewall 18 of the body 110. The stepped structure 18A may have a depth lower than the top surface 15 of the body 110 and may be disposed in the outer periphery of a top surface of the second sidewall 18.

The outer periphery of the second transparent film 330 may be disposed in the stepped structure 18A of the body 110. The length of the second transparent film 330 may be greater than the length of the first transparent film 320, is greater than the length of the phosphor layer 340, and less than the upper length Y4 of the body 110. The width of the second transparent film 330 may be greater than the upper width of the recess 160. Since the second transparent film 330 can be bonded to the stepped structure 18A of the body 110, it is possible to block moisture penetration and to prevent the molding member 181 from being exposed to the outside.

FIG. 61 illustrates a modification example of the optical plate in the light emitting device of FIG. 58.

Referring to FIG. 61, the optical plate 302 may be disposed in the recess 160 of the body 110 of the light emitting device 100B.

The optical plate 302 includes a second transparent film 330 and a phosphor layer 340. The optical plate 302 has a structure in which the first transparent film and the support are removed from the structure of FIG. 5. The configurations of the light emitting device 100B and the optical plate 302 can be understood by referring to the above description.

The optical plate 302 is disposed in the recess 160. The optical plate 302 is disposed above the first sidewall 17 of the recess 160 and disposed inside the second sidewall 18.

The phosphor layer 340 faces the light emitting chips 171 and 172 and is disposed on the molding member 181. The bottom surface of the phosphor layer 340 may be spaced apart from the light emitting chips 171 and 172 by a predetermined interval G1 by the height of the top surface of the molding member 181.

The outer sides of the phosphor layer 340 and the second transparent film 330 may be disposed in the second sidewall 18 of the recess 160. The phosphor layer 340 is bonded to the inner side of the second sidewall 18 of the recess 160 and the molding member 181, thereby preventing moisture penetration in the outside and preventing the molding member 181 from being exposed to the outside.

The second transparent film 330 may be disposed on the inner side of the second sidewall 18. The top surface of the second transparent film 330 may be disposed on the same horizontal plane as the top surface 15 of the body 110, or may be disposed to be higher or lower than the top surface 15 of the body 110.

The length of the phosphor layer 340 and the second transparent film 330 may be equal to the upper length Y3 of the recess 160. In addition, the length of the second transparent film 330 may be equal to the length of the phosphor layer 340 or greater than the length of the phosphor 340, but embodiments of the present invention are not limited thereto.

FIG. 62 illustrates a modification example of the light emitting device including the optical plate according to the embodiment.

Referring to FIG. 62, the optical plate 302 may be disposed in the recess 160 of the body 110 of the light emitting device 100B.

The optical plate 302 includes a second transparent film 330 and a phosphor layer 340. The optical plate 302 has a structure in which the first transparent film and the support are removed from the structure of FIG. 5. The configurations of the light emitting device 100B and the optical plate 301 can be understood by referring to the above description.

The optical plate 302 is disposed in the recess 160. The optical plate 302 is disposed above the first sidewall 17 of the recess 160 and disposed inside the second sidewall 18.

The phosphor layer 340 faces the light emitting chips 171 and 172 and is disposed on the molding member 181. The bottom surface of the phosphor layer 340 may be spaced apart from the light emitting chips 171 and 172 by a predetermined interval G1 by the height of the top surface of the molding member 181.

The outer sides of the phosphor layer 340 and the second transparent film 330 may be disposed in the second sidewall 18 of the recess 160. The phosphor layer 340 is bonded to the inner side of the second sidewall 18 of the recess 160 and the molding member 181, thereby preventing moisture penetration in the outside and preventing the molding member 181 from being exposed to the outside.

The second transparent film 330 may be disposed on the inner side of the second sidewall 18. The top surface of the second transparent film 330 may be disposed on the same horizontal plane as the top surface 15 of the body 110, or may be disposed to be higher or lower than the top surface 15 of the body 110.

The inner side of the first sidewall 17 of the recess 160 may be inclined at a first angle θ1 with respect to the optical axis or the vertical axis, and the inner side of the second side 18 may be inclined at a second angle θ2 with respect to the optical axis or the vertical axis. The second angle θ2 is smaller than the first angle θ1 with reference to the optical axis or the vertical axis, thereby improving the orientation angle and intensity of light.

The outer side of the phosphor layer 340 may contact a surface inclined to the inner surface of the second sidewall 18 of the recess 160. The length of the top surface of the phosphor layer 340 may be greater than the length of the bottom surface thereof. The area of the top surface of the phosphor layer 340 is larger than the area of the bottom surface thereof, thereby improving the area of the light exit surface.

An adhesive member 335 may be disposed in a region between the outer side of the second transparent film 330 disposed on the phosphor layer 340 and the second sidewall 18 of the recess 160. The adhesive member 335 is disposed in a gap between the second transparent film 330 and the second sidewall 18, thereby preventing moisture penetration. The adhesive member 335 may protrude above the top surface 15 of the body 110, but embodiments of the present invention are not limited thereto.

As another example, a first transparent film to be described below or a first transparent film having an open region may be further disposed below the phosphor layer 340, but embodiments of the present invention are not limited thereto.

FIG. 63 illustrates a modification example of the light emitting device including the optical plate according to the embodiment, and (A) and (B) of FIG. 64 are an example of bottom views of the optical plate.

Referring to FIGS. 63 and 64, the optical plate 303 may be disposed in the recess 160 of the body 110 of the light emitting device 100B. The configurations of the light emitting device 100B and the optical plate 303 can be understood by referring to the above description.

The optical plate 303 includes a first transparent film 320, a second transparent film 330, and a phosphor layer 340. The optical plate 303 has a structure in which the support is removed from the structure of FIG. 5 and the first transparent film is modified. In a method of manufacturing the optical plate 303, a second transparent film 330 is positioned on a base, a phosphor layer 340 is formed on the second transparent film 330, and a first transparent film 320 is bonded before the phosphor layer 340 is cured. The manufactured plate is cut to a predetermined size, is overturned such that the first transparent film 320 faces the base, and is disposed in a recess 160 of a body 110.

The optical plate 303 is disposed in the recess 160. The optical plate 302 is disposed above the first sidewall 17 of the recess 160 and disposed inside the second sidewall 18.

The first transparent film 320 may have an open region 326 in which the outer periphery is opened, and the outer lower portion 345 of the phosphor layer 340 may protrude through the open region 326. As illustrated in (A) of FIG. 64, the open region 326 of the first transparent film 320 may be disposed along the outer side of the first transparent film 320. In this case, the outer lower portion 345 of the phosphor layer 340 may be disposed along the outer periphery of the first transparent film 320. As another example, as illustrated in (B) of FIG. 64, the open region 326 of the first transparent film 320 may be disposed on both outer sides of the first transparent film 320. In this case, the outer lower portion 345 of the phosphor layer 340 may be disposed on both sides of the first transparent film 320. The outer lower portions 345 of the first transparent film 320 and the phosphor layer 340 may contact the molding member 181 of FIG. 63.

The first transparent film 320 may be disposed in the inner region of the phosphor layer 340, and may overlap the light emitting chips 171 and 172 in a vertical direction. The first transparent film 320 may reflect or transmit light incident from the light emitting chips 171 and 172. The outer lower portion 345 of the phosphor layer 340 contacts the molding member 181, thereby reducing the loss of incident light.

The length Y5 of the first transparent film 320 may be less than the upper length Y3 of the recess 160 and less than the bottom length of the recess 160. The interval G5 between the light emitting chips 171 and 172 in the light emitting device 100B may be less than the length Y5 of the first transparent film 320. The width of the first transparent film 320 may be less than the bottom width of the recess 160. The length Y5 of the first transparent film 320 may be greater than the interval between the plurality of light emitting chips 171 and 172 and may have a size overlapping the region of the cavities 125 and 135 of the plurality of lead frames 121 and 131 in a vertical direction. The first transparent film 320 may diffuse light incident from the light emitting chips 171 and 172.

The first transparent film 320 may be spaced apart from the second sidewall 18 of the recess 160. The outer sides of the phosphor layer 340 and the second transparent film 330 may be disposed in the second sidewall 18 of the recess 160. The phosphor layer 340 is bonded to the inner side of the second sidewall 18 of the recess 160, thereby preventing moisture penetration in the outside and preventing the molding member 181 from being exposed to the outside.

The second transparent film 330 may be disposed in the inner side of the second sidewall 18 of the recess 160. The top surface of the second transparent film 330 may be disposed on the same horizontal plane as the top surface 15 of the body 110, or may be disposed to be higher or lower than the top surface 15 of the body 110.

FIG. 65 illustrates a modification example of the light emitting device including the optical plate according to the embodiment, and (A) and (B) of FIG. 66 are an example of bottom views of the optical plate.

Referring to FIGS. 65 and 66, the optical plate 303 may be disposed in the recess 160 of the body 110 of the light emitting device 100B. The optical plate 303 includes a first transparent film 320, a second transparent film 330, and a phosphor layer 340. The optical plate 303 has a structure in which the support is removed from the structure of FIG. 5 and the first transparent film is modified. Detailed configurations of the light emitting device 100B and the optical plate 303 can be understood by referring to the description provided in the above embodiments, and the light emitting devices and/or the optical plates according to the above embodiments may be selectively applied.

The optical plate 303 is disposed in the recess 160. The optical plate 302 is disposed above the first sidewall 17 of the recess 160 and disposed inside the second sidewall 18.

The first transparent film 320 may have an open region 325 inside, and the inner lower portion 346 of the phosphor layer 340 may protrude through the open region 325. The bottom view shape of the inner open region 325 of the first transparent film 320 may be a circular shape or a polygonal shape, but embodiments of the present invention are not limited thereto. As illustrated in (A) of FIG. 66, the open region 325 of the first transparent film 320 may be disposed along the inner side of the first transparent film 320. In this case, the inner lower portion 346 of the phosphor layer 340 may be disposed along the inner periphery of the first transparent film 320. As another example, as illustrated in (B) of FIG. 66, the first transparent film 320 may be disposed on both sides of the open region 325. In this case, the inner lower portion 346 of the phosphor layer 340 may be disposed on the center side of the first transparent film 320. The first transparent film 320 may be formed in a structure in which the first transparent film 320 is connected to the outer side of the open region 325 as illustrated in FIG. (A) of FIG. 66, or may be formed in a structure in which the first transparent film 320 is disposed on both sides of the open region 325 as illustrated in (B) of FIG. 66. The inner lower portions 346 of the first transparent film 320 and the phosphor layer 340 may contact the molding member 181 of FIG. 65.

The length or width of the open region 325 of the first transparent film 320 may be less than the interval between the light emitting chips 171 and 172. The inner open region 325 of the phosphor layer 340 may be disposed in a region not overlapping the light emitting chips 171 and 172 in a vertical direction. The inner open region 325 of the first transparent film 320 may be disposed to be greater than the width of the top surface of the gap part 119 on the gap part 119 between the plurality of lead frames 121 and 131.

The inner lower portion 346 of the phosphor layer 340 may contact the top surface of the molding member 181. When the top surface of the molding member 181 contacts the bottom surface of the inner lower portion 346 of the phosphor layer 340 and the material of the phosphor layer 340 is the same as the material of the molding member 181, the optical loss caused by the contact interface may be reduced.

The first transparent film 320 may overlap the light emitting chips 171 and 172 in a vertical direction. The first transparent film 320 may reflect or transmit light incident from the light emitting chips 171 and 172.

The length of the first transparent film 320 may be equal to the upper length Y3 of the recess 160. The width of the first transparent film 320 may be equal to the bottom width of the recess 160.

The first transparent film 320 may be spaced apart from the second sidewall 18 of the recess 160. The outer sides of the phosphor layer 340 and the second transparent film 330 may be disposed in the second sidewall 18 of the recess 160. The phosphor layer 340 is bonded to the inner side of the second sidewall 18 of the recess 160, thereby preventing moisture penetration in the outside and preventing the molding member 181 from being exposed to the outside.

The second transparent film 330 may be disposed in the inner side of the second sidewall 18 of the recess 160. The top surface of the second transparent film 330 may be disposed on the same horizontal plane as the top surface 15 of the body 110, or may be disposed to be higher or lower than the top surface 15 of the body 110.

FIG. 67 illustrates a modification example of the light emitting device including the optical plate according to the embodiment.

Referring to FIG. 67, the optical plate 302 may be disposed in the recess 160 of the body 110 of the light emitting device 100B.

The optical plate 302 includes a first transparent film 320, a second transparent film 330, and a phosphor layer 340. The optical plate 302 has a structure in which the support is removed from the structure of FIG. 5. Detailed configurations of the light emitting device 100B and the optical plate 302 can be understood by referring to the description provided in the above embodiments, and the light emitting devices and/or the optical plates according to the above embodiments may be selectively applied.

The recess 160 may include an inclined first sidewall 17, a second sidewall 18 between the first sidewall 17 and the top surface 15, and a mounting part 17A between the first and second sidewalls 17 and 18. The mounting part 17A may be disposed as a horizontal plane and may be disposed in the outer periphery of the bottom surface of the optical plate 301. The outer side of the bottom surface of the first transparent film 320 or the outer bottom surface of the phosphor layer 340 may contact the mounting part 17A, but embodiments of the present invention are not limited thereto. The mounting part 17A may support the outer periphery of the bottom surface of the optical plate 301.

The length of at least one of the first and second transparent films 320 and 330 may be equal to, greater than, or less than the length of the phosphor layer 340, but embodiments of the present invention are not limited thereto. The optical plates according to the embodiments may be selectively applied.

FIG. 68 illustrates a modification example of the light emitting device including the optical plate according to the embodiment.

Referring to FIG. 68, the optical plate 302 may be disposed in the recess 160 of the body 110 of the light emitting device 100B. The light emitting device 100B has a structure in which the optical plate 302 is disposed on a light source.

The optical plate 302 includes a second transparent film 330 and a phosphor layer 340. The optical plate 302 has a structure in which the support and the first transparent film are removed from the structure of FIG. 5. Detailed configurations of the light emitting device 100B and the optical plate 302 can be understood by referring to the description provided in the above embodiments, and the light emitting devices and/or the optical plates according to the above embodiments may be selectively applied.

The recess 160 may include an inclined first sidewall 17, a second sidewall 18 between the first sidewall 17 and the top surface 15, and a mounting part 17A between the first and second sidewalls 17 and 18. The mounting part 17A may be disposed as a horizontal plane and may be disposed in the outer periphery of the bottom surface of the optical plate 302. The mounting part 17A may contact the outer side of the bottom surface of the phosphor layer 340. The mounting part 17A may support the outer periphery of the bottom surface of the optical plate 302.

The phosphor layer 340 may be disposed on the molding member 181, and may maintain the interval G1 with the light emitting chips 171 and 172 by the height of the top surface of the molding member 181.

The light emitting device 100B may have a stepped structure 18A on the second sidewall 18 of the body 110. The stepped structure 18A may have a depth lower than the top surface 15 of the body 110 and may be disposed in the outer periphery of a top surface of the second sidewall 18. The outer periphery of the second transparent film 330 may be disposed in the stepped structure 18A. The length of the second transparent film 330 may be equal to, greater than, or less than the length of the phosphor layer 340, but embodiments of the present invention are not limited thereto. The second transparent film 330 may be bonded to the stepped structure 18A by an adhesive member, thereby preventing moisture penetration.

FIG. 69 illustrates a modification example of the light emitting device including the optical plate according to the embodiment.

Referring to FIG. 69, the optical plate 301 may be disposed in the recess 160 of the body 110 of the light emitting device 100B. The light emitting device 100B has a structure in which the optical plate 301 is disposed on a light source.

The optical plate 301 includes a first transparent film 320, a second transparent film 330, and a phosphor layer 340. The optical plate 301 has a structure in which the support is removed from the structure of FIG. 5 and the first transparent film is modified.

The recess 160 may include an inclined first sidewall 17, a second sidewall 18 between the first sidewall 17 and the top surface 15, and a mounting part 17A between the first and second sidewalls 17 and 18. The mounting part 17A may be disposed as a horizontal plane and may be disposed in the outer periphery of the bottom surface of the optical plate 301. The mounting part 17A may contact the outer side of the bottom surface of the phosphor layer 340. The mounting part 17A may support the outer periphery of the bottom surface of the optical plate 301.

The first transparent film 320 may be disposed between the phosphor layer 340 and the molding member 181. The second transparent film 320 may maintain the interval G2 with the light emitting chips 171 and 172 by the height of the top surface of the molding member 181.

The first transparent film 320 may have an open region 326 in which the outer periphery is opened, and the outer lower portion 345 of the phosphor layer 340 may protrude through the open region 326. The first transparent film 320 may be disposed in the inner region of the phosphor layer 340, and may overlap the light emitting chips 171 and 172 in a vertical direction. The first transparent film 320 may reflect or transmit light incident from the light emitting chips 171 and 172. The outer lower portion 345 of the phosphor layer 340 contacts the molding member 181, thereby reducing the loss of incident light. The open region 326 of the first transparent film 320 can be understood by referring to the description of FIG. 22. As another example, the first transparent film 320 may include the open region 325 as illustrated in FIG. 66, but embodiments of the present invention are not limited thereto.

The length Y5 of the first transparent film 320 may be greater than the interval between the plurality of light emitting chips 171 and 172 and may have a size overlapping the region of the cavities 125 and 135 of the plurality of lead frames 121 and 131 in a vertical direction. The first transparent film 320 may diffuse light incident from the light emitting chips 171 and 172.

The first transparent film 320 may be spaced apart from the second sidewall 18 of the recess 160. The outer sides of the phosphor layer 340 and the second transparent film 330 may be disposed in the second sidewall 18 of the recess 160. The phosphor layer 340 is bonded to the inner side of the second sidewall 18 of the recess 160 and the stepped part 17A, thereby preventing moisture penetration in the outside and preventing the molding member 181 from being exposed to the outside.

The light emitting device 100B may have a stepped structure 18A on the second sidewall 18 of the body 110. The stepped structure 18A may have a depth lower than the top surface 15 of the body 110 and may be disposed in the outer periphery of a top surface of the second sidewall 18. The outer periphery of the second transparent film 330 may be disposed in the stepped structure 18A. The length of the second transparent film 330 may be equal to, greater than, or less than the length of the phosphor layer 340, but embodiments of the present invention are not limited thereto. The second transparent film 330 may be bonded to the stepped structure 18A by an adhesive member, thereby preventing moisture penetration.

FIG. 70 illustrates an example of the optical plate in the light emitting device of FIG. 24.

Referring to FIG. 70, in the light emitting device 100, the optical plate 302 is disposed in a recess 160 of a body 110A. The recess 160 includes a first sidewall 17, and a second sidewall 18 between the first sidewall 17 and the top surface 15 of the body 110A. A molding member 181 may be disposed in the recess 160, and the optical plate 302 may be bonded to the molding member 181.

The second sidewall 18 may be disposed in the outer side of the optical plate 302. The optical plate 302 according to the embodiment includes a first transparent film 320, a second transparent film 330, and a phosphor layer 340, and has a structure in which the support is removed from the structure of FIG. 5. Detailed configurations of the light emitting device 100C and the optical plate 302 can be understood by referring to the description provided in the above embodiments, and the light emitting devices and/or the optical plates according to the above embodiments may be selectively applied.

The phosphor layer 340 may be disposed between the first and second transparent films 320 and 330. The first transparent film 320 may be disposed below the phosphor layer 340, and the second transparent film 330 may be disposed above the phosphor layer 340. The optical plate 302 may be changed to any one structure of the optical plates of FIGS. 58 to 69, but embodiments of the present invention are not limited thereto.

FIG. 71 illustrates a structure in which the optical plate is provided in the light emitting device of FIG. 26.

Referring to FIG. 71, the optical plate 302 is disposed in a recess 425 of a body 410 in a light emitting device 400A. The light emitting device 400A can be understood by referring to the configuration of FIG. 26, and the optical plates of FIGS. 58 to 69 may be selectively applied to the optical plate 302.

FIG. 72 illustrates a structure in which the optical plate is provided in the light emitting device of FIG. 27.

Referring to FIG. 72, the optical plate 302 is disposed in a recess 517 of a body 410 in a light emitting device 500A. The light emitting device 500A can be understood by referring to the description of FIG. 27, and the optical plates of FIGS. 58 to 69 may be selectively applied to the optical plate 302.

FIGS. 73 and 74 are a plan view and a bottom view of a support in an optical plate having an adhesive tape according to an embodiment. FIG. 75 illustrates an example of a transparent film bonded to the support of the optical plate of FIGS. 73 and 74. FIG. 76 is a side cross-sectional view of a light emitting device including the optical plate of FIG. 75.

Referring to FIGS. 73 to 75, adhesive tapes 318 and 319 may be disposed on the top surface 311 and the bottom surface 312 of the support 310 in the optical plate. In the adhesive tapes 318 and 319, the first transparent film 320 and the second transparent film 330 may be respectively bonded to the top surface 311 and the bottom surface 312 of the support 310.

The width M1 of the adhesive tapes 318 and 319 may be less than the width of the support 310, that is, the intervals W1 and W2 between the inner surface and the outer surface. The adhesive tapes 318 and 319 may be spaced apart from the inner surface and the outer surface in the top surface 311 or the bottom surface 312 of the support 310 by predetermined intervals M2 and M3. When the adhesive tapes 318 and 319 are positioned on the inner side of the support 310 or protrude to the phosphor layer 340, the light interference problem may occur, and when the adhesive tapes 318 and 319 are positioned on the outer side of the support 310 or protrude to the outer side of the support 310, the outer appearance of the optical plate 300 may be impaired.

The first and second transparent films 320 and 330 may bonded to the top surface 311 and the bottom surface 312 of the support 310 by the adhesive tapes 318 and 319.

In the process of bonding the optical plate 300 on the light emitting device, for example, as illustrated in FIG. 76, the molding member 181 may be molded in the light emitting device 100, and the first transparent film 320 may be disposed on the molding member 181 before the molding member 181 is cured.

The optical plate 300 may be connected on the light emitting device 100 as illustrated in FIG. 76. The optical plate 300 may be bonded to the top surface of the body 110 of the light emitting device 100. The optical plate 300 may be spaced apart from the light emitting chips 171 and 172 by a predetermined interval. The interval may be in the range of 0.2 mm or more, for example, in the range of 0.2 mm to 0.7 mm. The interval between the phosphor layer 340 and the light emitting chips 171 and 172 is less than G1, for example, 0.7 mm or less, for example, in the range of 0.25 mm to 0.65 mm. When the interval between the light emitting chips 171 and 172 and the first transparent film 320 is less than the above range, the thickness of the body 110 becomes thinner and thus it may be difficult to secure the rigidity and the degradation problem may occur. When the interval is greater than the above range, the thickness of the light emitting device 100 may increase and the light diffusion effect may be slight.

Table 1 shows a comparison of intensity according to a distance between the light emitting chip and the phosphor. At this time, the first transparent film was designed to have a thickness of 0.1 mm.

TABLE 1

|  | Comparative Example 1 | Comparative Example 2 | Embodiment |
|---|---|---|---|
| Distance between phosphor layer and light emitting chip (mm) | 0 | 1.0 | 0.3 |
| Light intensity (mW/mm$^2$) | 100% | 8.84% | 65.29% |

Comparative Example 1 is a case where a molding member having a phosphor is disposed in a light emitting device, and a distance between a light emitting chip and a phosphor is 0 mm. Comparative Example 2 is a case where an optical plate has a predetermined air gap on a light emitting device, and a distance between a light emitting chip and an optical plate is 1 mm. Embodiment is a case where no air gap is present on a light emitting device and an optical plate is contacted, and a distance between a light emitting chip and a phosphor layer is 0.2 mm or more, for example, 0.3 mm. In this case, it can be seen that, when the intensity of Comparative Example 1 on the surface of the phosphor layer is 100%, Comparative Example 2 is less than 10%, and Embodiment is 65% or more.

Fourth Embodiment

FIGS. 77 to 79 illustrate an example of a light emitting device according to a fourth embodiment. A detailed configuration of a light emitting device illustrated in FIGS. 77 to 79 can be understood by referring to the description of FIGS. 2 to 4, and a different configuration will be described. In describing the fourth embodiment, the embodiment can be understood by referring to the configurations provided in the above embodiment or the modification examples thereof. The configurations disclosed in the first to third embodiments or the modification examples of the first to third embodiment may be selectively applied to the fourth embodiment.

Referring to FIGS. 77 to 79, the light emitting device 100 may include a groove 105 around the outer side of a body 110. The groove 105 may be formed in a stepped shape with a depth lower than a top surface 15 of the body 110. The groove 105 may be provided on first to fourth side parts 11, 12, 13, and 14 of the body 110. The groove 105 may be disposed in a continuously connected shape or a discontinuous shape, but embodiments of the present invention are not limited thereto. The length of the groove 105 may be equal to the length of the first and second side parts 11 and 12 of the body 110 in a Y-axis direction, and the width thereof may be equal to the width of the third and fourth side parts 13 and 14 of the body 110 in an X-axis direction. An example the groove 105 is disposed on the first to fourth side parts 11, 12, 13, and 14 has been described, but as another example, the groove 105 may be disposed on the first and second side parts 11 and 12, or may be disposed on the third and fourth side parts 13 and 14.

As illustrated in FIGS. 78 and 79, the depth K1 of the groove 105 is a distance to a first top surface 106 positioned at the bottom of the groove 105 and may be greater than the widths K2 and K3 of the groove 105. When the widths K2 and K3 of the groove 105 are increased, the area of lead frames 121 and 131 that the light emitting chips 171 and 172 can mount may be reduced, or the size of the light emitting device 100 may be increased. The width K3 of the groove 105 disposed on the first and second side parts 11 and 12 of the body 110 may be equal to or different from the width K2 of the groove 105 disposed on the third and fourth side parts 13 and 14. The widths K2 and K3 may satisfy K2 K3. The widths K2 and K3 of the groove 105 may be equal to or less than the width K4 of the top surface 15 of the body 110 in a length direction. The width K4 of the top surface 15 of the body 110 may be different according to a length direction, a width direction, or a edge direction, but embodiments of the present invention are not limited thereto.

The groove 105 may include a first top surface 106 lower than the top surface 15 of the body 110, and a first side 107 between the first top surface 106 and the top surface 15 of the body. The first top surface 106 may be a flat surface or an inclined surface, and the first side surface 107 may be a vertical surface or a surface inclined with respect to an optical axis.

FIGS. 80 to 83 illustrate a fourth embodiment. FIG. 80 is a perspective view of a lighting device in which an optical plate is disposed on a light emitting device, FIG. 81 is a C-C cross-sectional view of the lighting device of FIG. 80, FIG. 82 is a D-D cross-sectional view of the lighting device of FIG. 80, and FIG. 83 is a partial enlarged view of the lighting device of FIG. 81. In describing the embodiment, the same parts as those described above may be understood by referring to the above descriptions.

Referring to FIGS. 80 to 83, the optical plate 300 is disposed on the light emitting device 100. The outer side of the bottom surface of the optical plate 300 may overlap the body 110 of the light emitting device 100 in a vertical direction. The outer side of the bottom surface of the optical plate 300 may overlap the groove 105 disposed on the outer side of the body 110 of the light emitting device 100 in a vertical direction. Detailed configurations of the light emitting device 100 and the optical plate 300 can be understood by referring to the description provided in the above embodiments, and the light emitting devices and/or the optical plates according to the above embodiments may be selectively applied.

An adhesive member 150 may be disposed in the groove 105 disposed on the outer side of the body 110 of the light emitting device 100. The adhesive member 150 may be bonded to the outer side of the bottom surface of the optical plate 300. The adhesive member 150 may be bonded along the outer periphery of the bottom surface of the optical plate 300. Since the adhesive member 150 is bonded to the outer sides of the bottom surfaces of the body 110 and the optical plate 300, it is possible to prevent a part of the molding member 181 from leaking out.

Since the adhesive member 150 bonds the outer sides of the bottom surfaces of the body 110 and the optical plate 300 in the outer groove 105 of the body 110, it is possible to remove or reduce a gap between the top surface 15 of the body 110 and the bottom surface of the outer side of the optical plate 300.

The adhesive member 150 may be a material such as silicon or epoxy. The adhesive member 150 may be a transparent material or an opaque material.

When the first transparent film 320 is disposed on the outer side of the bottom surface of the optical plate 300, the adhesive member 150 may be bonded to the outer side of the bottom surface of the first transparent film 320. As illustrated in FIGS. 89 to 91, when the support 310 is disposed on the outer side of the bottom surface of the optical plate 300, the adhesive member 150 may be bonded to the outer side of the bottom surface of the support 310.

Figure 84:
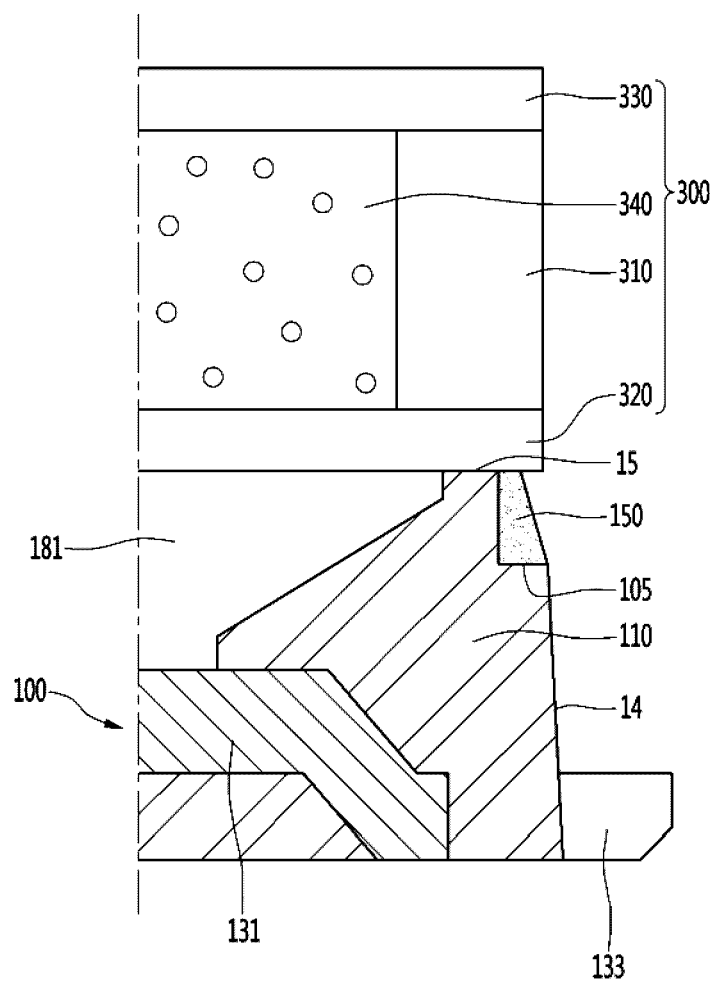

FIG. 84 illustrates another example of the adhesive member 150 of FIG. 83. The lower width or the area of the bottom surface of the adhesive member 150 may be less than the upper width or the area of the top surface thereof. By providing the adhesive member 150 in a triangular shape or a trapezoidal shape, the adhesive member 150 is positioned in the groove 105 and then may be stably bonded to the outer side of the bottom surface of the optical plate 300. Since the optical plate 300 and the body 110 are bonded by using the adhesive member 150, it is possible to prevent a part of the molding member 181 from leaking out. In addition, it is possible to prevent the light leakage problem that light leaks out to the side of the lighting device by using the adhesive member 150 having a reflective or absorbing material. In addition, it is possible to prevent moisture, foreign substance, or the like from penetrating between the optical plate 300 and the body 110.

Figure 85:
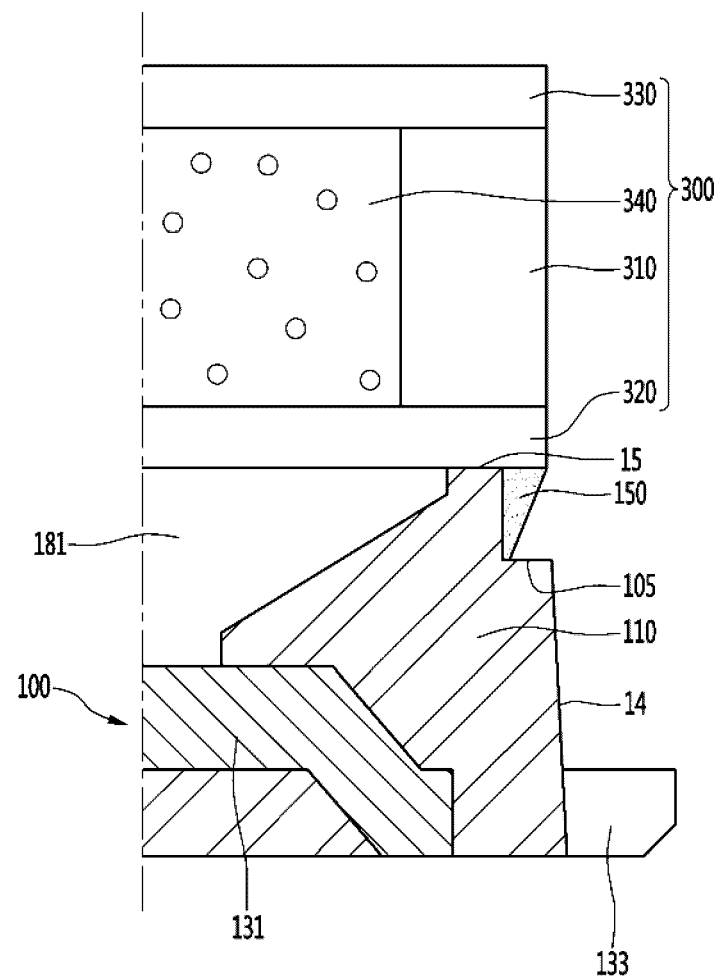

FIG. 85 illustrates another example of the adhesive member 150 of FIG. 83. The upper width or the area of the top surface of the adhesive member 150 may be greater than the lower width or the area of the bottom surface thereof. The adhesive member 150 may be provided in an inverted triangular shape or an inverted trapezoidal shape. When the adhesive member 150 is molded and the optical plate 300 is placed on the base and then cured before the adhesive member 150 is cured, an adhesive member 150 having an inverted triangular shape or an inverted trapezoidal shape may be formed A contact area between the adhesive member 150 and the outer side of the bottom surface of the optical plate 300 may increase. Since the optical plate 300 and the body 110 are bonded in the groove 105 by using the adhesive member 150, it is possible to prevent the molding member 181 from leaking out. In addition, it is possible to prevent the light leakage problem that light leaks out to the side of the lighting device by using the adhesive member 150 having a reflective or absorbing material. In addition, it is possible to prevent moisture, foreign substance, or the like from penetrating between the optical plate 300 and the body 110.

Figure 86:
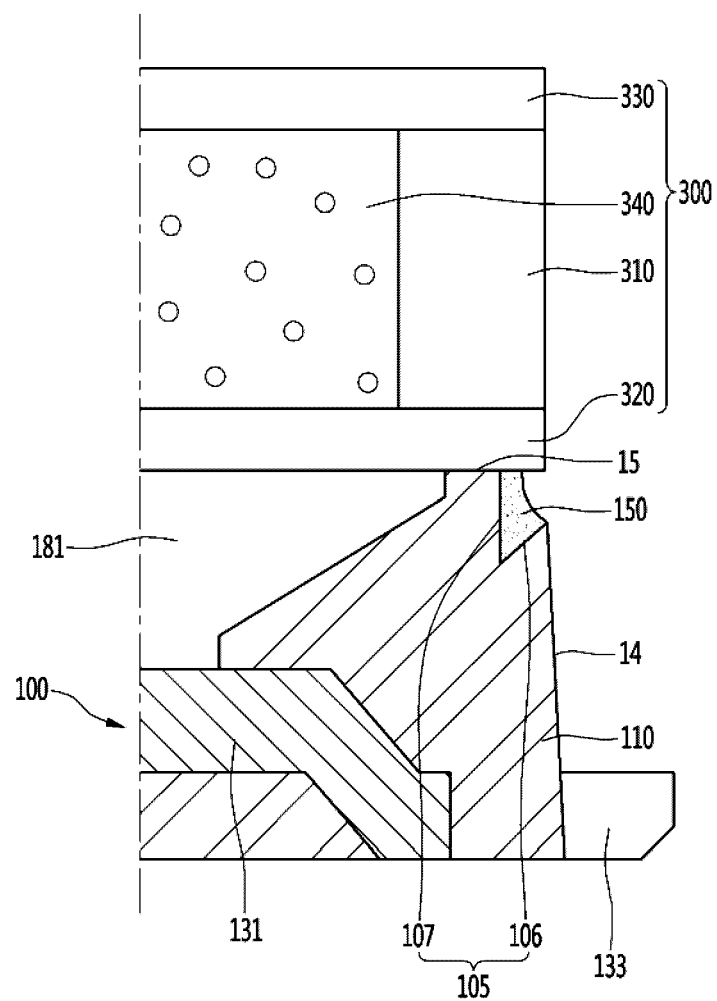

FIG. 86 illustrates another example of the groove 105 of FIG. 83. A groove 105 disposed on an outer side of a body 110 of a light emitting device 100 may have a structure in which the width gradually decreases toward the lower portion. Accordingly, it is possible to solve the problem that the adhesive member 150 disposed in the groove 105 overflows, and the outer side of the bottom surface of the optical plate 300 and the body 110 may be bonded by using the adhesive member 150. Since the optical plate 300 and the body 110 are bonded in the groove 105 by using the adhesive member 150, it is possible to prevent the molding member 181 from leaking out. In addition, it is possible to prevent the light leakage problem that light leaks out to the side of the lighting device by using the adhesive member 150 having a reflective or absorbing material. In addition, the adhesive member 150 may prevent moisture, foreign substance, or the like from penetrating between the optical plate 300 and the body 110.

Figure 87:
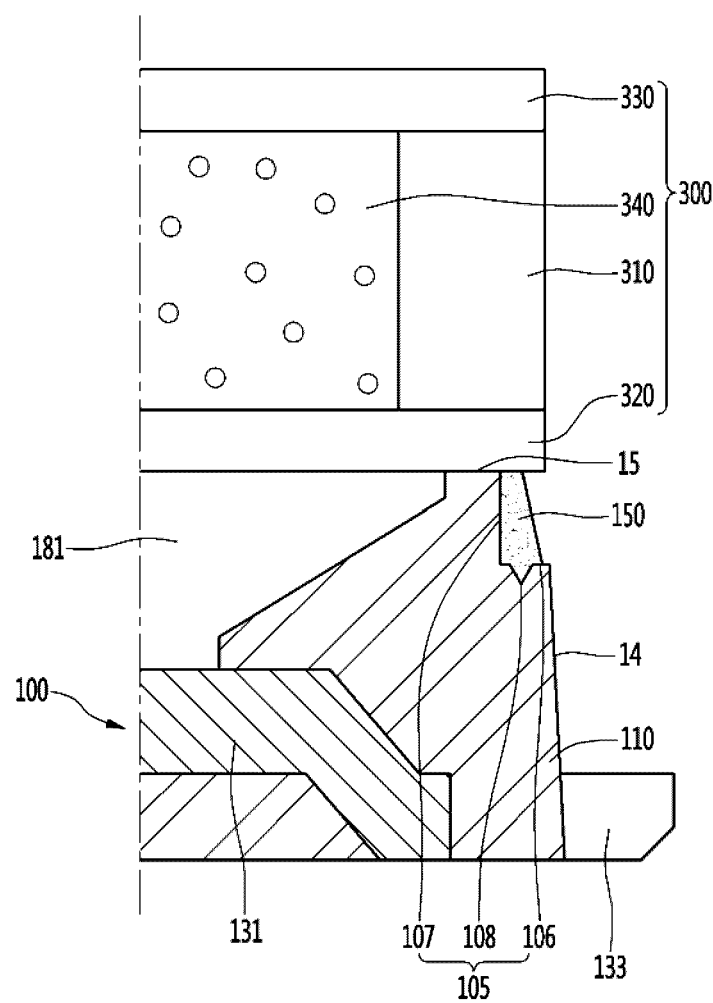

FIG. 87 illustrates another example of the groove 105 of FIG. 83. A groove 105 disposed on an outer periphery of a body 110 of a light emitting device 100 may have a trench structure on the bottom surface. The groove 105 having the trench structure 108 may prevent the adhesive member 150 from being released or flowing. The adhesive member 150 bonded to the groove 105 may bond the body 110 and the outer side of the bottom surface of the optical plate 300. Since the optical plate 300 and the body 110 are bonded in the groove 105 by using the adhesive member 150, it is possible to prevent the molding member 181 from leaking out. In addition, it is possible to prevent the light leakage problem that light leaks out to the side of the lighting device by using the adhesive member 150 having a reflective or absorbing material. In addition, the adhesive member 150 may prevent moisture, foreign substance, or the like from penetrating between the optical plate 300 and the body 110.

Figure 88:
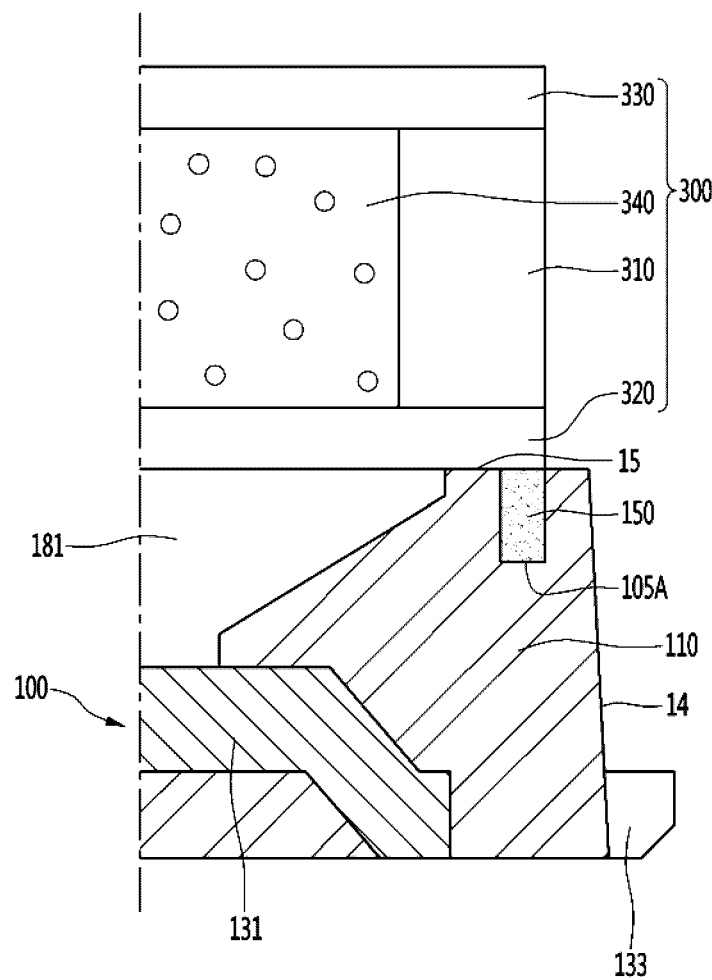

FIG. 88 illustrates another example of the groove 105 of FIG. 83. A groove 105A is disposed on a top surface 15 of a body 110 of the light emitting device 100. The groove 105A may be provided at positions different from the positions of the groove 105 disposed in FIGS. 28 to 79. The groove 105A may have a depth concave from the top surface 15 of the body 110 in the top surface 15 of the body 110. The groove 105 may be formed to have a trench structure on the top surface 15 of the body 110. An adhesive member 150 disposed in the groove 105 may be bonded to the outer side of the bottom surface of the optical plate 300. Since the optical plate 300 and the body 110 are bonded in the groove 105 by using the adhesive member 150, it is possible to prevent the molding member 181 from leaking out. In addition, it is possible to prevent the light leakage problem that light leaks out to the side of the lighting device by using the adhesive member 150 having a reflective or absorbing material. In addition, the groove 105A is not exposed to the outside of the body 110, thereby preventing a problem that impairs the outer appearance of the light emitting device 100. In addition, the adhesive member 150 may prevent moisture, foreign substance, or the like from penetrating between the optical plate 300 and the body 110.

Fifth Embodiment

FIG. 92 is an exploded perspective view of an optical plate of a lighting device according to a fifth embodiment, FIG. 93 is an assembly bottom view of the optical plate of FIG. 92, FIG. 94 is an assembly perspective view of the light emitting device including the optical plate of FIG. 92, FIG. 95 is an E-E cross-sectional view of the lighting device of FIG. 94, FIG. 96 is a view for describing the lighting device of FIG. 95, and FIG. 97 is an F-F cross-sectional view of the lighting device of FIG. 94. In describing the fifth embodiment, the embodiment can be understood by referring to the configurations provided in the above embodiment or the modification examples thereof. The configurations disclosed in the first to fourth embodiments or the modification examples of the first to fourth embodiment may be selectively applied to the fifth embodiment.

As illustrated in FIGS. 92 to 97, the optical plate 300 includes a frame-shaped support 310 having an open region 342, a phosphor layer 340 in the support 310, transparent films 320 and 330 disposed on at least one of the top surface and the bottom surface of the support 310 and the phosphor layer 340, and semi-transmissive mirrors 351 and 353 facing a light source below the phosphor layer 340. The optical plate 300 may be disposed on the light emitting device 300, or may be disposed in the recess of the light emitting device 300. Detailed configurations of the light emitting device 100 and the optical plate 300 can be understood by referring to the description provided in the above embodiments, and the light emitting devices and/or the optical plates according to the above embodiments may be selectively applied.

The thickness of the optical plate 300 may be in the range of 0.7 mm or more, for example, in the range of 0.7 mm to 1.5 mm. When the thickness of the optical plate 300 is less than 0.7 mm, it is difficult to secure the thickness of the phosphor layer 340, and the wavelength conversion efficiency is degraded. When exceeding 1.5 mm, the thickness of the device increases. When the thickness of the transparent films 320 and 330 increases, optical loss may occur.

The support 310 may include the open region 342 therein, and the outer shape thereof may include a circular frame or polygonal frame shape. The open region 342 may include a circular shape or a polygonal shape. As illustrated in FIGS. 95 to 97, the open region 342 may have a shape corresponding to the outer shape of the recess 160 of the light emitting device 100, and light exiting through the recess 160 may be incident. The support 310 may be formed to surround the side surface of the phosphor layer 340. The area of the bottom surface of the open region 342 may be equal to or smaller than the area of the top surface of the molding member 160 or the light exit surface.

The transparent films 320 and 330 may be disposed below and/or above the phosphor layer 340. The transparent films 320 and 330 may include a first transparent film 320 disposed below the phosphor layer 340, and a second transparent film 330 disposed above the phosphor layer 340. The transparent films 320 and 330 may be disposed on the incidence surface and/or the exit surface of the phosphor layer 340. In the optical plate 300, one of the first and second transparent films 320 and 330 may be removed. For example, the second transparent film 330 may be removed, but embodiments of the present invention are not limited thereto. The first transparent film 320 may be bonded to the bottom surface of the support 310 and the bottom surface of the phosphor layer 340. The second transparent film 330 may be bonded to the top surface of the support 310 and the top surface of the phosphor layer 340.

The thickness of the first and second transparent films 320 and 330 may be in the range of 0.05 mm or more, for example, in the range of 0.08 mm to 0.2 mm. When the thickness of the first and second transparent films 320 and 330 is less than 0.05 mm, handling may be difficult and a problem may occur in rigidity. When exceeding 0.2 mm, the thickness of the optical plate 300 may increase and the light transmittance may be degraded. The thicknesses of the first and second transparent films 320 and 330 may be equal to or different from each other. When the thicknesses of the first and second transparent films 320 and 330 are different from each other, the first transparent film 320 may be thicker than the second transparent film 330. Since the first transparent film 320 is thicker than the second transparent film 330, the first transparent film 320 may be stably bonded to the light emitting device 100.

The phosphor layer 340 may have the same thickness as the support 310. In this case, a partial or entire region of the top surface and the bottom surface of the support 310 may contact the first and second transparent films 320 and 330. As another example, the phosphor layer 340 may be thinner than the support 310. The support 310 may protrude around the outer periphery of the first and second transparent films 320 and 330, but embodiments of the present invention are not limited thereto.

The semi-transmissive mirrors 351 and 353 may include a metal material, e.g., aluminum (Al) or silver (Ag), which can perform a semi-transmissive function. The semi-transmissive mirrors 351 and 353 may be made of a material having high reflectivity rather than transmittance. When the sum of the transmittance and the reflectivity is 100%, the reflectivity of the semi-transmissive mirrors 351 and 353 may exceed 50%.

The semi-transmissive mirrors 351 and 353 may include a diffusion sheet. An uneven pattern may be formed on the bottom surfaces of the semi-transmissive mirrors 351 and 353, that is, the light incidence surface, but embodiments of the present invention are not limited thereto. The semi-transmissive mirrors 351 and 353 may be defined as a half mirror sheet, a semi-transmissive mirror, a polarization sheet, or a semi-transmissive diffusion sheet. The semi-transmissive mirrors 351 and 353 may be formed below the first transparent film 320 by screen printing, but embodiments of the present invention are not limited thereto.

The semi-transmissive mirrors 351 and 353 may be disposed below the phosphor layer 340, for example, the first transparent film 320. One or more semi-transmissive mirrors 351 and 353 may be disposed below the first transparent film 320. For example, in the case of the plurality of semi-transmissive mirrors 351 and 353, the same number as the number of light emitting chips 171 and 172 may be disposed. The semi-transmissive mirrors 351 and 353 may be disposed to face the light source, for example, the light emitting chips 171 and 172.

The semi-transmissive mirrors 351 and 353 may reflect or transmit light emitted from the light emitting device 100. The semi-transmissive mirrors 351 and 353 are disposed in a region in which the light amount of the light source incident on the optical plate 300 is maximum, and a part of the incident light may be transmitted and the other may be reflected.

In the optical plate 300, the semi-transmissive mirrors 351 and 353 are disposed in a region in which the light amount of the light emitting chips 171 and 172 is highest, thereby reducing the degradation problem of the phosphor or quantum dot by light generated from the light emitting chips 171 and 172 and reducing the optical loss. In addition, the color conversion due to the phosphor or quantum dot may prevent the degradation of the luminous efficiency and prevent the degradation of the color correction index. As another example, the semi-transmissive mirrors 351 and 353 may be disposed to face the light emitting chips 171 and 172 on the top surface of the molding member 181, but embodiments of the present invention are not limited thereto.

As illustrated in FIG. 93, when the semi-transmissive mirrors 351 and 353 are plural, the plurality of semi-transmissive mirrors 351 and 353 are arranged in a first axis direction (or a length direction). In each of the semi-transmissive mirrors 351 and 353, the length E4 in the first axis direction may be greater than the width E5 in a second axis direction. A straight line distance G3 between the centers of the plurality of semi-transmissive mirrors 351 and 353 may be twice or less the length E4. The straight line distance G3 may be equal to the straight line distance between the centers of the light emitting chips 171 and 172.

The optical plate 300 according to an embodiment is provided with a thickness smaller than the thickness of the light emitting device 100 (T1 in FIG. 4) and may function as a lighting plate or a fluorescent plate on the light emitting device 100.

The optical plate 300 may be connected on the light emitting device 100 as illustrated in FIGS. 94 to 97. The optical plate 300 may be bonded to the top surface of the body 110 of the light emitting device 100. As illustrated in FIG. 96, the length D2 of the optical plate 300 in the first axis direction may be less than the maximum length Y2 of the light emitting device 100 in the first axis direction, and may be equal to or less than the length Y1 of the body 110. The length Y1 of the body 110 may be a lower length of the body 110 and may be a maximum length of the body 110. The optical plate 300 may be disposed on the top surface 15 of the body 110 of the light emitting device 100. For example, the area of the bottom surface of the optical plate 300 may be equal to or different from the area of the top surface of the body 110. The length of the bottom surface of the optical plate 300 may be equal to or different from the length of the top surface of the body 110. The length of the phosphor layer 310 may be less than the length of the top surface of the body 110.

As illustrated in FIG. 97, the width D3 of the optical plate 300 in the second axis direction is less than the width X4 of the light emitting device 100 in the second axis direction, and the optical plate 300 may be disposed on the top surface 15 of the body of the light emitting device 100. The support 310 of the optical plate 300 may overlap the top surface 15 of the body 110 in a vertical direction. The first transparent film 320 may be disposed on the top surface of the body 110. For example, the outer periphery of the bottom surface of the first transparent film 320 may be bonded to the top surface of the body 110 by an adhesive. At least one of the support 310 and the first transparent film 320 may be bonded to the top surface of the body 110 by an adhesive.

The contact area between the bottom surface of the optical plate 300 and the top surface 15 of the body is maximized, thereby reducing the flow of the optical plate 300. The outer bottom surface of the optical plate 300 may be bonded to the top surface of the body 110 by an adhesive.

As illustrated in FIGS. 95 and 96, the phosphor layer 340 of the optical plate 300 may be disposed in a region corresponding to the recess 160 of the light emitting device 100, and the semi-transmissive mirrors 351 and 353 may be disposed in a region facing the light emitting chips 171 and 172.

The semi-transmissive mirrors 351 and 353 may be disposed between the light emitting chips 171 and 172 and the first transparent film 320. The semi-transmissive mirrors 351 and 353 may be disposed between the molding member 181 and the first transparent film 320. The molding member 181 may be disposed below the first transparent film 320.

The semi-transmissive mirrors 351 and 353 may contact the molding member 181 of the light emitting device 100. The bottom surfaces of the semi-transmissive mirrors 351 and 353 may be disposed below the top surface of the molding member 181. The bottom surfaces of the semi-transmissive mirrors 351 and 353 may be disposed closer to the light emitting chips 171 and 172 than the top surface of the molding member 181.

The molding member 181 may be bonded to the bottom surfaces of the semi-transmissive mirrors 351 and 353 and the first transparent film 320.

As illustrated in FIGS. 96 and 97, the length D1 of the phosphor layer 340 in the first axis direction may be equal to or less than the length Y3 of the recess 160 in the first axis direction. The width D4 of the phosphor layer 340 in the second axis direction may be equal to or less than the width X2 of the recess 160 in the second axis direction. The length D1 of the phosphor layer 340 in the first axis direction may be greater than the width D4 of the phosphor layer 340 in the second axis direction. The phosphor layer 340 may overlap the recess 160 in a vertical direction. Accordingly, the phosphor layer 340 may effectively wavelength-convert the light emitted through the recess 160 of the light emitting device 100.

The length E4 of the semi-transmissive mirrors 351 and 353 may be greater than the length E1 of the light emitting chips 171 and 172 and less than the bottom width B1 of the cavities 125 and 135. The length E4 may be in the range of one time or more the length B1, for example, one time to twice the length B1. When the length E4 is less than the above range, the light diffusion effect due to the semi-transmissive mirrors 351 and 353 may be slight. When the length E4 is greater than the above range, interference between light emitted from the adjacent light emitting chips 171 and 172 may occur.

The width E5 of the semi-transmissive mirrors 351 and 353 may be greater than the width E2 of the light emitting chips 171 and 172 and less than the bottom width B2 of the cavities 125 and 135. The length E5 may be in the range of one time or more the width B2, for example, one time to twice the width B2. When the width E5 is less than the above range, the light diffusion effect due to the semi-transmissive mirrors 351 and 353 may be slight. When the width E5 is greater than the above range, a distribution of diffused light may be non-uniform, and a width difference from the width E4 of the recess 160 is not great.

The width E5 of the semi-transmissive mirrors 351 and 353 may be in the range of 0.65 times the width X2 of the recess 160, for example, in the range of 0.34 times to 0.62 times the width X2 of the recess 160. When the width E5 is less than the above range, the light diffusion effect is slight. When the width E5 is greater than the above range, the light diffusion distribution is not uniform.

In the semi-transmissive mirrors 351 and 353, when the length E4 is greater than the width E5, the length (E4) to width (E5) ratio of the semi-transmissive mirrors 351 and 353 may be in the range of 1:05 to 2:1.4. The length (E4) to width (E5) ratio may be equal to the length (B1) to width (B2) ratio of the light emitting chips 171 and 172.

The area of the bottom surfaces of the semi-transmissive mirrors 351 and 353 may be greater than the area of the top surfaces of the light emitting chips 171 and 172 and the semi-transmissive mirrors 351 and 353 may be disposed on the light emitting chips 171 and 172. The semi-transmissive mirrors 351 and 353 may transmit or reflect light emitted from the light emitting chips 171 and 172, and the reflected light may be reflected by the lead frames 121 and 131 and incident again to the optical plate 300. Since the length E4 of the semi-transmissive mirrors 351 and 353 is less than the bottom width B1 of the cavities 125 and 135, the light reflected from the semi-transmissive mirrors 351 and 353 may be incident on the surfaces of the lead frames 121 and 131 or the region of the cavities 125 and 135 as illustrated in FIG. 11, and the light incident on the cavities 125 and 135 may be reflected in a different direction by the bottom surface and the inclined side of the cavities 125 and 135.

The area of the bottom surfaces of the semi-transmissive mirrors 351 and 353 may be greater than the area of the top surfaces of the light emitting chips 171 and 172. That is, the first semi-transmissive mirrors 351 and 353 may be disposed on the first light emitting chip 171 with the area greater than the area of the first light emitting chip 171, and the second semi-transmissive mirrors 351 and 353 may be disposed on the second light emitting chip 172 with the area greater than the area of the second light emitting chip 172.

In addition, the interval G11 between the semi-transmissive mirrors 351 and 353 and the light emitting chips 171 and 172 may be in the range of 1 mm or less, for example, in the range of 0.2 mm to 1 mm. When the interval G11 between the light emitting chips 171 and 172 and the semi-transmissive mirrors 351 and 353 is less than the above range, the thickness of the body 110 becomes thinner and thus it may be difficult to secure the rigidity and the degradation problem may occur. When the interval G11 is greater than the above range, the thickness t1 of the light emitting device 100 may increase and the light diffusion effect due to the semi-transmissive mirrors 351 and 353 may be slight.

The semi-transmissive mirrors 351 and 353 according to the embodiment may be disposed to face the light emitting chips 171 and 172. Thus, light emitted from the light emitting chips 171 and 172 is dispersed, and the light dispersed through the first transparent film 320 may be incident on the phosphor layer 340. Accordingly, the light emitted on the lighting device 101 may have a uniform distribution.

The optical plate 300 according to the embodiment may transmit or reflect light emitted from the light emitting chips 171 and 172 by the semi-transmissive mirrors 351 and 353, and the reflected light may be reflected in the light emitting device 100 and transmitted to the peripheral region of the semi-transmissive mirrors 351 and 353.

FIG. 99 illustrates another example of the semi-transmissive mirrors of the optical plate.

As illustrated in FIG. 99, the semi-transmissive mirrors 351 and 353 may be disposed between the phosphor layer 340 and the first transparent film 320, instead of the bottom surface of the optical plate 300. The semi-transmissive mirrors 351 and 353 may transmit a part of light incident through the first transparent film 320 and may reflect a part of the light. Accordingly, it is possible to disperse the light energy distribution collected on the light emitting chips 171 and 172.

FIG. 100 illustrates another example of the semi-transmissive mirrors of the optical plate.

As illustrated in FIG. 100, the semi-transmissive mirrors 352 and 354 may include a curved bottom surface. The bottom surfaces of the semi-transmissive mirrors 352 and 354 may have a curved shape convex in a direction of the light emitting chips 171 and 172. Accordingly, the semi-transmissive mirrors 352 and 354 may transmit a part of light incident on a center region among light incident from the light emitting chips 171 and 172, and increase reflection of light incident on a region around the center region. The semi-transmissive mirrors 352 and 354 may disperse the energy density distribution on the light emitting chips 171 and 172.

FIGS. 101 and 102 illustrates a modification example of a light emitting device of a lighting device according to an embodiment.

Referring to FIGS. 101 and 102, the lighting device includes a light emitting device 100A and an optical plate 300 on the light emitting device 100A.

The light emitting device 100A includes a body 110A having a recess 160, a plurality of lead frames 122 and 132 in the recess 160, and a plurality of light emitting chips 171 and 172 in the recess 160. The semi-transmissive mirrors 351 and 353 may be disposed between the light emitting chips 171 and 172 and the optical plate 300. The semi-transmissive mirrors 351 and 353 may be disposed between the molding member 180 and the optical plate 300.

At least one or all of the plurality of lead frames 122 and 132 may have a flat top surface. That is, as illustrated in FIG. 95, a cavity is not formed in each of the lead frames 121 and 131, and a flat lead frame may be provided. The plurality of lead frames 122 and 132 include a first lead frame 122 and a second lead frame 132 spaced apart from the first lead frame 132. The light emitting device 100A can be understood by referring to the above description of the embodiments.

As illustrated in FIG. 1-3, the semi-transmissive mirrors 351 and 353 of the optical plate 300 may transmit or reflect light emitted from the light emitting chips 171 and 172, and the reflected light may be reflected on the flat lead frames 122 and 132 and incident on the optical plate 300 again.

Sixth Embodiment

FIG. 104 is a view illustrating a lighting device according to a sixth embodiment, FIG. 105 is an assembly plan view of an optical and plate cover in the lighting device of FIG. 104, FIG. 106 is an assembly side cross-sectional view of the optical and plate cover of FIG. 104, FIG. 107 is another side cross-sectional view of the optical and plate cover of FIG. 104, FIG. 108 is an assembly cross-sectional view of the lighting device of FIG. 104, and FIG. 109 is another side cross-sectional view of the lighting device of FIG. 104. In describing the sixth embodiment, the disclosed configuration can be understood by referring to the above description. The configurations disclosed in the first to fifth embodiments or the modification examples of the first to fifth embodiment may be selectively applied to the sixth embodiment (including the modification examples).

Referring to FIGS. 104 to 109, the lighting device includes a light emitting device 100, an optical plate 300 on the light emitting device 100, and a plate cover 360 on the optical plate 300. The light emitting device 100 and the optical plate 300 can be understood by referring to the above description, and a redundant description of the same configurations will be omitted.

The plate cover 360 includes an opening 365, a side cover part 361, and a top cover part 362. The opening 365 is a region opened in a vertical direction, and may open an upper region of the optical plate 300. The side cover part 361 may be disposed on the outer side of the side surface of the optical plate 300, and may reflect light leaking out through the side surface of the optical plate 300. The side cover part 361 may block leakage light that may influence the orientation angle distribution or the light distribution of the lighting device.

The optical plate 300 may be inserted into the plate cover 360. The top cover part 362 of the plate cover 360 may be disposed around the top surface of the optical plate 300. The top cover part 362 may press the outer side of the top surface of the optical plate 300. The top cover part 362 and the side cover part 361 may minimize the flow of the plate cover 360.

The plate cover 360 may be a metal or a non-metal material. When the plate cover 360 is a metal, the plate cover 360 may be a metal material such as iron (Fe), copper (Cu), aluminum (Al), or silver (Ag), or an alloy thereof. When the plate cover 360 is a non-metal, the plate cover 360 may be a plastic material. The plate cover 360 may be a material having high reflectivity. A high-reflectivity material, such as at least one of Ag, an Ag alloy, Al, and an Al-ally, may be plated or coated on the surface of the plate cover 360. The plate cover 360 may reflect light incident on the surface, thereby preventing a reduction in light amount.

As illustrated in FIG. 105, in the plate cover 360, the Y-axis direction length D5 may be twice or more times the X-axis direction width D6, for example, three times or more the X-axis direction width D6. A length (D5) to width (D6) ratio of the plate cover 360 may be changed according to a length (Y1) to width (X4) ratio of the body 110 as illustrated in FIGS. 9 and 10, may satisfy a condition of D5☐Y1, and may satisfy a condition of D6☐X4.

As illustrated in FIG. 106, the plate cover 360 may extend from the outer side of the top surface of the optical plate 300 to the outer periphery of the upper portion of the light emitting device 100. The side height of the plate cover 360 may be disposed to be greater than the thickness or side height of the optical plate 300.

The plate cover 360 may reflect leakage light traveling through at least one or all sides of the first and second transparent films 320 and 330 of the optical plate 300. When the support 310 of the optical plate 300 is a transmissive material, the plate cover 360 may reflect light emitted to the outside through the support 310.

As illustrated in FIGS. 106 and 107, the side cover part 361 of the plate cover 360 may face the outer side of the optical plate 300, and may be spaced apart from the outer side of the optical plate 300. The first interval D7 between the side cover parts 361 of the plate cover 360 in the length direction Y may be greater than or equal to the length D2 of the optical plate 300, and the second interval in the width direction may be equal to or greater than the width D3 of the optical plate 300.

As illustrated in FIGS. 108 and 109, the plate cover 360 may be connected to the light emitting device 100 and the optical plate 300. The side cover part 361 of the plate cover 360 may protrude downward from the bottom surface of the optical plate 300 by a predetermined length P1. In this manner, the side cover part 361 of the plate cover 360 may extend from the outer side of the optical plate 300 to the outer upper portion of the light emitting device 100, and may block light leaking out through the side of the first transparent film 320. In addition, the side cover part 361 may reflect light leaking out through the sides of the first and second transparent films 320 and 330. The side cover part 361 of the plate cover 360 may not form a portion protruding from the bottom surface of the optical plate 300, but embodiments of the present invention are not limited thereto.

As illustrated in FIGS. 104, 108, and 109, the side cover part 361 of the plate cover 360 may be disposed on the side parts 11, 12, 13, and 14 of the body 110 of the light emitting device 100. A stepped structure 43 is disposed in at least one, two, or all of the side parts 11, 12, 13, and 14 of the body 110, and the side cover part 361 of the plate cover 360 may correspond to the stepped structure 43.

The stepped structure 43 of the body 110 may overlap the outer side of the bottom surface of the first transparent film 320 of the optical plate 360 in a vertical direction, or may overlap the support 310 in a vertical direction. The side cover part 361 of the plate cover 360 may be disposed on the stepped structure 43, or may be disposed at an adjacent position.

The side cover part 361 of the plate cover 360 may come into close contact with the side of the first transparent film 320 or may be disposed in an assembly error range. As illustrated in FIG. 109, in the side cover part 361 of the plate cover 360, the interval with the side of the first transparent film 320 in the width direction may be less than the interval with the side of the first transparent film 320 in the length direction as illustrated in FIG. 108. When the length of the first transparent film 320 is greater than the width, the interval between the sides of the side cover part 361 of the plate cover 360 and the first transparent film 320 in the width direction may be made smaller, thereby improving the light leakage problem.

The light emitting device 100 may include a stepped structure 43 on the side parts 11, 12, 13, and 14 of the body 110, and the stepped structure 43 may be stepped with the height having a lower top surface than the top surface 15 of the body 110. As illustrated in FIGS. 26 and 27, in the stepped structure, the side cover part 361 of the plate cover 360 may extend. Accordingly, in the plate cover 360, the side cover part 361 may extend up to the side parts 11, 12, 13, and 14 of the body 110, and may come into close contact with the stepped structure 43 or may be disposed on the stepped structure 43. Since the side cover part 361 of the plate cover 360 is formed to be deeper than the length P1 protruding from the bottom surface of the optical plate 300, the side cover part 361 may be disposed adjacent to the depth (P2 of FIG. 109) of the stepped structure 43. In addition, the side cover part 361 of the plate cover 360 may reflect light travelling through the first transparent film 320.

The side cover part 361 of the plate cover 360 may be disposed more adjacent to the stepped structure 43 disposed on the first and second side parts 11 and 12 than the stepped structure 43 disposed on the third and fourth side parts 13 and 14 of the body 110 of the light emitting device 100. Accordingly, the side cover part 361 of the plate cover 360 may be disposed more adjacent to the long side than the short side in the side parts of the body 110 of the light emitting device 100, thereby effectively reflecting light leaking toward the first transparent film 320 of the long side.

Examples 1, 2, and 3 of Table 2 are comparison of optical plates according to whether the plate cover is connected to the optical plate. Example 1 is the lighting device of FIG. 13, Example 2 is a lighting device having a plate cover having no plating layer, and Example 3 is a lighting device having a plate cover having a plating cover (for example, Ag plating).

TABLE 2

|  | Example 1 | Example 2 | Example 3 |
| --- | --- | --- | --- |
| Light intensity | 100% (reference) | 99.4% | 101% |
| Leakage light of first transparent film | 0% | 0% | 0% |
| Leakage light of second transparent film | 2.9% | 0% | 0% |

As shown in Table 2, when there is no plate cover, the light leaking out through the side of the first transparent film occurs about 2.9%, and the light distribution characteristics or the color orientation characteristics of the lighting device may be changed by the leakage light. According to an embodiment, the light leaking out through the side of the first transparent film may be blocked by the plate cover 360.

Since the side cover part 361 of the plate cover 300 is disposed adjacent to the stepped structure 43, even when the molding member 181 leaks through the region between the optical plate 300 and the body 110, the leaked molding member 181 may be placed on the stepped structure 43, thereby preventing the outer appearance of the molding member 181 from being impaired.

The plate cover 360 may bring the optical plate 300 into close contact with the light emitting device 100 and prevent the flow of the optical plate 300. In addition, when the plate cover 360 is made of a metal material, the plate cover 360 may dissipate heat generated from the light emitting device 100 and the optical plate 300.

Since the opening 365 of the plate cover 360 is disposed with an area larger than the area of the top surface of the phosphor layer 340, no interference may be given to the light emitted from the phosphor layer 340. The opening 365 of the plate cover 360 may face the recess 160 of the light emitting device 100.

The top cover part 362 of the plate cover 360 may be disposed on both sides of the opening 365 in the length direction. The top cover part 362 of the plate cover 360 may face the top surface of the body 110 of the light emitting device 100. As another example, the top cover part 362 of the plate cover 360 may be disposed on both sides of the opening 365 in the width direction, or may be disposed around the opening 365, but embodiments of the present invention are not limited thereto. The top cover part 362 may include a plurality of recesses 363 in an inner corner, and the recesses 363 may reinforce the rigidity of the top cover part 362 of the plate cover 360.

FIG. 110 illustrates a modification example of the light emitting device in the lighting device of FIG. 109.

Referring to FIG. 110, the light emitting device 100 may include the stepped structure 43 in the first and second side parts 11 and 12 of the body 110, and no stepped structure may be formed in the third and fourth side parts 13 and 14 of the body 110, as illustrated in FIGS. 108 and 109. That is, the stepped structure is not formed in the side parts of the body 110. The stepped structure is formed in at least one or two of the first to fourth side parts 11, 12, 13, and 14, and is not formed in the others. Accordingly, it is possible to prevent the rigidity of the body 110 of the light emitting device 100 from being weakened. As another example, the stepped structure is not formed in the first and second side parts 11 and 12 of the body 110, and is formed in the third and fourth side parts 13 and 14, but embodiments of the present invention are not limited thereto.

FIGS. 111 and 112 illustrate an example in which a plate cover is applied to the lighting device of FIGS. 9 and 10.

Referring to FIGS. 111 to 112, the lighting device includes a light emitting device 100A, an optical plate 300 on the light emitting device 100A, and a plate cover 360 on the optical plate 300. The light emitting device 100A can be understood by referring to the configuration of FIGS. 17 and 19, and the optical plate 300 will refer to the description of the optical plates of FIGS. 5 to 11. Detailed configurations of the light emitting device 100A and the optical plate 300 can be understood by referring to the description provided in the above embodiments, and the light emitting devices and/or the optical plates according to the above embodiments may be selectively applied.

A stepped structure 43 is disposed on the outer side of the body 110A of the light emitting device 100A, and the stepped structure 43 may be formed with a depth lower than the top surface 15 of the body 110A along the upper portions of the side parts 11, 12, 13, and 14 of the body 110A. A side cover part 361 of the plate cover 360 may be disposed in the stepped structure 43.

The side cover part 361 of the plate cover 360 may reflect light leaking out through the side of the first transparent film 320 of the optical plate 300.

FIG. 113 is a side cross-sectional view of a lighting device according to a modification example of the sixth embodiment.

Referring to FIG. 113, the lighting device includes a light emitting device 400, an optical plate 300, and a plate cover 360 on the light emitting device 400. The optical plate 300 and the plate cover 360 can be understood by referring to the description of the above embodiments.

The light emitting device 400 includes a body 410, a first lead frame 423 and a second lead frame 421 disposed in the body 410, and a light emitting chip 470 disposed on the body 410 and electrically connected to the first lead frame 423 and the second lead frame 421.

The body 410 may provide a recess 425 having an inclined surface around the light emitting chip 470. A molding member 440 may be disposed on the recess 425, but embodiments of the present invention are not limited thereto. The inclined surface of the recess 425 may be formed with one or more angles, and a separate reflective member may be further disposed on the inclined surface, but embodiments of the present invention are not limited thereto.

The stepped structure 43 may be disposed in the outer upper portion of the body 410, the side cover part 361 of the plate cover 360 may extend in the stepped structure 43, and the side cover part 361 may reflect light leaking out through the side of the optical plate 360.

The light emitting chip 470 may be disposed on the first lead frame 421 and may be connected to the first lead frame 423 by a wire 443. The first lead frame 421 may be formed as a cavity in which a region where the light emitting chip 470 is disposed is recessed, but embodiments are not limited thereto. The light emitting chip 470 may be disposed in a flip-chip manner, but embodiments of the present invention are not limited thereto.

The optical plate 300 may be disposed to face the light emitting chip 470. The optical plate 300 may include a phosphor therein, and may be disposed on the top surface of the body 410.

The optical plate 300 includes a support 310 having an open region 342, a phosphor layer 340 in the support 310, and transparent films 320 and 330 disposed below and/or above the support 310 and the phosphor layer 340.

The support 310 may include the open region 342 therein, and the outer shape thereof may include a circular or polygonal frame shape, but embodiments of the present invention are not limited thereto. The open region 342 may include a circular shape or a polygonal shape. The open region 342 may have a shape corresponding to the shape of the recess 425 of the light emitting device, and light exiting through the recess 160 may be incident. The support 310 may be formed to surround the side surface of the phosphor layer 340.

The transparent films 320 and 330 may be disposed below and/or above the phosphor layer 340. The transparent films 320 and 330 may include a first transparent film 320 disposed below the phosphor layer 340, and a second transparent film 330 disposed above the phosphor layer 340. The transparent films 320 and 330 may be disposed on the incidence surface and/or the exit surface of the phosphor layer 340. In the optical plate 300, one of the first and second transparent films 320 and 330 may be removed. For example, the second transparent film 330 may be removed, but embodiments of the present invention are not limited thereto.

The first transparent film 320 may be bonded to the bottom surface of the support 310 and the bottom surface of the phosphor layer 340. The outer side of the bottom surface of the first transparent film 320 may be bonded on the body 410. The second transparent film 330 may be bonded to the top surface of the support 310 and the top surface of the phosphor layer 340.

The phosphor layer 340 may have the same thickness as the support 310. In this case, a partial or entire region of the top surface and the bottom surface of the support 310 may contact the first and second transparent films 320 and 330. The bottom surface of the support 310 may be bonded to the top surface of the body 410 of the light emitting device 400, and may be disposed around the first transparent film 320. The bottom surface of the optical plate 300 may be bonded on the molding member 440. The bottom surface of the first transparent film 320 may be bonded to the surface of the molding member 440.

The optical plate 300 according to an embodiment is provided with a thickness smaller than the thickness of the light emitting device 400 and may function as a lighting plate or a fluorescent plate on the light emitting device 400.

A plate cover 360 may be disposed on the optical plate 300, and the plate cover 360 may extend to the outer side and the side of the top surface of the optical plate 300 and the outer side of the light emitting device 400, and may reflect light leaking out to the side of the optical plate 300.

FIG. 114 is a side cross-sectional view of a lighting device according to a modification example of the sixth embodiment.

Referring to FIG. 114, the lighting device includes a light emitting device 500 and an optical plate 300 on the light emitting device 500. The optical plate 300 can be understood by referring to the description of the above embodiments.

The light emitting device 500 includes a body 510, a first lead frame 521 and a second lead frame 523 disposed in the body 510, a light emitting chip 570 disposed on the body 510 and electrically connected to the first lead frame 521 and the second lead frame 523, and a molding member 531 on the light emitting chip 570.

The body 510 may include a reflective part 513 having a recess 517 having an opened upper portion, and a support 511 supporting the reflective part 513, but embodiments of the present invention are not limited thereto.

The lead frames 521 and 523 and the light emitting chip 570 may be disposed in the recess 517 of the body 510, and the light emitting chip 570 may be disposed on the second lead frame 523 and may be connected to the first lead frame 521 by a wire 503. The second lead frame 523 may include a recessed cavity, and the light emitting chip 570 may be disposed in the cavity, but embodiments of the present invention are not limited thereto. The first lead frame 521 and the second lead frame 523 are electrically separated from each other and supply power to the light emitting chip 570.

A stepped structure 43 is disposed in the outer upper portion of the body 510. The stepped structure 43 may be disposed in the upper external periphery of the reflective part 513 of the body 410. The side cover part 361 of the plate cover 360 may extend in the stepped structure 43, and the side cover part 361 may reflect light leaking out through the side of the optical plate 360.

The optical plate 300 may be disposed to face the light emitting chip 570. The optical plate 300 may include a phosphor therein, and may be disposed on the top surface of the body 510.

The optical plate 300 includes a frame-shaped support 310 having an open region 342, a phosphor layer 340 in the support 310, a first transparent film 320 disposed below the support 310 and the phosphor layer 340, and a second transparent film 330 disposed above the support 310 and the phosphor layer 340.

The first transparent film 320 may be bonded to the bottom surface of the support 310 and the bottom surface of the phosphor layer 340. The outer side of the bottom surface of the first transparent film 320 may be bonded to the body 510. The second transparent film 330 may be bonded to the top surface of the support 310 and the top surface of the phosphor layer 340.

The phosphor layer 340 may have the same thickness as the support 310. In this case, a partial or entire region of the top surface and the bottom surface of the support 310 may contact the first and second transparent films 320 and 330. The bottom surface of the support 310 may be bonded to the top surface of the body 510 of the light emitting device 500, and may be disposed around the first transparent film 320. The bottom surface of the optical plate 300 may be bonded on the molding member 440. The bottom surface of the first transparent film 320 may be bonded on the surface of the molding member 440.

The optical plate 300 according to an embodiment is provided with a thickness smaller than the thickness of the light emitting device 500 and may function as a lighting plate or a fluorescent plate on the light emitting device 500.

A plate cover 360 may be disposed on the optical plate 300, and the plate cover 360 may extend to the outer side and the side of the top surface of the optical plate 300 and the outer side of the light emitting device 500, and may reflect light leaking out to the side of the optical plate 300.

FIG. 115 is an assembly side cross-sectional view of an optical plate and a plate cover in the sixth embodiment, FIG. 116 is another side cross-sectional view of FIG. 115, FIG. 117 is a side cross-sectional view of a lighting device to which an optical plate and a plate cover are connected in a modification example of the sixth embodiment, and FIG. 118 is another side cross-sectional view of the lighting device of FIG. 117.

As illustrated in FIG. 115, the height of the plate cover 360 may be disposed to be greater than the thickness of the optical plate 300, and the plate cover 360 may extend from the top surface of the optical plate 300 to the outer periphery of the upper portion of the light emitting device 100. The plate cover 360 may prevent leakage of light traveling through at least one or all sides of the first and second transparent films 320 and 330 of the optical plate 300.

The maximum interval D7 between both side cover parts 361 of the plate cover 360 may be disposed to be greater than the length D2 of the optical plate 300, and the minimum interval may be disposed to be equal to or greater than the width D3 of the optical plate 300.

As illustrated in FIGS. 117 and 118, the plate cover 360 may be connected to the light emitting device 100 and the optical plate 300, but embodiments of the present invention are not limited thereto. The optical plate 300 may be inserted into the plate cover 360.

The side cover part 361 of the plate cover 360 may protrude from the bottom surface of the optical plate 300 by a predetermined length P1. In this manner, the side cover part 361 of the plate cover 360 may extend from the outer side of the optical plate 300 to the outer upper portion of the light emitting device 100, and may block light leaking out through the side of the first transparent film 320.

As illustrated in FIGS. 117 and 118, the plate cover 360 may be disposed on the side parts 11, 12, 13, and 14 of the body 110 of the light emitting device 100. The body 110 may provide a stepped structure in which the side cover part 361 of the plate cover 360 is inserted into at least one, two, or four of the side parts 11, 12, 13, and 14. For example, the stepped structures 42 and 43 may be included in the outer sides of the first and second side parts 11 and 12 of the body 110, and the stepped structures 42 and 43 may be stepped from the top surface 15 on the first and second side parts 11 and 12 of the body 110. As illustrated in FIG. 23, in the stepped structures 42 and 43, the side cover part 361 of the plate cover 360 may extend. Accordingly, in the plate cover 360, the side cover part 361 may extend up to the side parts 11, 12, 13, and 14 of the body 110, and may come into close contact with the stepped structures 42 and 43. The depth P2 of the stepped structures 42 and 43 may be deeper than the length P1 at which the side cover part 361 of the plate cover 360 protrudes from the bottom surface of the optical plate 300, and the side cover part 361 may be stably inserted. In addition, the side cover part 361 of the plate cover 360 may block leakage of light travelling through the first transparent film 32.

The plate cover 360 may bring the optical plate 300 into close contact with the light emitting device 100 and prevent the flow of the optical plate 300. In addition, since the plate cover 360 is made of a metal material, it is possible to dissipate heat generated from the light emitting device 100 and the optical plate 300.

Since the opening 365 of the plate cover 360 is disposed with an area larger than the area of the top surface of the phosphor layer 340, no interference may be given to the light emitted from the phosphor layer 340. The opening 365 of the plate cover 360 may face the recess 160 of the light emitting device 100.

The top cover part 362 of the plate cover 360 may be disposed on both sides of the opening 365 in the length direction. The top cover part 362 of the plate cover 360 may face the top surface of the body 110 of the light emitting device 100. As another example, the top cover part 362 of the plate cover 360 may be disposed on both sides of the opening 365 in the width direction, or may be disposed around the opening 365, but embodiments of the present invention are not limited thereto. The top cover part 362 may include a plurality of recesses 363 in an inner corner, and the recesses 363 may reinforce the rigidity of the top cover part 362 of the plate cover 360.

FIG. 119 is a view illustrating an example of a first shape of a semi-transmissive mirror disposed in an optical plate in the fifth and sixth embodiments, FIG. 120 is a graph showing a light energy density according to reflectivity of the semi-transmissive mirror in the optical plate of FIG. 119, and (a) to (e) of FIG. 121 are views illustrating a light energy distribution according to reflectivity of the semi-transmissive mirror in the optical plate of FIG. 119.

Referring to FIGS. 119 to 121, when the shape of the semi-transmissive mirrors 351 and 353 is an oval shape, the length E4 may be greater than the width E5. That is, the maximum length E4 may be greater than the maximum width E5. The ratio of the length E4 to the width E5 may be 1.5:1. For example, the length E4 may be 1.5 mm±0.3 mm, and the width E5 may be 1 mm±0.2 mm. The straight line distance G3 between the centers of the semi-transmissive mirrors 351 and 353 may be twice or less the length E4, and may exceed twice the width E5.

In this case, as illustrated in FIG. 120, regarding the light energy density of the first transparent film 320, when the reflectivity of the semi-transmissive mirrors 351 and 353 is in the range of 60% to 80%, the light energy density is lower as compared with the case where the reflectivity is 50%. When the reflectivity of the semi-transmissive mirrors 351 and 353 is 65%, the light energy density may be minimum.

FIG. 121 illustrates the light energy density according to the reflectivity of the semi-transmissive mirrors 351 and 353 in the first transparent film 320. (a) shows a case where the reflectivity of the semi-transmissive mirrors 351 and 353 is 50%, (b) shows a case where the reflectivity of the semi-transmissive mirrors 351 and 353 is 60%, (c) shows a case where the reflectivity of the semi-transmissive mirrors 351 and 353 is 65%, (d) shows a case where the reflectivity of the semi-transmissive mirrors 351 and 353 is 70%, and (e)

shows a case where the reflectivity of the semi-transmissive mirrors 351 and 353 is 80%. In the light energy densities of (a) to (e) of FIG. 121, the light amount dispersed around the semi-transmissive mirrors 351 and 353 increases when the reflectivity of the semi-transmissive mirrors 351 and 353 is in the range of 60% to 80%. As illustrated in (c) of FIG. 121, it can be seen that, when the reflectivity of the semi-transmissive mirrors 351 and 353 is 65%, the light energy densities of the center region of the semi-transmissive mirror and the peripheral region of the semi-transmissive mirror are uniformly distributed.

FIG. 122 is a view illustrating an example of a second shape of a semi-transmissive mirror in an optical plate in the fifth and sixth embodiments, FIG. 123 is a graph showing a light energy density according to reflectivity of the semi-transmissive mirror in the optical plate of FIG. 122, and (a) to (e) of FIG. 124 are views illustrating a light energy distribution according to reflectivity of the semi-transmissive mirror in the optical plate of FIG. 122.

Referring to FIGS. 122 to 124, the shape of the semi-transmissive mirrors 351 and 353 may have a circular shape having a predetermined diameter. The diameter of the circular shape, that is, the horizontal or vertical length E4 or E5, may be in the range of 1.5 mm±0.3 mm. The straight line distance G3 between the centers of the semi-transmissive mirrors 351 and 353 may be twice or more times the diameter, that is, the horizontal or vertical length E4 or E5, for example, greater than 2 mm.

As illustrated in FIG. 123, regarding the light energy density of the first transparent film 320, when the reflectivity of the semi-transmissive mirrors 351 and 353 is in the range of 68%±5%, the light energy density is low. When the reflectivity of the semi-transmissive mirrors 351 and 353 is 68%, the light energy density may be minimum.

FIG. 124 illustrates the light energy density according to the reflectivity of the semi-transmissive mirrors 351 and 353 in the first transparent film. (a) shows a case where the reflectivity of the semi-transmissive mirrors 351 and 353 is 50%, (b) shows a case where the reflectivity of the semi-transmissive mirrors 351 and 353 is 60%, (c) shows a case where the reflectivity of the semi-transmissive mirrors 351 and 353 is 65%, (d) shows a case where the reflectivity of the semi-transmissive mirrors 351 and 353 is 70%, and (e) shows a case where the reflectivity of the semi-transmissive mirrors 351 and 353 is 80%. In the light energy densities of (a) to (e) of FIG. 124, as the reflectivity of the semi-transmissive mirrors 351 and 353 increases, the light amount dispersed around the semi-transmissive mirrors 351 and 353 may increase. Accordingly, it can be seen that, when the reflectivity of the semi-transmissive mirrors 351 and 353 is 68%±5%, the light energy densities in the region of the semi-transmissive mirrors 351 and 353 and the region of the transparent film are dispersed at the same density and light intensity.

FIG. 125 is a view illustrating an example of a third shape of a semi-transmissive mirror disposed in an optical plate according to an embodiment, FIG. 126 is a graph showing a light energy density according to reflectivity of the semi-transmissive mirror in the optical plate of FIG. 125, and (a) to (e) of FIG. 127 are views illustrating a light energy distribution according to reflectivity of the semi-transmissive mirror in the optical plate of FIG. 30.

Referring to FIG. 125, the semi-transmissive mirrors 351 and 353 may have a polygonal shape, and the length E4 may be greater than the width E5. The ratio of the length E4 to the width E5 may be 1.5:1. For example, the length E4 may be 1.5 mm±0.3 mm, and the width E5 may be 1 mm±0.2 mm. The straight line distance G3 between the centers of the semi-transmissive mirrors 351 and 353 may be twice or less the length E4, and may exceed twice the width E5.

As illustrated in FIG. 126, regarding the light energy density of the first transparent film 320, when the reflectivity of the semi-transmissive mirrors 351 and 353 is in the range of 65%±5%, the light energy density is low. When the reflectivity of the semi-transmissive mirrors 351 and 353 is 65%, the light energy density may be minimum.

FIG. 127 illustrates the light energy density according to the reflectivity of the semi-transmissive mirrors 351 and 353 in the first transparent film. (a) shows a case where the reflectivity of the semi-transmissive mirrors 351 and 353 is 50%, (b) shows a case where the reflectivity of the semi-transmissive mirrors 351 and 353 is 60%, (c) shows a case where the reflectivity of the semi-transmissive mirrors 351 and 353 is 65%, (d) shows a case where the reflectivity of the semi-transmissive mirrors 351 and 353 is 70%, and (e) shows a case where the reflectivity of the semi-transmissive mirrors 351 and 353 is 80%. In the light energy densities of (a) to (e) of FIG. 127, as the reflectivity of the semi-transmissive mirrors 351 and 353 increases, the light amount dispersed around the semi-transmissive mirrors 351 and 353 may increase. Accordingly, it can be seen that, when the reflectivity of the semi-transmissive mirrors 351 and 353 is 65%±5%, the light energy densities in the region of the semi-transmissive mirrors 351 and 353 and the region of the transparent film are dispersed at the same density and light intensity.

The semi-transmissive mirrors 351 and 353 according to the embodiment may have a circular shape, an oval shape, or a polygonal shape. When the reflectivity of the semi-transmissive mirrors 351 and 353 is in the range of 60% to 70%, the light energy densities are similar in the semi-transmissive mirrors 351 and 353 and the peripheral region thereof, thereby obtaining the light dispersion effect.

(a) to (c) of FIG. 128 are views illustrating a light energy distribution according to the length E4 and the width E5 of the semi-transmissive mirrors 351 and 353 in the optical plate according to the embodiment. The light energy distribution is a case where the semi-transmissive mirrors 351 and 353 have an oval shape, and the interval between the light emitting chips 171 and 172 is 0.5 mm.

(a) of FIG. 128 is a case where the length E4 and the width E5 in the size of the semi-transmissive mirrors 351 and 353 are equal to the light emitting chips 171 and 172, and the reflectivity of the semi-transmissive mirrors 351 and 353 is 45%, the diffusion effect due to the semi-transmissive mirrors 351 and 353 in the light energy distribution may be slight.

(b) of FIG. 128 is a case where the length E4 and the width E5 in the size of the semi-transmissive mirrors 351 and 353 are greater than the light emitting chips 171 and 172, and the reflectivity of the semi-transmissive mirrors 351 and 353 is 65%, the diffusion effect due to the semi-transmissive mirrors 351 and 353 in the light energy distribution may be improved to the uniform distribution. The length E4 is in the range of 1.5 mm±0.3 mm, and the width E5 is in the range of 1 mm±0.2 mm.

(c) of FIG. 128 is a case where the length E4 and the width E5 in the size of the semi-transmissive mirrors 351 and 353 are greater than the light emitting chips 171 and 172, and the reflectivity of the semi-transmissive mirrors 351 and 353 is 65%, the diffusion effect due to the semi-transmissive mirrors 351 and 353 in the tight energy distribution may be improved, but is partially biased.

The length E4 is in the range of 2.2 mm±0.44 mm, the width E5 is in the range of 1.4 mm±0.28 mm, and the horizontal and vertical lengths of the opening may be changed according to the size of the package.

FIG. 129 is a view illustrating a light energy distribution in an optical plate to which the light emitting device of FIG. 95 is applied, and FIG. 101 is a view illustrating a light energy distribution in an optical plate to which the light emitting device of FIG. 101 is applied.

Referring to FIGS. 129 and 130, even when the light emitting chips 171 and 172 of the lead frames 121 and 131 disposed below the recess 160 in the light emitting device 100 as illustrated in FIG. 95 are excluded or the cavity is not formed in the lead frames 121 and 131, the difference in the light energy density distribution occurs due to the semi-transmissive mirrors 351 and 353, but the uniform optical distribution may be provided as a whole.

(a) to (d) of FIG. 131 are views illustrating a light energy distribution in an optical plate having no semi-transmissive mirror in a comparative example. (a) of FIG. 131 illustrates a light energy distribution when the distance between the light emitting chip and the first transparent film is 0.5 mm. It can be seen that there is no dispersion effect since high light intensity appears in the region of the light emitting chips. (b) to (d) of FIG. 131 illustrate a case where the interval between the light emitting chip and the first transparent film 320 is increased to 1.0 mm, 1.5 mm, and 2.0 mm, and the light emitted from the light emitting chip may gradually diffuse. However, as the interval between the light emitting chip and the optical plate increases, the thickness of the lighting device may increase and the thickness of the lighting device may increase. Accordingly, the thickness (T1 of FIG. 4) of the light emitting device may be maximally 1.8 mm or less.

FIG. 132 is a side cross-sectional view of a lighting device according to a modification example of the sixth embodiment.

Referring to FIG. 132, the lighting device includes a light emitting device 400 and an optical plate 300 on the light emitting device 400. Detailed configurations of the light emitting device 400 and the optical plate 300 can be understood by referring to the description provided in the above embodiments, and the light emitting devices and/or the optical plates according to the above embodiments may be selectively applied.

The light emitting device 400 includes a body 410, a first lead frame 423 and a second lead frame 421 disposed in the body 410, and a light emitting chip 470 disposed on the body 410 and electrically connected to the first lead frame 423 and the second lead frame 421.

The optical plate 300 may be disposed to face the light emitting chip 470. The optical plate 300 may include a phosphor therein, and may be disposed on the top surface of the body 410.

The optical plate 300 includes a frame-shaped support 310 having an open region 342, a phosphor layer 340 in the support 310, transparent films 320 and 330 disposed below and/or above the support 310 and the phosphor layer 340, and a semi-transmissive mirror 350 facing the light emitting chip 470 that is a light source below the phosphor layer 340.

The transparent films 320 and 330 may be disposed below and/or above the phosphor layer 340. The transparent films 320 and 330 may include a first transparent film 320 disposed below the phosphor layer 340, and a second transparent film 330 disposed above the phosphor layer 340. The transparent films 320 and 330 may be disposed on the incidence surface and/or the exit surface of the phosphor layer 340. In the optical plate 300, one of the first and second transparent films 320 and 330 may be removed. For example, the second transparent film 330 may be removed, but embodiments of the present invention are not limited thereto.

The first transparent film 320 may be bonded to the bottom surface of the support 310 and the bottom surface of the phosphor layer 340. The outer side of the bottom surface of the first transparent film 320 may be bonded on the body 410. The second transparent film 330 may be bonded to the top surface of the support 310 and the top surface of the phosphor layer 340.

The phosphor layer 340 may have the same thickness as the support 310. In this case, a partial or entire region of the top surface and the bottom surface of the support 310 may contact the first and second transparent films 320 and 330.

The semi-transmissive mirror 350 may include a metal material, e.g., aluminum (Al) or silver (Ag), which can perform a semi-transmissive function. The semi-transmissive mirror 350 may be made of a material having high reflectivity rather than transmittance. The sum of the reflectivity and the transmittance may be 100%.

The semi-transmissive mirror 350 may include a diffusion sheet. An uneven pattern may be formed on the bottom surface of the semi-transmissive mirror 350, that is, the light incidence surface, but embodiments of the present invention are not limited thereto. The semi-transmissive mirror 350 may be defined as a half mirror sheet, a semi-transmissive mirror, a polarization sheet, or a semi-transmissive diffusion sheet. The semi-transmissive mirror 350 may be formed below the first transparent film 320 by screen printing, but embodiments of the present invention are not limited thereto.

The semi-transmissive mirror 350 may be disposed below the phosphor layer 340, for example, the first transparent film 320. One or more semi-transmissive mirror 350 may be disposed below the first transparent film 320. For example, in the case of the plurality of semi-transmissive mirror 350, the same number as the number of light emitting chip 470 may be disposed. The semi-transmissive mirror 350 may be disposed to face the light source, for example, the light emitting chip 470.

The semi-transmissive mirror 350 and the light emitting chip 470 can be understood by referring to the description of the above embodiments. For example, the length E4 of the semi-transmissive mirror 350 in the first direction may be greater than the length E1 of the light emitting chip 470 in the first direction, and the width in the second direction may be greater than the width of the light emitting chip 470 in the second direction. The area of the top surface or bottom surface of the semi-transmissive mirror 350 may be greater than the area of the top surface of the light emitting chip 470.

The interval G1 between the semi-transmissive mirror 350 and the light emitting chip 470 may be in the range of 1 mm or less, for example, in the range of 0.2 mm to 1 mm. When the interval G11 between the light emitting chip 470 and the semi-transmissive mirror 350 is less than the above range, the thickness of the body 410 becomes thinner and thus it may be difficult to secure the rigidity and the degradation problem may occur. When the interval G11 is greater than the above range, the thickness of the light emitting device 100 may increase and the light diffusion effect due to the semi-transmissive mirror 350 may be slight.

The semi-transmissive mirror 350 may reflect or transmit light incident from the light emitting device 100. The semi-transmissive mirror 350 is disposed in a region in which the light amount incident on the optical plate 300 is maximum, and may diffuse light to the peripheral region. The semi-transmissive mirror 350 may be higher in reflectivity than in transmittance as described above.

In the optical plate 300, the semi-transmissive mirror 350 is disposed in a region in which the light amount of the light emitting chip 470 is highest, thereby reducing the degradation problem of the phosphor by light generated from the light emitting chip 470 and reducing the optical loss. In addition, the color conversion due to the quantum dot may prevent the degradation of the luminous efficiency and prevent the degradation of the color correction index.

The optical plate 300 according to an embodiment is provided with a thickness smaller than the thickness of the light emitting device 100 and may function as a lighting plate or a fluorescent plate on the light emitting device 100.

The plate cover illustrated in FIG. 17 may be connected to the top surface and the periphery of the lighting device, but embodiments of the present invention are not limited thereto.

FIG. 133 is a side cross-sectional view illustrating a lighting device according to an embodiment.

Referring to FIG. 133, the lighting device includes a light emitting device 500 and an optical plate 300 on the light emitting device 500.

The light emitting device 500 includes a body 510, a first lead frame 521 and a second lead frame 523 disposed in the body 510, a light emitting chip 570 disposed on the body 510 and electrically connected to the first lead frame 521 and the second lead frame 523, and a molding member 531 on the light emitting chip 570.

The body 510 may include a reflective part 513 having a recess 517 having an opened upper portion, and a support 511 supporting the reflective part 513, but embodiments of the present invention are not limited thereto.

The lead frames 521 and 523 and the light emitting chip 570 may be disposed in the recess 517 of the body 510, and the light emitting chip 570 may be disposed on the second lead frame 523 and may be connected to the first lead frame 521 by a wire 503. The second lead frame 523 may include a cavity in which the light emitting chip 570 is disposed, but embodiments of the present invention are not limited thereto. The first lead frame 521 and the second lead frame 523 are electrically separated from each other and supply power to the light emitting chip 570.

The first lead frame 521 and the second lead frame 523 may reflect light generated by the light emitting chip 570, thereby increasing luminous efficiency. To this end, a separate reflective layer may be further formed on the first lead frame 521 and the second lead frame 523, but embodiments of the present invention are not limited thereto. In addition, the first and second lead frames 521 and 523 may serve to discharge heat generated from the light emitting chip 570 to the outside. A lead part 522 of the first lead frame 521 and a lead part 524 of the second lead frame 523 may be disposed on the bottom surface of the body 510.

The molding member 531 may include a resin material such as silicon or epoxy and may surround the light emitting chip 570 to protect the light emitting chip 570. The molding member 531 may have a flat, convex, or concave top surface. The molding member 531 may be removed and the recess 517 may be filled with an air region.

The optical plate 300 may be disposed to face the light emitting chip 570. The optical plate 300 may include a phosphor therein, and may be disposed on the top surface of the body 510.

The optical plate 300 includes a frame-shaped support 310 having an open region 342, a phosphor layer 340 in the support 310, a first transparent film 320 disposed below the support 310 and the phosphor layer 340, a second transparent film 340 disposed above the support 310 and the phosphor layer 340, and a semi-transmissive mirror 350 facing the light emitting chip 570 that is a light source in a partial region of the first transparent film 320.

The support 310 may include the open region 342 therein, and the outer shape thereof may include a circular frame or polygonal frame shape. The open region 342 may include a circular shape or a polygonal shape. The open region 342 may have a shape corresponding to the shape of the recess 517 of the light emitting device, and light exiting through the recess 517 may be incident. The support 310 may be formed to surround the side surface of the phosphor layer 340.

The support 310 may include a glass material, for example, a white glass or a glass material having high reflectivity. The white glass or the glass material having high reflectivity may be formed by adding white particles and/or bubbles to a transparent glass. The reflectivity of the support 310 may be higher than the reflectivity of the first and second transparent films 320 and 330.

As another example, the support 310 may include a resin material, and the resin material may include a resin material such as PPA, epoxy, or a silicon material. A filler, which is a metal oxide such as $TiO_2$ or $SiO_2$, may be added to the resin material. The support 310 may include a white resin. The support 310 may include a ceramic material.

In the phosphor layer 340, a phosphor may be added to the resin material such as transparent silicon or epoxy. The phosphor layer 340 converts a wavelength of light emitted from the light emitting chip 570. The phosphor layer 340 may include at least one of a red phosphor, a green phosphor, a yellow phosphor, and a blue phosphor. The phosphor may excite part of emitted light and emit light of different wavelengths. The phosphor may selectively include YAG, TAG, silicate, nitride, or oxynitride-based material. The phosphor may include at least one of a red phosphor, a yellow phosphor, and a green phosphor.

The phosphor layer 340 according to the embodiment may include a quantum dot. The quantum dot may include a group II-VI compound semiconductor or a group III-V compound semiconductor and may include at least one of blue, green, yellow, and red quantum dots.

Examples of the quantum dot may be ZnS, ZnSe, ZnTe, CdS, CdSe, CdTe, GaN, GaP, GaAs, GaSb, InP, InAs, InSb, AlS, AlP, AlAs, PbS, PbSe, Ge, Si, CuInS2, and $CuInSe_2$, and a combination thereof. In the case of the quantum dot, the light emission efficiency greatly changes according to the temperature. Thus, the change in the light emission efficiency may be reduced by spacing the quantum dot apart from the light emitting chip 570.

The first and second transparent films 320 and 330 may include glass or a transparent resin film. The first and second transparent films 320 and 330 are bonded on the support 310 to protect the phosphor layer 340. The first and second transparent films 320 and 330 may be made of a material having a refractive index equal to or lower than a refractive index of the molding member 181 and/or the phosphor layer 340. The first and second transparent films 320 and 330 may be made of a material having a difference of 0.2 or less from a refractive index of the molding member 181.

The first transparent film 320 may be bonded to the bottom surface of the support 310 and the bottom surface of the phosphor layer 340. The outer side of the bottom surface of the first transparent film 320 may be bonded on the body 510. The second transparent film 330 may be bonded to the top surface of the support 310 and the top surface of the phosphor layer 340.

The phosphor layer 340 may have the same thickness as the support 310. In this case, a partial or entire region of the top surface and the bottom surface of the support 310 may contact the first and second transparent films 320 and 330.

The semi-transmissive mirror 350 may include a metal material, e.g., aluminum (Al) or silver (Ag), which can perform a semi-transmissive function. The semi-transmissive mirror 350 may be made of a material having high reflectivity rather than transmittance. The sum of the reflectivity and the transmittance may be 100%.

The semi-transmissive mirror 350 may include a diffusion sheet. An uneven pattern may be formed on the bottom surface of the semi-transmissive mirror 350, that is, the light incidence surface, but embodiments of the present invention are not limited thereto. The semi-transmissive mirror 350 may be defined as a half mirror sheet, a semi-transmissive mirror, a polarization sheet, or a semi-transmissive diffusion sheet. The semi-transmissive mirror 350 may be formed below the first transparent film 320 by screen printing, but embodiments of the present invention are not limited thereto.

The semi-transmissive mirror 350 may be disposed below the phosphor layer 340, for example, the first transparent film 320. One or more semi-transmissive mirror 350 may be disposed below the first transparent film 320. For example, in the case of the plurality of semi-transmissive mirror 350, the same number as the number of light emitting chips 570 may be disposed. The semi-transmissive mirror 350 may be disposed to face the light source, for example, the light emitting chip 470.

The semi-transmissive mirror 350 and the light emitting chip 570 can be understood by referring to the description of the above embodiments. For example, the length E4 of the semi-transmissive mirror 350 in the first direction may be greater than the length E1 of the light emitting chip 570 in the first direction, and the width in the second direction may be greater than the width of the light emitting chip 570 in the second direction. The area of the top surface or bottom surface of the semi-transmissive mirror 350 may be greater than the area of the top surface of the light emitting chip 570.

The interval G11 between the semi-transmissive mirror 350 and the light emitting chip 570 may be in the range of 0.5 mm or more, for example, in the range of 0.5 mm to 1.5 mm. When the interval G11 between the light emitting chip 570 and the semi-transmissive mirror 350 is less than the above range, the thickness of the body 510 becomes thinner and thus it may be difficult to secure the rigidity and the degradation problem may occur. When the interval G11 is greater than the above range, the thickness of the light emitting device 100 may increase and the light diffusion effect due to the semi-transmissive mirror 350 may be slight.

The semi-transmissive mirror 350 may reflect or transmit light incident from the light emitting device 100. The semi-transmissive mirror 350 is disposed in a region in which the light amount incident on the optical plate 300 is maximum, and may diffuse light to the peripheral region. The semi-transmissive mirror 350 may be higher in reflectivity than in transmittance as described above.

In the optical plate 300, the semi-transmissive mirror 350 is disposed in a region in which the light amount of the light emitting chip 570 is highest, thereby reducing the degradation problem of the phosphor by light generated from the light emitting chip 570 and reducing the optical loss. In addition, the color conversion due to the quantum dot may prevent the degradation of the luminous efficiency and prevent the degradation of the color correction index.

The optical plate 300 according to an embodiment is provided with a thickness smaller than the thickness of the light emitting device 100 and may function as a lighting plate or a fluorescent plate on the light emitting device 100. The plate cover may be connected to the top surface and the periphery of the lighting device, but embodiments of the present invention are not limited thereto.

FIG. 134 is a view illustrating a lighting device including an optical plate having a semi-transmissive mirror and a light emitting device, and FIG. 135 illustrates another example of an optical plate having a semi-transmissive mirror and a light emitting device as a modification example of FIG. 103.

Referring to FIGS. 134 and 135, the optical plate 301 may include a semi-transmissive mirror 351 on the bottom surface thereof. The semi-transmissive mirror 351 may be disposed to face the light emitting chips 171 and 172 of the light emitting devices 100 and 100A. The semi-transmissive mirror 351 may be disposed to overlap the light emitting chips 171 and 172 of the light emitting devices 100 and 100A in a vertical direction. The semi-transmissive mirror 351 may be disposed on the bottom surface of the phosphor layer 340 of the optical plate 301. When the light emitting devices 100 and 100A include the molding member 181, the semi-transmissive mirror 351 may contact the molding member 181. The bottom surface of the semi-transmissive mirror 351 may be disposed below the top surface of the molding member 181.

The semi-transmissive mirror 351 may be disposed between the light emitting chips 171 and 172 and the phosphor layer 340. The semi-transmissive mirror 351 may contact the molding member 181 and the phosphor layer 340, and the molding member 181 may surround the outer side of the semi-transmissive mirror 351.

The semi-transmissive mirror 351 may transmit light incident from the light emitting device 171,172, and reflect a part of light. The semi-transmissive mirror 351 may be higher in reflectivity than in transmittance.

The area of the bottom surfaces of the semi-transmissive mirror 351 may be greater than the area of the top surfaces of the light emitting chips 171 and 172. Accordingly, the semi-transmissive mirror 351 may transmit or reflect relatively high incident light. The width E4 of the semi-transmissive mirror 351 may be greater than the width of the light emitting chips 171 and 172.

When the light emitting chips are plural, the plurality of semi-transmissive mirrors 351 may be disposed to face the light emitting chips 171 and 172. A top view shape of the semi-transmissive mirror 351 may be a circular shape, a polygonal shape, or an oval shape, but embodiments of the present invention are not limited thereto. Since the semi-transmissive mirror 351 diffuses incident light, light with the uniform light distribution may be incident on the phosphor layer 340 of the optical plate 301.

As illustrated in FIG. 134, a part of light emitted from the light emitting chips 171 and 172 may transmit through the semi-transmissive mirror 351, and a part of light may be reflected by the semi-transmissive mirror 351 and reflected again from the surfaces of the lead frames 121 and 131 that are the bottom of the cavity.

As illustrated in FIG. 135, a part of light emitted from the light emitting chips 171 and 172 may transmit through the semi-transmissive mirror 351, and a part of light may be reflected by the semi-transmissive mirror 351 and reflected again from the flat surfaces of the lead frames 121 and 131.

Seventh Embodiment

FIG. 136 is a plan view of a light emitting device according to a seventh embodiment, and FIG. 137 is a G-G cross-sectional view of the light emitting device of FIG. 136. The embodiment can be understood by referring to the configurations provided in the above embodiment or the modification examples thereof. In describing the seventh embodiment, the configurations disclosed in the first to sixth embodiments or the modification examples of the first to sixth embodiment may be selectively applied to the seventh embodiment (including the modification example thereof).

Referring to FIGS. 136 and 137, in the light emitting device 200 according to the embodiment, a phosphor layer 280 may be disposed on a light emitting chip emitting a relatively long wavelength among light emitting chips 251 and 253 emitting different wavelengths. The phosphor layer 280 may be a film type or a molding member having a constant thickness.

In the light emitting device 200 according to the embodiment, the phosphor layer 280 may be disposed on the light emitting chip 253 emitting a relatively long wavelength among the light emitting chips 251 and 253 having the same color and emitting light having different peak wavelengths.

The light emitting device 200 according to the embodiment may include the phosphor layer 280 having a relatively wavelength as an excitation wavelength among the light emitting chips 251 and 253 having the same color and emitting light having different peak wavelengths.

The light emitting device 200 according to the embodiment may include a body 210 in which a barrier part 214 is disposed between the light emitting chips 251 and 253 having the same color and emitting light having different peak wavelengths.

In the light emitting device 200 according to the embodiment, the light emitting chips 251 and 253 having the same color and emitting different peak wavelengths may be disposed in different cavities 215 and 217, and the phosphor layer 280 may be disposed on the light emitting chip 253 emitting a relatively long wavelength.

The light emitting device 200 includes a body 210, a plurality of lead frames 221, 231, and 241 disposed in the body 210, light emitting chips 251 and 253 electrically connected to the plurality of lead frames 221, 231, and 241 and emitting light L1 and L2 having different peak wavelengths, molding members 261 and 263 covering the light emitting chips 251 and 253, and a phosphor layer 280 disposed on the light emitting chip 253 emitting the light L2 having a relatively long wavelength among the light emitting chips 251 and 253.

The body 210 may be formed to include a conductive substrate such as silicon, a synthetic resin material such as PPA, a ceramic substrate, an insulating substrate such as plastic leaded chip carrier (PLCC), a metal substrate (for example, metal core PCB (MCPCB)), or a white insulating layer. The body 210 may include a reflective part 213 having concave cavities 215 and 217 of which the upper portions are opened, and a support 211 supporting the reflective part 213, but embodiments of the present invention are not limited thereto. As another example, the body 210 may not include the support 211. In this case, a plurality of lead frames 221, 231, and 241 may be disposed on the bottom of the body 210.

The body 210 may include a plurality of cavities 215 and 217. The cavities 215 and 217 may include a first cavity 215 and a second cavity 217 spaced apart from the first cavity 215. The first and second cavities 215 and 217 may be formed in a structure concave from the top surface 219 of the body 210, for example, a recess structure or a cup structure. A top view shape of the first and second cavities 215 and 217 may be a polygonal shape, a circular shape, an oval shape, or a shape in which an edge of a polygonal shape is curved. When viewed from the side cross-sectional view, the upper length (D4 of FIG. 1) of the cavities 215 and 217 may be greater than the lower length thereof. The peripheral surfaces of the cavities 215 and 217 may be an inclined surface or a vertical surface. When the peripheral surfaces of the cavities 215 and 217 are the inclined surfaces, the inclined surfaces may be formed with one or different angles with respect to the bottom of the cavities 215 and 217, but embodiments of the present invention are not limited thereto. Accordingly, light emitted from the light emitting chips 251 and 253 may be reflected from the peripheral surfaces of the cavities 215 and 217, and the light extraction efficiency may be improved.

As illustrated in FIG. 136, when the plurality of cavities 215 and 217 are disposed in a length direction, the length C1 of the body 210 in the light emitting device 200 may be greater than the width C2 thereof, for example, twice the width C2. As another example, the plurality of cavities 215 and 217 may be disposed in a width direction, but embodiments of the present invention are not limited thereto.

The barrier part 214 may be disposed between the first and second cavities 215 and 217, and the barrier part 214 may be the same material as or different materials from that of the body 210. The barrier part 214 may be disposed at the same height as that of the top surface of the body 210, or may be disposed to be lower than the top surface of the body 210, but embodiments of the present invention are not limited thereto. The outer side of the body 210 may be formed vertically, or may be formed with a slope.

The plurality of lead frames 221, 231, and 241 are disposed in the body 210. The plurality of lead frames 221, 231, and 241 may be disposed on the bottom of the cavities 215 and 217. At least two of the plurality of lead frames 221, 231, and 241 may be disposed in the cavities 215 and 217. For example, first frame parts 232 of the first lead frame 221 and the second frame 231 are disposed in the first cavity 215, and a second frame part 234 of the second lead frame 231 and the third lead frame 241 may be disposed in the second cavity 215.

The second lead frame 231 may include an extension part 236 disposed below the barrier part 214, and the extension part 236 may be disposed between the barrier part 214 and the support 211. The extension part 236 may be connected between the first and second frame parts 232 and 234, and may extend from the first and second cavities 215 and 217 toward the inside of the body 210.

The first lead part 223 extending to one side of the body 210 in the first lead frame 221 may be disposed on the bottom surface of the body 210. The second lead part 243 extending to the other side of the body 210 in the third lead frame 243 may be disposed on the bottom surface of the body 210.

The first lead part 223 of the first lead frame 221 and the second lead part 243 of the third lead frame 241 may bonded to the circuit board, or may receive external power.

The first to third lead frames 221, 231, and 241 may include a metal, for example, at least one selected from titanium (Ti), copper (Cu), nickel (Ni), gold (Au), chromium (Cr), tantalum (Ta), platinum (Pt), tin (Sn), silver (Ag), and phosphorus (P). In addition, the first to third lead frames 221, 231, and 241 may be formed to have a single-layer or multi-layer structure, but embodiments of the present invention are not limited thereto. A separate reflective layer may be further formed on the surfaces of the first to third lead frames 221, 231, and 241, but embodiments of the present invention are not limited thereto.

The light emitting device 200 according to the embodiment may include a plurality of light emitting chips 251 and 253, and the plurality of light emitting chips 251 and 253 may be two or more. The plurality of light emitting chips 251 and 253 may include one or more first light emitting chips 251 disposed in the first cavity 215, and one or more second light emitting chips 253 disposed in the second cavity 217.

The first and second light emitting chips 251 and 253 may emit different peak wavelengths. The first and second light emitting chips 251 and 253 may emit at least one of ultraviolet light, blue light, green light, and red light, and may emit, for example, light of a single wavelength, such as ultraviolet light or blue light. The first and second light emitting chips 251 and 253 may have the same color and emit different peak wavelengths. The first light emitting chip 251 may emit light having a single wavelength closer to ultraviolet light than the peak wavelength of the second light emitting chip 253. On the contrary, the second light emitting chip 253 may emit light having a longer wavelength than the peak wavelength of the first light emitting chip 251. Since the single wavelength of the first light emitting chip 251 among the first and second light emitting chips 251 and 253 is provided without wavelength conversion, color reproducibility may be improved in the light unit such as a display.

The first and second light emitting chips 251 and 253 may emit blue light, for example, a peak wavelength in the range of 430 nm to 470 nm. The first light emitting chip 251 may emit a peak wavelength in the range of 455 nm or less, for example, in the range of 440 nm to 450 nm. When out of the range of the blue light of the first light emitting chip 251, color reproducibility may be degraded. The second light emitting chip 253 may emit a peak wavelength in the range of more than 455 nm, for example, in the range of 460 nm to 470 nm. When the range of the blue light of the second light emitting chip 253 is lower than the above range and is used as the excitation wavelength, the life of the second light emitting chip 253 may be degraded. When higher than the above range, the excitation efficiency may be degraded. The difference between the peak wavelengths of the first and second light emitting chips 251 and 253 may be 5 nm or more, for example, in the range of 10 nm to 30 nm. When the difference between the peak wavelengths exceeds the above range, improvement effect of color reproducibility or excitation efficiency may be slight.

The first light emitting chip 251 may be disposed on the first frame part 232 of the second lead frame 231 or the first lead frame 221 in the first cavity 215. For example, the first light emitting chip 251 may be bonded to the first frame part 232 of the second lead frame 231 by an adhesive, and may be connected to the first frame parts 232 of the first lead frame 221 and the second lead frame 231 by a wire 255. When the first light emitting chip 251 is a horizontal chip, the first light emitting chip 251 may be connected to different lead frames 221 and 231 by the wire 255 or may be disposed in a flip-chip manner. When the first light emitting chip 251 is a vertical chip, the first light emitting chip 251 may be bonded and electrically connected to the first frame part 232 of the first lead frame 221 by a conductive adhesive and may be connected to the first lead frame 221 by the wire 255.

The second light emitting chip 253 may be disposed on the third frame 241 or the second lead frame 231 in the second cavity 217. For example, the second light emitting chip 253 may be bonded to the third lead frame 241 by an adhesive, and may be connected to the second frame part 234 of the second lead frame 231 and the third lead frame 241 by a wire 257. When the second light emitting chip 253 is a horizontal chip, the second light emitting chip 253 may be connected to different lead frames 231 and 241 by the wire 257 or may be disposed in a flip-chip manner. When the second light emitting chip 253 is a horizontal chip, the vertical chip may be bonded and electrically connected to the third lead frame 241 by a conductive adhesive, and may be connected to the second frame part 234 of the second lead frame 231 by the wire 257.

The first lead frame part 232 and the second frame part 234 of the second lead frame 231 may be frames that are connected to each other, or that are separately separated and become electrical. In addition, the first and second light emitting chips 251 and 253 may be connected in series or connected in parallel, but embodiments of the present invention are not limited thereto.

The molding members 261 and 263 include a first molding member 261 disposed in the first cavity 215, and a second molding member 263 disposed in the second cavity 217. The first molding member 261 may be disposed on the surface of the first light emitting chip 251 and protect the first light emitting chip 251. The second molding member 263 may be disposed on the surface of the second light emitting chip 253 and protect the second light emitting chip 253.

The molding members 261 and 263 may include a resin material such as silicon or epoxy. The molding members 261 and 263 may have a refractive index lower than that of a semiconductor material constituting the light emitting chips 251 and 253. The molding members 261 and 263 may be, for example, a resin layer not having a wavelength conversion member such as a phosphor therein. The molding members 261 and 263 may be spaced apart from each other by the barrier part 214. The molding member 261,263 may have a flat, convex, or concave top surface. An optical lens may be disposed on at least one or all of the molding members 261 and 263, and the optical lens may have a concave shape, a convex shape, or a shape having a total reflection surface with respect to the light emitting device.

The phosphor layer 280 may be disposed on the second cavity 215. As illustrated in FIG. 136, the length C3 and the width of the phosphor layer 280 may be greater than the upper length C4 and the width of the second cavity 217 and may cover the region of the second cavity 217.

The phosphor layer 280 may be disposed on a chip emitting a peak wavelength of a long wavelength among the first and second light emitting chips 251 and 253, for example, the second light emitting chip 253. The phosphor layer 280 may be disposed on a chip emitting a peak wavelength of a long wavelength among the first and second light emitting chips 251 and 253, for example, the second light emitting chip 253. The phosphor layer 280 may overlap the second molding member 263 in a vertical direction and may wavelength-convert the light incident through the second molding member 263. The phosphor layer 280 may be disposed in a region not overlapping the first molding member 261 in a vertical direction. The phosphor layer 280 may be disposed in a region different from the first light emitting chip 251. The phosphor layer 280 may be disposed on the top surface 219 of the body 210 and the top surface of the barrier part 214. The outer side of the bottom surface of the phosphor layer 280 may be bonded to the top surface 219 of the body 210 and the top surface of the barrier part 214. The phosphor layer 280 may be bonded to the second molding member 263. Since the second molding member 263 is disposed between the phosphor layer 280 and the second light emitting chip 253, the phosphor layer 280 is disposed at a position spaced apart from the second light emitting chip 253, thereby preventing a damage caused by heat generated from the second light emitting chip 253.

In the phosphor layer 280, a phosphor may be added to the resin material such as transparent silicon or epoxy. The phosphor layer 280 converts a wavelength of light emitted from the second light emitting chip 253. The phosphor layer 280 may include at least one or different color phosphors of a red phosphor, a green phosphor, a yellow phosphor, and a blue phosphor. The phosphor may excite part of emitted light and emit light of different wavelengths.

The phosphor layer 280 may include a phosphor such as a quantum dot. The quantum dot may include a group II-VI compound semiconductor or a group III-V compound semiconductor and may include at least one of blue, green, yellow, and red quantum dots. The quantum dot is a nanoscale particle which may have optical characteristics generated from quantum confinement. Specific composition (s), structure, and/or size of the quantum dot may be selected so that light having a desired wavelength is emitted from the quantum dot at the time of stimulation using a specific excitation source. By changing the size of the quantum dot, light may be emitted over an entire visible spectrum.

The quantum dot may include at least one semiconductor material. Examples of the semiconductor material may include a group IV element, a group II-VI compound, a group II-V compound, a group III-VI compound, a group III-V compound, a group IV-VI compound, a group I-III-VI compound, a group II-IV-VI compound, a group II-IV-V compound, an alloy thereof, and/or ternary and quaternary mixtures or alloys. Examples of the quantum dot may be ZnS, ZnSe, ZnTe, CdS, CdSe, CdTe, GaN, GaP, GaAs, GaSb, InP, InAs, InSb, AlS, AlP, AlAs, PbS, PbSe, Ge, Si, $CuInS_2$, $CuInSe_2$, MgS, MgSe, MgTe, and a combination thereof. In the case of the quantum dot, the light emission efficiency greatly changes according to the temperature. Thus, the change in the light emission efficiency may be reduced by spacing the quantum dot apart from the second light emitting chip 253.

The quantum dot according to the embodiment may adjust the wavelength range by changing the size of the quantum dot and/or the composition of the quantum dot. For example, a semiconductor nanocrystal including CdSe may be adjusted in a visible light region, and a semiconductor nanocrystal including InAs may be adjusted in an infrared light region. The optical plates according to the embodiments or the modification examples may be selectively applied to the phosphor layer.

The quantum dot according to the embodiment may emit red light, for example, a peak wavelength in the range of 615 nm to 630 nm. The quantum dot according to the embodiment may emit green light, for example, a peak wavelength in the range of 520 nm to 540 nm. According to the embodiment, color reproducibility may be improved by the blue light of the first and second light emitting chips 251 and 253 and the green light and the red light from the phosphor layer 280. The quantum dot according to the embodiment may emit yellow light, for example, in the range of 580 nm to 595 nm.

As another example, the phosphor layer 280 may selectively include YAG, TAG, silicate, nitride, or oxynitride-based material. The phosphor may include at least one of a red phosphor, a yellow phosphor, a blue phosphor, and a green phosphor.

In the light emitting device 200 according to the embodiment, first light L1 emitted from the first light emitting chip 251 may be shorter in wavelength than second light L2 emitted from the second light emitting chip 253. The first light L1 and the second light L2 may be light of a blue wavelength. A part of the second light L2 may be converted into third light L3 that is longer in wavelength than the second light L2 by the phosphor layer 280. The third light L3 may include red light and green light, or may include at least one of red light, green light, and yellow light. In the light emitting device 200 according to the embodiment, since the first light L1 emitted from the first light emitting chip 251 is emitted without wavelength conversion, color reproducibility may be improved by the blue light of a relatively short wavelength. In addition, the life of the second light emitting chip 253 may be improved by using the second light L2 of a long wavelength emitted from the second light emitting chip 253 as an excitation wavelength of the phosphor layer 280.

In addition, according to the embodiment, the first light emitting chip 251 directly emitting primary color (e.g., blue) light and the second light emitting chip 253 providing the excitation wavelength are separately disposed in one light emitting device 200, thereby obtain the light intensity improvement effect.

The life and color reproducibility of the light emitting chips 251 and 253 in the light emitting device 200 will be described.

FIG. 152 is a view illustrating a wavelength spectrum of a light emitting device according to an embodiment. Referring to FIGS. 152 and 137, the light emitting device 200 emits a peak wavelength λ1 of the first light L1 emitted from the first light emitting chip 251 without wavelength conversion, and a part of a peak wavelength λ2 of the second light L2 emitted from the second light emitting chip 253 is wavelength-converted into the third light L3, thereby emitting a mixed wavelength spectrum κ3 having the peak wavelength λ2 of the second light L2 and the peak wavelength of the third light L3 converted by the phosphor layer 280. In the region of the first cavity 215, the peak wavelength of the first light L1 may be emitted without wavelength conversion, and in the region of the second cavity 217, a spectrum in which the peak wavelengths of the second light L2 and the third light L3 are mixed may be emitted. Accordingly, the light emitting device 200 according to the embodiment may emit a spectrum in which a blue wavelength of the first light L1, a blue wavelength of the second light L2, and green and red wavelengths of the third light L3 are mixed.

According to the embodiment, since a separate phosphor is not disposed on the first light emitting chip 251, color reproducibility by the peak wavelength of the first light L1 of the first light emitting chip 251 may be improved. In addition, it is possible to prevent the reduction in optical speed for the first light L1 emitted from the first light emitting chip 251. Since the phosphor is not disposed on the first light emitting chip 251, it is possible to reduce the amount of the phosphor or the area of the phosphor layer 280. In addition, in the light emitting device 200, the phosphor layer 280 is disposed at a position spaced apart from the second light emitting chip 253, thereby reducing the degradation of the phosphor.

In addition, in the second light emitting chip 253, the peak wavelength λ2 of the second light L2 higher than the peak wavelength λ1 of the first light L1 of the first light emitting chip 251 can be provided as the excitation wavelength of the phosphor layer 280, thereby extending the life of the second light emitting chip 253. In addition, the first light emitting chip 251 that is not used as the excitation wavelength of the phosphor layer 280 need not more increase the optical power than the second light emitting chip 253 that is used as the excitation wavelength, thereby extending the life of the second light emitting chip 253.

The life dependence of the light emitting chips according to the excitation wavelength and the optical power of the light emitting chip is as follows.

Referring to FIG. 153, as the excitation wavelength incident on the phosphor layer increases, the life of the chip emitting the excitation wavelength may increase and the excitation efficiency may degrade. For example, it can be seen that the life of the light emitting chip in which the excitation wavelength emitted from the light emitting chip is a long wavelength (e.g., 470 nm) extends as compared with the light emitting chip in which the excitation wavelength is a short wavelength (e.g., 440 nm). In addition, it can be seen that, as the optical power of the light emitting chip is lower, the life extends as compared with the light emitting chip emitting the same excitation wavelength. Therefore, the life of the light emitting chip may extend when the excitation wavelength incident on the phosphor layer is high and the optical power is low. The life dependency of the light emitting chip is proportional to the excitation wavelength of the light emitting chip and is inversely proportional to the optical power.

As illustrated in FIG. 154, it can be seen that the excitation efficiency of the phosphor layer disposed on the light emitting chip is lower as the excitation wavelength is higher. That is, the excitation efficiency of the phosphor layer gradually decreases as the excitation wavelength increases from 450 nm to 550 nm. Therefore, it can be seen that the excitation efficiency is changed according to the excitation wavelength.

In FIG. 137, when the optical power when the peak wavelength of the long wavelength emitted from the second light emitting chip 253 is provided as the excitation wavelength of the phosphor layer 280 is equal to the optical power when the peak wavelength of the short wavelength emitted from the first light emitting chip 251 is provided as the excitation wavelength of the phosphor layer 280, the excitation efficiency of the phosphor layer 280 exciting the peak wavelength of the long wavelength emitted from the second light emitting chip 253 may be slightly degraded, but the life of the second light emitting chip 253 may be improved. That is, as compared with the comparative example having the light emitting chip providing the peak wavelength of the same short wavelength as the excitation wavelength, the life of the second light emitting chip 253 providing the peak wavelength of the long wavelength as the excitation wavelength may be improved. In addition, since the first light emitting chip 251 is not provided as the excitation wavelength, the life of the first light emitting chip 251 may be improved and the color reproducibility may be improved.

FIG. 155 is a graph showing a comparison of the life according to the optical power of the light emitting chip, and FIG. 156 is a view illustrating the life according to the peak wavelength and the optical power of the light emitting chip.

As illustrated in FIG. 155, it can be seen that, as the optical power of the light emitting chip increases, the life of the light emitting chip is inversely proportional to the optical power. As illustrated in FIGS. 156 and 157, when the phosphor layers are disposed on the first and second light emitting chips, the first peak wavelength λ1 of the first light emitting chip and the first light power V1 by the phosphor layer are higher than the second peak wavelength λ2 of the second light emitting chip and the second light power V2 by the phosphor layer. However, as illustrated in FIG. 157, it can be seen that the life of the second light emitting chip emitting the second light power V2 is longer than the life of the first light emitting chip emitting the first light power V1. It can be seen that when the second light power V2 of the second light emitting chip increases to the same as the first light power V1, the life of the light emitting chip emitting the third light power V3 is slightly reduced as illustrated in FIG. 157. Accordingly, it can be seen that, when the first peak wavelength λ1 is replaced with the second peak wavelength λ2, the life of the light emitting chip is improved, but when the second light power V2 by the second peak wavelength λ2 is increased to the same as the first light power V1 by the first peak wavelength, the life is slightly reduced. As a whole, the life of the light emitting chip providing the second peak wavelength of the long wavelength as the excitation wavelength is further improved than the light emitting chip emitting the first light power V1, regardless of the optical powers V2 and V3. Therefore, as illustrated in FIG. 137, the life of the second light emitting chip 253 providing the second peak wavelength λ2 of the long wavelength as the excitation wavelength may be increased. According to the embodiment, since the phosphor layer 280 is not disposed on the first light emitting chip 251, the color reproducibility may be improved in the light source requiring the short wavelength such as the display. According to the embodiment, the light emitting device 200 including the first light emitting chip 251 directly emitting the first light L1, the second light emitting chip 253 emitting the second light L2 and the third light L3, and the phosphor layer 280 is provided so that the life of the light emitting device 200 is improved and the reliability of the color reproducibility is improved.

FIG. 158 illustrates the relation of the life of the phosphor layer at the excitation wavelength of the light emitting chip and the optical power, FIG. 159 illustrates a comparison between the peak wavelength and the optical power, and FIG. 160 illustrates a comparison of the life of the light emitting chip according to the peak wavelength and the optical power of FIG. 159.

As illustrated in FIG. 158, when the phosphor layer is disposed on the light emitting chip in which the optical power is 70 mW and the peak wavelength is 445 nm, the fluorescent power P3 appears as the first optical power V1 illustrated in FIG. 159. In order to improve the life of the light emitting chip, the fluorescent power P4 when the wavelength is 465 nm and the optical power is 70 mW is reduced to the second light power V2 of FIG. 159. In order to compensate the second light power V2 with the first light power V1, the third light power v3 may be generated by multiplying the second light power V2 by 1.2 times. In this case, it can be seen from FIG. 160 that the life of the light emitting chip having the first light power V1 is about 1,100 hours, but the life of the light emitting chip having the second light power V2 increases to about 4,000 hours, and the life of the light emitting chip having the third light power V3 is about 2,500 hours. That is, it can be seen from FIG. 158 that when the peak wavelength in the same color is high, the life of the light emitting chip is improved even when the light power is increased.

According to the embodiment, the peak wavelength emitted from the light emitting chip of the relatively long wavelength in the same color is set as the excitation wavelength, so that the life of the light emitting chip of the long wavelength is improved as compared with the case where the light emitting chip of the short wavelength is set to as the excitation wavelength.

FIGS. 138 to 141 illustrate a modification example of the seventh embodiment and illustrate an example of the phosphor layer of the light emitting device or the lighting device.

Referring to FIG. 138, the phosphor layer 280 according to the embodiment includes a resin layer 282 having a phosphor in a transparent tube 281. The transparent tube 281 may be implemented with a capillary having a plastic material or a glass material, but embodiments of the present invention are not limited thereto. The resin layer 282 may be sealed in the transparent tube 281 and may include transparent silicon or epoxy. The phosphor may be the phosphor disclosed in the embodiment, for example, a quantum dot, but embodiments of the present invention are not limited thereto. The shape of the transparent tube 281 may have a circular cross-section or a polygonal cross-section, but embodiments of the present invention are not limited thereto. The thickness of the phosphor layer 280 according to the embodiment may be 2 nm or less, for example, 1.5 nm or less. When the thickness exceeds the above range, the thickness of the light emitting device may increase. The optical plates according to the embodiments or the modification examples may be selectively applied to the tube.

Referring to FIG. 139, the optical plate 139 according to the embodiment includes a sidewall 286 having an open region 284, a resin layer 285 having a phosphor in the sidewall 286, and transparent films 287 and 288 disposed on at least one of the top surface and the bottom surface of the sidewall 286 and the resin layer 285. The optical plates according to the embodiments or the modification examples may be selectively applied to the phosphor layer.

The thickness of the phosphor layer 280 may be in the range of 0.7 mm or more, for example, in the range of 0.75 mm to 1.5 mm. When the thickness of the phosphor layer 280 is less than 0.7 mm, it is difficult to secure the thickness of the resin layer 285, and the wavelength conversion efficiency is degraded. When exceeding 1.5 mm, the thickness of the device increases. When the thickness of the transparent films 287 and 288 increases, optical loss may occur. The thickness of the resin layer 285 may be less than the thickness of the sidewall 286, and may be in the range of less than 1 mm, for example, in the range of 0.4 mm to 0.7 mm. When the thickness of the resin layer 285 is less than the above range, wavelength conversion efficiency is reduced, and when the thickness of the resin layer 285 is greater than the above range, the thickness of the light emitting device increases.

The sidewall 286 may include the open region 284 therein, and the outer shape thereof may include a circular or polygonal frame shape. The sidewall 286 may include a frame shape in the outer periphery of the open region 284. The open region 284 may include a circular shape or a polygonal shape. As illustrated in FIG. 137, the open region 284 may have a shape corresponding to the top surface shape of the first cavity 215, for example, the same shape, but embodiments of the present invention are not limited thereto. The sidewall 286 may be formed to surround the side surface of the resin layer 285. The sidewall 286 may be formed to surround the outer periphery of the resin layer 285.

The length C5 of the open region 284 of the sidewall 286 may be equal to or greater than the upper length C3 of the second cavity 217 of FIG. 136. The area of the bottom surface of the open region 284 may be equal to or larger than the area of the top surface of the first molding member 261 of FIG. 137 or the light exit surface. The area of the bottom surface of the open region 284 may be equal to or smaller than the area of the top surface thereof, but embodiments of the present invention are not limited thereto.

The sidewall 286 may be a reflective material. The sidewall 286 may include a glass material, for example, a white glass or a glass material having high reflectivity. The white glass or the glass material having high reflectivity may be formed by adding white particles and/or bubbles to a transparent glass. The reflectivity of the sidewall 286 may be higher than the reflectivity of the transparent films 287 and 288.

As another example, the sidewall 286 may include a resin material, and the resin material may include a resin material such as PPA, epoxy, or a silicon material. A filler, which is a metal oxide such as $TiO_2$ or $SiO_2$ or white particles, may be added to the resin material. The sidewall 286 may include a white resin. The sidewall 286 may include a ceramic material. The sidewall 286 may be formed with a dark color or a black color so as to improve contrast, but embodiments of the present invention are not limited thereto. When the sidewall 286 is a reflective material, the sidewall 286 may reflect incident light. A fine uneven pattern may be formed on the inner surface of the sidewall 286, but embodiments of the present invention are not limited thereto.

As another example, the sidewall 286 may be a transmissive material, for example, a transparent glass material or a transparent resin material. The sidewall 286 may be a resin material such as silicon or epoxy.

When the sidewall 286 is a transmissive material, the sidewall 286 may emit incident light through the side surface. As another example, a reflective layer made of a metal material may be further disposed on the inner surface of the sidewall 286 or the inner surface and the bottom surface of the sidewall 286, and the reflective layer may effectively reflect incident light. At this time, the sidewall 286 may include a transmissive material or a reflective material.

At least one of the inner surface and the outer surface of the sidewall 286 may be a vertical or inclined surface, but embodiments of the present invention are not limited thereto. The inner surface of the sidewall 286, for example, the surface contacting the resin layer 285, may be disposed to be vertical or inclined with respect to the bottom surface of the first transparent film 287. When the inner surface of the sidewall 286 is inclined, the width or the area of the top surface of the resin layer 285 may be greater than the width or the area of the bottom surface of the resin layer 285.

In the resin layer 285, a phosphor may be added to the resin material such as transparent silicon or epoxy. The resin layer 285 excites the excitation wavelength and converts the wavelength. The resin layer 285 may include at least one type or different types of a red phosphor, a green phosphor, a yellow phosphor, and a blue phosphor. The phosphor may excite part of emitted light and emit light of different wavelengths. The phosphor may be the phosphor disclosed in the embodiments.

The transparent films 287 and 288 may be disposed below and/or above the resin layer 285. The transparent films 287 and 288 may include, for example, a first transparent film 287 disposed below the resin layer 285, and a second transparent film 288 disposed above the resin layer 285. The transparent films 287 and 288 may be disposed on the incidence surface and/or the exit surface of the resin layer 285.

As illustrated in FIG. 140 or 141, one of the first and second transparent films 287 and 288 may be removed in the top surface or the bottom surface of the phosphor layer 280. For example, the first transparent film 287 may be removed as illustrated in FIG. 140, and the second transparent film 288 may be removed as illustrated in FIG. 141, but embodiments of the present invention are not limited thereto. In manufacturing the phosphor layer 280, one of the transparent films 287 and 288 may be a base film supporting the phosphor layer 280 in a dispensing process of the resin layer 285.

The first and second transparent films 287 and 288 may include glass or a transparent resin film. The first and second transparent films 287 and 288 are bonded to the sidewall 286 to protect the resin layer 285. The first and second transparent films 287 and 288 may be made of a material having a refractive index equal to or lower than a refractive index of the molding member 281. The first and second transparent films 287 and 288 may be made of a material having a difference of 0.2 or less from a refractive index of the first molding member 261. The first and second transparent films 287 and 288 may have a refractive index lower than a refractive index of the second molding member 263 and the resin layer 285. As another example, when the second molding member 263 is removed in FIG. 2, air gap may exist in the second cavity 217, and the first transparent film 287 may be disposed on the air gap.

The first transparent film 287 may be bonded to the bottom surface of the sidewall 286 and the bottom surface of the resin layer 285. The second transparent film 288 may be bonded to the top surface of the sidewall 286 and the top surface of the resin layer 285. The bottom surface of the phosphor layer 280 may be bonded to the second molding member 263. The bottom surface of the first transparent film 287 may be bonded to the surface of the second molding member 263. The first transparent film 287 is bonded before the curing of the second molding member 263, thereby reducing optical loss at the interface between the first transparent film 287 and the second molding member 263.

The thickness of the first and second transparent films 287 and 288 may be in the range of 0.05 mm to 0.3 mm, for example, in the range of 0.08 mm to 0.2 mm. When the thickness of the first and second transparent films 287 and 288 is less than 0.05 mm, handling may be difficult and a problem may occur in rigidity. When exceeding 0.2 mm, the thickness of the phosphor layer 280 may increase and the light transmittance may be degraded.

The thickness of the resin layer 285 may be thicker than the thickness of the first transparent film 287 or the second transparent film 288 and may be thicker than the sum of the thicknesses of the first and second transparent films 287 and 288. The resin layer 285 may have the same thickness as the sidewall 286. In this case, a partial or entire region of the top surface and the bottom surface of the sidewall 286 may contact the first and second transparent films 287 and 288.

As another example, the resin layer 285 may be thinner than the sidewall 286. The resin layer 285 may have a flat, convex, or concave top surface. The sidewall 286 may protrude around the outer periphery of the first and second transparent films 287 and 288, but embodiments of the present invention are not limited thereto.

In the process of manufacturing the phosphor layer 280, as illustrated in FIG. 139, the sidewall 286 is formed on the first transparent film 287, and then the resin layer 285 is dispensed in the open region 284 of the sidewall 286. The second transparent film 288 may be stacked on the resin layer 285 and the sidewall 287 before the resin layer 285 is cured, and may be cut to a predetermined size to provide the phosphor layer 280 having a desired size.

In the process of bonding the phosphor layer 280 on the light emitting device, the second molding member 263 may be molded in the light emitting device 200, and the first transparent film 287 may be bonded on the second molding member 263 before the second molding member 263 is cured.

FIG. 142 illustrates another example of the light emitting device of FIG. 137. In describing FIG. 142, the same configuration as that disclosed above will be understood by referring to the descriptions of the above embodiments.

Referring to FIG. 142, the light emitting device includes a plurality of cavities 215 and 217 in a body 210, light emitting chips 251 and 253 disposed in the plurality of cavities 215 and 217, and molding members 261 and 263 in the cavities 215 and 217. A phosphor layer 280 may be disposed on the second light emitting chip 253 emitting a relatively long wavelength among the plurality of light emitting chips 251 and 253, and a transmissive layer 270 may be disposed on the first light emitting chip 251 emitting a relatively short wavelength.

The phosphor layer 280 and the first and second light emitting chips 251 and 253 can be understood by referring to the description of the embodiments. The transmissive layer 270 may be disposed on the first cavity 215 and may overlap the first light emitting chip 251 in a vertical direction. The transmissive layer 270 may be formed by filling a transparent capillary tube with a transparent resin material, or may be a transparent glass material, but embodiments of the present invention are not limited thereto.

The thickness of the transmissive layer 270 may be equal to or less than the thickness of the phosphor layer 280. The transmissive layer 270 and the phosphor layer 280 are horizontally disposed on the light emitting device, thereby providing the surface of the light emitting device as a horizontal surface. The optical plates according to the embodiments or the modification examples may be selectively applied to the phosphor layer.

FIG. 143 illustrates another example of a light emitting device according to an embodiment. In describing FIG. 143, the same configuration as that disclosed above will be understood by referring to the descriptions of the above embodiments.

Referring to FIG. 143, the light emitting device 200 includes a body 210, a plurality of lead frames 221, 231, and 241 disposed in the body 210, light emitting chips 251 and 253 electrically connected to the plurality of lead frames 221, 231, and 241 and emitting light L1 and L2 having different peak wavelengths, molding members 261 and 263 covering the light emitting chips 251 and 253, and a phosphor layer 280 disposed on the light emitting chip 253 emitting the light L2 having a relatively long wavelength among the light emitting chips 251 and 253.

The phosphor layer 280 may be disposed in the second cavity 217 of the body 210, and the second molding member 263 may be disposed between the phosphor layer 280 and the second light emitting chip 253. The optical plates according to the embodiments or the modification examples may be selectively applied to the phosphor layer.

A stepped structure 214A may be disposed in the second cavity 217 of the body 210, and the stepped structure 214A may have a depth lower than the top surface of the body 210 and may be disposed in a stepped shape. The stepped structure 214A may be disposed closer to the top surface 219 of the body 210 than the bottom of the second cavity 217. The phosphor layer 280 may be bonded to the surface of the stepped structure 214A by an adhesive, but embodiments of the present invention are not limited thereto. The adhesive may be silicon or epoxy material, or may be the same as the material of the second molding member 263.

The outer periphery of the phosphor layer 280 may be disposed in the stepped structure 214A. The top surface of the phosphor layer 280 may be disposed to be equal to or lower than the top surface 219 of the body 210. In this case, since the top surface of the phosphor layer 280 does not protrude more than the top surface 219 of the body 210, the light leakage caused by the side of the phosphor layer 280 may be prevented.

As another example, the top surface of the phosphor layer 280 may protrude more than the top surface 219 of the body 210. In this case, it is possible to secure the height of the second molding member 263, and the degree of freedom of bonding of the wire 257 may be improved. The orientation angle distribution of the light may be improved through the phosphor layer 280.

Since the phosphor layer 280 is disposed in the stepped structure 214A of the second cavity 217, the width of the top surface of the barrier part 214 between the first cavity 215 and the second cavity 217 may be more reduced than the structure of FIG. 137. Therefore, the length of the light emitting device may also be reduced.

FIG. 144 is a side cross-sectional view illustrating a light emitting device according to an embodiment. In describing FIG. 144, the same configuration as that disclosed above will be understood by referring to the descriptions of the above embodiments.

Referring to FIG. 144, the light emitting device 200 may include a body 210, a plurality of lead frames 221, 231, and 241 disposed in the body 210, light emitting chips 251 and 253 electrically connected to the plurality of lead frames 221, 231, and 241 and emitting light L1 and L2 having different peak wavelengths, a first molding member 261 covering the first light emitting chip 251 among the light emitting chips 251 and 253, and a second molding member 263A having a phosphor covering the second light emitting chip 253.

The first molding member 261 may be disposed in the first cavity 215, and the second molding member 263A may be disposed in the second cavity 217. The second molding member 263A may include the phosphor according to the embodiment. Since the second molding member 263A having the phosphor is disposed on the second light emitting chip 253, a separate phosphor layer may not be disposed on the body 210.

The second molding member 263A may be a single layer or a multi-layer.

When the second molding member 263A is a single layer, the second molding member 263A may be a layer having a phosphor. When the second molding member 263A is a multi-layer, the second molding member 263A may have a stack structure including at least one first resin layer and a second resin layer having a phosphor on the first resin layer. The at least one first resin layer may be a layer not including a phosphor.

The second molding member 263A having the phosphor may be disposed on the second light emitting chip 253 emitting a relatively long wavelength among the plurality of light emitting chips 251 and 253. In the light emitting device according to the embodiment, since the first light L1 emitted from the first light emitting chip 251 is emitted without wavelength conversion, color reproducibility may be improved by the blue light of a relatively short wavelength. In addition, the life of the second light emitting chip 253 may be improved by using the second light L2 of a long wavelength emitted from the second light emitting chip 253 as an excitation wavelength of the second molding member 263A having the phosphor.

FIG. 145 is a side cross-sectional view illustrating a light emitting device according to an embodiment. In describing FIG. 145, the same configuration as that disclosed above will be understood by referring to the descriptions of the above embodiments.

Referring to FIG. 145, the light emitting device may include a body 210, a plurality of lead frames 221, 231, and 241 disposed in the body 210, light emitting chips 251A and 253A electrically connected to at least two of the plurality of lead frames 221, 231, and 241 and emitting light L1 and L2 having different peak wavelengths, molding members 261 and 263 covering the light emitting chips 251A and 253A, and a phosphor layer 280A disposed on the second light emitting chip 253 emitting the light having a relatively long wavelength among the plurality of light emitting chips 251A and 253A. Light L1 and L2 emitted from the first and second light emitting chips 251A and 253A and the configuration of the phosphor layer 280A can be understood by referring to the description of the light emitting chips 251 and 253 and the phosphor layer 280 of FIG. 2. The optical plates according to the embodiments or the modification examples may be selectively applied to the phosphor layer.

At least one or both of the first and second light emitting chips 251A and 253A may be disposed in a flip-chip manner. The first light emitting chip 251A may be disposed on the first frame parts 232 of the first lead frame 221 and the second lead frame 231 in a flip-chip manner and may be electrically connected thereto. The second light emitting chip 253A may be disposed on the second frame part 234 of the second lead frame 231 and the third lead frame 241 in a flip-chip manner and may be electrically connected thereto. The first and second light emitting chips 251A and 253A may be a transmissive substrate or a semiconductor layer, but embodiments of the present invention are not limited thereto.

The phosphor layer 280A may be disposed in the second cavity 217. The phosphor layer 280A may be disposed in the second molding member 263. The phosphor layer 280A may be contacted on the second light emitting chip 253A. The phosphor layer 280A may contact the top surface of the second light emitting chip 253A, and the inner phosphor may be the disclosed phosphor, but embodiments of the present invention are not limited thereto. The area of the phosphor layer 280A may be wider than the area of the top surface of the second light emitting chip 253, but embodiments of the present invention are not limited thereto.

The phosphor layer 280A may be disposed on the second light emitting chip 253A emitting a relatively long wavelength among the plurality of light emitting chips 251A and 253A. In the light emitting device according to the embodiment, since the first light L1 emitted from the first light emitting chip 251A is emitted without wavelength conversion, color reproducibility may be improved by the blue light of a relatively short wavelength. In addition, the life of the second light emitting chip 253A may be improved by using the second light L2 of a long wavelength emitted from the second light emitting chip 253A as an excitation wavelength of the phosphor layer 280A.

FIG. 146 is a side cross-sectional view illustrating a light emitting device according to an embodiment. In describing FIG. 146, the same configuration as that disclosed above will be understood by referring to the descriptions of the above embodiments.

Referring to FIG. 146, the light emitting device may include a body 210, a plurality of lead frames 221, 231, and 241 disposed in the body 210, light emitting chips 251 and 253 electrically connected to the plurality of lead frames 221, 231, and 241 and emitting light L1 and L2 having different peak wavelengths, molding members 261 and 263 covering the light emitting chips 251 and 253, and a phosphor layer 280B disposed around the second light emitting chip 253 emitting the light having a relatively long wavelength among the plurality of light emitting chips 251 and 253. Light L1 and L2 emitted from the first and second light emitting chips 251 and 253 and the configuration of the phosphor layer 280B can be understood by referring to the description of the light emitting chips 251 and 253 and the phosphor layer 280 of FIG. 2.

The phosphor layer 280B may be disposed in the second cavity 217. The phosphor layer 280B may be disposed in the second molding member 263. The phosphor layer 280B may be disposed around the second light emitting chip 253 emitting a relatively long wavelength among the plurality of light emitting chips 251 and 253. The phosphor layer 280B is disposed around the peripheral surface 217A of the second cavity 217, and wavelength-converts a part of the second light L2 emitted from the second light emitting chip 253. The phosphor layer 280B may be disposed in a partial or entire region of the peripheral surface 217A of the second cavity 217. The lower portion of the phosphor layer 280B may contact or be spaced apart from the second frame part 234 of the second lead frame 231 and the third lead frame 241.

In the light emitting device according to the embodiment, since the first light L1 emitted from the first light emitting chip 251 is emitted without wavelength conversion, color reproducibility may be improved by the blue light of a relatively short wavelength. In addition, the life of the second light emitting chip 253 may be improved by using the second light L2 of a long wavelength emitted from the second light emitting chip 253 as an excitation wavelength of the phosphor layer 280B. The optical plates according to the embodiments or the modification examples may be selectively applied to the phosphor layer.

FIG. 147 is a side cross-sectional view illustrating a light emitting device according to a modification example of FIG. 137. In describing FIG. 147, the same configuration as that disclosed above will be understood by referring to the descriptions of the above embodiments.

Referring to FIG. 147, the light emitting device may include a body 210, a plurality of lead frames 221, 231, and 241 disposed in the body 210, light emitting chips 251 and 253 electrically connected to the plurality of lead frames 221, 231, and 241 and emitting light L1 and L2 having different peak wavelengths, molding members 261 and 263 covering the light emitting chips 251 and 253, and a phosphor layer 280 disposed on the light emitting chip 253 emitting the light having a relatively long wavelength among the plurality of light emitting chips 251 and 253. The optical plates according to the embodiments or the modification examples may be selectively applied to the phosphor layer.

The light emitting device according to an embodiment may include an optical filter 290 on the phosphor layer 280. The optical filter 290 reflects the peak wavelength of the second light L2 emitted from the second light-emitted chip 253 and transmits only the wavelength-converted light. Accordingly, the light emitted to the optical filter 290 may be third light L3 that is wavelength-converted by the phosphor layer 280. The light emitting device may provide a spectrum in which the first light L1 emitted from the first light emitting chip 251 and the third light L3 emitted by the phosphor layer 280 are mixed. Accordingly, the peak wavelength of the second light is removed, and the blue wavelength can be implemented by only the peak wavelength (21 of FIG. 152) of the short wavelength emitted from the first light emitting chip 251, thereby further improving the color purity and the color reproducibility.

FIG. 148 is a side cross-sectional view illustrating a light emitting device according to an embodiment. In describing FIG. 148, the same configuration as that disclosed above will be understood by referring to the descriptions of the above embodiments.

Referring to FIG. 148, the light emitting device may include a body 210A, a plurality of lead frames 221, 225, 231, and 235 disposed in the body 210A, light emitting chips 251 and 253 electrically connected to the plurality of lead frames 221, 225, 231, and 235 and emitting light L1 and L2 having different peak wavelengths, molding members 261 and 263 covering the light emitting chips 251 and 253, and a phosphor layer 280 disposed on the second light emitting chip 253 emitting the light L2 having a relatively long wavelength among the plurality of light emitting chips 251 and 253. Light L1 and L2 emitted from the first and second light emitting chips 251 and 253 and the configuration of the phosphor layer 280 can be understood by referring to the description of FIG. 2. The optical plates according to the embodiments or the modification examples may be selectively applied to the phosphor layer.

The body 210 may include a ceramic material, thereby improving the heat dissipation efficiency of the light emitting device. The ceramic material includes a low temperature co-fired ceramic (LTCC) or a high temperature co-fired ceramic (HTCC). The body 210A may be made of, for example, $SiO_2$, $Si_xN_y$, $Si_xN_y$, $SiO_xN_y$, $Al_2O_3$, or AlN, and may be made of a metal nitride having a thermal conductivity of 140 W/mK or more.

The body 210A may include the first and second cavities 215 and 217, and the sides of the first and second cavities 215 and 217 may be a vertical surface, an inclined surface, or a stepped surface. At least two lead frames may be disposed in the first and second cavities 215 and 217. The first light emitting chip 251 and the first molding member 261 according to the embodiment may be disposed in the first cavity 215, and the second light emitting chip 253 and the second molding member 263 according to the embodiment may be disposed in the second cavity 217.

The body 210A may include a reflective part 213A having the first and second cavities 215 and 217, and a support 211A supporting the reflective part 213A. A region between the first and second cavities 215 and 217 may include a barrier part 214.

The first light emitting chip 251 may be disposed on at least one of the first and second lead frames 221 and 225 and may be connected to the first and second lead frames 221 and 225 by a wire 255. The second light emitting chip 253 may be disposed on at least one of the third and fourth lead frames 231 and 235 and may be connected to the third and fourth lead frames 231 and 235 by a wire 257. As another example, the first and second light emitting chips 251 and 253 may be disposed in a flip-chip manner, but embodiments of the present invention are not limited thereto.

A plurality of connection electrodes 222, 227, 232, and 237 may be disposed in the body 210A, and a plurality of lead electrodes 223, 226, 233, and 236 may be disposed on the bottom surface of the body 210A. The connection electrodes 222, 227, 232, and 237 may include first to fourth connection electrodes 222, 227, 232, and 237 disposed at different positions, and the lead electrodes 223, 226, 233, and 236 may include first to fourth lead electrodes 223, 226, 233, and 236 disposed at different positions.

The first lead frame 221 disposed in the first cavity 215 may be connected to the first lead electrode 223 through the first connection electrode 222, and the second lead frame 225 may be connected to the second lead electrode 226 through the second connection electrode 227. The third lead frame 231 disposed in the second cavity 217 may be connected to the third lead electrode 233 through the third connection electrode 232, and the fourth lead frame 235 may be connected to the fourth lead electrode 236 through the fourth connection electrode 237. The first and second light emitting chips 251 and 253 may be connected in parallel or in series, but embodiments of the present invention are not limited thereto.

The second and third lead frames 225 and 231 may be one lead frame, or may be connected together. Alternatively, the second and third lead electrodes 226 and 233 may be one lead electrode, or may be connected together, but embodiments of the present invention are not limited thereto. The first and second light emitting chips 251 and 253 may be connected in series.

The phosphor layer 280 may be disposed on the second light emitting chip 253 emitting light L2 of a relatively long wavelength in a blue wavelength range. The phosphor layer 280 may be disposed on the second cavity 217 and the second molding member 263. In the light emitting device according to the embodiment, since the first light L1 emitted from the first light emitting chip 251 is emitted without wavelength conversion, color reproducibility may be improved by the blue light of a relatively short wavelength. In addition, the life of the second light emitting chip 253 may be improved by using the second light L2 of a long wavelength emitted from the second light emitting chip 253 as an excitation wavelength of the phosphor layer 280.

FIG. 149 is a view of a light unit including a light emitting device according to an embodiment. The light unit according to the embodiment may be a light-emitting module, but embodiments of the present invention are not limited thereto.

Referring to FIG. 149, in the light unit, one or more light emitting devices 200 may be disposed on a circuit board 200A. The light emitting device 200 may include the light emitting device according to the embodiment. The light emitting device 200 may be disposed on the circuit board 200A and may be electrically connected to a circuit pattern of the circuit board 200A.

The circuit board 200A may be a printed circuit board (PCB) including the circuit pattern. The circuit board may include a PCB made of a resin material, a metal core PCB (MCPCB), and a flexible PCB (FPCB), but embodiments of the present invention are not limited thereto.

The light emitting devices 200 may be disposed on the circuit board 200A in rows and/or columns, but embodiments of the present invention are not limited thereto. In the light unit according to the embodiment, since the first light L1 emitted from the first light emitting chip 251 is emitted on the circuit board 200A without wavelength conversion, color reproducibility may be improved by the blue light of a relatively short wavelength. In addition, the life of the second light emitting chip 253 may be improved by using the second light L2 of a long wavelength emitted from the second light emitting chip 253 as an excitation wavelength of the phosphor layer 280.

FIG. 150 is a view illustrating another example of a light unit including a light emitting device according to an embodiment. The light unit according to the embodiment may be a light-emitting module, but embodiments of the present invention are not limited thereto.

Referring to FIG. 150, in the light unit, a plurality of light emitting devices 201 and 203 may be disposed on a circuit board 200A, and the plurality of light emitting devices 201 may be disposed adjacent to each other with a predetermined interval G4. The interval G4 between the plurality of light emitting devices 201 and 203 may be spaced apart within a distance at which light L1, L2, and L3 emitted from the light emitting devices 201 and 203 can be mixed.

The light unit may be disposed such that the first light emitting device 201 having the first light emitting chip 251 emitting the peak wavelength of the first light L1 according to the embodiment and the second light emitting chip 253 emitting the peak wavelength of the second light L2 according to the embodiment are separated from each other. The light exit region of the first and second light emitting devices 201 and 203 may be defined as one lighting region.

The first light emitting device 201 may emit the first light L1 of a short wavelength from the first light emitting chip 251 disposed in the first cavity 215 of the body 210, and the plurality of lead frames 221 and 241 may be connected to the first light emitting chip 251 in the first cavity 215. The second light emitting device 203 may emit the second light L2 of a long wavelength from the second light emitting chip 253 disposed in the second cavity 217 of the body 210, and the plurality of lead frames 221 and 243 may be connected to the second light emitting chip 253 in the second cavity 217.

The phosphor layer 280 may be disposed on the second light emitting chip 253. The phosphor layer 280 may include the phosphor according to the embodiment. The first and second light emitting chips 251 and 253 may emit blue light, and the second light emitting chip 253 may emit the second light L2 of a longer wavelength than the peak wavelength of the first light L1 emitted from the first light emitting chip 251. The first and second light emitting chips 251 and 253 and the phosphor layer 280 can be understood by referring to the description of the embodiments. The optical plates according to the embodiments or the modification examples may be selectively applied to the phosphor layer.

In the light unit according to the embodiment, since the first light L1 emitted from the first light emitting chip 251 of the light emitting device 201 is emitted on the circuit board 200A without wavelength conversion, color reproducibility may be improved by the blue light of a relatively short wavelength. In addition, since the second light emitting device 203 uses the second light L2 of a long wavelength emitted from the second light emitting chip 253 as the excitation wavelength of the phosphor layer 280, thereby improving the life of the second light emitting chip 253.

FIG. 151 is a view illustrating another example of a light unit including light emitting chips according to an embodiment. The light unit according to the embodiment may be a light-emitting module, but embodiments of the present invention are not limited thereto.

Referring to FIG. 151, in the light unit, a plurality of light emitting chips 251 and 253 may be disposed on a circuit board 200A, and a phosphor layer 280 may be disposed on the light emitting chip 253 emitting light of a relatively long wavelength among the plurality of light emitting chips 251 and 253. The first light emitting chip 251, the second light emitting chip 253, and the phosphor layer 280 can be understood by referring to the description of the embodiments. The optical plates according to the embodiments or the modification examples may be selectively applied to the phosphor layer.

A support 295 may be disposed in the circuit board 200A, and the support 295 may be disposed at the outer side of the first light emitting chip 251 and the second light emitting chip 253. A sidewall part 294 may be disposed between the first and second light emitting chips 251 and 253, and the sidewall part 294 may be made of the same material as that of the support 295. The support 295 may be a white resin material or a solder resistor material, but embodiments of the present invention are not limited thereto.

The first light emitting chip 251 may be molded in the first molding member 291 disposed in the first cavity 292, and the second light emitting chip 253 may be molded in the second molding member 293 in the second cavity 297. The first and second molding members 291 and 293 may include a resin material such as silicon or epoxy. The phosphor layer 280 is disposed on the second molding member 293 and converts light emitted from the second light emitting chip 253. In the light unit according to the embodiment, since the first light L1 emitted from the first light emitting chip 251 is emitted without wavelength conversion, color reproducibility may be improved by the blue light of a relatively short wavelength. In addition, the life of the second light emitting chip 253 may be improved by using the second light L2 of a long wavelength emitted from the second light emitting chip 253 as an excitation wavelength of the phosphor layer 280.

Figure 161:
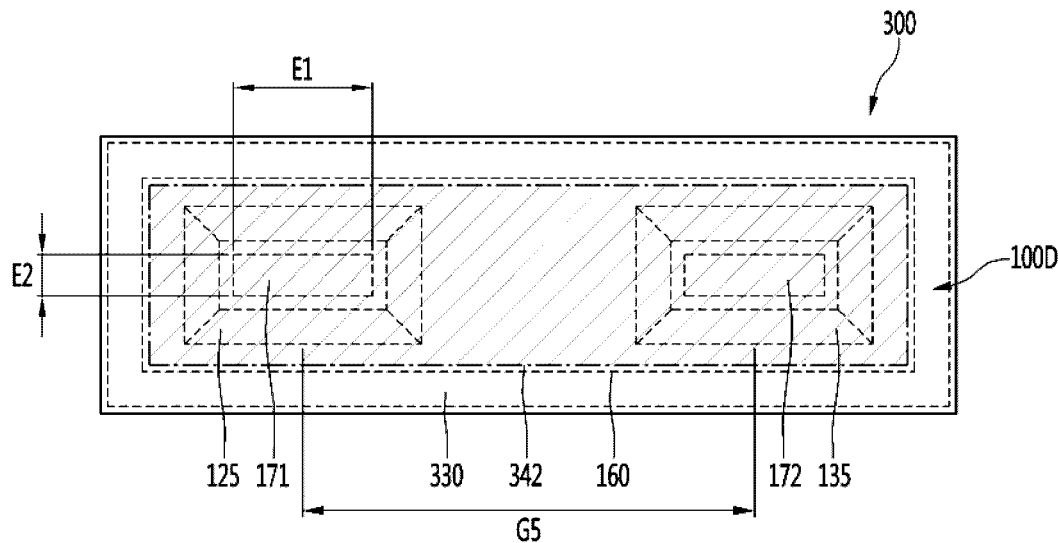
Figure 162:
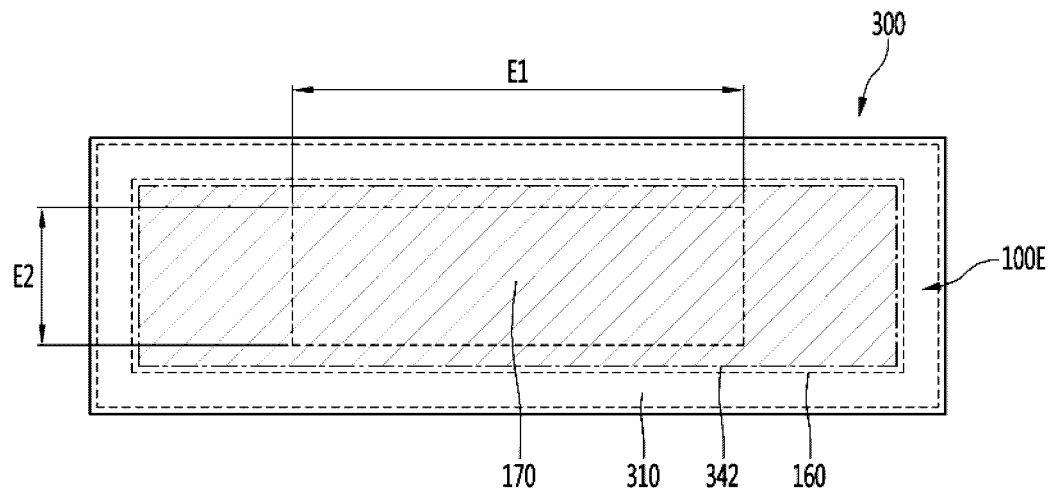
Figure 163:
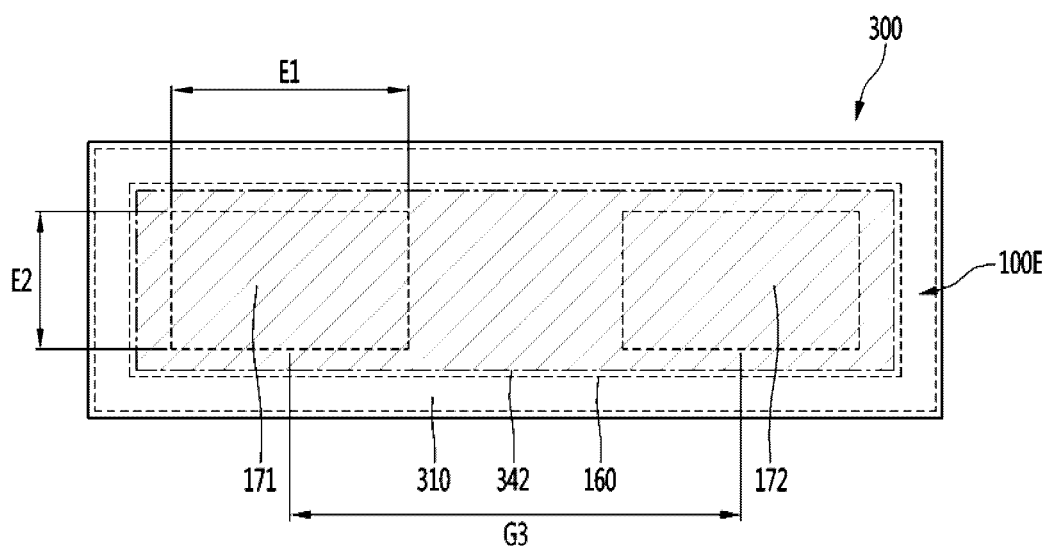
Figure 164:
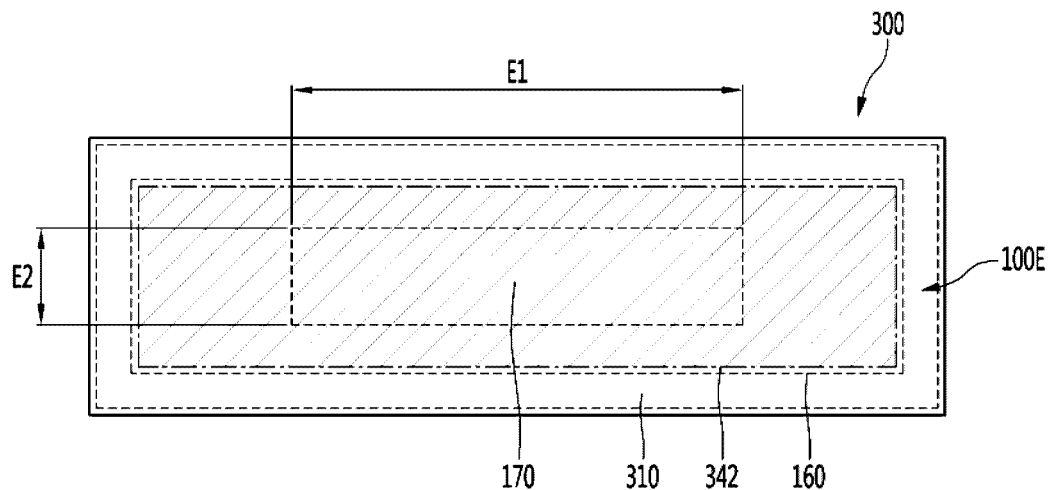

Referring to FIGS. 161 to 164, the light emitting device has a structure having cavities 125 and 135 below the recess 160 of the body of FIG. 2, and has a structure in which light emitting chips 171 and 172 are disposed in the cavities 125 and 135 at a predetermined interval G5 and the optical plate 300 is disposed on the light emitting device. FIG. 162 illustrates a structure in which one light emitting chip 170 is disposed on the lead frame in the recess 160 of the light emitting device 100E as illustrated in FIG. 12. FIG. 163 illustrates a case where a large-area light emitting chip is disposed in the recess 160 of the light emitting device 100E as illustrated in FIG. 12. The size (E1×E2) of the light emitting chips 171 and 172 of the light emitting device 100D of FIG. 161 is, for example, 700 µm-1200 µm×300 µm-600 µm, and may be smaller than the size (E1×E2) of the light emitting chip 170 of FIG. 163. The size (E1×E2) of the light emitting chip 170 of FIG. 162 is, for example, 3500 µm-5000 µm×5000 µm-800 µm, and the size (E1×E2) of the light emitting chip 170 of FIG. 164 is a large area and is, for example, 3500 µm-5000 µm×700 µm-1000 µm. The light intensity and efficiency according to the shape of the light emitting device and the change in the size of the light emitting chip are shown in text examples of Table 3 and Table 4.

Table 3 shows the light intensity and efficiency according to the shape of the light emitting device and the size of the light emitting chip according to Examples and Comparative Examples.

TABLE 3

| Type | Comparative example | Example 1 | Example 2 | Example 3 | Example 4 | Example 5 |
|---|---|---|---|---|---|---|
| Chip size (E1 × E2)(µm) | 1000 × 550 | 1700 × 600 | 1500 × 600 | 1700 × 800 | 4300 × 600 | 4300 × 800 |
| Chip thickness (µm) | 100 | 100 | 100 | 100 | 100 | 100 |
| Maximum value of light intensity (mW/mm²) | 206.4 | 59.5 | 63.8 | 58.9 | 54.6 | 54.1 |
| Relative value for maximum value of light intensity (%) | 100.0 | 28.8 | 30.9 | 28.5 | 26.5 | 26.2 |
| Efficiency (%) | 93.7 | 92.1 | 92.1 | 92.1 | 92.2 | 92.3 |

FIGS. 161 to 164 are top views for describing the arrangement type and size of the light emitting chip of the light emitting device disposed below the optical plate according to another example of the seventh embodiment. The plate cover may be applied to the optical plate of FIGS. 161 to 164, but embodiments of the present invention are not limited thereto.

Table 4 shows the light intensity and efficiency of types 1 to 5 when the thickness of the light emitting chip is changed in Table 3.

TABLE 4

| Type | Comparative Example | Example 1 | Example 2 | Example 3 | Example 4 | Example 5 |
|---|---|---|---|---|---|---|
| Chip size (E1 × E2)(µm) | 1000 × 550 | 1700 × 600 | 1500 × 600 | 1700 × 800 | 4300 × 600 | 4300 × 800 |
| Chip thickness (µm) | 100 | 150 | 150 | 150 | 250 | 250 |
| Maximum value of light intensity (mW/mm²) | 206.4 | 58.3 | 62.5 | 57.6 | 52.7 | 49.8 |
| Relative value for maximum value of light intensity (%) | 100.0 | 28.2 | 30.3 | 27.9 | 25.5 | 24.1 |
| Efficiency (%) | 93.7 | 91.1 | 91.1 | 91.1 | 89.7 | 89.7 |

Comparative Examples in Tables 3 and 4 are a structure in which the molding member having the phosphor is disposed in the light emitting device as illustrated in FIG. 2, Examples 1 to 3 are the lighting device of FIG. 163 or the lighting device of FIG. 12, and Examples 4 and 5 are the lighting devices illustrated in FIGS. 162 and 164. The efficiency represents the radiant flux incident on the first transparent film of the optical plate/chip power. As shown in Tables 3 and 4, the light emitting device has less optical loss as compared with Comparative Example in terms of the luminous efficiency and may prevent the degradation of the phosphor.

Referring to FIG. 165, the plurality of light emitting chips 170A are disposed in the light emitting device 100E in the matrix form. Three or more light emitting chips 170A may be disposed in series or in parallel. The intervals G6 and G7 between the plurality of light emitting chips 170A may be changed according to the size of the recess 160 of the light emitting device 100B. The optical plate 300 may be disposed on the plurality of light emitting chips 170A disposed in the matrix form.

FIG. 166 is a perspective view illustrating a light source module in which the lighting device of FIG. 7 is disposed on a circuit board, and FIG. 167 is a perspective view illustrating a light source module in which the lighting device of FIG. 7 is disposed on a circuit board.

Referring to FIG. 166, in the light source module, the lighting device 101 including the light emitting device 100 and the optical plate 300 according to the embodiment is disposed on a circuit board 600. The lighting device 101 may include the plate cover (360 of FIG. 104) according to the embodiment, but embodiments of the present invention are not limited thereto.

Referring to FIG. 167, in the light source module, the lighting devices 101 according to the embodiment are disposed on the circuit board 600 at a predetermined interval. The lighting devices 101 may be disposed at least one row and/or column, but embodiments of the present invention are not limited thereto. The lighting device 101 may include the plate cover (360 of FIG. 104) according to the embodiment, but embodiments of the present invention are not limited thereto.

The circuit board 600 may be a printed circuit board (PCB) including a circuit pattern (not illustrated). The circuit board 600 may include a general PCB, a metal core PCB (MCPCB), and a flexible PCB (FPCB), but embodiments of the present invention are not limited thereto.

FIGS. 168 to 170 illustrate an example in which a light emitting chip and an optical plate are disposed on a circuit substrate as an embodiment.

Referring to FIG. 168, in the light source module, the light emitting chip 170B is disposed on the circuit board 610. The optical plate 300 according to the embodiment or the modification example may be disposed on the light emitting chip 170B. A plate cover may be disposed on the optical plate 300, but embodiments of the present invention are not limited thereto.

The circuit board 610 may be a printed circuit board (PCB) including a circuit pattern (not illustrated). The circuit board 600 may include a general PCB, a metal core PCB (MCPCB), and a flexible PCB (FPCB), but embodiments of the present invention are not limited thereto.

The light emitting chip 170B may be disposed in a vertical type chip in which two electrodes are disposed on opposite sides, a horizontal type chip in which two electrodes are disposed adjacent to each other, or a flip-chip type, but embodiments of the present invention are not limited thereto.

The interval G2 between the light emitting chip 170B and the optical plate 300 may be within the range disclosed in the embodiment.

A reflective member 630 may be disposed on the outer side of the light emitting chip 170B, and the reflective member 630 may reflect light emitted from the light emitting chip 170B and block light leakage. The reflective member 630 may support the outer side of the bottom surface of the optical plate 300. The reflective member 630 may overlap the support 310 of the optical plate 300 in a vertical direction. The top surface 631 of the reflective member 630 may contact at least one of the outer side of the bottom surface of the first transparent film 320 and the support 310.

The reflective member 630 may be a white resin material or a resin material in which a reflective layer is formed on the surface thereof. In the white resin material, a metal oxide, for example, $TiO_2$, $SiO_2$, and $Al_2O_3$, may be added to silicon or epoxy. A top view shape of the reflective member 630 may be a circular shape or a polygonal shape.

An air gap or a transparent molding member may be disposed in a space 650 between the circuit board 610 and the optical plate 300, but embodiments of the present invention are not limited thereto. The molding member in the reflective member 630 may contact the first transparent film 320 of the optical plate 300.

Referring to FIG. 169, in the light source module, the plurality of light emitting chips 170E are disposed on the circuit board 610. The light emitting chips 170B may be spaced apart from one another, and the reflective member 630 may be disposed therearound. The optical plate 300 may be disposed on each of the light emitting chips 170B. The optical plates according to the embodiments or the modification examples may be selectively applied to the optical plate 300. A plate cover may be disposed on the optical plate 300, but embodiments of the present invention are not limited thereto. An air gap or a transparent molding member may be disposed in a space 650 between the circuit board 610 and the optical plate 300, but embodiments of the present invention are not limited thereto.

Referring to FIG. 170, in the light source module, a plurality of light emitting chips 170B may be disposed on a circuit board 610, and two or more (e.g., four or more) light emitting chips 170B may be connected in series or in parallel. The optical plate 300 according to the embodiment may be disposed on the plurality of light emitting chips 170B. A plurality of lighting regions having the plurality of light emitting chips 170B and the optical plate 300 may be disposed on the circuit board 610, but embodiments of the present invention are not limited thereto. The optical plates according to the embodiments or the modification examples may be selectively applied to the optical plate.

The interval G2 between the optical plate 300 and the light emitting chip 170B may be within the range disclosed in the embodiment. A plate cover may be disposed on the optical plate 300, but embodiments of the present invention are not limited thereto.

A reflective member 630 may be disposed at the outer side of the plurality of light emitting chips 170B The reflective member 630 may reflect light and support the optical plate 300.

An air gap or a transparent molding member may be disposed in a space 650 between the circuit board 610 and the optical plate 300, but embodiments of the present invention are not limited thereto.

Eighth Embodiment

FIG. 171 is a perspective view of a light emitting device according to an eighth embodiment, FIG. 172 is a plan view of the light emitting device of FIG. 171, FIG. 173 is an H-H cross-sectional view of the light emitting device of FIG. 172, FIG. 174 is an I-I cross-sectional view of the light emitting device of FIG. 172, FIG. 175 is a J-J cross-sectional view of the light emitting device of FIG. 172, and FIG. 176 is a bottom view of the light emitting device of FIG. 172. In describing the eighth embodiment, the embodiment can be understood by referring to the configurations provided in the above embodiment or the modification examples thereof. The configurations disclosed in the first to seventh embodiments or the modification examples of the first to seventh embodiment may be selectively applied to the eighth embodiment.

Referring to FIGS. 171 and 176, the light emitting device 100G includes a body 110 having a cavity 162, a plurality of lead frames 122 and 132 in the bottom of the cavity 162, light emitting chips 171 and 172 disposed on the plurality of lead frames 122 and 132, and a molding member 181 in the cavity 162.

The body 110 may include an insulating material or a conductive material. The body 110 may include at least one selected from a resin material such as polyphthalamide (PPA), silicon (Si), a metal material, photo sensitive glass (PSG), sapphire ($Al_2O_3$), and a printed circuit board (PCB). For example, the body 110 may include a resin material, for example, a material such as PPA, epoxy, or silicon. In order to increase reflection efficiency, a filler, which is a metal oxide such as $TiO_2$ or $SiO_2$, may be added to the epoxy or the silicon material used as the body 110. The body 110 may include a ceramic material. For another example, the body 110 may include a circuit board, and may include at least one selected from a substrate (PCB) made of a resin material, a substrate (metal core PCB) having a heat dissipation metal, and a ceramic substrate. The body 110 may be formed with a dark color or a black color so as to improve contrast, but embodiments of the present invention are not limited thereto.

The body 110 includes a cavity 162 having an opened upper portion and having a predetermined depth. The cavity 162 may be formed in a cup structure concave from the top surface 15 of the body 110, a concave structure, or a recess structure, but embodiments of the present invention are not limited thereto. The side surface 163 of the cavity 162 may be inclined with respect to the bottom, and two or more of the sidewalls may be disposed to be inclined at the same angle or different angles. A reflective layer made of a different material may be further disposed on the surface of the cavity 162, but embodiments of the present invention are not limited thereto. In the side surface 163 of the cavity 162, angles of the upper sidewall adjacent to the top surface of the body 110 and the lower sidewall adjacent to the lead frames 121 and 131 may be different, but embodiments of the present invention are not limited thereto.

When viewed from above, the shape of the body 110 may be formed in a polygonal structure such as a triangle, a rectangle, or a pentagon, may be formed in a circular shape, an oval shape, or a curved shape, or may be a polygonal shape with a curved edge, but embodiments of the present invention are not limited thereto.

The body 110 may include a plurality of side parts, for example, four side parts 11, 12, 13, and 14, as the outer sides. One or more of the plurality of side parts 11, 12, 13, and 14 may be formed as a surface vertical or inclined with respect to the bottom surface of the body 110. In the body 110, the first to fourth side parts 11, 12, 13, and 14 are described as an example. The first side part 11 and the second side part 12 are disposed on opposite sides, and the third side part 13 and the fourth part 14 are disposed on opposite sides. The length Y1 of each of the first side part 11 and the second side part 12 is the length of the body 110, and may be less than the width X1 of each of the third side part 13 and the fourth side part 14, that is, the width of the body 110. The length Y1 of the body 110 may be twice or more times, for example, three times or more the width X1 of the body 110. The maximum length Y2 of the light emitting device 100G may be greater than the length Y1 of the body 110 and may be a length between both ends of the lead frames 122 and 132.

The width X2 of the third side part 13 or the fourth side part 14 may be an interval between the first side part 11 and the second side part 12, that is, the maximum interval. The length direction of the body 110 is a direction perpendicular to the width direction. The plurality of light emitting chips 171 and 172 may be disposed in the light emitting device 100G in the length direction. The plurality of light emitting chips 171 and 172 may be disposed on different lead frames 122 and 132. In the light emitting device 1000, the light emitting chips 171 and 172 may be disposed on the individual lead frames 122 and 132 in terms of heat dissipation, or a plurality of light emitting chips may be disposed on one lead frame. In addition, the length of the light emitting device 100G is greater than the width, thereby improving the heat dissipation efficiency of the light emitting chips 171 and 172. Since the size of the light emitting chips 171 and 172 increases, the high-luminance element may be provided.

Referring to FIGS. 172, 174, and 175, the first side part 11 of the body 110 includes a stepped structure 105C lower than the top surface of the body 110 in the length direction, and the second side part 12 of the body 110 includes a stepped structure 105D lower than the top surface of the body 110 in the length direction. The stepped structures 105C and 105D of the body 110 may function as a dam for containing the molding member 181 overflowing through the top surface 15 of the body 110. The stepped structures 105C and 105D may be removed.

The plurality of lead frames 122 and 132 are disposed in the cavity 162 of the body 110. The plurality of lead frames 122 and 132 may include two or more metal frames, for example, the first and second lead frames 122 and 132. The first and second lead frames 122 and 132 may be separated by a separation part 145.

One or more light emitting chips 171 and 172 may be disposed in the cavity 162. The plurality of light emitting chips 171 and 172 may include two or more LED chips, for example, the first and second light emitting chips 171 and 172. One or more light emitting chips may be disposed on at least one of the plurality of lead frames 122 and 132, or at least one light emitting chip 171 and 172 may be disposed on each of the plurality of lead frames 122 and 132. The plurality of light emitting chips 171 and 172 may be selectively connected to the plurality of lead frames 122 and 132 by wires 177, 178, and 179.

The first lead frame 122 is disposed in a first region on the bottom of the cavity 162, and the second lead frame 132 is disposed in a second region spaced apart from the first region on the bottom of the cavity 162. The first lead frame 122 and the second lead frame 132 may include a metal material, for example, at least one selected from titanium (Ti), copper (Cu), nickel (Ni), gold (Au), chromium (Cr), tantalum (Ta), platinum (Pt), tin (Sn), silver (Ag), and phosphorus (P), and may be formed in a single metal layer or a multi-layer metal layer. The first and second lead frames 122 and 132 may be formed with the same thickness, but embodiments of the present invention are not limited thereto.

The first light emitting chip 71 may be disposed on the first lead frame 122, and the second light emitting chip 73 may be disposed on the second lead frame 132.

The light emitting chips 171 and 172 may selectively emit light in the range from a visible light band to an ultraviolet light band. For example, the light emitting chips 171 and 172 may be selected from a red LED chip, a blue LED chip, a green LED chip, and a yellow green LED chip. The light emitting chips 171 and 172 include a compound semiconductor light emitting device of group III to V elements.

The molding member 181 may be disposed in the cavity 162 of the body 110, and the molding member 181 may include a molding member such as silicon or epoxy and may be formed in a single-layer structure or a multi-layer structure. The molding member 181 may include a phosphor for converting a wavelength of emitted light on the light emitting chips 171 and 172, and the phosphor excites a part of light emitted from the light emitting chips 171 and 172 and emits light of different wavelengths. The phosphor may selectively include YAG, TAG, silicate, nitride, or oxynitride-based material. The phosphor may include at least one of a red phosphor, a yellow phosphor, and a green phosphor, but embodiments of the present invention are not limited thereto. The surface of the molding member 181 may have a flat shape, a concave shape, or a convex shape, but embodiments of the present invention are not limited thereto.

A lens may be further formed in the upper portion of the body 110. The lens may include a structure of a concave and/or convex lens, and may adjust the distribution of light emitted by the light emitting device 100G. In the first leas frame 122 and the second lead frame 132, a concave recess structure may be formed in a region where the light emitting chips 171 and 172 are mounted, but embodiments of the present invention are not limited thereto.

Referring to FIGS. 172 and 173, the separation part 145 may be disposed between the first and second lead frames 122 and 132, and the separation part 145 may be made of the same material as that of the body 110. The separation part 145 includes a protrusion 145A, and the protrusion 145A may protrude more highly than the top surfaces of the first and second lead frames 122 and 132. The protrusion 145A may be disposed between the first and second light emitting chips 171 and 172 and may reflect incident light. In the protrusion 145A, the surface corresponding to the light emitting chips 171 and 172 is disposed as an inclined surface. Thus, the protrusion 145A may reflect incident light in a direction of the light exit surface. The separation part 145 having the protrusion 145A may suppress moisture penetration and may improve the light extraction efficiency.

The separation part 145 having the protrusion 145A may reinforce rigidity for the region between the first and second lead frames 122 and 132 in a structure in which the length of the body 110 is three times or more longer than the width thereof. The bottom surface of the separation part 145 may be disposed to be greater than the interval between the first and second lead frames 122 and 132. Accordingly, the separation part 145 may suppress moisture penetration and reinforce rigidity.

As illustrated in FIGS. 173 to 176, the bottom surface of the first lead frame 122 and the bottom surface of the second lead frame 132 may be exposed to the bottom surface of the body 110, or may be disposed on the same horizontal surface as the bottom surface of the body 110.

The first lead frame 122 may include a first recess 25 from which the separation part 145 extends, a plurality of first lead parts 123 protruding outward from the third side part 13 of the body 110, a first extension part 23 in a region between the plurality of first lead parts 123, and a second recess 23A below the first extension part 23. The first extension part 23 may be disposed above the bottom surface of the body 110, or may be spaced apart from the plane horizontal to the bottom surface of the body 110.

The second lead frame 132 may include a third recess 32 from which the separation part 145 extends, a plurality of first lead parts 133 protruding outward from the fourth side part 14 of the body 110, a second extension part 33 in a region between the plurality of second lead parts 133, and a fourth recess 33A below the second extension part 33. The second extension part 33 may be disposed above the bottom surface of the body 110, or may be spaced apart from the plane horizontal to the bottom surface of the body 110.

As illustrated in FIGS. 171 and 176, a plurality of first lead parts 123 of the first lead frame 122 may be disposed at a predetermined interval and protrude outward from the third side part 13. The bottom surfaces of the plurality of first lead parts 123 may extend to the same horizontal plane as the bottom surface of the body 110.

A plurality of second lead parts 133 of the second lead frame 132 may be disposed at a predetermined interval and protrude outward from the fourth side part 14. The bottom surfaces of the plurality of second lead parts 133 may extend to the same horizontal plane as the bottom surface of the body 110.

Referring to FIGS. 174 to 176, recesses 25, 26A. 25A, and 25B may be disposed around the bottom surface of the first lead frame 122. The area of the bottom surface of the first lead frame 122 may be smaller than the area of the top surface thereof. Recesses 35, 36A. 35A, and 35B may be disposed around the bottom surface of the second lead frame 132. The area of the bottom surface of the second lead frame 132 may be smaller than the area of the top surface thereof.

As illustrated in FIG. 173, the first lead frame 122 includes the first recess 25 from which the separation part 145 extends, and the second recess 26A below the body 110 adjacent to the third side part 13. The second lead frame 132 includes the third recess 35 from which the separation part 145 extends, and the fourth recess 36A below the body 110 adjacent to the fourth side part 14.

Referring to FIGS. 173 and 176, the light emitting device includes first and second open regions 20 and 30 in opposite regions of the lower portion thereof. The first open region 20 includes a first lower portion 13A adjacent to the third side part 13 of the body 110, and the second recess 26A of the first lead frame 122. The first open region 20 is a region opened from the lower end of the third side part 13 of the body 110 to the second recess 26A of the first lead frame 122, and may be disposed to be deeper than the bottom surface of the body 110 and the bottom surface of the first lead frame 122 in a direction of the top surface 15 of the body.

The second open region 30 includes a second lower portion 14A adjacent to the fourth side part 14 of the body 110, and the fourth recess 36A of the second lead frame 132. The second open region 30 is a region opened from the lower end of the fourth side part 14 of the body 110 to the fourth recess 36A of the second lead frame 132, and may be disposed to be deeper than the bottom surface of the body 110 and the bottom surface of the second lead frame 132 in a direction of the top surface 15 of the body.

The length Z1 of the first open region 20 may be equal to or greater than the interval Q2 between the side 163 of the cavity 162 and the third side part 13 of the body 110, that is, the maximum interval. When the length Z1 of the first and second open regions 25 and 35 is less than the interval Q2 of the body 110, the moisture penetration path may be shortened, and when the length Z1 is greater than the interval Q2, the moisture penetration path may be lengthened. Since the length Z1 of the first and second open regions 20 and 30 is lengthened, the first extension part 26 of the first lead frame 122 may further extend in a direction of the third side part 13. The interval Q2 of the body 110 may be formed to be narrower, and the bottom length (Q1 of FIG. 173) of the cavity 162 may be further lengthened. When the bottom length Q1 of the cavity 162 is lengthened, a longer light emitting chip 71 or a larger light emitting chip 71 may be disposed as compared with the same light emitting device.

The length of the second open region 30 and the interval between the sidewall 14 of the cavity 162 and the fourth side part 14 of the body 110 can be understood by referring to the above description.

The widths Z4 of the first lower portion 13A and the second lower portion 14A of the body 110 may be equal to each other. The width Z4 of the first lower portion 13A may be an interval between the plurality of first lead parts 133, and the width Z4 of the second lower portion 14A may be an interval between the plurality of second lead parts 133.

The second recess 26A of the first lead frame 122 is a region obtained by etching the lead frame, and the first extension part 26 of the first lead frame 122 may be exposed to the bottom surface of the body 110. The bottom surface of the second recess 26A of the first lead frame 122 may be a semispherical shape or a polygonal shape. The inner side (26B of FIG. 176) of the second recess 26A of the first lead frame 122 may be curved or angled, but embodiments of the present invention are not limited thereto.

The fourth recess 36A of the second lead frame 132 is a region obtained by etching the lead frame, and the second extension part 36 of the second lead frame 132 may be exposed to the bottom surface of the body 110. The bottom surface of the fourth recess 36A of the second lead frame 132 may be a semispherical shape or a polygonal shape. The inner side (36B of FIG. 176) of the fourth recess 36A of the second lead frame 132 may be curved or angled, but embodiments of the present invention are not limited thereto.

The first and second extension parts 26 and 36 of the first and second lead frames 122 and 132 may extend with a predetermined length 23 in a direction of the third and fourth side parts 13 and 14 of the body 110. The length Z3 of the first and second extension parts 26 and 36 may be less than the width Z4 of the first and second lower portions 13A and 14A, and the maximum width may be equal to the width Z4. The first and second extension parts 26 and 36 extend in a direction of the third and fourth side parts 13 and 14 of the body 110, so that the length of the top surfaces of the first and second lead frames 122 and 132 in the cavity 162 may be exposed to be further longer. As illustrated in FIGS. 172 and 173, the bottom length Q1 of the cavity 162 may be longer as compared with the light emitting device having the same length Y1 of the body 110, and the length of the light emitting chips 171 and 172 mounted on the first and second lead frames 122 and 132 may be provided to be long.

Referring to FIG. 177, the first extension part 26 extends in a direction of the third side part 13 of the body 110. In this case, the side 163 of the cavity 162 may be moved further outside (moving from 163b to 163). Accordingly, the top surface of the first lead frame 122, that is, the top surface of the first extension part 26, may be further exposed to the bottom of the cavity 162. Accordingly, the distance (b1<b2) between the center and the side 163 of the light emitting chip 171 may be provided to be longer. The light emitting chip 171 may be provided to be longer by ½ length (A1<A2) with reference to the center. A part of the second recess 26A of the first lead frame 122 may overlap the bottom of the cavity 162 in a vertical direction. Accordingly, the path through which moisture penetrates through the first open region 20 or the heat transfer path L5 may be lengthened. The description of the first lead frame 122 may be equally applied to the second lead frame 132.

Referring to FIG. 178, the first extension part 26 of the first lead frame 122 extend in a direction of the third side part 13 of the body 110. When the top surface of the first extension part 26 of the first lead frame 122 is not exposed to the bottom of the cavity 162, the moisture penetration or heat transfer path L5 may be lengthened, but the distance b1 between the center of the light emitting chip 171 and the side 163 of the cavity 162 corresponding to the third side part 13 may be shortened.

Referring to FIG. 179, the first extension part 26 of the first lead frame 122 extend in a direction of the third side part 13 of the body 110. When the top surface of the first extension part 26 of the first lead frame 122 is exposed to the bottom of the cavity 162, the moisture penetration or heat transfer path L5 may be shortened, but the distance b2 between the center of the light emitting chip 171 and the side 163 of the cavity 162 corresponding to the third side part 13 may be lengthened. Accordingly, since the distance b2 of FIG. 178 is provided to be longer than the distance b1, the length of the light emitting chip 171 may be provided to be long.

As illustrated in FIG. 180, a gate part 705 connected during the injection of the body 110 may be disposed in the first open region 20 illustrated in FIG. 177. As illustrated in FIG. 180, a gate part 706 connected during the injection of the body 110 may be disposed in the second open region 30.

Referring to FIG. 180, when the lead frames 122 and 132 are prepared, the injection gates 705 and 706 may be disposed below the outer side of the individual light emitting devices for injection of the body, and a liquid body material may be injected. The open regions may be provided at both lower portions of the light emitting device by the injection gates 705 and 706.

FIG. 181 illustrates another example of the light emitting device of FIG. 173. In describing FIG. 181, the same configuration as that disclosed above will be understood by referring to the descriptions of the above embodiments.

Referring to FIG. 181, the open regions 20 and 30 may be disposed on both lower portions of the light emitting device, that is, below the region between the lead parts 123 and 133 of the first and second lead frames 122 and 132 of FIG. 172. The first and second lower portions 13A and 14A may be disposed below the third and fourth side parts 13 and 14 of the body 110, and a part of the body may be connected below the second recess 26A of the first lead frame 122 and the fourth recess 36A of the second lead frame 132. Accordingly, the body is formed in the second recess 26A of the first lead frame 122 and the fourth recess 36A of the second lead frame 132, thereby increasing the moisture penetration path and the heat transfer path.

The lower portion 14B of the side 163 of the cavity 162 may be disposed as a plane perpendicular to the region contacting the lead frames 122 and 132 Accordingly, it is possible to prevent occurrence of bur caused by the lower portion 14B of the side 163 of the cavity 162 and to effectively reflect incident light.

FIG. 182 illustrates another example of the light emitting device of FIG. 172, and the light emitting device may include an open region illustrated in FIG. 173 or FIG. 181.

Referring to FIG. 182, the light-emitting device may be provided such that the bottom length Q1 of the cavity 162 of the body 110 is long. A first bonding part 163A may be disposed in a region adjacent to the third side part 13 on the bottom of the cavity 162, and a second bonding part 163B may be included in a region adjacent to the fourth side part 14. The first and second bonding parts 163A and 163B may be formed in a concave shape having a size at which the ends of the wires 177 and 179 are bonded, for example, a semispherical shape.

The length Q11 of the first and second bonding parts 163A and 163B disposed on the bottom of the cavity 162 may be longer than the bottom length Q1 of the cavity 162. The first bonding part 163A may be disposed on the first extension part (26 of FIG. 173) of the first lead frame 122, and the second bonding part 163B may be disposed on the second extension part (36 of FIG. 173) of the second lead frame 132. Since the ends of the wires 177 and 179 are disposed on the first and second bonding parts 163A and 163B, the light emitting chips 171 and 172 may be provided as a larger chip as compared with the light emitting device having the same size. Accordingly, the light intensity of the light emitting device may increase as compared with the light emitting device having the same size.

(a) and (b) of FIG. 183 are views illustrating a comparison of optical densities in Comparative Example and Example (FIG. 172). Comparative Example is a structure in which the extension part is not present between the lead parts of the lead frames in Example (FIG. 172), and Example is a structure in which the extension part is present between the lead parts of the lead frames.

As illustrated in (a) and (b) of FIG. 183, Example (b) has a larger size of the cavity as compared with Comparative Example (a), so that the optical density in the cavity is reduced. In addition, as the size of the cavity increases, the life or efficiency of the molding member may be improved. In addition, as compared with Comparative Example, the life of the light emitting device may extend by about 7.5%.

Table 5 shows a comparison of a maximum value of a radiation density in the light exit plane of the light emitting device in Comparative Example and Example (b).

TABLE 5

| Comparative Example | Example |
|---|---|
| 100% | 93.5% |

It can be seen that as the size of the cavity of the light emitting device increases, the maximum value of the radiation density is reduced as compared with Comparative Example.

The optical plates according to the embodiments may be selectively applied on the light emitting chip according to the eighth embodiment. The disclosed optical plate may be applied to the inside of the concave part of the light emitting device, the upper portion of the concave part, above the light emitting chip, or the top surface of the body.

Meanwhile, in the first embodiment, the optical plate 300 illustrated in FIGS. 1 to 30, a part of the light incident on the first transparent film 320 may leak out to the outside through a region between the body 110 of the light emitting device 100 and the support 310 along the first transparent film 320. That is, the light leakage problem through the outer periphery of the first transparent film 320 may occur. This light leakage problem may degrade the light speed extracted through the second transparent film 330 of the optical plate 300. Hereinafter, another embodiment may provide an optical plate 300 having a structure that can reduce the light leakage problem. Accordingly, in the test graphs illustrated in FIGS. 184 to 186, the light emission efficiency may be lower as compared with the structure of the optical plate of the embodiment, as in Example 1.

The light emission efficiency of the optical plate 300 according to the first embodiment may be compared as in FIGS. 184 to 186. The open region of the optical plate of FIG. 184 is an open region 342 of the optical plate of FIGS. 11 and 12, and the length is three times to fourth times the width, for example, length×width is 6.0 mm×1.6 mm.

FIG. 184 is a graph showing a comparison of emission efficiency by the optical plate in the lighting device of FIGS. 11 and 14. In FIG. 185, Example 1 illustrates the emission efficiency of the optical plate in the lighting device of FIG. 11, and Example 2 illustrates the emission efficiency of the optical plate in the lighting device of FIG. 14 according to the width of the first stepped part. The optical plate of Example 1 shows the light emission efficiency of 78% or more, and the optical plate of Example 2 shows the light emission efficiency of 84% or more when the width of the first stepped part is 0 mm to 0.4 mm and the light emission efficiency of 86% or more when the width is 0 mm to 0.2 mm. Example 2 has the first stepped part, thereby preventing the side light leakage and increasing the light emission efficiency. In FIG. 14, the width of the first stepped part may be 0.4 mm or less as illustrated in FIG. 184. It can be seen that when the width of the first stepped part is out of the range, the light extraction efficiency is not improved. In FIG. 184, when the width of the first stepped part is 0 mm, it may be the optical plate illustrated in FIG. 20.

FIG. 185 is a graph showing a comparison of emission efficiency by the optical plate in the lighting device of FIGS. 11 and 21. In FIG. 34, Example 1 illustrates the emission efficiency of the optical plate in the lighting device of FIG. 11, and Example 3 illustrates the emission efficiency of the optical plate in the lighting device of FIG. 21 according to the width of the first stepped part. The open region of the optical plate of FIG. 185 is an open region 342 of the optical plate of FIGS. 11 and 21, and the length is five times to six times the width, for example, length×width is 5.5 mm×1.0 mm.

As illustrated in FIG. 185, the optical plate of Example 1 shows the light emission efficiency of 60% or more, and the optical plate of Example 3 shows the light emission efficiency of 68% or more when the width of the first stepped part is 0.1 mm to 0.4 mm. Example 3 has the first stepped part, thereby preventing the side light leakage and increasing the light emission efficiency as compared with Example 1. In FIG. 21, the width of the first stepped part may be 0 mm to 0.4 mm as illustrated in FIG. 34. It can be seen that when the width of the first stepped part is out of the range, the light extraction efficiency is not improved. In FIG. 184, when the width of the first stepped part is 0 mm, it may be the optical plate illustrated in FIG. 20.

FIG. 186 is a graph showing a comparison of emission efficiency by the optical plate in the lighting device of FIGS. 11 and 23. In FIG. 186, Example 1 illustrates the emission efficiency of the optical plate in the lighting device of FIG. 11, and Example 3 illustrates the emission efficiency of the optical plate in the lighting device of FIG. 23 according to the width of the first stepped part. The open region of the optical plate of FIG. 186 is an open region 342 of the optical plate of FIGS. 11 and 23, and the length is three times to fourth times the width, for example, length×width is 6.5 mm×2.0 mm.

As illustrated in FIG. 186, the optical plate of Example 1 shows the light emission efficiency of 84% or more, and the optical plate of Example 4 shows the light emission efficiency of 90% or more when the width of the first stepped part is 0 mm to 0.4 mm. Example 4 has the first stepped part, thereby preventing the side light leakage and increasing the light emission efficiency as compared with Example 1. In FIG. 21, the width of the first stepped part may be 0 mm to 0.4 mm as illustrated in FIG. 186. It can be seen that when the width of the first stepped part is out of the range, the light extraction efficiency is not improved. In FIG. 186, when the width of the first stepped part is 0 mm, it may be the optical plate illustrated in FIG. 20 and the light emission efficiency may exceed 90%.

The open region of the optical plate of Example 2 in FIGS. 184 to 186 may be larger than the open region of the optical plate of Example 3, and may be smaller than the open region of the optical plate of Example 4. When the width of the stepped part is changed to the range of 0 mm to 0.4 mm according to the size of the open region, the light emission efficiency is changed. As in Example 1, it is possible to prevent the degradation of the light emission efficiency by the light leakage through the outer periphery of the first transparent film 320. In addition, the optical speed of the optical plates of Examples 2 to 4 may be increased according to the light emission efficiency, as compared with Example 1.

FIG. 187 is a view showing an example of a light emitting chip of a lighting element or a light unit according to the embodiment.

Referring to FIG. 187, the light emitting chip according to the embodiment includes a first conductive type semiconductor layer 841, an active layer 850 disposed on the first conductive type semiconductor layer 841, and a second conductive type semiconductor layer 875 disposed on the electron blocking layer 871.

The light emitting chip may include at least one or both of a buffer layer 831 and a substrate 821 under the first conductive type semiconductor layer 841. The light emitting chip includes a first clad layer 843 between the first conductive semiconductor layer 841 and the active layer 850 and a second clad layer (not shown) between the active layer 850 and the second conductive semiconductor layer 875.

The substrate 821 may include a transmissive substrate, an insulation substrate or a conductive substrate. For instance, the substrate 821 may include at least one of $Al_2O_3$, SiC, Si, GaAs, GaN, ZnO, GaP, InP, Ge and $Ga_2O_3$. A plurality of protrusions (not shown) may be formed on the upper surface and/or the lower surface of the substrate 821. Each of the plurality of protrusions may include at least one of a side sectional surface of a hemispherical shape, a polygonal shape, may be arranged in a stripe form or a matrix form. The protrusions can improve the light extraction efficiency. A plurality of compound semiconductor layers may be disposed on the substrate 821. The plurality of compound semiconductor layers may be grown using an electron beam evaporator, physical vapor deposition (PVD), chemical vapor deposition (CVD), plasma laser deposition (PLD) A dual-type thermal evaporator, sputtering, metal organic chemical vapor deposition (MOCVD), or the like.

The buffer layer 831 may be formed on the substrate 821. The buffer layer 831 may be prepared as at least one layer by using a group II to VI. The buffer layer 831 may include a semiconductor layer formed by using the group III-V compound semiconductor. For instance, the buffer layer 831 may include at least one of compound semiconductors having the compositional formula of $In_xAl_yGa_{1-x-y}N$ ($0 \le x \le 1$, $0 \le y \le 1$, $0 \le x+y \le 1$), such as GaN, InN, AlN, InGaN, AlGaN, InAlGaN, and AlInN. The buffer layer 831 may have the superlattice structure by alternately stacking heterogeneous semiconductor layers. The buffer layer 831 may attenuate the lattice mismatch between the substrate 821 and the nitride semiconductor layer and may be defined as a defect control layer. The buffer layer 831 may have a lattice constant between a lattice constant of the substrate 11 and a lattice constant of the nitride semiconductor layer. The buffer layer 831 includes an undoped semiconductor layer and the undoped semiconductor layer has conductivity lower than that of the first conductive semiconductor layer 841. The undoped semiconductor layer has a first conductive property even if a conductive dopant is not intentionally doped thereto. The buffer layer 831 can be formed of a single layer or multi-layers.

The first conductive semiconductor layer 841 may be formed between at least one of the buffer layer 831 and the substrate 821 and the active layer 850. The first conductive semiconductor layer 841 may include at least one of group II to VI compound semiconductor and group III to V compound semiconductors doped with a first conductive dopant. For example, the first conductive semiconductor layer 841 may be formed of a semiconductor material having the compositional formula of InxAlyGa1-x-yN ($0 \le x \le 1$, $0 \le y \le 1$, $0 \le x+y \le 1$). For example, the first conductive semiconductor layer 841 includes at least one of GaN, InN, AlN, InGaN, AlGaN, InAlGaN, AlInN, AlGaAs, GaP, GaAs, GaAsP and AlGaInP. The first conductive semiconductor layer 841 includes an n type semiconductor layer and the first conductive dopant is an n type dopant including Si, Ge, Sn, Se or Te. The first conductive type semiconductor layer 841 may be a single layer or a multilayer structure. The first conductive semiconductor layer 841 may have a superlattice structure in which at least two different layers are alternately arranged. The first conductive semiconductor layer 841 may be an electrode contact layer.

The first clad layer 843 may include at least one of group II to VI compound semiconductor and group III to V compound semiconductors. The first clad layer 843 may be an n type semiconductor layer with the first conductive dopant is an n type dopant. The first clad layer 843 includes at least one of GaN, InN, AlN, InGaN, AlGaN, InAlGaN, AlInN, AlGaAs, GaP, GaAs, GaAsP and AlGaInP. The first clad layer 843 may include an n type semiconductor layer and the first conductive dopant is an n type dopant including Si, Ge, Sn, Se or Te. The first clad layer 843 may be a single layer or a multilayer structure.

The active layer 850 may be formed in at least one of a single well structure, a single quantum well structure, a multiple well structure, a multiple quantum well (MQW) structure, a quantum dot structure, and a quantum wire structure. The active layer 850 Electrons (or holes) injected through the first conductive type semiconductor layer 841 and holes (or electrons) injected through the second conductive type semiconductor layer 875 meet with each other in the active layer 850, and is a layer that emits light due to a band gap difference of an energy band according to a material of the active layer 850. The active layer 850 may be formed of a compound semiconductor. The active layer 850 may be formed of at least one of Group II-VI and Group III-V compound semiconductors.

When the active layer 850 is implemented as a multi-well structure, the active layer 850 includes a plurality of alternately arranged well layers and a plurality of barrier layers, and the pairs of well layers/barrier layers are formed in a period of 2 to 30. The pair of well layer/barrier layer includes at least one of pairs, for example InGaN/AlGaN, InGaN/AlGaN, InGaN/InGaN, AlGaAs/GaAs, InGaAs/GaAs, InGaP/GaP, AlInGaP/InGaP, or InP/GaAs. The well layer may be disposed of a semiconductor material having a composition formula of, for example, $In_xAl_yGa1-x-yN$ ($0 \leq x \leq 1$, $0 \leq y \leq 1$, $0 \leq x+y \leq 1$). The barrier layer may be disposed of a semiconductor material having a composition formula of, for example, $In_xAl_yGa1-x-yN$ ($0 \leq x \leq 1$, $0 \leq y \leq 1$, $0 \leq x+y \leq 1$). The active layer 850 may emit at least one peak wavelength of ultraviolet, blue, green, and red wavelengths. For example, the active layer 850 may provide different peak wavelengths of the respective light emitting chips depending on the composition of the indium or aluminum.

The electron blocking layer 871 is disposed on the active layer 850. The electron blocking layer 871 may include an AlGaN-based semiconductor. The electron blocking layer 871 may be a p-type semiconductor layer having a dopant of the second conductivity type, for example, a p-type dopant. The electron blocking layer 871 may include at least one of GaN, AlN, AlGaN, InGaN, InN, InAlGaN, AlInN, AlGaAs, GaP, GaAs, GaAsP, or AlGaInP, and include a p-type dopant such as Mg, Zn, Ca, Sr, Ba.

A second conductive semiconductor layer 875 may be disposed on the electron blocking layer 871. The second conductivity type semiconductor layer 875 may be formed of a semiconductor material having a composition formula of $In_xAl_yGa1-x-yN$ ($0 \leq x \leq 1$, $0 \leq y \leq 1$, $0 \leq x+y \leq 1$). The second conductive semiconductor layer 875 may include at least one of GaN, AlN, AlGaN, InGaN, InN, InAlGaN, AlInN, AlGaAs, GaP, GaAs, GaAsP, and includes p-type semiconductor layer doped with a p-type dopant. The second conductive semiconductor layer 875 may be a single layer or a multilayer. The second conductive semiconductor layer 875 may have a superlattice structure in which at least two different layers are alternately arranged. The second conductive semiconductor layer 875 may be an electrode contact layer.

The light emitting structure may include the first conductivity type semiconductor layer 841 to the second conductivity type semiconductor layer 875. As another example, in the light emitting structure, the first conductivity type semiconductor layer 841 and the first clad layer 843 are the p-type semiconductor layer, the second clad layer 873, and the second conductivity type semiconductor layer 875 are n Type semiconductor layer. Such a light emitting structure may be implemented by any one of an n-p junction structure, a p-n junction structure, an n-p-n junction structure, and a p-n-p junction structure.

The light emitting chip includes a first electrode 891 and a second electrode 895, the first electrode 891 may be electrically connected to the first conductive semiconductor layer 841 and the second electrode 895 may be electrically connected to the second conductive semiconductor layer 875. The first electrode 891 may be disposed on the first conductive semiconductor layer 841 and the second electrode 895 may be disposed on the second conductive semiconductor layer 875. The first electrode 891 and the second electrode 895 may have a current diffusion pattern having an arm structure or a finger structure. The first electrode 891 and the second electrode 895 may be made of a metal having characteristics of an ohmic contact, an adhesive layer, and a bonding layer, and may not be transparent. The first electrode 891 and the second electrode 895 may be formed of one selected from the group consisting of Ti, Ru, Rh, Ir, Mg, Zn, Al, In, Ta, Pd, Co, Ni, Si, Alloys.

An electrode layer 893 may be disposed between the second electrode 895 and the second conductive semiconductor layer 875. The electrode layer 893 may be a light transmitting material that transmits light of 70% And may be formed of, for example, a metal or a metal oxide. The electrode layer 893 may be formed of indium tin oxide (ITO), indium zinc oxide (IZO), indium zinc oxide (IZTO), indium aluminum zinc oxide (IAZO), indium gallium zinc oxide (IGZO), indium gallium tin oxide (ZnO), RuOx, NiO, Al, Ag, Pd, Rh, Pt, and Ir may be selectively formed.

An insulating layer 881 may be disposed on the electrode layer 893. The insulating layer 881 may be disposed on the upper surface of the electrode layer 893 and the side surface of the semiconductor layer, and may be selectively in contact with the first and second electrodes 891 and 895. The insulating layer 881 includes an insulating material or an insulating resin formed of at least one of oxide, nitride, fluoride, and sulfide having at least one of Al, Cr, Si, Ti, Zn, and Zr. The insulating layer 881 may be selectively formed of, for example, $SiO_2$, $Si_3N_4$, $Al_2O_3$, or $TiO_2$. The insulating layer 881 may be formed as a single layer or a multilayer, but is not limited thereto.

FIG. 188 is a view showing example a vertical type light emitting chip using a light emitting chip in FIG. 117. In explaining FIG. 188, the same parts as those shown in FIG. 187 will be described with reference to the description of the embodiments disclosed above.

Referring to FIG. 188, the light emitting chip according to the embodiment includes a first electrode 891 on a first conductive type semiconductor layer 841 of a light emitting structure and a second electrode 890 having a plurality of conductive layers 896, 897, 898, and 899 below the second conductive type semiconductor layer 875.

The second electrode 890 is disposed under the second conductive type semiconductor layer 875, and includes a contact layer 896, a reflective layer 897, a bonding layer 898, and a support member 890. The contact layer 986 may be formed of metal or a metallic material which makes ohmic contact with a bottom surface of the second conductive semiconductor layer 875. The contact layer 896 may be formed by using a low-conductive material such as ITO, IZO, IZTO, IAZO, IGZO, IGTO, AZO or ATO, or metal such as Ni or Ag. The reflective layer 897 may be formed below the contact layer 896. The reflective layer 897 may be formed of a structure having at least one layer including a material selected from the group consisting of Ag, Ni, Al, Rh, Pd, Ir, Ru, Mg, Zn, Pt, Au, Hf and combination thereof. The bonding layer 898 may be formed below the reflective layer 897. The bonding layer 868 may be formed by using barrier or bonding metal. The bonding layer 898 may include at least one of Ti, Au, Sn, Ni, Cr, Ga, In, Bi, Cu, Ag, Ta and alloy thereof.

A current blocking layer 885 and a channel layer 883 is disposed between the second conductive type semiconductor layer 875 and the second electrode. The channel layer 883 may be disposed along an edge of the bottom surface of the second conductive semiconductor layer 875, and may be formed in a ring shape, a loop shape or a frame shape. The channel layer 883 may be formed of a material selected from a conductive material, a non-conductive material and an insulation material. The channel layer 883 may include at least one of ITO, IZO, IZTO, IAZO, IGZO, IGTO, AZO, ATO, $SiO_2$, $SiO_x$, $SiO_xN_y$, $Si_3N_4$, $Al_2O_3$, and $TiO_2$. The inner side portion of the channel layer 883 makes contact with the circumference of the lower surface region of the second conductive semiconductor layer 875, and the outer side portion of the channel layer 883 is disposed outward of the side surface of the second conductive type semiconductor layer 875, the current blocking layer 885 may be formed between the second conductive type semiconductor layer 875 and the contact layer 896 or the reflective layer 897. The current blocking layer 885 may include an insulating material and includes for example, at least one of $SiO_2$, $SiO_x$, $SiO_xN_y$, $Si_3N_4$, $Al_2O_3$, and $TiO_2$. Another example, the current blocking layer 885 may be formed of a metallic material that makes Schottky contact.

The current blocking layer 885 is disposed to correspond in the thickness direction of the first electrode 891 disposed on the light emitting structure and the light emitting structure. The current blocking layer 885 blocks the current provided from the second electrode 890, so that the current may be diffused in other paths. The current blocking layer 885 may be disposed in one or a plurality of regions, and at least some or all of the regions may overlap with the first electrode 891 in the vertical direction.

The supporting member 899 is formed below the bonding layer 898. The supporting member 899 may be formed of a conductive material such as Cu, Au, Ni, Mo, Cu—W, or a carrier wafer (for example, Si, Ge, GaAs, ZnO, SiC, etc.). As another example, the supporting member 899 may be realized by using a conductive sheet.

The substrate in FIG. 187, the growth substrate is removed from the first conductive semiconductor layer 841. The substrate may removed through a physical scheme (for example, laser lift off scheme) and/or a chemical scheme (for example, wet etching scheme), so that the first conductive semiconductor layer 841 may be exposed. The first electrode 891 is formed on the first conductive semiconductor layer 841 by performing an isolation etching process in the direction of removing the growth substrate. A light extracting structure (not shown) such as a roughness may be formed on the top surface of the first conductive semiconductor layer 841, and an insulating layer (not show) is further disposed on a surface of the semiconductor layer, but the embodiment is not limited thereto. Thus, the light emitting device, which includes the first electrode 143 on the light emitting structure 150A and the supporting member 173 below the light emitting structure 150A in a vertical electrode structure, may be fabricated.

A light emitting chip using a semiconductor device includes a laser diode in addition to the light emitting diode described above. The laser diode may include a first conductivity type semiconductor layer, an active layer, and a second conductivity type semiconductor layer having the above-described structure, like the light emitting device. Then, electro-luminescence (electroluminescence) phenomenon in which light is emitted when a current is supplied after bonding the p-type first conductivity type semiconductor and the n-type second conductivity type semiconductor is used, And phase. That is, the laser diode can emit light having the same phase and in the same direction with one specific wavelength (monochromatic beam) by using a phenomenon called stimulated emission and a constructive interference phenomenon, and can be used for optical communication, medical equipment, semiconductor processing equipment, and the like.

As the light receiving device, a photodetector, which is a kind of transducer that detects light and converts the intensity of the light into an electric signal, is exemplified. As such a photodetector, a photodiode (e.g., a PD with a peak wavelength in a visible blind spectral region or a true blind spectral region), a photodiode (e.g., a photodiode such as a photodiode (silicon, selenium), a photoconductive element (cadmium sulfide, cadmium selenide) Photoelectron tube, photo-tube (vacuum, gas-filled), IR (Infra-Red) detector, and the like.

In addition, a semiconductor device such as a photodetector may be fabricated using a direct bandgap semiconductor having excellent light conversion efficiency. Alternatively, the photodetector has a variety of structures, and the most general structure includes a pinned photodetector using a pn junction, a Schottky photodetector using a Schottky junction, and a metal-semiconductor metal (MSM) photodetector have.

The photodiode, like the light emitting chip, may include the first conductivity type semiconductor layer having the above-described structure, the active layer and the second conductivity type semiconductor layer, and is formed of a pn junction or a pin structure. The photodiode operates by applying a reverse bias or a zero bias. When light enters the photodiode, electrons and holes are generated and a current flows. At this time, the magnitude of the current may be approximately proportional to the intensity of the light incident on the photodiode.

A photovoltaic cell or a solar cell is a type of photodiode that can convert light into current. The solar cell, like the light emitting device, may include the first conductivity type semiconductor layer, the active layer, and the second conductivity type semiconductor layer having the above-described structure.

In addition, it can be used as a rectifier of an electronic circuit through a rectifying characteristic of a general diode using a p-n junction, and can be applied to an oscillation circuit or the like by being applied to a microwave circuit.

In addition, the above-described semiconductor element is not necessarily implemented as a semiconductor, and may further include a metal material in some cases. For example, a semiconductor device such as a light receiving device can be implemented using at least one of Ag, Al, Au, In, Ga, N, Zn, Se, P, or As, Or may be implemented using a doped semiconductor material or an intrinsic semiconductor material.

A light guide plate, a prism sheet, a diffusion sheet, and the like may be disposed on the light emitting device according to the embodiment. The light unit may be implemented in a top view or a side view type and may be provided in a display device such as a portable terminal and a notebook computer, or may be variously applied to a lighting device and a pointing device. Still another embodiment can be embodied as a lighting device including the light emitting element described in the above embodiments. For example, the lighting device may include a lamp, a streetlight, an electric signboard, and a headlight.

The light emitting device according to the embodiment is applicable to a lighting system. The lighting system includes a structure in which plurality of lighting devices are arrayed. The lighting system includes a display apparatus shown in FIGS. 189 and 190, a lighting apparatus shown in FIG. 191, a lighting lamp, a camera flash, a signal lamp, a headlamp for a vehicle, and an electronic display.

FIG. 189 is an exploded perspective view showing a display apparatus having the lighting device according to the embodiment.

Referring to FIG. 189, a display apparatus 1000 according to the embodiment includes a light guide plate 1041, a light source module 1033 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light source module 1033, and the reflective member 1022, but the embodiment is not limited thereto.

The bottom cover 1011, the reflective sheet 1022, the light guide plate 1041, the optical sheet 1051, and the light unit 1050 may be defined as a back light unit.

The light guide plate 1041 diffuses the light supplied from the light source module 1033 to provide surface light. The light guide plate 1041 may include a transparent material. For example, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light source module 1033 is disposed on at least one side of the light guide plate 1041 to supply the light to at least one side of the light guide plate 1041. The light source module 1033 serves as the light source of the display device.

At least one light source module 1033 is disposed to directly or indirectly supply the light from one side of the light guide plate 1041. The light source module 1033 may include a board 1031 and the light emitting device according to the embodiments or the light emitting device 1035. The light emitting device or the light emitting device 1035 are arranged on the board 1031 while being spaced apart from each other at the predetermined interval.

The board 1031 may include a printed circuit board (PCB) including a circuit pattern (not shown). In addition, the board 1031 may also include a metal core PCB (MCPCB) or a flexible PCB (FPCB) as well as a typical PCB, but the embodiment is not limited thereto. If the light emitting device 1035 is installed on the side of the bottom cover 1011 or on a heat dissipation plate, the board 1031 may be omitted. The heat dissipation plate partially makes contact with the top surface of the bottom cover 1011.

In addition, the light emitting device 1035 are arranged such that light exit surfaces to discharge light of the light emitting device 1035 are spaced apart from the light guide plate 1041 by a predetermined distance on the board 1031, but the embodiment is not limited thereto. The light emitting device 1035 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light source module 1033, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light source module 1031 as optical members, but the embodiment is not limited thereto.

FIG. 190 is a sectional view showing a display apparatus having the light device according to the embodiment.

Referring to FIG. 190, the display device 1100 includes a bottom cover 1152, a board 1120 on which the light emitting device 1124 are arrayed, an optical member 1154, and a display panel 1155.

The board 1120 and the light emitting device 1124 may constitute the light source module 1160. In addition, the bottom cover 1152, at least one light source module 1160, and the optical member 1154 may constitute the light unit 1150. The bottom cover 1151 can be disposed with a receiving section 1153, but the embodiment is not limited thereto. The light source module 1160 includes a board 1120, and a plurality of light emitting devices arranged on the board 1120 or a light emitting device 1124.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light source module 1160 in order to convert the light emitted from the light source module 1160 into the surface light.

FIG. 191 is an exploded perspective view showing a lighting device having the light emitting device according to the embodiment.

Referring to FIG. 191, the lighting device according to the embodiment may include a cover 2100, a light source module 2200, a heat radiation member 2400, a power supply part 2600, an inner case 2700, and a socket 2800. In addition, the light emitting device according to the embodiment may further include at least one of a member 2300 and a holder 2500. The light source module 2200 may include the light emitting device according to the embodiment.

For example, the cover 2100 has the shape of a bulb, or a hemispherical shape. The cover 2100 may have a hollow structure, and a portion of the cover 2100 may be open. The cover 2100 may be optically connected to the light source module 2200, and may be coupled with the heat radiation member 2400. The cover 2100 may have a recess part coupled with the heat radiation member 2400.

The inner surface of the cover 2100 may be coated with ivory white pigments serving as a diffusing agent. The light emitted from the light source module 2200 may be scattered or diffused by using the ivory white material, so that the light can be discharged to the outside.

The cover 2100 may include glass, plastic, PP, PE, or PC. In this case, the PC represents superior light resistance, superior heat resistance, and superior strength. The cover 2100 may be transparent so that the light source module 2200 may be recognized at the outside. In addition, the cover 2100 may be opaque. The cover 2100 may be formed through a blow molding scheme.

The light source module 2200 may be disposed at one surface of the heat radiation member 2400. Accordingly, the heat emitted from the light source module 2200 is conducted to the heat radiation member 2400. The light source module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light source module 2200, toward the cover 2100. Accordingly, the light efficiency of the lighting apparatus according to the embodiment can be improved.

The member 2300 may include an insulating material. The connection plate 2230 of the light source module 2200 may include an electric-conductive material.

Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light source module 2200 and the heat from the power supply part 2600 and radiates the heats.

The holder 2500 blocks a receiving groove 2719 of an insulating part 2710 disposed in an internal case 2700. Accordingly, the power supply part 2600 received in the insulating part 2710 of the internal case 2700 is sealed. The holder 2500 has a guide protrusion part 2510. The guide protrusion part 2510 may include a hole allowing a protrusion part 2610 of the power supply part 2600 to pass therethrough.

The power supply part 2600 processes and transforms an electrical signal received from the outside and supplies the electrical signal to the light source module 2200. The power supply part 2600 is received in the receiving groove 2719 of the internal case 2700, and sealed in the internal case 2700 by the holder 2500. A supporting portion 2370 of the internal case 2700 may be disposed under the heat radiation member 2400.

The power supply part 2600 may include a protrusion part 2610, a guide part 2630, a base 2650, and an extension part 2670.

The guide part 2630 protrudes outward from one side of the base 2650. The guide part 2630 may be inserted into the holder 2500. A plurality of parts may be disposed on one surface of the base 2650. For example, the parts include a DC converter, a driving chip to drive the light source module 2220, and an ESD (electrostatic discharge) protective device to protect the light source module 2200, but the embodiment is not limited thereto.

The extension part 2670 protrudes outward from another side of the base 2650. The extension part 2670 is inserted into the connection part 2750 of the internal case 2700, and receives an electrical signal from the outside. For example, the extension part 2670 may be equal to or less than the width of the connection part 2750 of the internal case 2700. The extension part 2670 may be electrically connected to the socket 2800 through a wire.

The internal case 2700 may be disposed therein with a molding part together with the power supply part 2600. The molding part is formed by hardening a molding liquid, so that the power supply part 2600 may be fixed into the internal case 2700.

It will be apparent to those skilled in the art that various modifications and variations can be made in the present invention without departing from the spirit or scope of the invention. It will be clear to those who have knowledge of it. Therefore, the technical scope of the present invention should not be limited to the contents described in the detailed description of the specification, but should be defined by the claims.

INDUSTRIAL APPLICABILITY

An embodiment may improve reliability of a light emitting device or a lighting device.

An embodiment may improve optical reliability by preventing degradation of phosphors by a light emitting device including an optical plate or a lighting device.

An embodiment may apply a light emitting device including an optical plate or a lighting device to a light source module or a light unit.

An embodiment may apply a light emitting device including an optical plate or a lighting device to various lighting devices or display devices.

The invention claimed is:

1. A lighting device comprising:
a light emitting device having a light emitting chip;
an optical plate corresponding to the light emitting chip; and
a semi-transmissive mirror disposed under the optical plate and overlapped with the light emitting chip in a vertical direction,
wherein the optical plate comprises:
  a phosphor layer;
  a first transparent film on a top surface of the phosphor layer;
  a second transparent film on a bottom surface of the phosphor layer; and
  a support surrounding the outer side of the phosphor layer,
wherein the support is disposed between the first and second transparent films,
wherein the semi-transmissive mirror is disposed between the phosphor layer and the light emitting chip,
wherein an area of a bottom surface of the semi-transmissive mirror is greater than an area of a top surface of the light emitting chip and smaller than an area of a bottom surface of the phosphor layer,
wherein the light emitting device comprises:
  a body having a recess; and a plurality of lead frames disposed in the recess, and
wherein the light emitting chip is disposed in the recess and is electrically connected to one of the plurality of lead frames,
wherein the optical plate is disposed on the recess and the body,
wherein the recess overlaps the phosphor layer in the vertical direction,
wherein a groove is disposed in the outer side of the body, and an adhesive member is disposed in the groove, and
wherein the optical plate is bonded to the adhesive member.

2. The lighting device according to claim 1, wherein the optical plate is spaced apart from the light emitting chip in the recess of the body.

3. The lighting device according to claim 1, wherein the phosphor layer is a quantum dot.

4. The lighting device according to claim 1, further comprising an adhesive tape bonded between the support and the first and second transparent films.

5. The lighting device according to claim 1, wherein the light emitting device includes a molding member on the light emitting chip, and
wherein the molding member contacts the bottom surface of the semi-transmissive mirror.

6. The lighting device according to claim 1, wherein the semi-transmissive mirror has an oval, circular, or polygonal shape,
wherein the support comprises a reflective material or a transmissive material, and
wherein the first and second transparent films comprise a glass material.

7. The lighting device according to claim 1, wherein the semi-transmissive mirror is one of a plurality of semi-transmissive mirrors, and
wherein the plurality of transmissive mirrors is disposed on a bottom surface of the first transparent film in a first axis direction.

8. The lighting device according to claim 1, wherein the semi-transmissive mirror is spaced from the light emitting chip by 1 mm or less, and
wherein an area of a top surface of the semi-transmissive mirror is less two times than the area of the top surface of the light emitting chip.

9. The lighting device according to claim 1, wherein the semi-transmissive mirror comprises a metal material or a diffusion sheet and has a reflectance higher than that of a transmissivity.

10. The lighting device according to claim 1, wherein at least one of the plurality of lead frames comprises a cavity recessed from a bottom of the recess, and
wherein the light emitting chip is disposed in the cavity.

11. The lighting device according to claim 1, wherein the support comprises at least one of a first stepped part in which an outer side of the first transparent film is disposed, and a second stepped part in which an outer side of the second transparent film is disposed.

* * * * *